United States Patent
Anryu et al.

(10) Patent No.: US 9,620,717 B2
(45) Date of Patent: Apr. 11, 2017

(54) COMPOSITION AND BLOCK TYPE COPOLYMER

(75) Inventors: Makoto Anryu, Tsukuba (JP); Daisuke Fukushima, Tsukuba (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 800 days.

(21) Appl. No.: 13/995,813

(22) PCT Filed: Dec. 21, 2011

(86) PCT No.: PCT/JP2011/079596
§ 371 (c)(1),
(2), (4) Date: Jun. 19, 2013

(87) PCT Pub. No.: WO2012/086670
PCT Pub. Date: Jun. 28, 2012

(65) Prior Publication Data
US 2013/0270544 A1    Oct. 17, 2013

(30) Foreign Application Priority Data
Dec. 21, 2010  (JP) .................................. 2010-285057

(51) Int. Cl.
| | | |
|---|---|---|
| H01L 51/54 | (2006.01) | |
| C09K 11/06 | (2006.01) | |
| H01L 51/00 | (2006.01) | |
| C08G 61/12 | (2006.01) | |
| H01L 51/50 | (2006.01) | |

(52) U.S. Cl.
CPC .......... *H01L 51/0039* (2013.01); *C08G 61/12* (2013.01); *C08G 61/122* (2013.01); *C09K 11/06* (2013.01); *H01L 51/0043* (2013.01); *C08G 2261/312* (2013.01); *C08G 2261/314* (2013.01); *C08G 2261/3142* (2013.01); *C08G 2261/3162* (2013.01); *C08G 2261/3245* (2013.01); *C08G 2261/342* (2013.01); *C08G 2261/5222* (2013.01); *C08G 2261/95* (2013.01); *C09K 2211/1416* (2013.01); *C09K 2211/1433* (2013.01); *H01L 51/50* (2013.01)

(58) Field of Classification Search
CPC ........ H05B 33/14; C08G 61/00; C08G 61/02; C08G 61/10; C08G 61/12; C08G 2261/00; C08G 2261/10; C08G 2261/12; C08G 2261/122; C08G 2261/124; C08G 2261/30; C08G 2261/31; C08G 2261/312; C08G 2261/314; C08G 2261/3142; C08G 2261/316; C08G 2261/3162; C08G 2261/3245; C08G 2261/34; C08G 2261/342; C08G 2261/40; C08G 2261/411; C08G 2261/50; C08G 2261/51; C08G 2261/512; C08G 2261/514; C08G 2261/52; C08G 2261/522; C08G 2261/5222; C08G 2261/524; C08G 2261/5242; C08G 2261/95; C09K 11/06; C09K 2211/00; C09K 2211/14; C09K 2211/1408; C09K 2211/1416; C09K 2211/1425; C09K 2211/1433; H01L 51/0032; H01L 51/0034; H01L 51/0039; H01L 51/0043; H01L 51/50; H01L 51/5012; H01L 51/5016
USPC ....... 428/690, 691, 411.4, 336, 917; 427/58, 427/66; 313/500–512; 257/40, 88–102, 257/E51.001–E51.052; 528/8, 397; 526/239
See application file for complete search history.

(56) References Cited
U.S. PATENT DOCUMENTS

| | | |
|---|---|---|
| 5,998,045 A | 12/1999 | Chen et al. |
| 6,353,083 B1 | 3/2002 | Inbasekaran et al. |
| 2003/0082402 A1 | 5/2003 | Zheng et al. |
| 2006/0229427 A1* | 10/2006 | Becker .................... C07F 5/025 528/86 |
| 2007/0167614 A1 | 7/2007 | Chen et al. |
| 2008/0103279 A1 | 5/2008 | Heun et al. |
| 2009/0302748 A1* | 12/2009 | Nakatani ................ C08G 61/02 313/504 |

(Continued)

FOREIGN PATENT DOCUMENTS

| | | |
|---|---|---|
| CN | 1337987 A | 2/2002 |
| CN | 1835985 A | 9/2006 |

(Continued)

OTHER PUBLICATIONS

First Office Action issued Feb. 25, 2015 in counterpart Chinese Patent Application No. 201180062147.8 with translation.

(Continued)

Primary Examiner — Andrew K Bohaty
(74) Attorney, Agent, or Firm — Sughrue Mion, PLLC

(57) ABSTRACT

A composition comprising:
 a light emitting material; and
 a polymer compound having a constitutional sequence represented by the following formula (1) as a main chain:

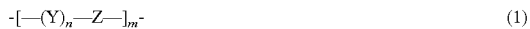

in the formula,
Y represents a divalent group, in which two hydrogen atoms are removed from a structure represented by the following formula (Y-1) or (Y-2),
Z represents a divalent group, in which two hydrogen atoms are removed from a structure represented by the following formula (Z-1), (Z-2), (Z-3), (Z-4), (Z-5), (Z-6), (Z-7), or (Z-8),
m represents an integer of 4 to 10,000, and n represents an integer of 1 to 3.

23 Claims, No Drawings

(56) References Cited

U.S. PATENT DOCUMENTS

| | | |
|---|---|---|
| 2010/0108993 A1 | 5/2010 | Moriwaki et al. |
| 2010/0289014 A1 | 11/2010 | Ito et al. |
| 2011/0127512 A1 | 6/2011 | Goto et al. |
| 2012/0108731 A1 | 5/2012 | Heun et al. |

FOREIGN PATENT DOCUMENTS

| | | |
|---|---|---|
| CN | 101611070 A | 12/2009 |
| EP | 2213693 A1 | 8/2010 |
| JP | 2002-536492 A | 10/2002 |
| JP | 2003163088 A | 6/2003 |
| JP | 2007-501883 A | 2/2007 |
| JP | 2008-56090 A | 3/2008 |
| JP | 2008-506798 A | 3/2008 |
| JP | 2008-227383 A | 9/2008 |
| WO | 99/54385 A1 | 10/1999 |
| WO | 2008/093822 A1 | 8/2008 |
| WO | 2009/066666 A1 | 5/2009 |
| WO | 2009/084548 A1 | 7/2009 |
| WO | 2009/151144 A1 | 12/2009 |
| WO | 2010149258 A1 | 12/2010 |

OTHER PUBLICATIONS

Communication dated Apr. 23, 2015 from the Taiwanese Patent Office in counterpart application No. 100147663.

Communication dated Nov. 9, 2015 from the State Intellectual Property Office of the People's Republic of China in counterpart application No. 201180062147.8.

International Preliminary Report on Patentability and Written Opinion issued Jul. 11, 2013 in counterpart International Application No. PCT/JP2011/079596.

Communication dated Sep. 15, 2015 from the Japanese Patent Office in counterpart application No. 2011-279920.

* cited by examiner

COMPOSITION AND BLOCK TYPE COPOLYMER

CROSS REFERENCE TO RELATED APPLICATIONS

This application is a National Stage of International Application No. PCT/JP2011/079596 filed Dec. 21, 2011, claiming priority based on Japanese Patent Application No. 2010-285057 filed Dec. 21, 2010, the contents of all of which are incorporated herein by reference in their entirety.

TECHNICAL FIELD

The present invention relates to a composition and a block type copolymer, and an organic electroluminescence device, a surface light source device, and a display device that are obtained by using them.

BACKGROUND ART

In recent years, an organic electroluminescence display using an organic electroluminescence device has been attracting attention as a next-generation display (hereinafter, referred to as an "organic EL device"). This organic EL device has organic layers such as a light emitting layer and a charge transport layer. The organic EL device may be made of a low molecular weight organic material or a polymeric organic material. The use of the polymeric organic material as a principal material is advantageous when producing a large organic EL display because a homogenous film can be easily formed when a coating method such as ink jet printing, spin coating or the like is used. As such, the use of the polymeric organic material for an organic EL device is suggested until now (Patent Document 1 and Patent Document 2).

CITATION LIST

Patent Literature

Patent Document 1: JP 2008-56090 A
Patent Document 2: WO 99/54385 A

SUMMARY OF INVENTION

Technical Problem

However, when a conventional polymeric organic material, particularly a material emitting light in blue, is used to produce an organic EL device, it cannot be said that the organic EL device has an adequate luminous life time.

Thus, it is an object of the present invention to provide an organic EL device having excellent luminous life time, a surface light source device and a display device using it, and a composition and a block type copolymer that can be used for an organic layer of the device.

Solution to Problem

Specifically, the invention provides a composition containing a light emitting material and a polymer compound that has a constitutional sequence represented by the following formula (1) as a main chain $$\text{-}[\text{-}(Y)_n\text{-}Z\text{-}]_m\text{-} \quad (1)$$

In the formula, Y represents a divalent group in which two hydrogen atoms are removed from a structure represented by the following formula (Y-1), or (Y-2). Z represents a divalent group in which two hydrogen atoms are removed from a structure represented by the following formula (Z-1), (Z-2), (Z-3), (Z-4), (Z-5), (Z-6), (Z-7), or (Z-8). m represents an integer of 4 to 10,000, and n represents an integer of 1 to 3. Plural Y's, Z's, and n's each may be the same as or different from each other.

Further, a hydrogen atom included in Y and Z may be substituted by R', and R' each independently represents a functional group selected from a group consisting of a carboxyl group, a nitro group, a cyano group, an alkyl group, an alkoxy group, an alkylthio group, an aryl group, an aryloxy group, an arylthio group, an alkenyl group, an alkynyl group, an amino group, a silyl group, an acyl group, an acyloxy group, an imine residue, an amide compound residue, an acid imide residue, a monovalent heterocyclic group, and a monovalent heterocyclic thio group, or a hydrogen atom or a halogen atom. When there are plural R''s, they may be the same as or different from each other, and plural R''s may be bonded to each other to form a ring structure. The hydrogen atom included in the functional group may be further substituted by a substituent.

[Chemical Formula 1]

(Y-1)

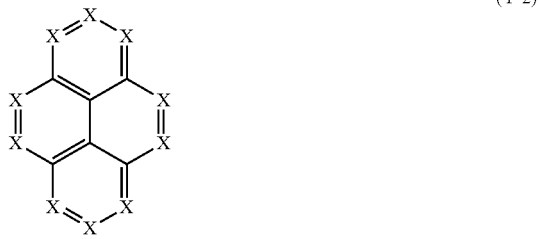

(Y-2)

[Chemical Formula 2]

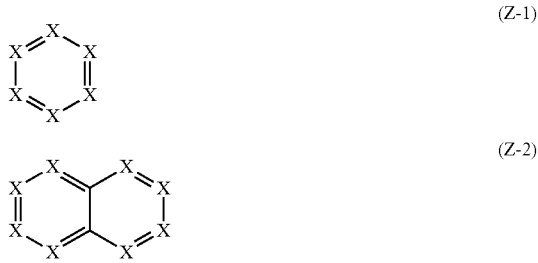

(Z-1)

(Z-2)

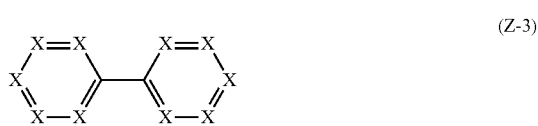

(Z-3)

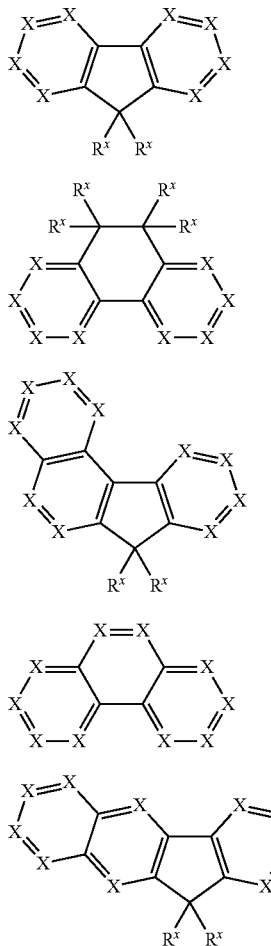

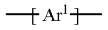

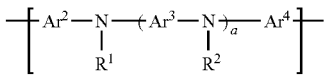

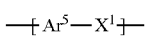

In the formulas, X represents —CH= or —N=. Plural X's may be the same as or different from each other, with the proviso that the number of —N= as X is 0 to 2.

$R^x$ represents a functional group selected from a group consisting of a carboxyl group, a nitro group, a cyano group, an alkyl group, an alkoxy group, an alkylthio group, an aryl group, an aryloxy group, an arylthio group, an alkenyl group, an alkynyl group, an amino group, a silyl group, an acyl group, an acyloxy group, an imine residue, an amide compound residue, an acid imide residue, a monovalent heterocyclic group, and a monovalent heterocyclic thio group, or a hydrogen atom or a halogen atom. Plural $R^x$'s may be the same as or different from each other, and plural $R^x$'s may be bonded to each other to form a ring structure. The hydrogen atom included in the functional group may be further substituted by a substituent.

The organic EL device obtained by using the composition has an excellent luminous life time.

The aforementioned light emitting material is preferably a polymeric light emitting material. When the light emitting material is a polymeric light emitting material, resistance to charge transfer tends to have small value, yielding excellent current characteristics.

As there is a tendency of having more excellent luminous life time and/or improved light emitting efficiency, the polymeric light emitting material preferably includes at least one of constitutional units represented by the following formula (A), (B), or (C).

[Chemical Formula 3]

In the formulas, $Ar^1$ and $Ar^5$ each independently represent an arylene group, a divalent heterocyclic group, or a divalent group having a metal complex structure. $Ar^2$, $Ar^3$ and $Ar^4$ each independently represent an arylene group or a divalent heterocyclic group. $R^1$ and $R^2$ each independently represent a hydrogen atom, an alkyl group, an aryl group, or a monovalent heterocyclic group. $X^1$ represents —$CR^3$=$CR^4$— or —C≡C—. $R^3$ and $R^4$ each independently represent a hydrogen atom, a carboxyl group, a substituted carboxyl group, a cyano group, an alkyl group, an aryl group, or a monovalent heterocyclic group, a is 0 or 1.

In terms of having improved hole transport property, the light emitting material preferably has the constitutional unit represented by the above formula (B).

In the composition, Y each independently is preferably a divalent group represented by the following formula (Y-3), (Y-4), (Y-5), or (Y-6), more preferably a divalent group represented by the following formula (Y-3), (Y-4), or (Y-5), further preferably a divalent group represented by the following formula (Y-3), or (Y-5), and particularly preferably a divalent group represented by the following formula (Y-3).

[Chemical Formula 4]

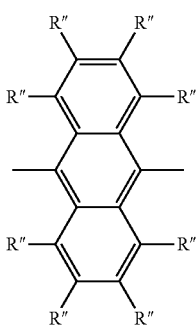

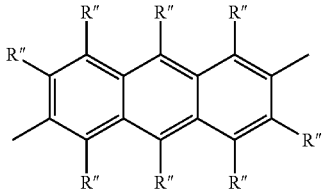

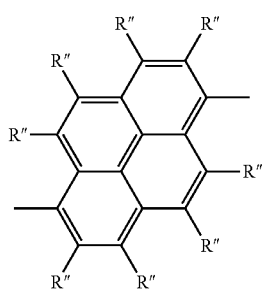
(Y-5)

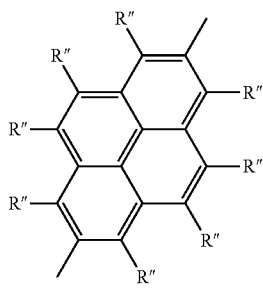
(Y-6)

In the formulas, R″ represents a hydrogen atom, an alkyl group, an aryl group, or a monovalent heterocyclic group. Plural R″'s may be the same as or different from each other.

In the composition, Z is preferably a divalent group represented by the following formula (Z-9), (Z-10), (Z-11), (Z-12), (Z-13), (Z-14), (Z-15), (Z-16), (Z-17), (Z-18), (Z-19), or (Z-20), more preferably a divalent group represented by the following formula (Z-9), (Z-11), (Z-13), (Z-15), (Z-16), (Z-17), or (Z-19), still more preferably a divalent group represented by the following formula (Z-9), (Z-11), (Z-15), (Z-16), (Z-17), or (Z-19), and particularly preferably a divalent group represented by the following formula (Z-11), (Z-15), or (Z-17). More particularly preferably, it is a divalent group represented by the following formula (Z-15).

[Chemical Formula 5]

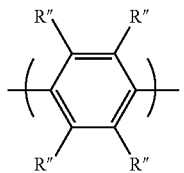
(Z-9)

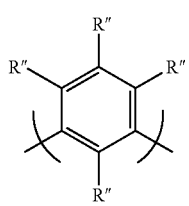
(Z-10)

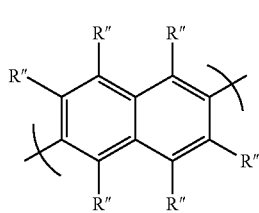
(Z-11)

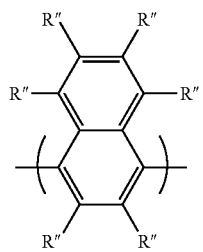
(Z-12)

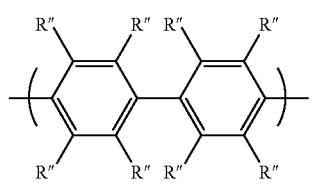
(Z-13)

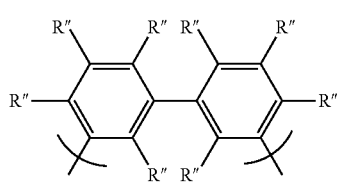
(Z-14)

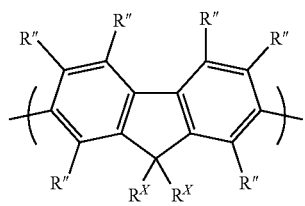
(Z-15)

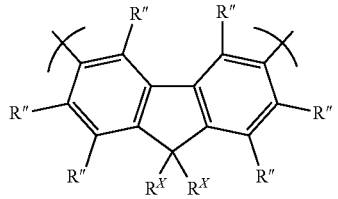
(Z-16)

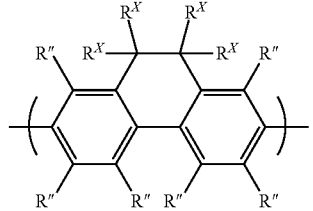
(Z-17)

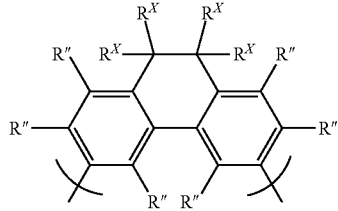
(Z-18)

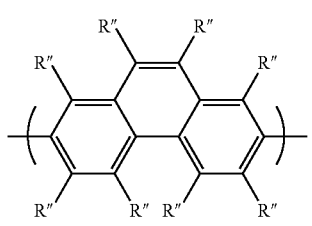
(Z-19)

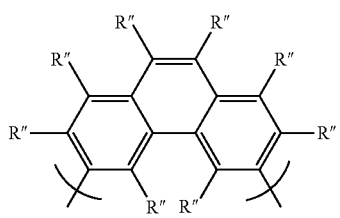
(Z-20)

In the formulas, R" represents a hydrogen atom, an alkyl group, an aryl group, or a monovalent heterocyclic group. Plural R"'s may be the same as or different from each other. $R^x$ has the same meaning as defined above.

The composition preferably contains the light emitting material in an amount of 0.1 to 100 parts by mass relative to 1 part by mass of the polymer compound.

According to one embodiment of the composition, the polymer compound is synthesized by condensation polymerization, in the polymer compound, the group represented by Y and the group represented by Z are introduced by condensation polymerization, an arbitrary additional group which is different from the group represented by Y and the group represented by Z may be introduced by condensation polymerization, and when mole numbers of Y, Z, and the arbitrary additional group in the polymer compound are $N_Y$, $N_Z$ and $N_M$, respectively, $N_Y$, $N_Z$ and $N_M$ preferably satisfy the following equation (2)

$$30 \leq N_Y \times 100/(N_Y+N_Z+N_M) \leq 75 \qquad (2)$$

According to other embodiment of the composition, each of the polymer compound and the light emitting material is synthesized by condensation polymerization, and in the polymer compound, the group represented by Y and the group represented by Z are introduced by condensation polymerization and an arbitrary additional group which is different from the group represented by Y and the group represented by Z may be introduced by condensation polymerization, and when mole numbers of Y, Z and the arbitrary additional group in the polymer compound are $N_Y$, $N_Z$ and $N_M$, respectively, and a mole number of chemical structures in the light emitting material constituting the light emitting material, which is introduced by the condensation polymerization, is $N_L$, $N_Y$, $N_Z$, $N_M$, and $N_L$ preferably satisfy the following equation (3).

When the number of Y in the polymer compound satisfies the following equation (2), or (3), the light emitting efficiency tends to improve.

$$0.5 \leq N_Y \times 100/(N_Y+N_Z+N_M+N_L) \leq 37.5 \qquad (3)$$

In the composition, since there is a tendency of having more excellent luminous life time and/or improved light emitting efficiency, the main chain of the polymer compound is composed only of the constitutional sequence represented by the above formula (1).

Also provided by the invention is a block type copolymer containing a constitutional sequence represented by the following formula (1) as a main chain and a chemical structure constituting a light emitting material as a main chain or a side chain.

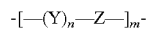
(1)

In the formula, Y represents a divalent group in which two hydrogen atoms are removed from a structure represented by the following formula (Y-1), or (Y-2). Z represents a divalent group in which two hydrogen atoms are removed from a structure represented by the following formula (Z-1), (Z-2), (Z-3), (Z-4), (Z-5), (Z-6), (Z-7), or (Z-8). m represents an integer of 4 to 10,000, and n represents an integer of 1 to 3. Plural Y's, Z's, and n's each may be the same as or different from each other.

The hydrogen atom included in Y and Z may be substituted by R', and R' represents a functional group selected from a group consisting of a carboxyl group, a nitro group, a cyano group, an alkyl group, an alkoxy group, an alkylthio group, an aryl group, an aryloxy group, an arylthio group, an alkenyl group, an alkynyl group, an amino group, a silyl group, an acyl group, an acyloxy group, an imine residue, an amide compound residue, an acid imide residue, a monovalent heterocyclic group, and a monovalent heterocyclic thio group, or a halogen atom. When there are plural R"s, they may be the same as or different from each other, and plural R"s may be bonded to each other to form a ring structure. The hydrogen atom included in the functional group may be further substituted by a substituent.

[Chemical Formula 6]

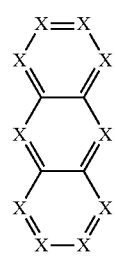
(Y-1)

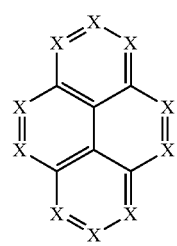
(Y-2)

[Chemical Formula 7]

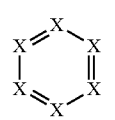
(Z-1)

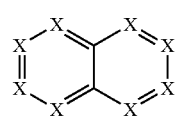
(Z-2)

-continued

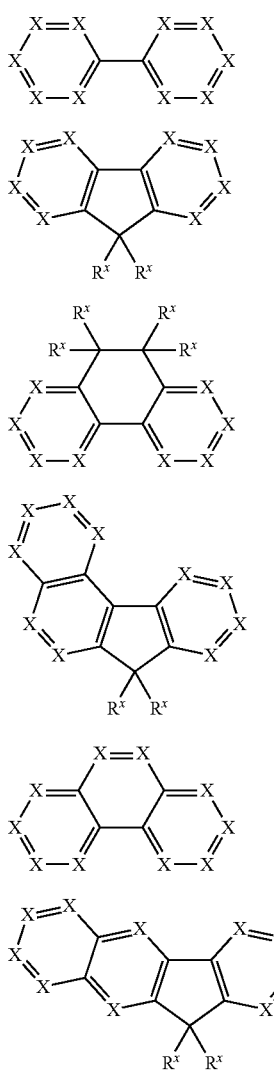

(Z-3)
(Z-4)
(Z-5)
(Z-6)
(Z-7)
(Z-8)

In the formulas, X represents —CH= or —N=. Plural X's may be the same as or different from each other, with the proviso that the number of —N= as X is 0 to 2.

$R^x$ represents a functional group selected from a group consisting of a carboxyl group, a nitro group, a cyano group, an alkyl group, an alkoxy group, an alkylthio group, an aryl group, an aryloxy group, an arylthio group, an alkenyl group, an alkynyl group, an amino group, a silyl group, an acyl group, an acyloxy group, an imine residue, an amide compound residue, an acid imide residue, a monovalent heterocyclic group, and a monovalent heterocyclic thio group, or a hydrogen atom or a halogen atom. Plural $R^x$'s may be the same as or different from each other, and plural $R^x$'s may be bonded to each other to form a ring structure. The hydrogen atom included in the functional group may be further substituted by a substituent.

The organic EL device obtained by using the block type copolymer has an excellent luminous life time.

With respect to the block type copolymer, as there is a tendency of having more excellent luminous life time and/or improved light emitting efficiency, the chemical structure constituting the light emitting material is preferably at least one of constitutional units represented by the following formula (A), (B), or (C).

[Chemical Formula 8]

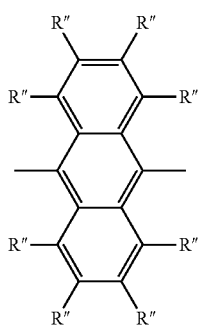

(A)
(B)
(C)

In the formulas, $Ar^1$ and $Ar^5$ each independently represent an arylene group, a divalent heterocyclic group, or a divalent group having a metal complex structure. $Ar^2$, $Ar^3$ and $Ar^4$ each independently represent an arylene group or a divalent heterocyclic group. $R^1$ and $R^2$ each independently represent a hydrogen atom, an alkyl group, an aryl group, or a monovalent heterocyclic group. $X^1$ represents —$CR^3$=$CR^4$— or —C≡C—. $R^3$ and $R^4$ each independently represent a hydrogen atom, a carboxyl group, a substituted carboxyl group, a cyano group, an alkyl group, an aryl group, or a monovalent heterocyclic group. a is 0 or 1.

As there is a tendency of having improved current characteristics, the chemical structure constituting the light emitting material in the block type copolymer is preferably the constitutional unit represented by the above formula (B).

In the block type copolymer, Y preferably represents a divalent group represented by the following formula (Y-3), (Y-4), (Y-5), or (Y-6). Y more preferably represents a divalent group represented by the following formula (Y-3), (Y-4), or (Y-5). Y still more preferably represents a divalent group represented by the following formula (Y-3), or (Y-5). Y particularly preferably represents a divalent group represented by the following formula (Y-3).

[Chemical Formula 9]

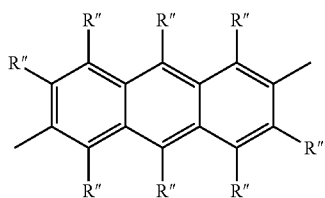

(Y-3)

(Y-4)

-continued (Y-5)
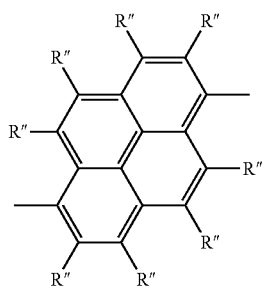

(Y-6)
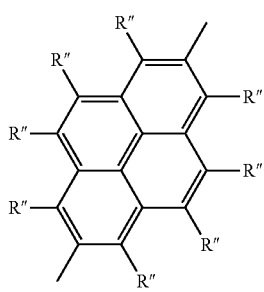

In the formulas, R" represents a hydrogen atom, an alkyl group, an aryl group, or a monovalent heterocyclic group. Plural R"'s may be the same as or different from each other.

In the block type copolymer, it is preferable that Z each independently represents a divalent group represented by the following formula (Z-9), (Z-10), (Z-11), (Z-12), (Z-13), (Z-14), (Z-15), (Z-16), (Z-17), (Z-18), (Z-19), or (Z-20). It is more preferable that Z each independently represents a divalent group represented by the following formula (Z-9), (Z-11), (Z-13), (Z-15), (Z-16), (Z-17), or (Z-19). It is still more preferable that Z each independently represents a divalent group represented by the following formula (Z-9), (Z-11), (Z-15), (Z-16), (Z-17), or (Z-19). It is particularly preferable that Z each independently represents a divalent group represented by the following formula (Z-11), (Z-15), or (Z-17). More particularly, it is a divalent group represented by the following formula (Z-15).

[Chemical Formula 10]

(Z-9)
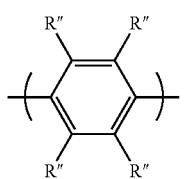

(Z-10)
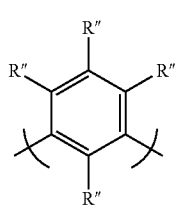

(Z-11)
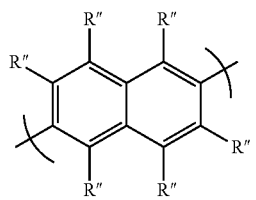

(Z-12)
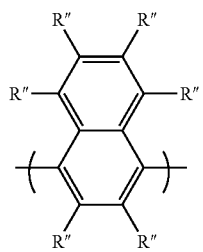

(Z-13)
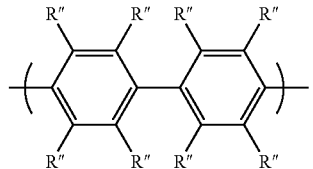

(Z-14)
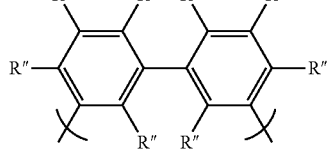

(Z-15)
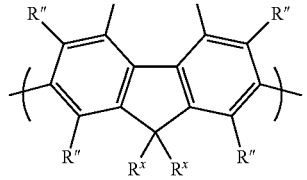

(Z-16)
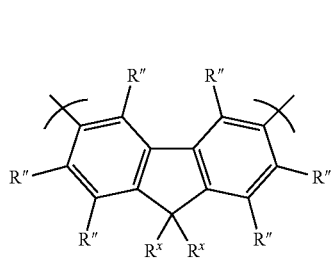

(Z-17)
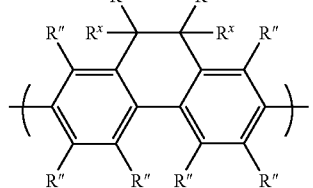

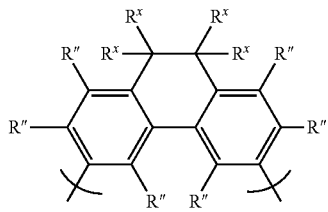

(Z-18)

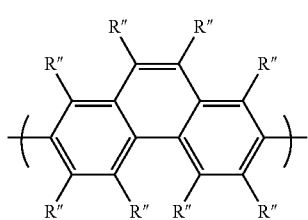

(Z-19)

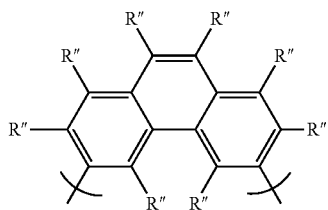

(Z-20)

In the formulas, R" represents a hydrogen atom, an alkyl group, an aryl group, or a monovalent heterocyclic group. When there are plural R"'s, they may be the same as or different from each other and $R^x$ has the same meaning as defined above.

The block type copolymer preferably contains 1 to 30 constitutional sequences represented by the above formula (1).

According to one embodiment of the block type copolymer, the block type copolymer is synthesized by condensation polymerization as there is a tendency of having improved light emitting efficiency, and in the block type copolymer, the group represented by Y, the group represented by Z, and the chemical structure constituting the light emitting material are introduced by condensation polymerization and an arbitrary additional group which is different from the group represented by Y, the group represented by Z, and the chemical structure constituting the light emitting material may be introduced by condensation polymerization, and when mole numbers of Y, Z, the arbitrary additional group, and the chemical structure constituting the light emitting material in the block type copolymer are $N_Y$, $N_Z$, $N_M$, and $N_K$, respectively, $N_Y$, $N_Z$, $N_M$, and $N_K$ preferably satisfy the following equation (4).

$$2 \leq N_Y \times 100/(N_Y+N_Z+N_K+N_M) < 40 \quad (4)$$

According to other embodiment of the block type copolymer, since there is a tendency of having improved light emitting efficiency, the block type copolymer is composed only of the chemical structure constituting the light emitting material and the constitutional sequence represented by the above formula (1).

Also provided by the invention is an organic EL device comprising a pair of electrodes and an organic layer provided between the pair of the electrodes, in which the organic layer is obtained by using the composition described above.

Also provided by the invention is an organic EL device comprising a pair of electrodes and an organic layer provided between the pair of the electrodes, in which the organic layer contains the block type copolymer described above.

Also provided by the invention is a surface light source device and a display device having the organic EL device described above.

Advantageous Effects of Invention

By using the composition or block type copolymer of the invention, luminous life time of an organic EL device to be obtained can be improved. Further, according to the invention, an organic EL device, a surface light source device, and a display device having excellent luminous life time, and a composition and a block type copolymer which can be used for an organic layer of the device can be provided.

DESCRIPTION OF EMBODIMENTS

Herein below, preferred embodiments of the present invention will be described in detail. Further, in the description below, a tert-butyl group is described as "t-Bu", and a phenyl group is described as "Ph" in some cases.

Explanation of Terminology

Herein below, terms that are used in common in the present description will be described with reference to specific examples as required.

The term "constitutional unit" indicates an atom or a group of atoms that are present in a molecular chain of the polymer compound. The term "constitutional sequence" indicates a molecular chain containing one or more types of constitutional units in constant order.

Examples of a halogen atom include a fluorine atom, a chlorine atom, a bromine atom and an iodine atom.

The term "$C_p$~$C_q$" (p and q are positive integers satisfying p<q) means that the number of carbon atoms of a partial substructure corresponding to a functional group name described just after the term is p to q. That is, the term means that when an organic group described just after "$C_p$~$C_q$" is an organic group named in combination of plural functional group names (e.g., a $C_p$~$C_q$ alkoxyphenyl group), the number of carbon atoms of a partial substructure corresponding to a functional group name (e.g., alkoxy) described just after "$C_p$~$C_q$" among the plural functional group names is p to q. For example, a "$C_1$~$C_{12}$ alkyl group" means an alkyl group having 1 to 12 carbon atoms, and a "$C_1$~$C_{12}$ alkoxyphenyl group" means a phenyl group having an "alkoxy group having 1 to 12 carbon atoms".

An alkyl group may have a substituent, and may be any of a linear alkyl group, a branched alkyl group and a cyclic alkyl group (cycloalkyl group). As the alkyl group, a linear alkyl group and a cyclic alkyl group are preferable, and an unsubstituted alkyl group and an alkyl group substituted by a halogen atom or the like are preferable.

Examples of the substituents include a carboxyl group, a nitro group, a cyano group, an alkyl group, an alkoxy group, an alkylthio group, an aryl group, an aryloxy group, an arylthio group, an alkenyl group, an alkynyl group, an amino group, a silyl group, an acyl group, an acyloxy group, an imine residue, an amide compound residue, an acid imide residue, a monovalent heterocyclic group, a monovalent heterocyclic thio group, and a halogen atom, and some or all of hydrogen atoms included in these groups may be substituted by fluorine atoms. Further, when the substituents have a hydrocarbon chain, the number of carbon atoms in the substituent is preferably 1 to 20 (hereinafter, when a "substituent" is mentioned, these are provided as examples thereof unless otherwise specified).

The number of carbon atoms of the alkyl group is preferably 1 to 20, more preferably 1 to 15, and still more preferably 1 to 12 for a linear alkyl group and a branched alkyl group. For a cyclic alkyl group, it is preferably 3 to 20, more preferably 3 to 15, and still more preferably 3 to 12. Examples of the alkyl group which may have a substituent include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a 2-ethyl hexyl group, a heptyl group, an octyl group, a 3,7-dimethyloctyl group, a nonyl group, a decyl group, a dodecyl group, an aryl alkyl group, a trifluoromethyl group, a pentafluoroethyl group, a perfluorobutyl group, a perfluorohexyl group, and a perfluorooctyl group.

An aryl alkyl group may have a substituent, and is preferably an unsubstituted aryl alkyl group or an aryl alkyl group substituted by a halogen atom, an alkoxy group, or the like. The number of carbon atoms of the aryl alkyl group is preferably 7 to 60, more preferably 7 to 48, and still more preferably 7 to 30. Examples of the aryl alkyl group that may have a substituent include a phenyl-$C_1$~$C_{12}$ alkyl group, a $C_1$~$C_{12}$ alkoxyphenyl-$C_1$~$C_{12}$ alkyl group, a $C_1$~$C_{12}$ alkylphenyl-$C_1$~$C_{12}$ alkyl group, a 1-naphthyl-$C_1$~$C_{12}$ alkyl group, and a 2-naphthyl-$C_1$~$C_{12}$ alkyl group.

An alkoxy group may have a substituent, and may be any of a linear alkoxy group, a branched alkoxy group and a cyclic alkoxy group (cycloalkoxy group). As the alkoxy group, a linear alkoxy group or a cyclic alkoxy group are preferable, and an unsubstituted alkoxy group and an alkoxy group substituted by a halogen atom, an alkoxy group, or the like are preferable.

The number of carbon atoms of the alkoxy group is preferably 1 to 20, more preferably 1 to 15, and still more preferably 1 to 12 for a linear alkoxy group and a branched alkoxy group. The number of carbon atoms of the cyclic alkoxy group is preferably 3 to 20, more preferably 3 to 15, and still more preferably 3 to 12. Examples of the alkoxy group which may have a substituent include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a dodecyloxy group, an aryl alkoxy group, a trifluoromethoxy group, a pentafluoroethoxy group, a perfluorobutoxy group, a perfluorohexyloxy group, a perfluorooctyloxy group, a methoxymethyloxy group, and a 2-methoxyethyloxy group.

An aryl alkoxy group may have a substituent, and is preferably an unsubstituted aryl alkoxy group or an aryl alkoxy group substituted by a halogen atom, an alkoxy group, or the like. The number of carbon atoms of the aryl alkoxy group is preferably 7 to 60, more preferably 7 to 48, and still more preferably 7 to 30. Examples of the aryl alkoxy group that may have a substituent include a phenyl-$C_1$~$C_{12}$ alkoxy group, a $C_1$~$C_{12}$ alkoxyphenyl-$C_1$~$C_{12}$ alkoxy group, a $C_1$~$C_{12}$ alkylphenyl-$C_1$~$C_{12}$ alkoxy group, a 1-naphthyl-$C_1$~$C_{12}$ alkoxy group, and a 2-naphthyl-$C_1$~$C_{12}$ alkoxy group.

An alkylthio group may have a substituent, and may be any of a linear alkylthio group, a branched alkylthio group and a cyclic alkylthio group (cycloalkylthio group). As the alkylthio group, a linear alkylthio group or a cyclic alkylthio group are preferable, and an unsubstituted alkylthio group or an alkylthio group substituted by a halogen atom or the like are preferable.

The number of carbon atoms of the alkylthio group is preferably 1 to 20, more preferably 1 to 15, and still more preferably 1 to 12 for the linear alkylthio group and the branched alkylthio group. The number of carbon atoms of the cyclic alkylthio group is preferably 3 to 20, more preferably 3 to 15, and still more preferably 3 to 12. Examples of the alkylthio group which may have a substituent include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a 2-ethylhexylthio group, a nonylthio group, a decylthio group, an aryl alkylthio group, a 3,7-dimethyloctylthio group, a dodecylthio group, and a trifluoromethylthio group.

An aryl alkylthio group may have a substituent, and is preferably an unsubstituted aryl alkylthio group or an aryl alkylthio group substituted by a halogen atom, an alkoxy group, or the like. The number of carbon atoms of the aryl alkylthio group is preferably 7 to 60, more preferably 7 to 48, and still more preferably 7 to 30. Examples of the aryl alkylthio group that may have a substituent include a phenyl-$C_1$~$C_{12}$ alkylthio group, a $C_1$~$C_{12}$ alkoxyphenyl-$C_1$~$C_{12}$ alkylthio group, a $C_1$~$C_{12}$ alkylphenyl-$C_1$~$C_{12}$ alkylthio group, a 1-naphthyl-$C_1$~$C_{12}$ alkylthio group, and a 2-naphthyl-$C_1$~$C_{12}$ alkylthio group.

An aryl group is a group of atoms left after removing one of hydrogen atoms bound to carbon atoms constituting an aromatic ring from an aromatic hydrocarbon, and may have a substituent. As the aryl group, an aryl group consisting of an aromatic ring only, an unsubstituted aryl group or an aryl group substituted by a halogen atom, an alkoxy group, or the like are preferable. Examples of the aryl group include a group having a benzene ring, a group having a fused ring, and a group with two or more of benzene rings and/or fused rings bound via single bond or a divalent organic group (e.g., an alkylene group such as a vinylene group).

The number of carbon atoms of the aryl group is preferably 6 to 60, more preferably 6 to 48, and still more preferably 6 to 30. Examples of the aryl group that may have a substituent include a phenyl group, a $C_1$~$C_{12}$ alkoxyphenyl group, a $C_1$~$C_{12}$ alkylphenyl group, a 1-naphthyl group, a 2-naphthyl group, a 1-anthracenyl group, a 2-anthracenyl group, a 9-anthracenyl group, a 2-fluorenyl group, a pentafluorophenyl group, a biphenylyl group, a $C_1$~$C_{12}$ alkoxybiphenylyl group, and a $C_1$~$C_{12}$ alkylbiphenylyl group. Of those, a phenyl group, a $C_1$~$C_{12}$ alkoxyphenyl group, a $C_1$~$C_{12}$ alkylphenyl group, a biphenylyl group, a $C_1$~$C_{12}$ alkoxybiphenylyl group or a $C_1$~$C_{12}$ alkylbiphenylyl group are preferable.

Examples of the $C_1$~$C_{12}$ alkoxyphenyl group include a methoxyphenyl group, an ethoxyphenyl group, a propyloxyphenyl group, an isopropyloxyphenyl group, a butyloxyphenyl group, an isobutyloxyphenyl group, a tert-butyloxyphenyl group, a pentyloxyphenyl group, a hexyloxyphenyl group, or an octyloxyphenyl group.

Examples of the $C_1$~$C_{12}$ alkylphenyl group include a methylphenyl group, an ethylphenyl group, a dimethylphenyl group, a propylphenyl group, a mesityl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group, and a dodecylphenyl group.

An aryloxy group may have a substituent, and is preferably an unsubstituted aryloxy group or an aryloxy group substituted by a halogen atom, an alkoxy group, or the like.

The number of carbon atoms of the aryloxy group is preferably 6 to 60, more preferably 6 to 48, and still more preferably 6 to 30. Examples of the aryloxy group that may have a substituent include a phenoxy group, a $C_1 \sim C_{12}$ alkoxyphenoxy group, a $C_1 \sim C_{12}$ alkylphenoxy group, a 1-naphthyloxy group, a 2-naphthyloxy group, and a pentafluorophenyloxy group. A $C_1 \sim C_{12}$ alkoxyphenoxy group, or a $C_1 \sim C_{12}$ alkylphenoxy group is preferable.

Examples of the $C_1 \sim C_{12}$ alkoxyphenoxy group include a methoxyphenoxy group, an ethoxyphenoxy group, a propyloxyphenoxy group, an isopropyloxyphenoxy group, a butyloxyphenoxy group, an isobutyloxyphenoxy group, a tert-butyloxyphenoxy group, a pentyloxyphenoxy group, a hexyloxyphenoxy group, and an octyloxyphenoxy group.

Examples of the $C_1 \sim C_{12}$ alkylphenoxy group include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a sec-butylphenoxy group, a tert-butylphenoxy group, a pentylphenoxy group, an isoamylphenoxy group, a hexylphenoxy group, a heptylphenoxy group, an octylphenoxy group, a nonylphenoxy group, a decylphenoxy group, and a dodecylphenoxy group.

An arylthio group may have a substituent, and is preferably an unsubstituted arylthio group, or an arylthio group substituted by a halogen atom, an alkoxy group or the like. The number of carbon atoms of the arylthio group is preferably 6 to 60, more preferably 6 to 48, and still more preferably 6 to 30. Examples of the arylthio group that may have a substituent include a phenylthio group, a $C_1 \sim C_{12}$ alkoxyphenylthio group, a $C_1 \sim C_{12}$ alkylphenylthio group, a 1-naphthylthio group, a 2-naphthylthio group, and a pentafluorophenylthio group.

An alkenyl group may have a substituent, and may be any of a linear alkenyl group, a branched alkenyl group and a cyclic alkenyl group. The number of carbon atoms of the alkenyl group is preferably 2 to 20, more preferably 2 to 15, and still more preferably 2 to 10. Examples of the alkenyl group that may have a substituent include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group, a 1-octenyl group, and an aryl alkenyl group.

An aryl alkenyl group may have a substituent, and is preferably an unsubstituted aryl alkenyl group or an aryl alkenyl group substituted by a halogen atom, an alkoxy group, or the like. The number of carbon atoms of the aryl alkenyl group is preferably 8 to 60, more preferably 8 to 48, and still more preferably 8 to 30. Examples of the aryl alkenyl group that may have a substituent include a phenyl-$C_2 \sim C_{12}$ alkenyl group, a $C_1 \sim C_{12}$ alkoxyphenyl-$C_2 \sim C_{12}$ alkenyl group, a $C_1 \sim C_{12}$ alkylphenyl-$C_2 \sim C_{12}$ alkenyl group, a 1-naphthyl-$C_2 \sim C_{12}$ alkenyl group, and a 2-naphthyl-$C_2 \sim C_{12}$ alkenyl group. Of those, a $C_1 \sim C_{12}$ alkoxyphenyl-$C_2 \sim C_{12}$ alkenyl group, or a $C_1 \sim C_{12}$ alkylphenyl-$C_2 \sim C_{12}$ alkenyl group is preferable.

An alkynyl group may have a substituent, and may be any of a linear alkynyl group, a branched alkynyl group and a cyclic alkynyl group. The number of carbon atoms of the alkynyl group is preferably 2 to 20, more preferably 2 to 15, and still more preferably 2 to 10 for a linear alkynyl group and a branched alkynyl group. For the cyclic alkynyl group, it is preferably 10 to 20, and more preferably 10 to 15.

Examples of the alkynyl group include that may have a substituent include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group, a 1-octynyl group, and an aryl alkynyl group.

An aryl alkynyl group may have a substituent, and is preferably an unsubstituted aryl alkynyl group or an aryl alkynyl group substituted by a halogen atom, an alkoxy group, or the like. The number of carbon atoms of the aryl alkynyl group is preferably 8 to 60, more preferably 8 to 48, and still more preferably 8 to 30. Examples of the aryl alkynyl group that may have a substituent include a phenyl-$C_2 \sim C_{12}$ alkynyl group, a $C_1 \sim C_{12}$ alkoxyphenyl-$C_2 \sim C_{12}$ alkynyl group, a $C_1 \sim C_{12}$ alkylphenyl-$C_2 \sim C_{12}$ alkynyl group, a 1-naphthyl-$C_2 \sim C_{12}$ alkynyl group, and a 2-naphthyl-$C_2 \sim C_{12}$ alkynyl group. Of those, a $C_1 \sim C_{12}$ alkoxyphenyl-$C_2 \sim C_{12}$ alkynyl group, or a $C_1 \sim C_{12}$ alkylphenyl-$C_2 \sim C_{12}$ alkynyl group is preferable.

A monovalent heterocyclic group is a group of atoms left after removing one of hydrogen atoms bound to an atom constituting a heterocycle from a heterocyclic compound, and may have a substituent. As the monovalent heterocyclic group, an unsubstituted monovalent heterocyclic group or a monovalent aromatic heterocyclic group substituted by a substituent such as an alkyl group or the like are preferable. The number of carbon atoms of the monovalent heterocyclic group is preferably 4 to 60, more preferably 4 to 30, and still more preferably 4 to 20 without including the number of carbon atoms of the substituent. The heterocyclic compound refers to an organic compound having a ring structure and containing not only carbon atoms but also heteroatoms, such as an oxygen atom, a sulfur atom, a nitrogen atom, a phosphorus atom, a boron atom, a silicon atom, a selenium atom, a tellurium atom, and an arsenic atom, as elements constituting the ring. Examples of the monovalent heterocyclic group that may have a substituent include a thienyl group, a $C_1 \sim C_{12}$ alkylthienyl group, a pyrrolyl group, a furyl group, a pyridyl group, a $C_1 \sim C_{12}$ alkylpyridyl group, a pyridazinyl group, a pyrimidinyl group, a pyrazinyl group, a triazinyl group, a pyrrolidyl group, a piperidyl group, a quinolyl group, and an isoquinolyl group, and a thienyl group, a $C_1 \sim C_{12}$ alkylthienyl group, a pyridyl group, or a $C_1 \sim C_{12}$ alkylpyridyl group is preferable.

A monovalent heterocyclic thio group is a group with the hydrogen atom of a mercapto group having been substituted by a monovalent heterocyclic group, and may have a substituent. Examples of the monovalent heterocyclic thio group include a pyridylthio group, a pyridazinylthio group, a pyrimidinylthio group, a pyrazinylthio group, and a triazinylthio group.

An amino group may have a substituent, and is preferably an unsubstituted amino group or an amino group substituted by one or two substituents selected from an alkyl group, an aryl group, and a monovalent heterocyclic group (hereinafter, referred to as a "substituted amino group"). The substituent may further have a substituent (hereinafter, a substituent possessed by a substituent included in a functional group is referred to as a "secondary substituent" in some cases).

The number of carbon atoms of the substituted amino group is preferably 1 to 60, more preferably 2 to 48, and still more preferably 2 to 40 without including the number of carbon atoms of the secondary substituent. Examples of the substituted amino group that may have a secondary substituent include a methyl amino group, a dimethyl amino group, an ethyl amino group, a diethyl amino group, a propyl amino group, a dipropyl amino group, an isopropyl amino group, a diisopropyl amino group, a butyl amino group, an isobutyl amino group, a sec-butyl amino group, a tert-butyl amino group, a pentyl amino group, a hexyl amino group, a heptyl amino group, an octyl amino group, a 2-ethylhexyl amino group, a nonyl amino group, a decyl amino group, a 3,7-dimethyloctyl amino group, a dodecyl amino group, a cyclopentyl amino group, a dicyclopentyl amino group, a cyclohexyl amino group, a dicyclohexyl amino group, a ditrifluoromethyl amino group, a phenyl amino group, a diphenyl amino group, a $C_1$~$C_{12}$ alkoxyphenyl amino group, a bis($C_1$~$C_{12}$ alkoxyphenyl)amino group, a $C_1$~$C_{12}$ alkylphenyl amino group, a bis($C_1$~$C_{12}$ alkylphenyl)amino group, a 1-naphthyl amino group, a 2-naphthyl amino group, a pentafluorophenyl amino group, a pyridyl amino group, a pyridazinyl amino group, a pyrimidinyl amino group, a pyrazinyl amino group, a triazinyl amino group, a phenyl-$C_1$~$C_{12}$ alkyl amino group, a $C_1$~$C_{12}$ alkoxyphenyl-$C_1$~$C_{12}$ alkyl amino group, a di($C_1$~$C_{12}$ alkoxyphenyl-$C_1$~$C_{12}$ alkyl) amino group, a $C_1$~$C_{12}$ alkylphenyl-$C$~$C_{12}$ alkyl amino group, a di($C_1$~$C_{12}$ alkylphenyl-$C_1$~$C_{12}$ alkyl)amino group, a 1-naphthyl-$C_1$~$C_{12}$ alkyl amino group, and a 2-naphthyl-$C_1$~$C_{12}$ alkyl amino group.

A silyl group may have a substituent, and is preferably an unsubstituted silyl group or a silyl group substituted by 1 to 3 substituents selected from an alkyl group, an aryl group, and a monovalent heterocyclic group (hereinafter, referred to as a "substituted silyl group"). The substituent may have a secondary substituent.

The number of carbon atoms of the substituted silyl group is preferably 1 to 60, more preferably 3 to 48, and still more preferably 3 to 40 without including the number of carbon atoms of the secondary substituent. Examples of the substituted silyl group that may have a secondary substituent include a trimethylsilyl group, a triethylsilyl group, a tripropylsilyl group, a tri-isopropylsilyl group, a dimethyl-isopropylsilyl group, a diethyl-isopropylsilyl group, a tert-butyldimethylsilyl group, a pentyldimethylsilyl group, a hexyldimethylsilyl group, a heptyldimethylsilyl group, an octyldimethylsilyl group, a 2-ethylhexyl-dimethylsilyl group, a nonyldimethylsilyl group, a decyldimethylsilyl group, a 3,7-dimethyloctyl-dimethylsilyl group, a dodecyldimethylsilyl group, a phenyl-$C_1$~$C_{12}$ alkylsilyl group, a $C_1$~$C_{12}$ alkoxyphenyl-$C_1$~$C_{12}$ alkylsilyl group, a $C_1$~$C_{12}$ alkylphenyl-$C_1$~$C_{12}$ alkylsilyl group, a 1-naphthyl-$C_1$~$C_{12}$ alkylsilyl group, a 2-naphthyl-$C_1$~$C_{12}$ alkylsilyl group, a phenyl-$C_1$~$C_{12}$ alkyldimethylsilyl group, a triphenylsilyl group, a tri-p-xylylsilyl group, a tribenzylsilyl group, a diphenylmethylsilyl group, a tert-butyldiphenylsilyl group, and a dimethylphenylsilyl group.

An acyl group may have a substituent, and is preferably an unsubstituted acyl group or an acyl group substituted by a halogen atom or the like. The number of carbon atoms of the acyl group is preferably 2 to 20, more preferably 2 to 18, and still more preferably 2 to 16. Examples of the acyl group include an acetyl group, a propionyl group, a butylyl group, an isobutylyl group, a pivaloyl group, a benzoyl group, a trifluoroacetyl group, and a pentafluorobenzoyl group.

An acyloxy group may have a substituent, and is preferably an unsubstituted acyloxy group or an acyloxy group substituted by a halogen atom or the like. The number of carbon atoms of the acyloxy group is preferably 2 to 20, more preferably 2 to 18, and still more preferably 2 to 16. Examples of the acyloxy group include an acetoxy group, a propionyloxy group, a butylyloxy group, an isobutylyloxy group, a pivaloyloxy group, a benzoyloxy group, a trifluoroacetyloxy group, and a pentafluorobenzoyloxy group.

An imine residue means a residue left after removing, from an imine compound having a structure represented by at least one of the formula: H—$CR^{X1}$=N—$R^{Y1}$ or the formula: H—N=$C(R^{y1})_2$, one of the hydrogen atoms in the formula. In the formulas, $R^{X1}$ represents a hydrogen atom, an alkyl group, an aryl group, an aryl alkenyl group, or an aryl alkynyl group, and $R^{Y1}$ represents a hydrogen atom, an alkyl group, an aryl group, an aryl alkenyl group, or an aryl alkynyl group. When two $R^{Y1}$ are present, they may be same or different, and two $R^{Y1}$ may be bound together and integrated to form a ring as a divalent group, for example, an alkylene group having 2 to 18 carbon atoms, such as an ethylene group, a trimethylene group, a tetramethylene group, a pentamethylene group, a hexamethylene group, or the like. Examples of the imine compound include compounds in which a hydrogen atom bound to aldimine, ketimine or a nitrogen atom in aldimine has been substituted by an alkyl group, an aryl group, an aryl alkenyl group, an aryl alkynyl group, or the like. The number of carbon atoms of the imine residue is preferably 2 to 20, more preferably 2 to 18, and still more preferably 2 to 16. Specific examples of the imine residue include groups represented by the following structural formula.

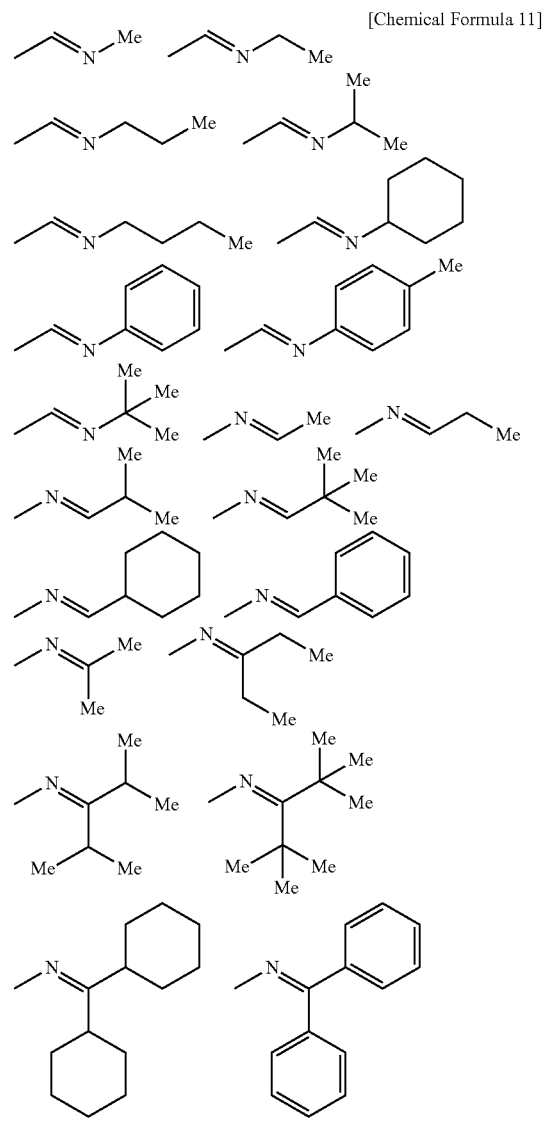

[Chemical Formula 11]

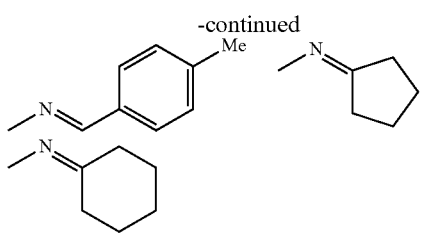

An amide compound residue means a residue left after removing, from an amide compound having a structure represented by at least one of the formula: H—NR$^{X2}$—COR$^{Y2}$ or the formula: H—CO—N(R$^{Y2}$)$_2$, a hydrogen atom in the formula. In the formulas, R$^{X2}$ and R$^{Y2}$ each independently represent a hydrogen atom, an alkyl group that may have a substituent, an aryl group that may have a substituent. The number of carbon atoms of the amide compound residue is preferably 2 to 20, more preferably 2 to 18, and still more preferably 2 to 16. Examples of the amide compound residue include a formamide group, an acetamide group, a propioamide group, a butyroamide group, a benzamide group, a trifluoroacetamide group, a pentafluorobenzamide group, a diformamide group, a diacetamide group, a dipropioamide group, a dibutyroamide group, a dibenzamide group, a ditrifluoroacetamide group, and a dipentafluorobenzamide group.

An acid imide residue means a residue left after removing, from an acid imide having a structure represented by the formula: R$^{X3}$—CO—NH—CO—R$^{Y3}$, a hydrogen atom in the formula. In the formula, R$^{X3}$ and R$^{Y3}$ each independently represent an alkyl group that may have a substituent, an aryl group that may have a substituent, or a ring structure which is formed by binding of R$^{X3}$ and R$^{Y3}$ to each other. The number of carbon atoms of the acid imide residue is preferably 4 to 20, more preferably 4 to 18, and still more preferably 4 to 16. Specific examples of the acid imide residue include the following groups.

[Chemical Formula 12]

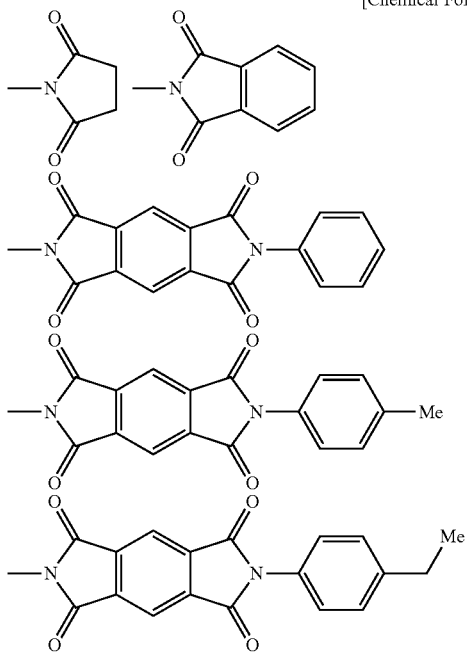

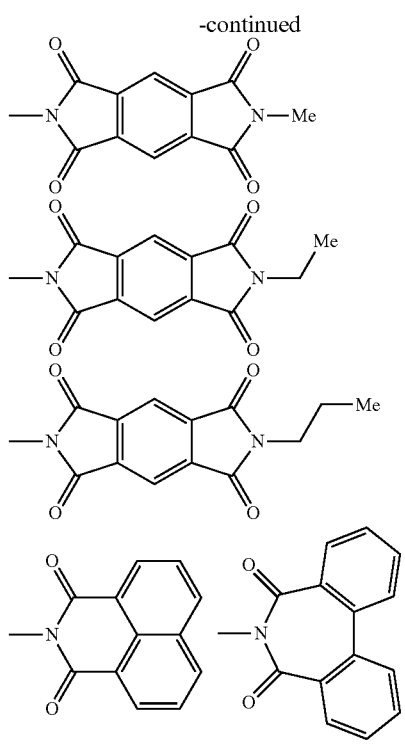

An arylene group means a group of atoms constituted by removing 2 hydrogen atoms bound to the aromatic ring-constituting carbon atoms from an aromatic hydrocarbon, and include those having an independent benzene ring or fused ring, and may have a substituent. Without including the number of carbon atoms of a substituent, the number of carbon atoms of the arylene group is preferably 6 to 60, more preferably 6 to 48, still more preferably 6 to 30, and particularly preferably 6 to 18. The number of carbon atoms does not include the number of carbon atoms of a substituent. Examples of the arylene group include phenylene groups, such as a 1,4-phenylene group, a 1,3-phenylene group, and a 1,2-phenylene group; naphthalenediyl groups, such as a 1,4-naphthalenediyl group, a 1,5-naphthalenediyl group, and a 2,6-naphthalenediyl group; anthracenediyl groups, such as a 1,4-anthracenediyl group, a 1,5-anthracenediyl group, a 2,6-anthracenediyl group, and a 9,10-anthracenediyl group; phenanthrenediyl groups, such as a 2,7-phenanthrenediyl group; naphthacenediyl groups, such as a 1,7-naphthacenediyl group, a 2,8-naphthacenediyl group, and a 5,12-naphthacenediyl group; fluorenediyl groups, such as a 2,7-fluorenediyl group, and a 3,6-fluorenediyl group; pyrenediyl groups, such as a 1,6-pyrenediyl group, a 1,8-pyrenediyl group, a 2,7-pyrenediyl group, and a 4,9-pyrenediyl group; perylenediyl groups, such as a 3,9-perylenediyl group, and a 3,10-perylenediyl group. Among them, preferable are a phenylene group that may have a substituent and a fluorenediyl group that may have a substituent.

A divalent heterocyclic group refers to a group of atoms left after removing two of hydrogen atoms which binds to the carbon atom or hetero atom constituting the heterocycle from a heterocyclic compound, and may have a substituent. As the divalent heterocyclic group, an unsubstituted divalent heterocyclic group or a divalent heterocyclic group substituted by an alkyl group or the like are preferable.

The number of carbon atoms of the divalent heterocyclic group is preferably 4 to 60, more preferably 4 to 30, and still more preferably 4 to 12 without including the number of carbon atoms of the substituent. Examples of the divalent heterocyclic group include pyridinediyl groups, such as a 2,5-pyridinediyl group, and a 2,6-pyridinediyl group; thiophenediyl groups, such as a 2,5-thiophenediyl group; furandiyl groups, such as a 2,5-furandiyl group; quinolinediyl groups, such as a 2,6-quinolinediyl group; isoquinolinediyl groups, such as a 1,4-isoquinolinediyl group, a 1,5-isoquinolinediyl group; quinoxalinediyl groups, such as a 5,8-quinoxalinediyl group; 2,1,3-benzothiadiazole groups, such as a 2,1,3-benzothiadiazole-4,7-diyl group; benzothiazolediyl groups, such as a 4,7-benzothiazolediyl group; carbazolediyl groups, such as a 2,7-carbazolediyl group, a 3,6-carbazolediyl group; phenoxazinediyl groups, such as a 3,7-phenoxazinediyl group; phenothiazinediyl groups, such as a 3,7-phenothiazinediyl group; dibenzosilolediyl groups, such as a 2,7-dibenzosilolediyl group. Among them, preferable are a 2,1,3-benzothiadiazole-4,7-diyl group that may have a substituent, a phenoxazinediyl group that may have a substituent, a phenothiazinediyl group that may have a substituent. Further, as the divalent heterocyclic group, a divalent group of an aromatic heterocycle is preferable.

Composition

The composition according to the present embodiment includes a light emitting material and a polymer compound. The composition contains the light emitting material preferably in an amount of 0.1 to 100 parts by mass relative to 1 part by mass of the polymer compound, contains the light emitting material preferably in an amount of 1 to 100 parts by mass relative to 1 part by mass of the polymer compound, contains the light emitting material preferably in an amount of 4 to 20 parts by mass relative to 1 part by mass of the polymer compound. As to the light emitting material and polymer compound, it will be explained herein below.

Polymer Compound

The polymer compound includes a constitutional sequence represented by the above formula (1) as a main chain. Further, the polymer compound which includes a constitutional sequence represented by the formula (1) as a main chain and has a chemical structure constituting the light emitting material described below is classified as the polymer compound unless it is a block type copolymer.

In the constitutional sequence represented by the formula (1), for a case in which n≥2 and plural Y's are a divalent group in which two hydrogen atoms are removed from a structure represented by the formula (Y-1), the plural structures represented by the formula (Y-1) may be the same as or different from each other, preferably the same.

In the constitutional sequence represented by the formula (1), for a case in which n≥2 and plural Y's are divalent groups in which two hydrogen atoms are removed from a structure represented by the formula (Y-1), the plural structures represented by the formula (Y-1) may consist of only a structure in which all X are —CH=, may consist of both a structure in which all X are —CH= and a structure in which one or two of X are —N= and remaining X are —CH=, or may consist of only a structure in which one or two of X are —N= and remaining X are —CH=, and preferably consists of only a structure in which all X are —CH=.

When the hydrogen atom contained in Y and Z is substituted by R', R' is preferably a functional group selected from a group consisting of an alkyl group, an alkoxy group, an aryl group, an amino group, and a monovalent heterocyclic group, or a halogen atom. More preferably, R' is a functional group selected from a group consisting of an alkyl group, an aryl group, and a monovalent heterocyclic group, or a halogen atom, still more preferably an alkyl group or an aryl group, particularly preferably an alkyl group. When there are plural R''s, they may be the same as or different from each other, and plural R''s may bind to each other to form a ring structure. When R' forms a ring structure, it is preferably a ring structure having no unsaturated bond. Examples of R' which can form such structure include an alkyl group, an alkoxy group, an alkylthio group, an amino group, and a silyl group.

In the constitutional sequence represented by the formula (1), for a case in which n≥2 and plural Y's are divalent groups in which two hydrogen atoms are removed from a structure represented by the formula (Y-2), the plural structures represented by the formula (Y-2) may be the same as or different from each other, preferably the same.

In the constitutional sequence represented by the formula (1), for a case in which n≥2 and plural Y's are divalent groups in which two hydrogen atoms are removed from a structure represented by the formula (Y-2), the plural structures represented by the formula (Y-2) may consist of only a structure in which all X are —CH=, may consist of both a structure in which all X are —CH= and a structure in which one or two of X are —N= and remaining X are —CH=, or may consist of only a structure in which one or two of X are —N= and remaining X are —CH=, preferably consists only of a structure in which all X are —CH=.

For a case in which the hydrogen atom contained in Y and Z is substituted by R', a preferred scope of R' is the same as those described above.

With regard to the constitutional sequence represented by the formula (1), each of the structure represented by [—$(Y)_n$—Z—], that is present in the number of m, may be the same as or different from each other. For example, for a case in which m=4, and n=1, 2, 1, 2 in an order starting from the left structure, the constitutional sequence is represented by [—$Y^{01}$—$Z^{01}$—]-[—$Y^{02}$—$Y^{03}$—$Z^{02}$—]-[—$Y^{04}$—$Z^{03}$—]-[—$Y^{05}$—$Y^{06}$—$Z^{04}$—]. In this regard, $Y^{01}$, $Y^{02}$, $Y^{03}$, $Y^{04}$, $Y^{05}$ and $Y^{06}$ may be the same as or different from each other and $Z^{01}$, $Z^{02}$, $Z^{03}$ and $Z^{04}$ may be the same as or different from each other. In addition, it is similar even when m and n have a combination of other integers.

In the constitutional sequence represented by the formula (1), $R^x$ included in the formulas (Z-1), (Z-2), (Z-3), (Z-4), (Z-5), (Z-6), (Z-7) and (Z-8), and the formula (Z-9), (Z-10), (Z-11), (Z-12), (Z-13), (Z-14), (Z-15), (Z-16), (Z-17), (Z-18), (Z-19) and (Z-20) that are described below is preferably an alkyl group, an alkoxy group, an aryl group, an aryloxy group, an arylthio group, or a monovalent heterocyclic group, more preferably an alkyl group or an aryl group, still more preferably an aryl group.

Further, with regard to the formula (Z-4), (Z-6), (Z-8), (Z-15) and (Z-16), it is preferable that one of the two $R^x$ is an alkyl group and the other is an aryl group.

Further, with regard to the formula (Z-5), (Z-17) and (Z-18), plural $R^x$'s preferably bind to each other to form a ring structure. The ring structure may be a ring with no unsaturated bond or a ring with unsaturated bond.

In the formula (1), m represents an integer of 4 to 10000. m is preferably an integer of 8 to 10000, more preferably an integer of 30 to 10000, still more preferably an integer of 50 to 5000. In the formula (1), plural n's are the same as or different from each other and represent an integer of 1 to 3, preferably represent the same integer. More preferably, plural n's are all 1 or all 2.

In the formula (1), plural Y's are the same as or different from each other, and preferably a divalent group represented by the formula (Y-3), (Y-4), (Y-5), or (Y-6).

In the formulas (Y-3), (Y-4), (Y-5) and (Y-6), R″ is preferably a hydrogen atom, an alkyl group, or an aryl group, more preferably a hydrogen atom or an alkyl group, particularly preferably a hydrogen atom.

Preferred examples of the structure of Y in the formula (1) include the following groups.

[Chemical Formula 13]

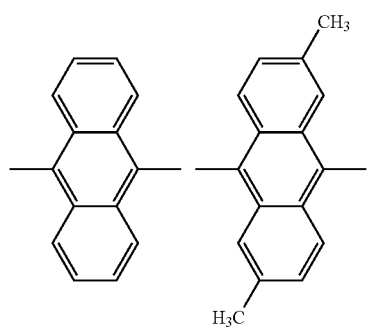

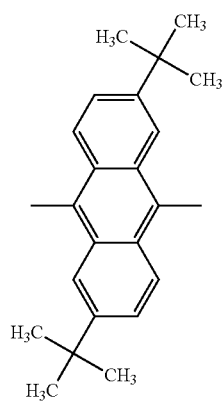

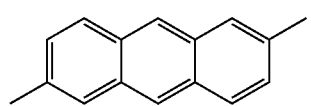

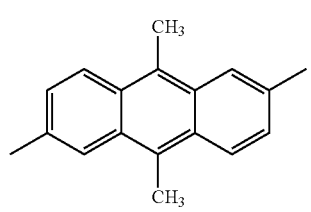

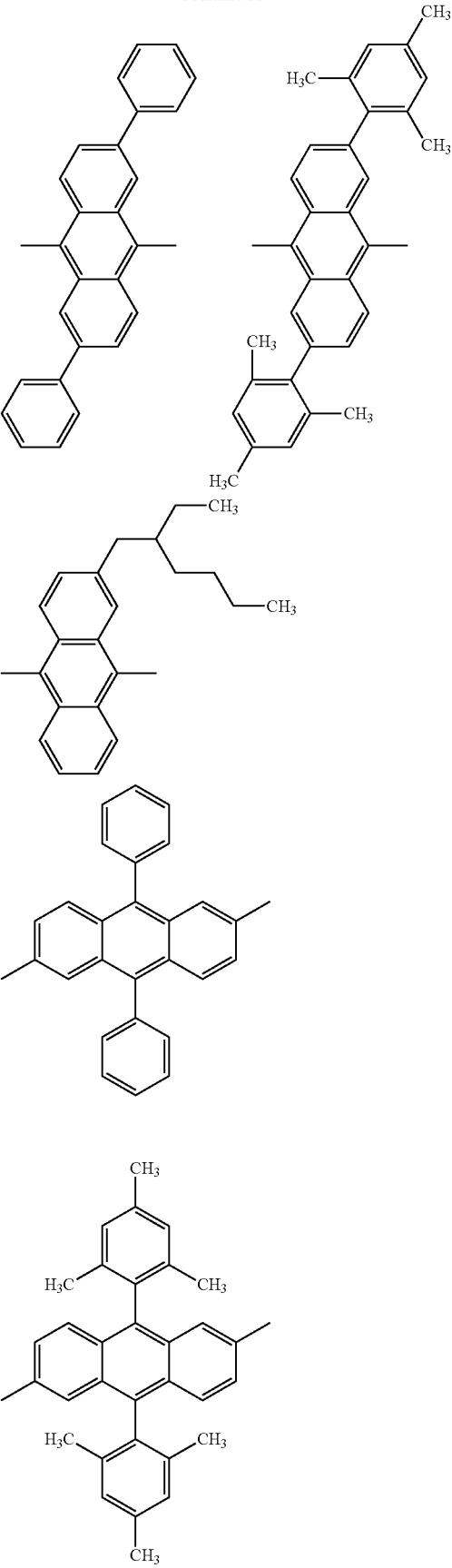

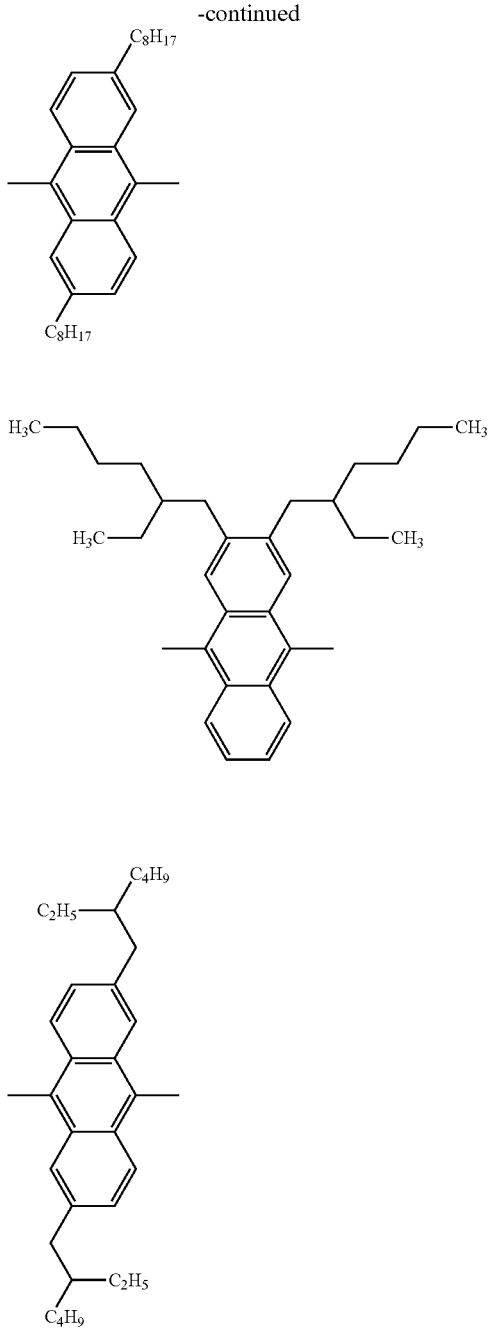
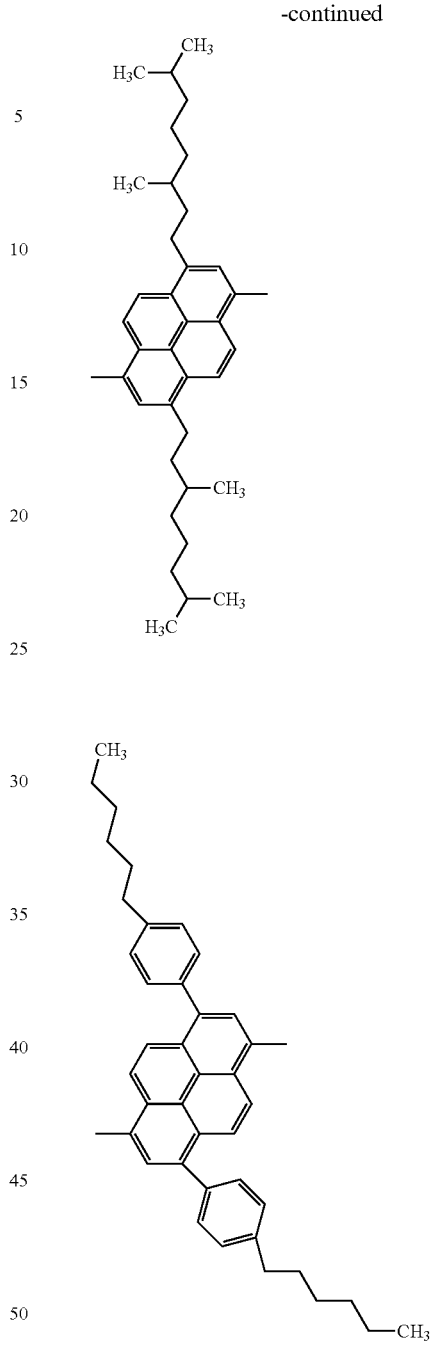
[Chemical Formula 14]
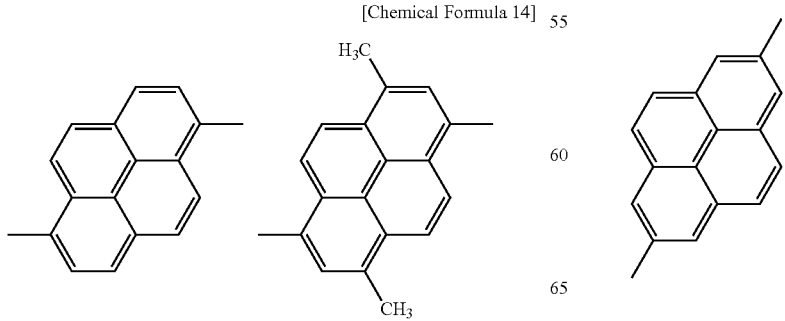

-continued

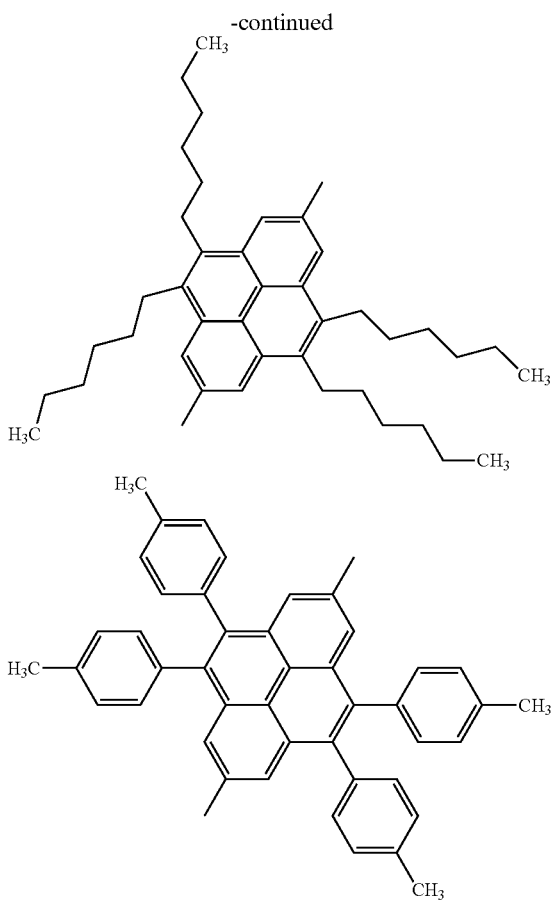

In the constitutional sequence represented by the formula (1), Z represents a divalent group in which two hydrogen atoms are removed from a structure represented by the formula (Z-1), (Z-2), (Z-3), (Z-4), (Z-5), (Z-6), (Z-7), or (Z-8). Plural Z's may consist of any one group of the divalent group in which two hydrogen atoms are removed from a structure represented by the formula (Z-1), (Z-2), (Z-3), (Z-4), (Z-5), (Z-6), (Z-7) and (Z-8) only, or may consist of the plural groups, preferably, and they may consist of only any one group only.

In the constitutional sequence represented by the formula (1), for a case in which two or more among plural Z's are any one of a divalent group in which two hydrogen atoms are removed from a structure represented by the formula (Z-1), (Z-2), (Z-3), (Z-4), (Z-5), (Z-6), (Z-7) and (Z-8), the structures represented by the formula (Z-1), (Z-2), (Z-3), (Z-4), (Z-5), (Z-6), (Z-7) and (Z-8) may be the same as or different from each other, preferably the same as. For a case in which plural among Z are any one of a divalent group in which two hydrogen atoms are removed from a structure represented by the formula (Z-1), (Z-2), (Z-3), (Z-4), (Z-5), (Z-6), (Z-7) and (Z-8), the plural structures represented by the formula (Z-1), (Z-2), (Z-3), (Z-4), (Z-5), (Z-6), (Z-7) and (Z-8) may consist of only a structure in which all X are —CH=, may consist of both a structure in which all X are —CH= and a structure in which one or two of X are —N= and remaining X are —CH=, or may consist of only a structure in which one or two of X are —N= and remaining X are —CH=, preferably consists only of a structure in which all X are —CH=.

Z in the formula (1) is preferably a divalent group represented by the formula (Z-9), (Z-10), (Z-11), (Z-12), (Z-13), (Z-14), (Z-15), (Z-16), (Z-17), (Z-18), (Z-19), or (Z-20). Plural Z's may be the same as or different from each other.

Of those, Z is preferably a divalent group represented by the formula (Z-9), (Z-11), (Z-13), (Z-15), (Z-16), (Z-17), or (Z-19), more preferably a divalent group represented by the formula (Z-9), (Z-11), (Z-15), (Z-16), (Z-17), or (Z-19), still more preferably a divalent group represented by the formula (Z-11), (Z-15), or (Z-17), particularly preferably a divalent group represented by the formula (Z-15).

Examples of the preferred structure of Z in the formula (1) include the following structures.

[Chemical Formula 15]

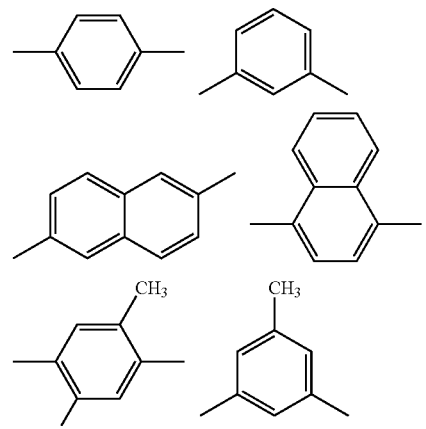

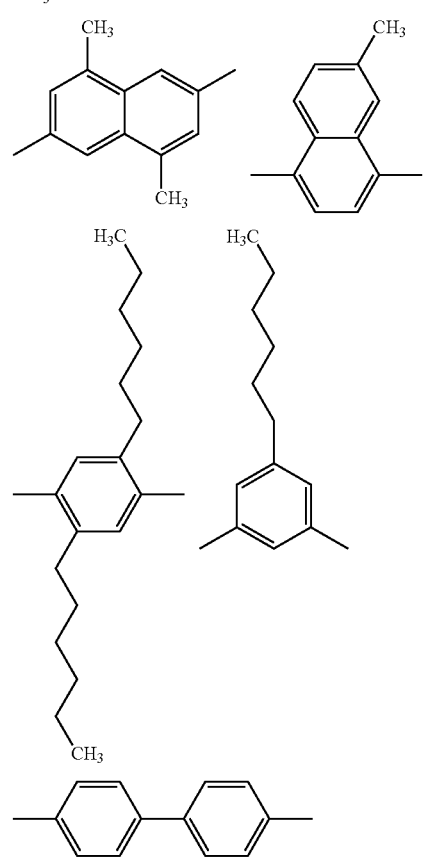

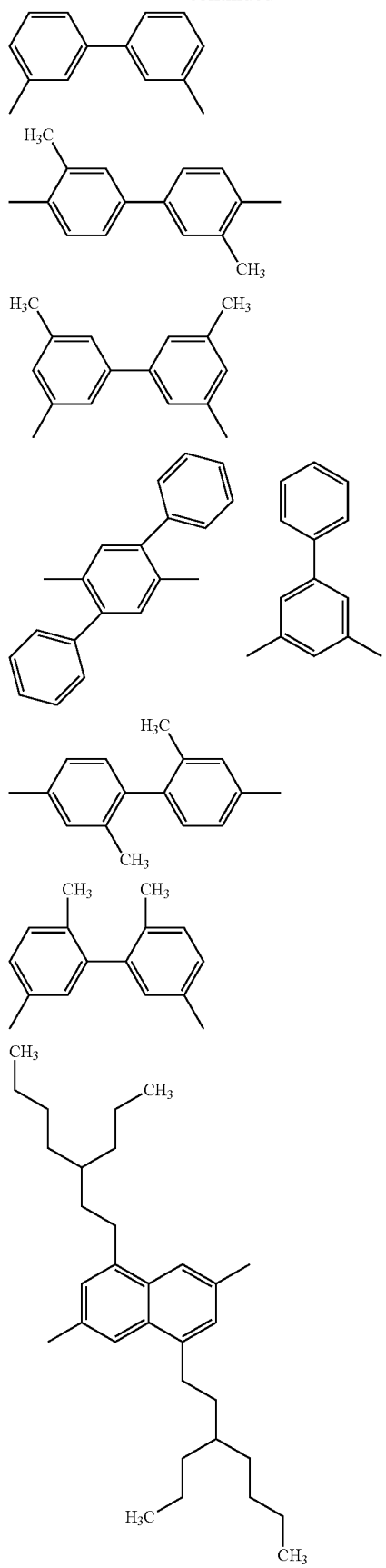
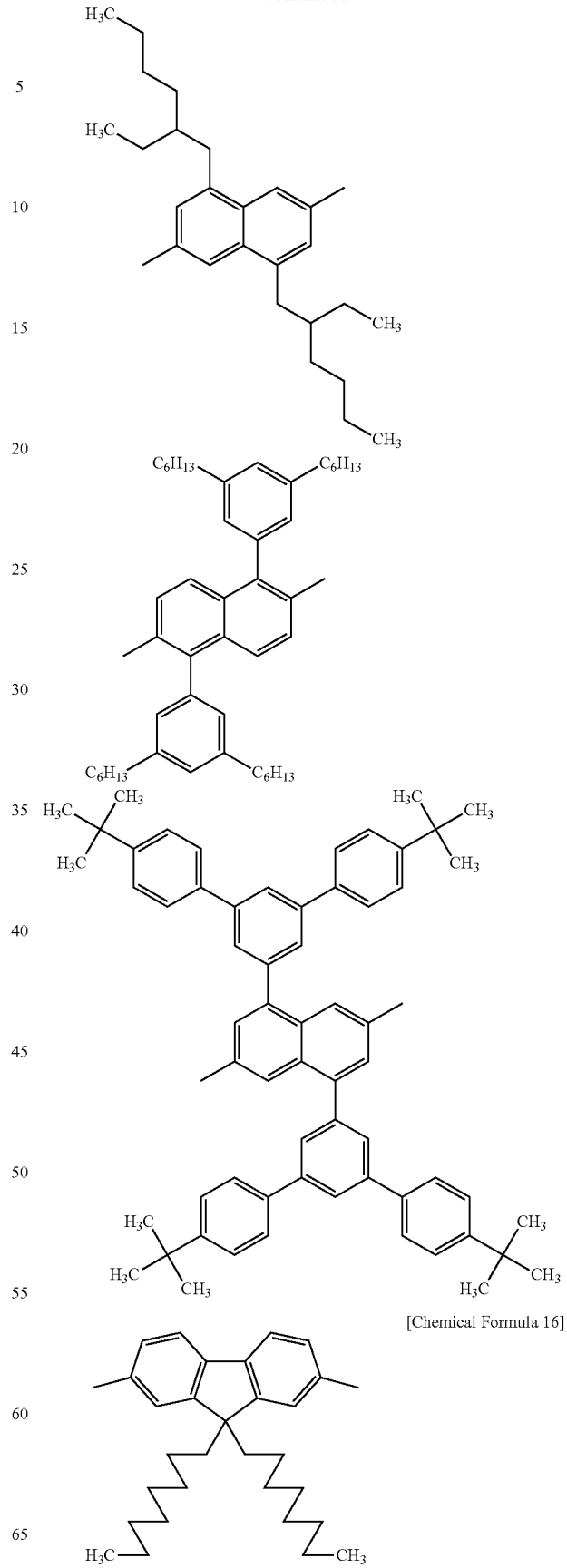

33
-continued
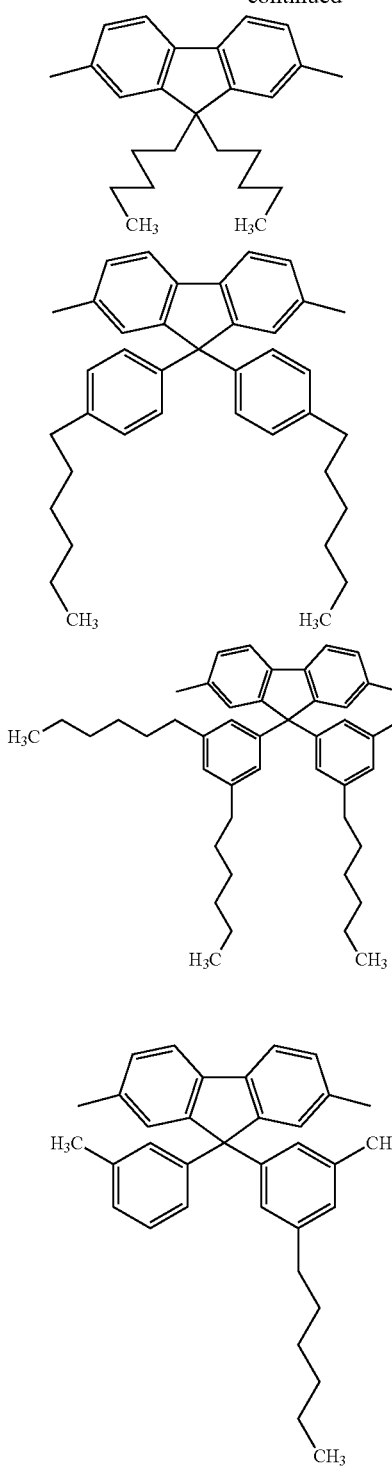
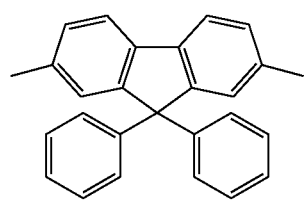
34
-continued
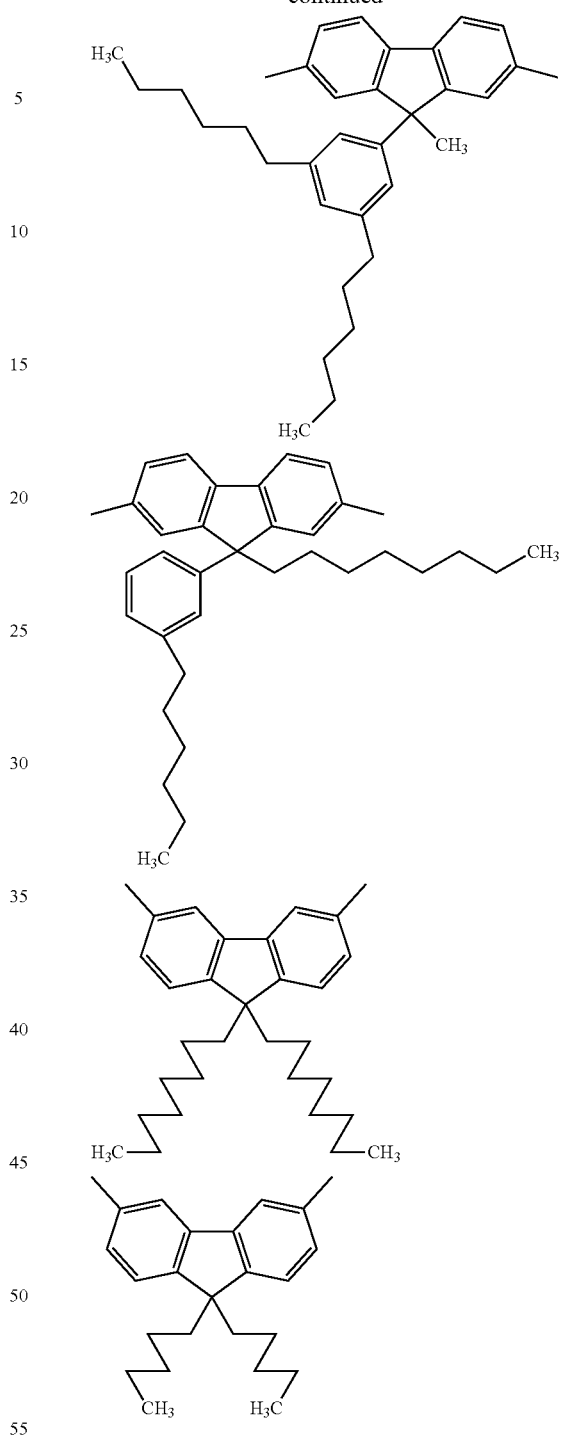
[Chemical Formula 17]
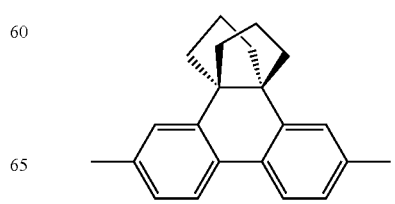

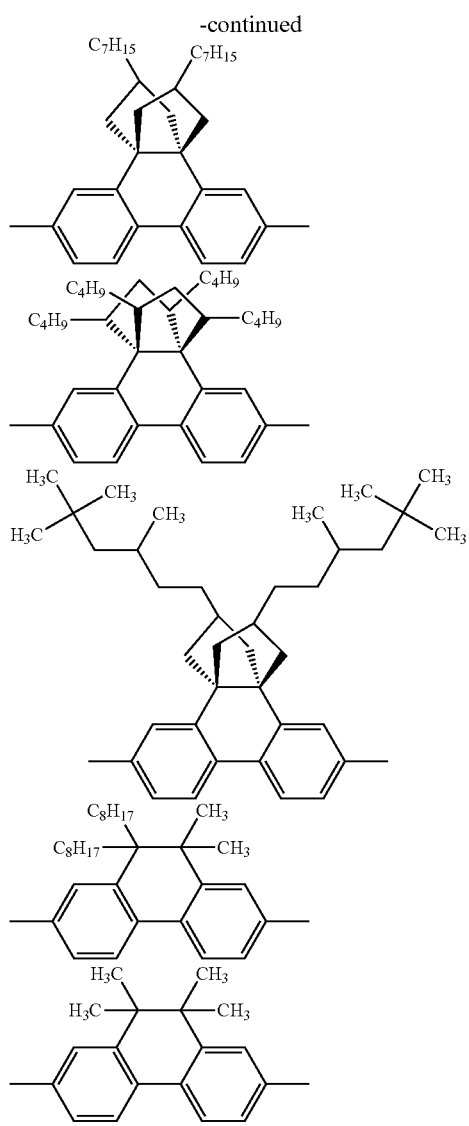

Examples of a combination of Y and Z in the formula (1) include a combination of a divalent group represented by the formula (Y-3) and a divalent group represented by the formula (Z-9) (hereinafter, simply referred to as "(Y-3) and (Z-9)"), (Y-3) and (Z-11), (Y-3) and (Z-13), (Y-3) and (Z-15), (Y-3) and (Z-16), (Y-3) and (Z-17), (Y-3) and (Z-19), (Y-4) and (Z-9), (Y-4) and (Z-11), (Y-4) and (Z-13), (Y-4) and (Z-15), (Y-4) and (Z-16), (Y-4) and (Z-17), (Y-4) and (Z-19), (Y-5) and (Z-9), (Y-5) and (Z-11), (Y-5) and (Z-13), (Y-5) and (Z-15), (Y-5) and (Z-16), (Y-5) and (Z-17), (Y-5) and (Z-19), (Y-6) and (Z-9), (Y-6) and (Z-11), (Y-6) and (Z-13), (Y-6) and (Z-15), (Y-6) and (Z-16), (Y-6) and (Z-17), or (Y-6) and (Z-19), it is preferably (Y-3) and (Z-9), (Y-3) and (Z-11), (Y-3) and (Z-13), (Y-3) and (Z-15), (Y-3) and (Z-16), (Y-3) and (Z-17), (Y-3) and (Z-19), (Y-4) and (Z-9), (Y-4) and (Z-11), (Y-4) and (Z-13), (Y-4) and (Z-15), (Y-4) and (Z-16), (Y-4) and (Z-17), (Y-4) and (Z-19), (Y-5) and (Z-9), (Y-5) and (Z-11), (Y-5) and (Z-13), (Y-5) and (Z-15), (Y-5) and (Z-16), (Y-5) and (Z-17), or (Y-5) and (Z-19), it is more preferably (Y-3) and (Z-9), (Y-3) and (Z-11), (Y-3) and (Z-15), (Y-3) and (Z-16), (Y-3) and (Z-17), (Y-3) and (Z-19), (Y-4) and (Z-9), (Y-4) and (Z-11), (Y-4) and (Z-15), (Y-4) and (Z-16), (Y-4) and (Z-17), (Y-4) and (Z-19), (Y-5) and (Z-9), (Y-5) and (Z-11), (Y-5) and (Z-15), (Y-5) and (Z-16), (Y-5) and (Z-17), or (Y-5) and (Z-19), it is still more preferably (Y-3) and (Z-11), (Y-3) and (Z-15), (Y-3) and (Z-16), (Y-3) and (Z-17), (Y-4) and (Z-11), (Y-4) and (Z-15), (Y-4) and (Z-16), (Y-4) and (Z-17), (Y-5) and (Z-11), (Y-5) and (Z-15), (Y-5) and (Z-16), or (Y-5) and (Z-17), and it is particularly preferably (Y-3) and (Z-11), (Y-3) and (Z-15), (Y-3) and (Z-17), (Y-4) and (Z-11), (Y-4) and (Z-15), (Y-4) and (Z-17), (Y-5) and (Z-11), (Y-5) and (Z-15), or (Y-5) and (Z-17).

Preferred Examples of the structure represented by [—(Y)$_n$—Z—] in the constitutional sequence represented by the formula (1) include the followings.

[Chemical Formula 18]

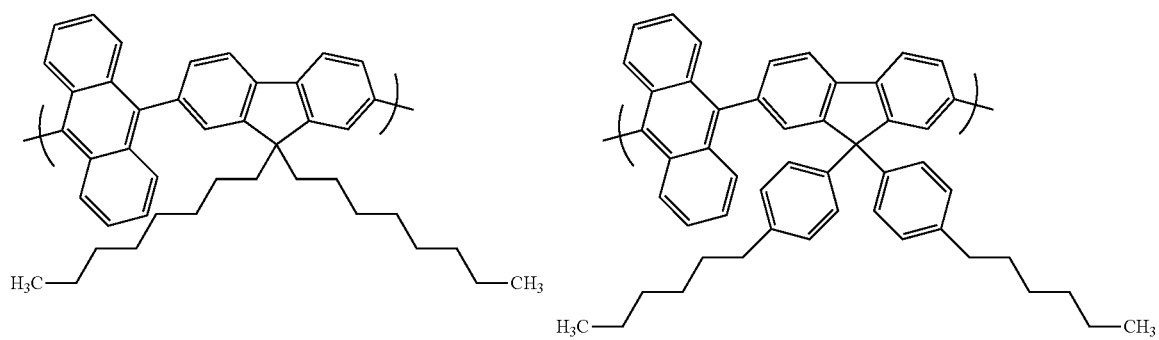

-continued
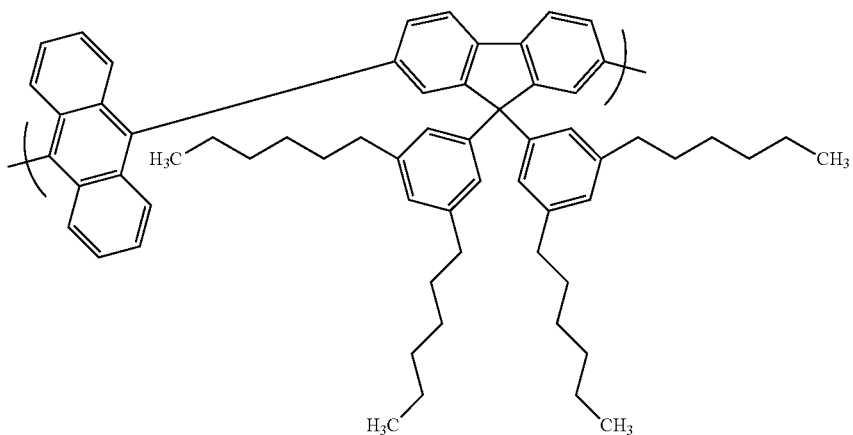
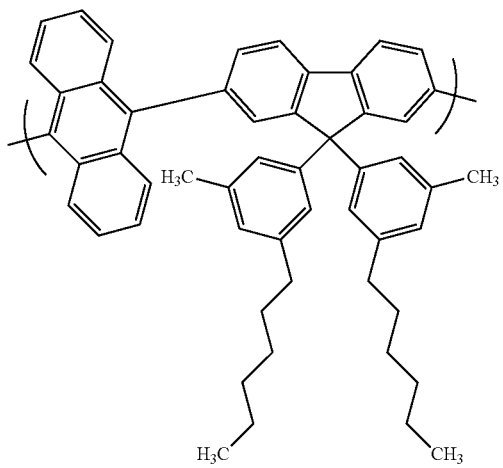
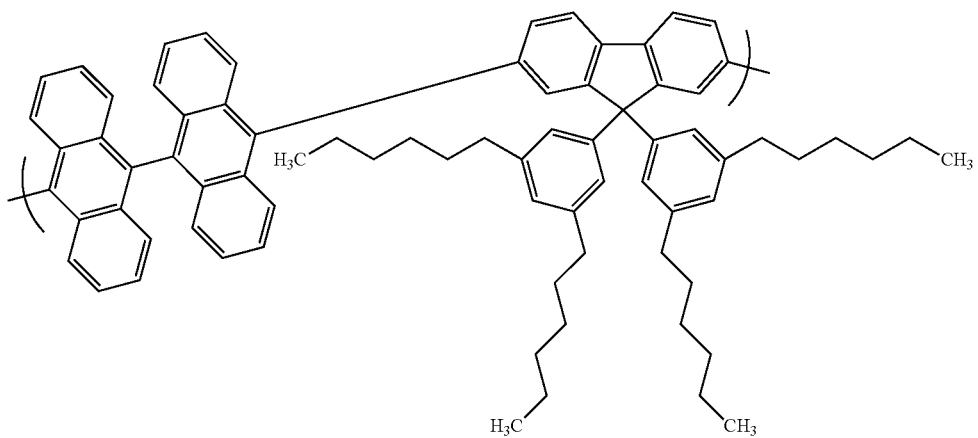
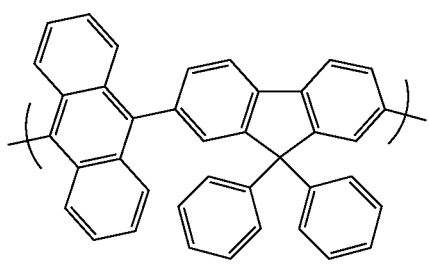

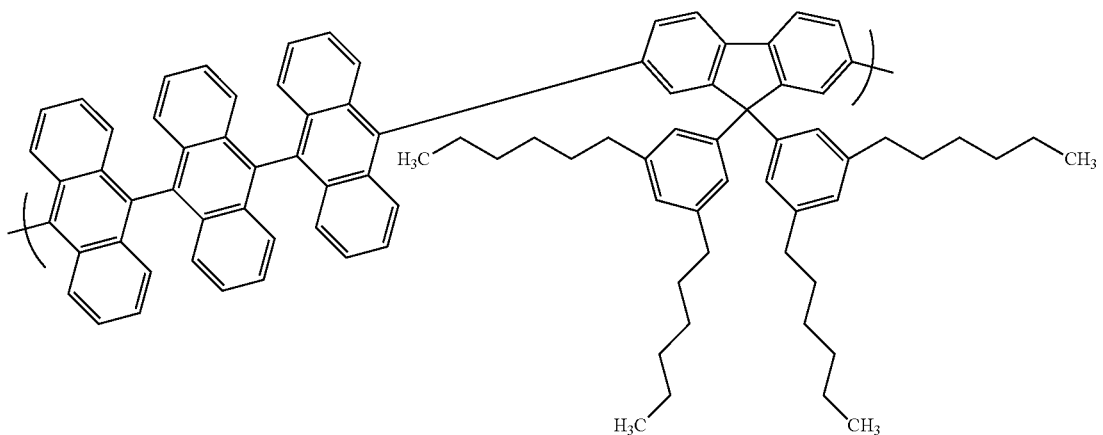
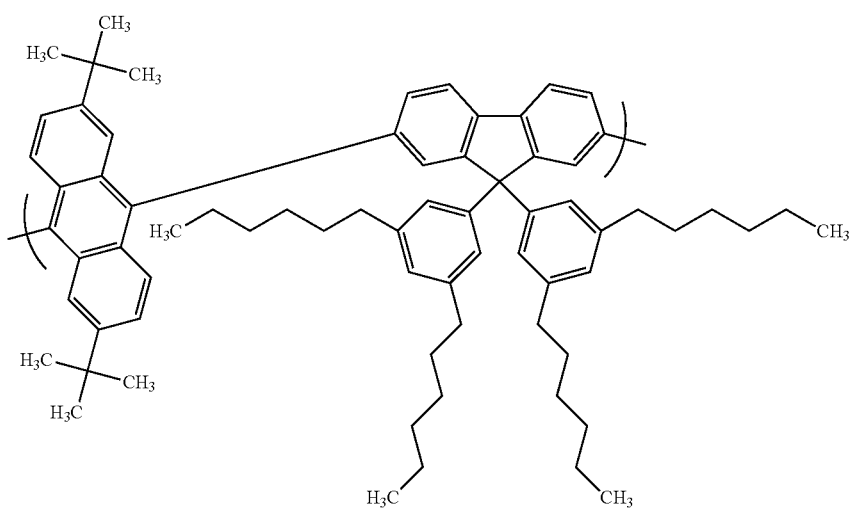
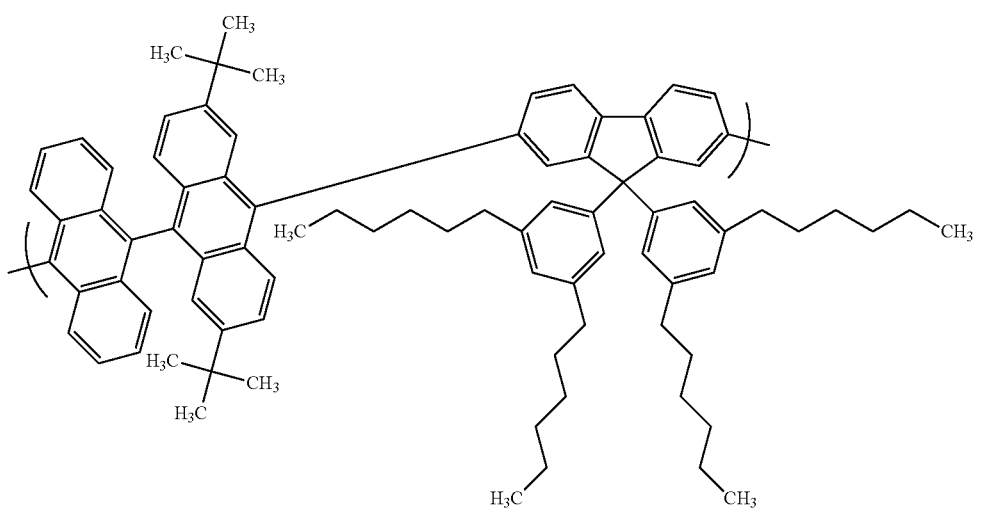

-continued
[Chemical Formula 19]
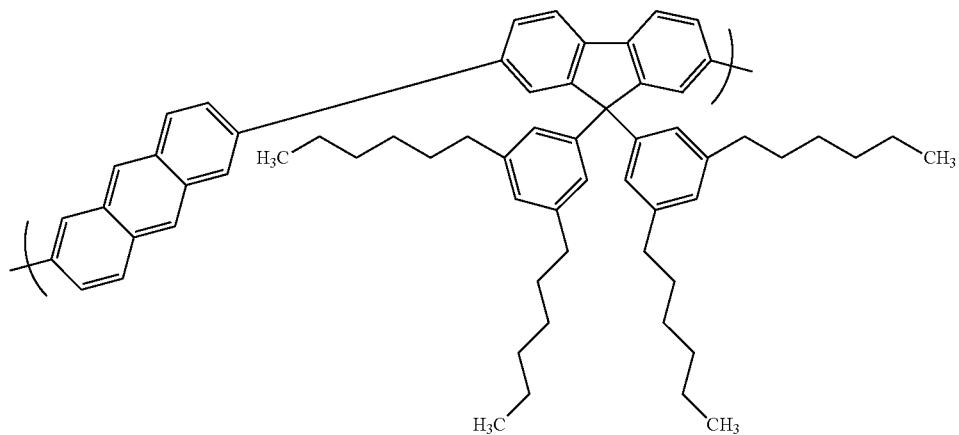
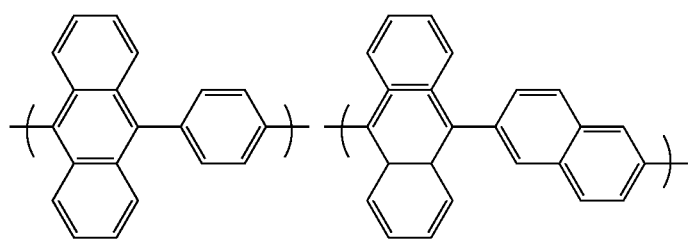
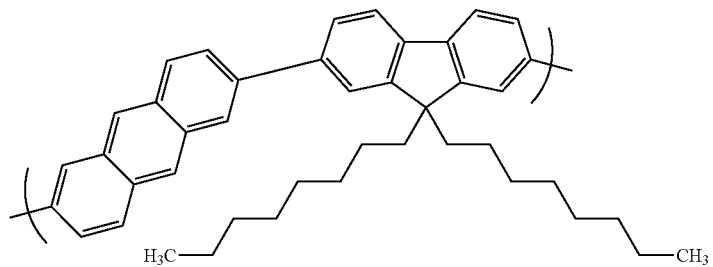
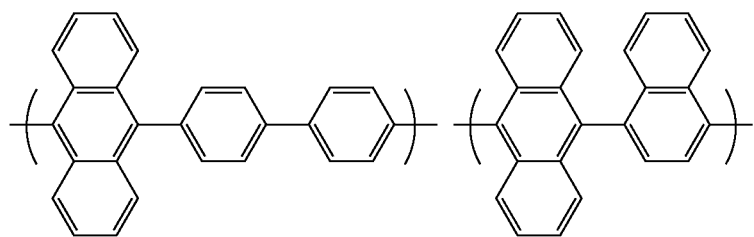
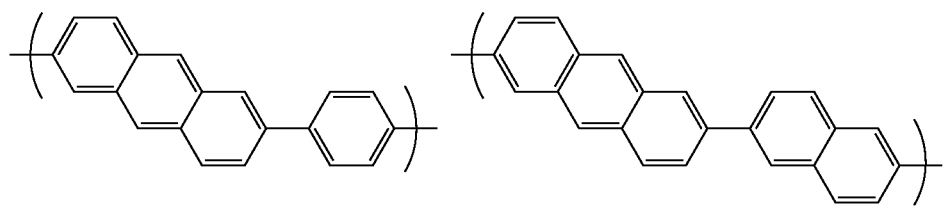
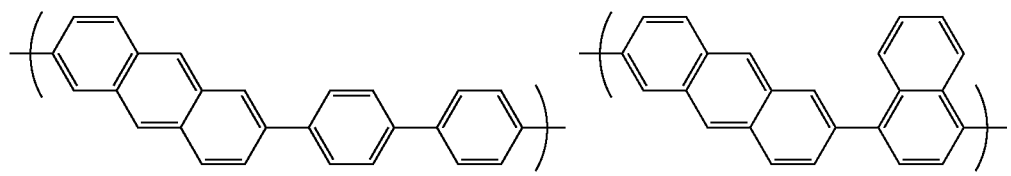

-continued
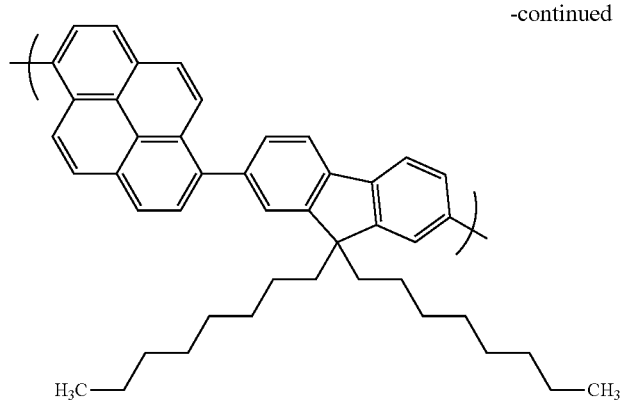
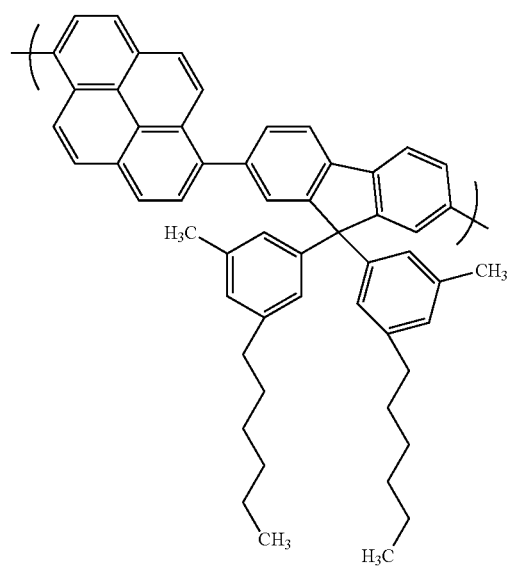
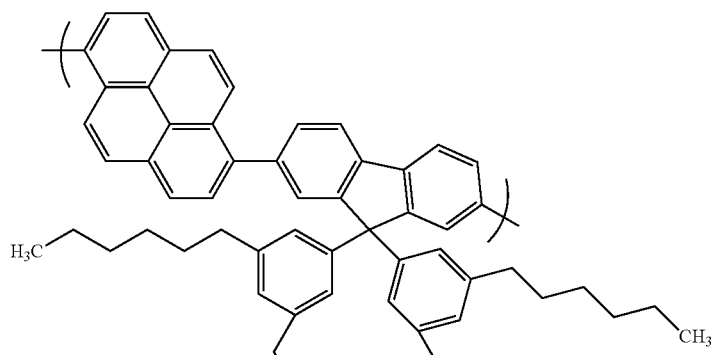
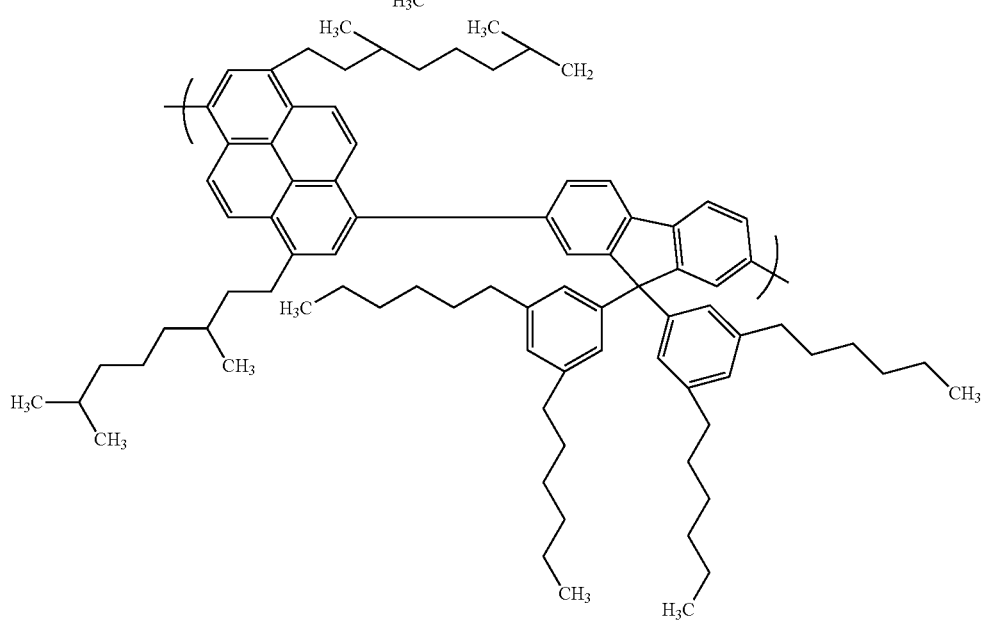

-continued
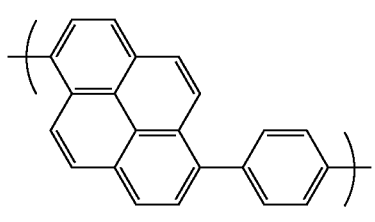
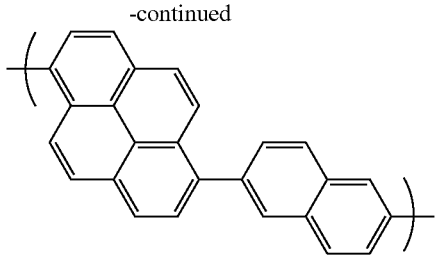
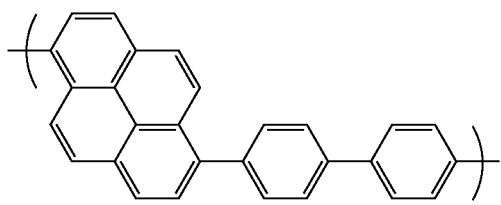
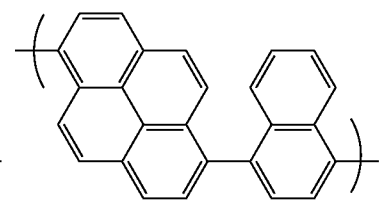
[Chemical Formula 20]
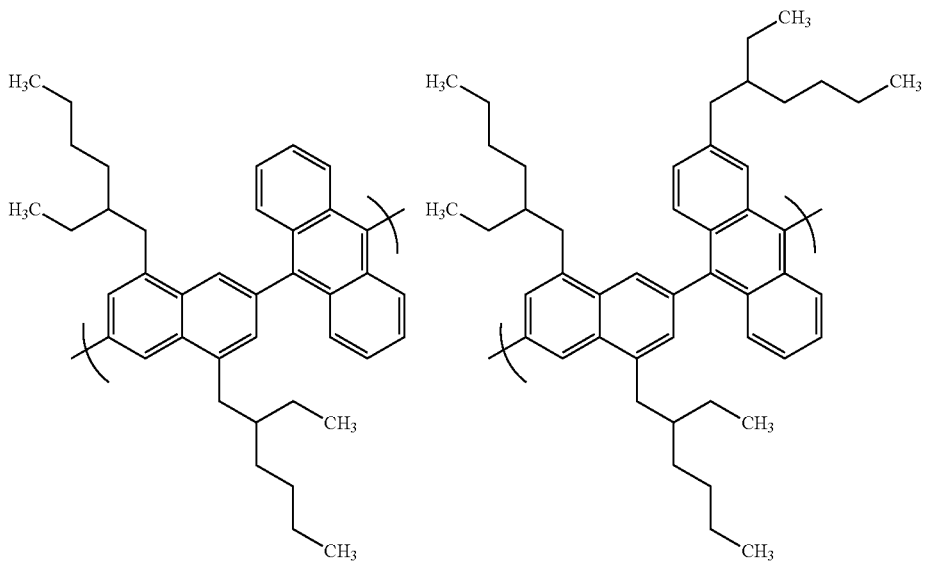
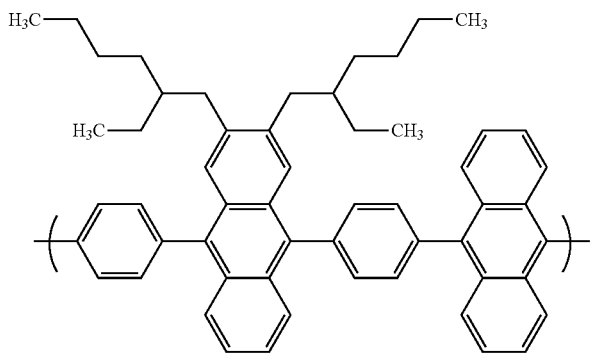
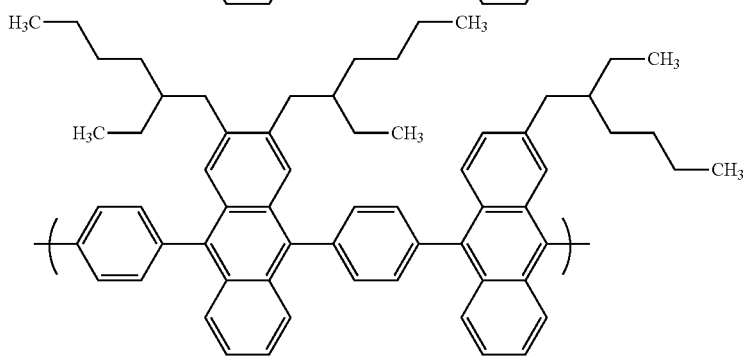

47 48
-continued
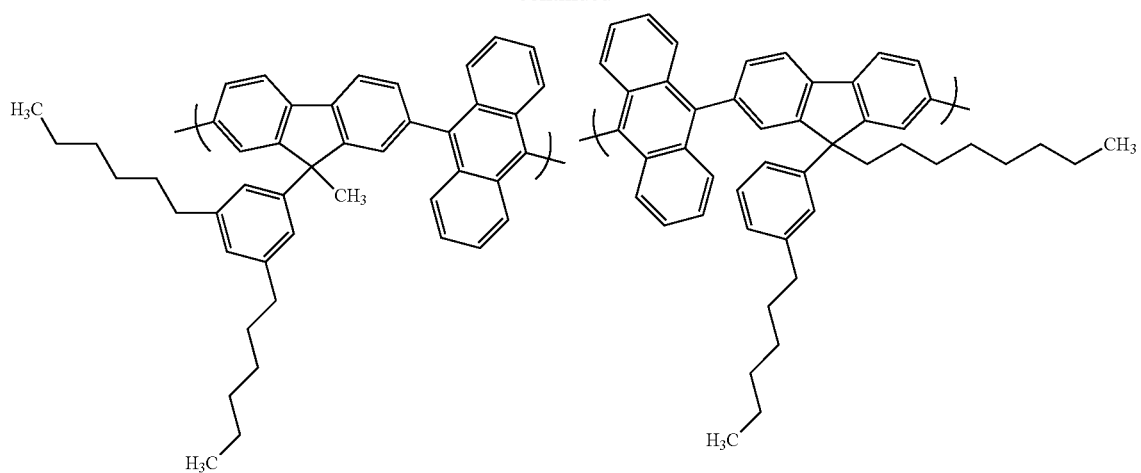
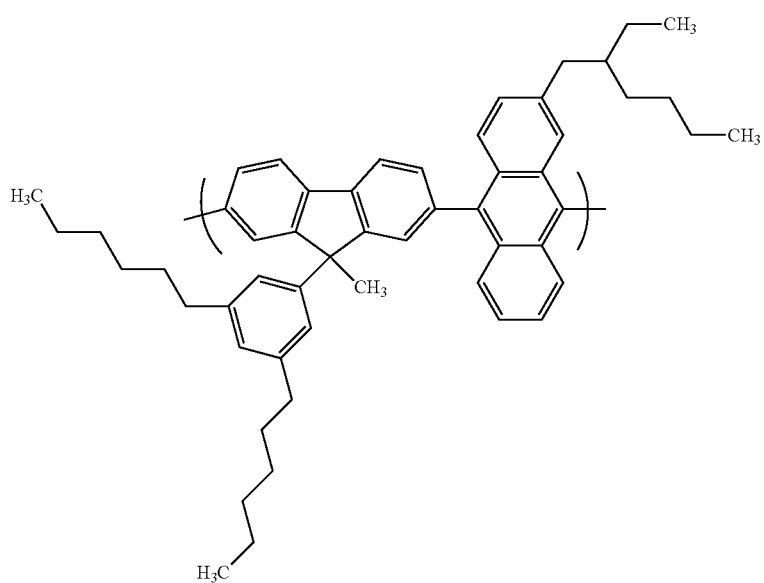
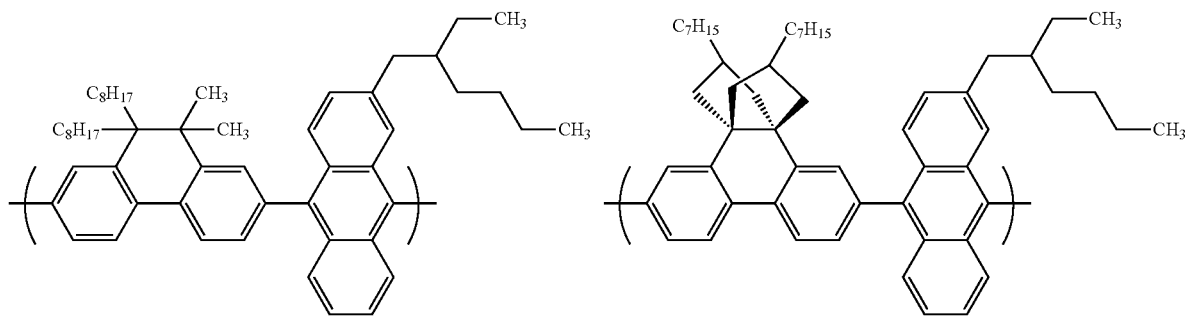

-continued
[Chemical Formula 21]
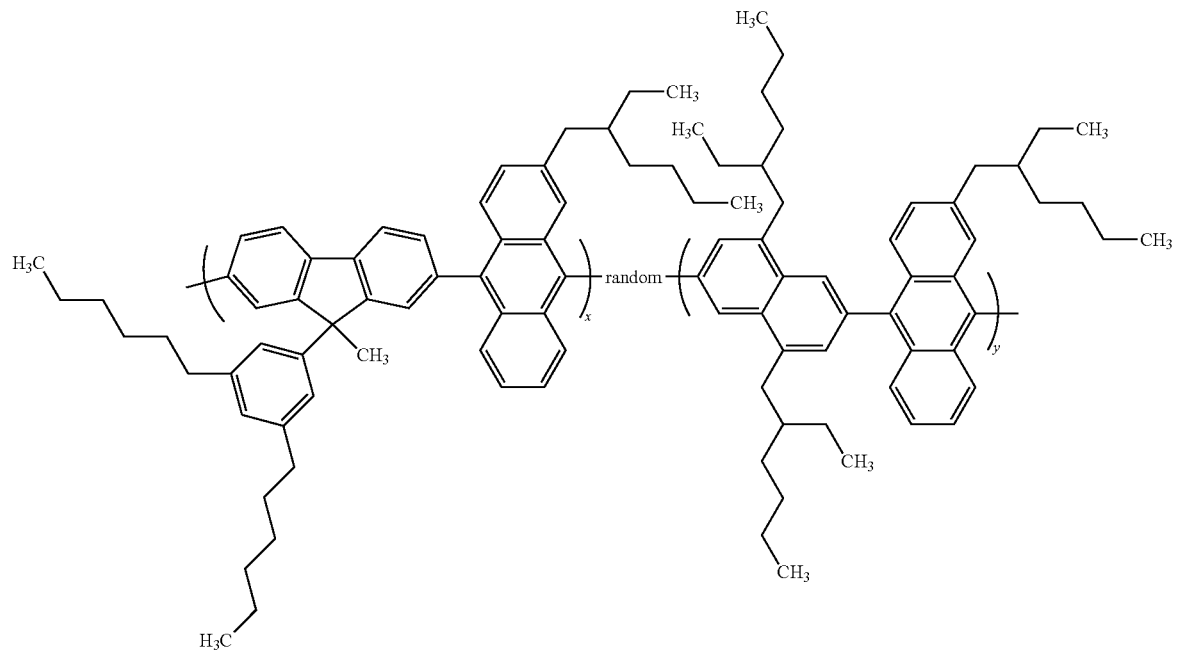
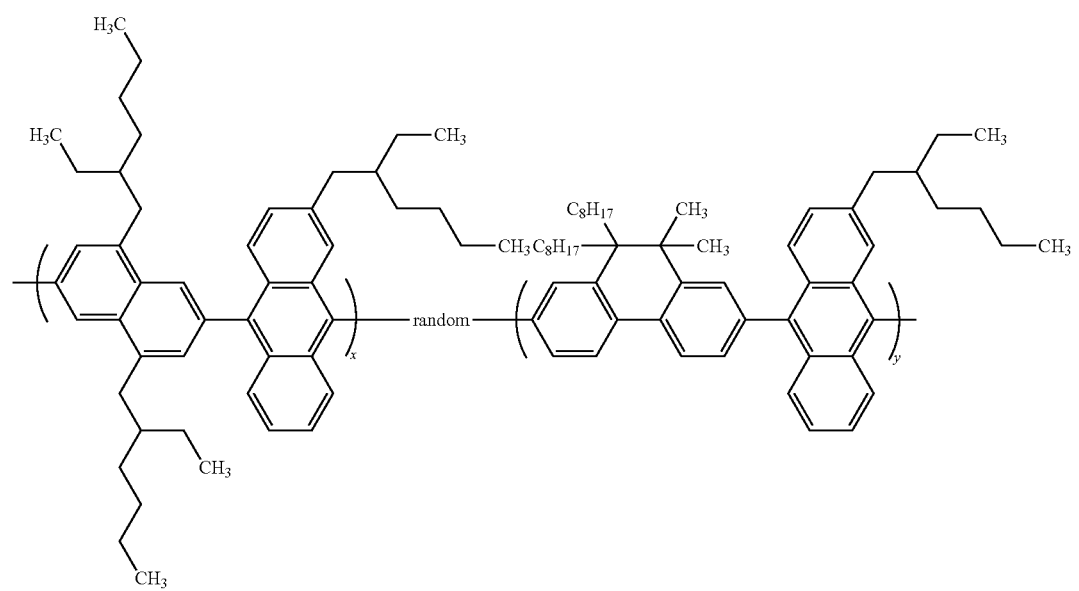

-continued

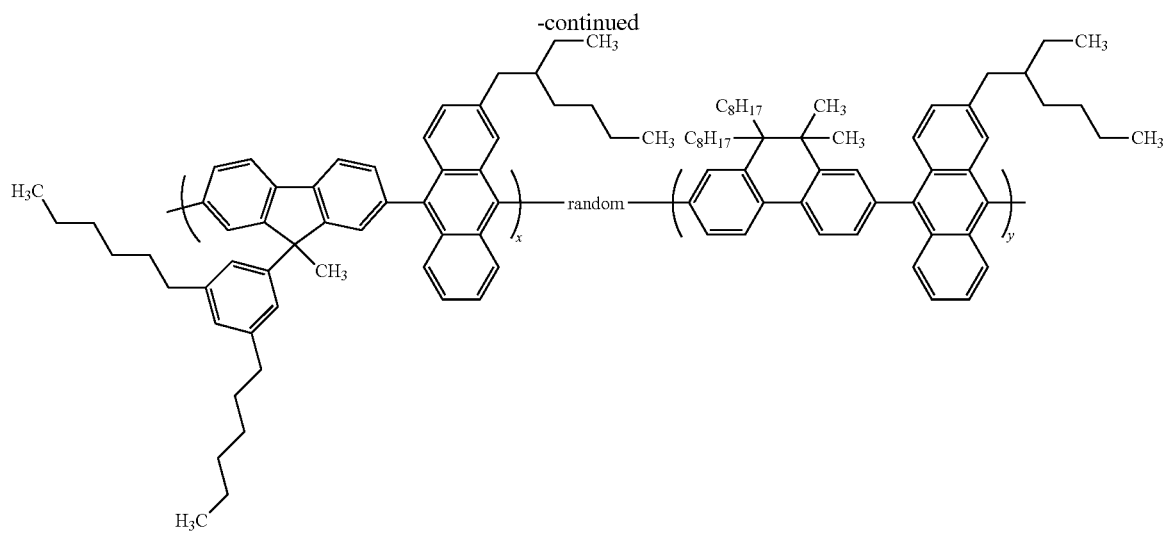

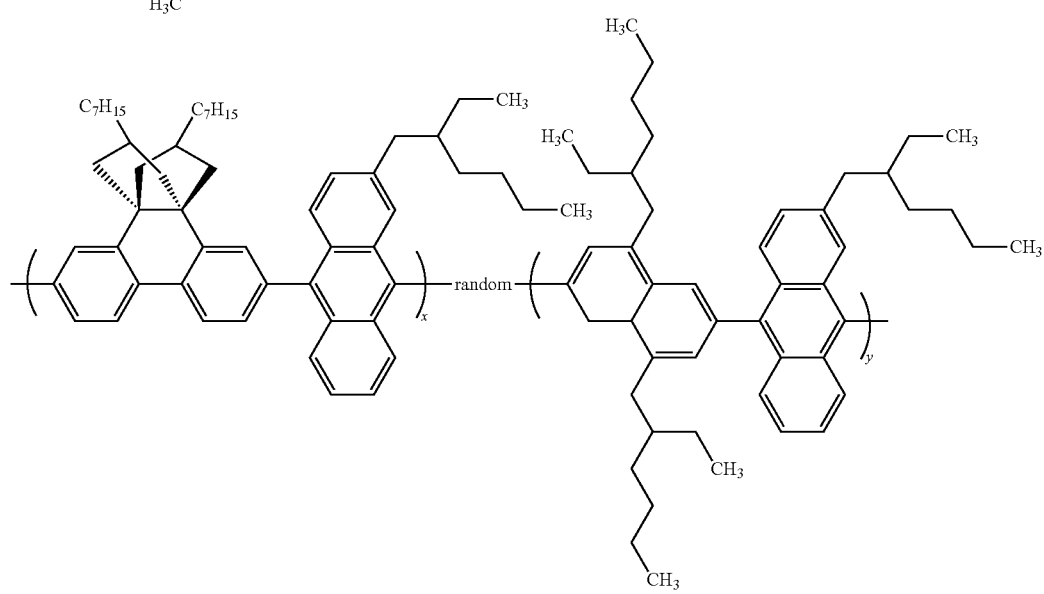

In the formulas, x and y represent copolymerization ratio, and are the numbers satisfying x+y=1.

The constitutional sequence represented by the formula (1) may be a structure in which total m of the structures represented by the above formula [—(Y)$_n$—Z—] are sequentially linked to each other with one kind or combined two or more kinds.

The polymer compound that has a constitutional sequence represented by the formula (1) as a main chain has a polystyrene-equivalent number average molecular weight of preferably $1 \times 10^3$ to $1 \times 10^7$, and more preferably $1 \times 10^4$ to $5 \times 10^6$. In addition, the polymer compound has a polystyrene-equivalent weight average molecular weight of preferably $1 \times 10^4$ to $5 \times 10^7$, and more preferably $5 \times 10^4$ to $1 \times 10^7$.

Resistance to charge transfer tends to decrease and the property of forming a film by coating tends to be improved when the number average molecular weight and the weight average molecular weight are higher than the lower limits described above, and the property of forming a film by coating tends to be improved when the number average molecular weight and the weight average molecular weight are lower than the upper limits described above.

Light Emitting Material

The light emitting material according to the present embodiment will be explained. As for the light emitting material according to the present embodiment, a common light emitting material may be used, for example. Preferably, fluorescent materials or triplet light emitting materials that are described in "Organic EL Display" (Shizuo Tokito, Chihaya Adachi, and Hideyuki Murata, The 1st Edition, 1st Issue issued on Aug. 20, 2004, Ohmsha Ltd.) pp. 17 to 48, 83 to 99, or 101 to 120 may be used as the light emitting material. Examples of the low molecular weight fluorescent material include perylene and a derivative thereof, pigments such as polymethine based, xanthene based, coumarin based and cyanine based, a metal complex of 8-hydroxyquinoline, a metal complex of a derivative of 8-hydroxyquinoline, aromatic amine, tetraphenylcyclopentadiene and a derivative thereof, and tetraphenyl butadiene and a derivative thereof. More specifically, those described in Japanese Patent Application Laid-Open Publication No. 57-51781 or Japanese Patent Application Laid-Open Publication No. 59-194393 can be used. Additional examples of the light emitting material include polyfluorene, a copolymer of fluorene derivatives, polyarylene, a copolymer of arylene derivatives, polyarylene vinylene, a copolymer of arylene vinylene derivatives, an aromatic amine, and a (co) polymer of derivatives thereof that are described in International Publication No. 99/13692 pamphlet, International Publication No. 99/48160 pamphlet, German Patent Application Laid-Open Publication No. 2340304, International Publication No. 00/53656 pamphlet, International Publication No. 01/19834 pamphlet, International Publication No. 00/55927 pamphlet, German Patent Application Laid-Open Publication No. 2348316, International Publication No. 00/46321 pamphlet, International Publication No. 00/06665 pamphlet, International Publication No. 99/54943 pamphlet, International Publication No. 99/54385 pamphlet, U.S. Pat. No. 5,777,070, International Publication No. 98/06773 pamphlet, International Publication No. 97/05184 pamphlet, International Publication No. 00/35987 pamphlet, International Publication No. 00/53655 pamphlet, International Publication No. 01/34722 pamphlet, International Publication No. 99/24526 pamphlet, International Publication No. 00/22027 pamphlet, International Publication No. 00/22026 pamphlet, International Publication No. 98/27136 pamphlet, U.S. Pat. No. 573,636, International Publication No. 98/21262 pamphlet, U.S. Pat. No. 5,741,921, International Publication No. 97/09394 pamphlet, International Publication No. 96/29356 pamphlet, International Publication No. 96/10617 pamphlet, European Patent Application Laid-Open Publication No. 0707020, International Publication No. 95/07955 pamphlet, Japanese Patent Application Laid-Open Publication No. 2001-181618, Japanese Patent Application Laid-Open Publication No. 2001-123156, Japanese Patent Application Laid-Open Publication No. 2001-3045, Japanese Patent Application Laid-Open Publication No. 2000-351967, Japanese Patent Application Laid-Open Publication No. 2000-303066, Japanese Patent Application Laid-Open Publication No. 2000-299189, Japanese Patent Application Laid-Open Publication No. 2000-252065, Japanese Patent Application Laid-Open Publication No. 2000-136379, Japanese Patent Application Laid-Open Publication No. 2000-104057, Japanese Patent Application Laid-Open Publication No. 2000-80167, Japanese Patent Application Laid-Open Publication No. 10-324870, Japanese Patent Application Laid-Open Publication No. 10-114891, Japanese Patent Application Laid-Open Publication No. 9-111233, or Japanese Patent Application Laid-Open Publication No. 9-45478.

Further, the polymer compound which is a light emitting material and includes a constitutional sequence represented by the formula (1) as a main chain is categorized into the polymer compound or the block polymer described below.

The light emitting material is preferably a polymeric light emitting material, and more preferably a polymeric light emitting material which is a copolymer. The polymeric light emitting material preferably has at least one constitutional unit represented by the formula (A), (B), or (C). Further, even with at least one constitutional unit represented by the formula (A), (B), or (C), the polymeric light emitting material that has a constitutional sequence represented by the following formula (1) as a main chain is categorized into the polymer compound or the block type polymer described below.

The polymeric light emitting material preferably has a constitutional unit represented by the formula (B) as it can have improved hole transport property.

Further, as having improved charge (which means a hole and an electron, and ditto for the followings) injection property and charge transport property and efficient formation of excitation energy resulting from binding between hole and electron, the polymeric light emitting material which has a constitutional unit represented by the formula (A) and a constitutional unit represented by the formula (B), the polymeric light emitting material which has a constitutional unit represented by the formula (B) and a constitutional unit represented by the formula (C), or the polymeric light emitting material which has a constitutional unit represented by the formula (A), a constitutional unit represented by the formula (B) and a constitutional unit represented by the formula (C) is preferable. The polymeric light emitting material which has a constitutional unit represented by the formula (A) and a constitutional unit represented by the formula (B) is more preferable.

When the polymeric light emitting material consists of a constitutional unit represented by the formula (B) and a constitutional unit represented by the formula (A) and/or a constitutional unit represented by the formula (C), the content ratio (molar ratio) between the constitutional unit represented by the formula (B) and other constitutional units is preferably 1:99 to 40:60, more preferably 3:97 to 30:70, and still more preferably 5:95 to 20:80.

The polymeric light emitting material has a polystyrene-equivalent number average molecular weight of preferably $1 \times 10^3$ to $1 \times 10^7$, more preferably $1 \times 10^4$ to $5 \times 10^6$. In addition, the polymeric light emitting material has a polystyrene-equivalent weight average molecular weight of preferably $1 \times 10^4$ to $5 \times 10^7$, more preferably $5 \times 10^4$ to $1 \times 10^7$. Resistance to charge transfer tends to decrease and the property of forming a film by coating tends to get easily improved when the number average molecular weight and the weight average molecular weight are higher than the lower limits described above, and the property of forming a film by coating tends to get improved when the number average molecular weight and the weight average molecular weight are lower than the upper limits described above.

$Ar^1$ in the formula (A) represents an arylene group, a divalent heterocyclic group, or a divalent group having a metal complex structure, and it may have a substituent. Herein, examples of the substituent include an alkyl group, an alkoxy group, an aryl group, an aryloxy group, an aryl alkoxy group, an aryl alkenyl group, an aryl alkynyl group, an amino group, a substituted amino group, a halogen atom, an acyl group, an acyloxy group, a monovalent heterocyclic group, a carboxyl group, a nitro group, and a cyano group. An alkyl group, an alkoxy group, an aryl group, an aryloxy group, a substituted amino group, or a monovalent heterocyclic group is preferable. An alkyl group, an alkoxy group, or an aryl group is more preferable.

In the formula (A), examples of the arylene group as $Ar^1$ are the same as the explanations and examples given in the "Explanation of terminology" described above, and a 1,4-phenylene group, a 2,7-biphenylylene group, a 1,4-naphthalenediyl group, a 1,5-naphthalenediyl group, a 2,6-naphthalenediyl group or a 2,7-fluorenediyl group is preferable, and a 1,4-phenylene group, a 1,4-naphthalenediyl group, a 1,5-naphthalenediyl group, a 2,6-naphthalenediyl group or a 2,7-fluorenediyl group is more preferable, a 1,4-phenylene group, a 2,6-naphthalenediyl group, a 2,7-biphenylylene group or a 2,7-fluorenediyl group is still more preferable, and a 2,7-fluorenediyl group is particularly preferable.

In the formula (A), examples of the divalent heterocyclic group as $Ar^1$ are the same as the explanations, examples, and preferable examples given in the "Explanation of terminology" described above.

In the formula (A), examples of the divalent group having a metal complex structure which may have a substituent as represented by $Ar^1$ include a group of atoms in which two hydrogen atoms are removed from an iridium complex or a platinum complex (i.e., a residue of an iridium complex or a platinum complex), and a group represented by the following formulas M-1, M-2, M-3, M-4, M-5, M-6, or M-7 is preferable. In the formulas, R represents an alkyl group, an alkoxy group, an aryl group, an aryloxy group, an aryl alkyl group, an aryl alkoxy group, an aryl alkenyl group, an aryl alkynyl group, an amino group, a substituted amino group, a halogen atom, an acyl group, an acyloxy group, a monovalent heterocyclic group, a carboxyl group, a nitro group, or a cyano group. Plural R's may be the same as or different from each other.

[Chemical Formula 22]

M-1

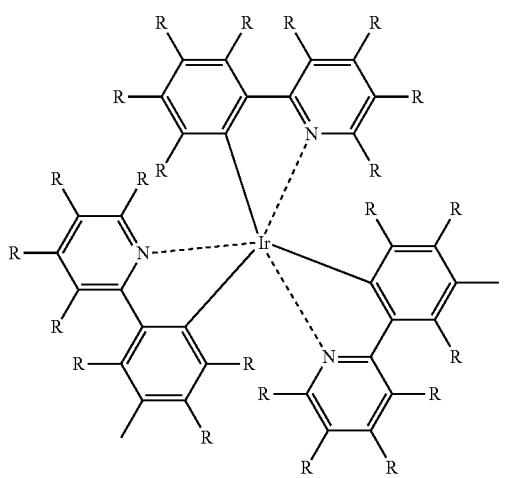

M-2

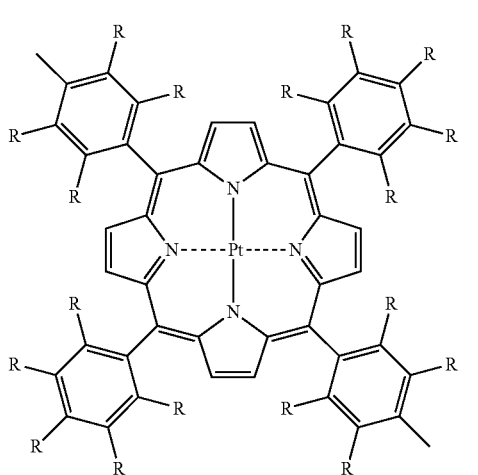

M-3

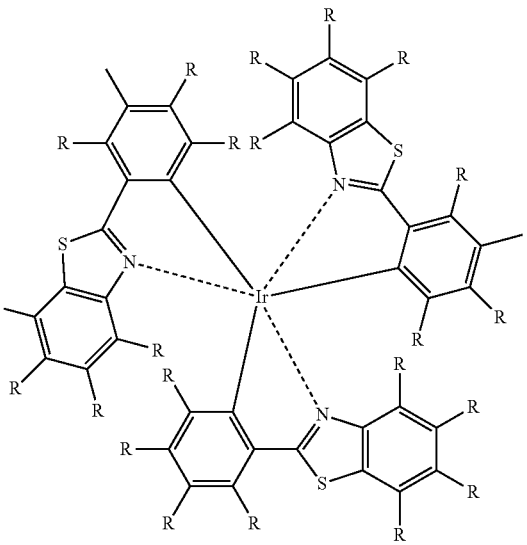

M-4

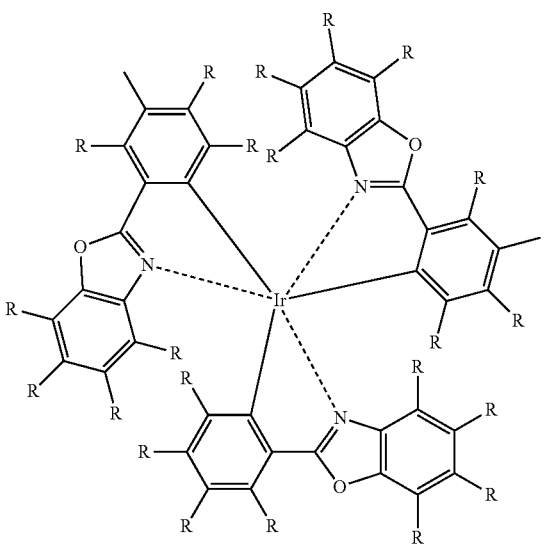

[Chemical Formula 23]

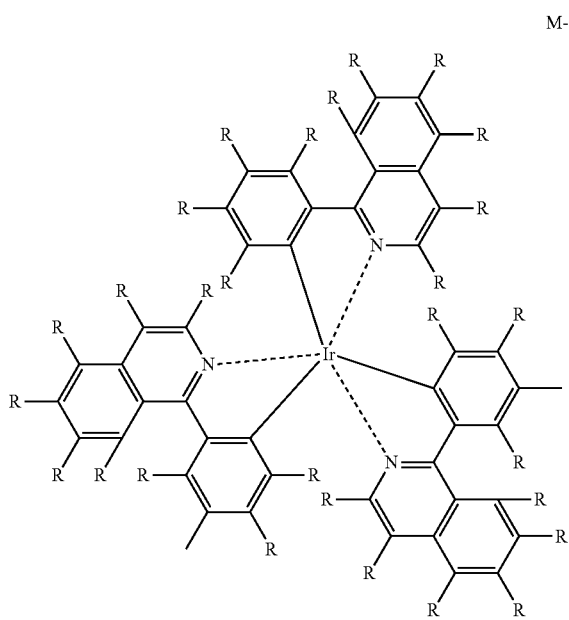

M-5

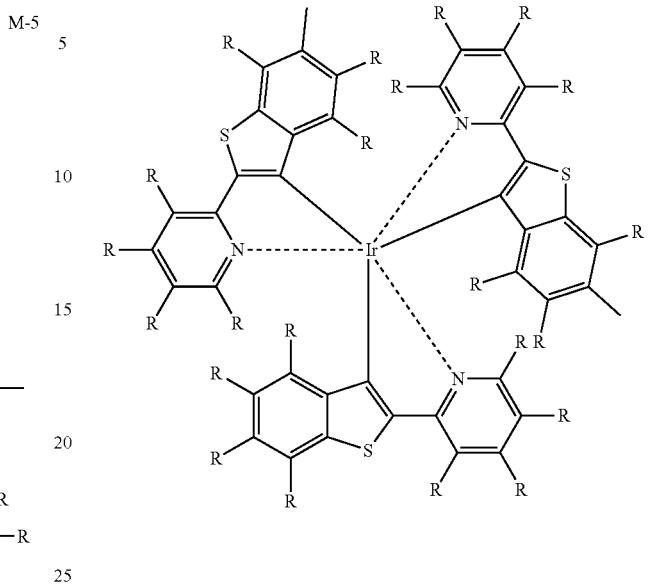

M-7

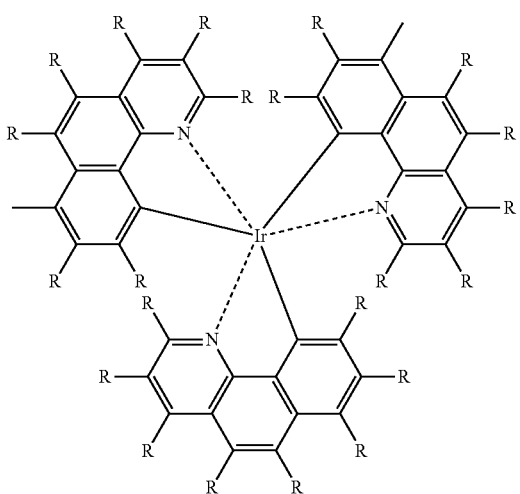

M-6

When two or more are contained as constitutional unit represented by the formula (A), a group selected from a group consisting of a constitutional unit consisting of a fluorenediyl group which may have a substituent, a constitutional unit consisting of a phenylene group which may have a substituent, a naphthalenediyl group which may have a substituent, and a 2,7-biphenylylene group which may have a substituent is preferable.

As for the constitutional unit represented by the formula (A), a constitutional unit represented by the following formula (A-1), (A-2), (A-3), (A-4), or (A-5) is preferable. A constitutional unit represented by the following formula (A-2), (A-4), or (A-5) is more preferable.

[Chemical Formula 24]

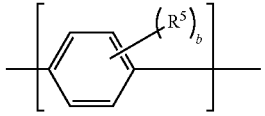

(A-1)

In the formula, $R^5$ represents an alkyl group, an alkoxy group, an aryl group, an aryloxy group, an aryl alkoxy group, an aryl alkenyl group, an aryl alkynyl group, an amino group, a substituted amino group, a halogen atom, an acyl group, an acyloxy group, a monovalent heterocyclic group, a carboxyl group, a nitro group, a cyano group, or a halogen atom, and b represents an integer of 0 to 4. The aforementioned group may have a substituent. When b is 2 or more, Plural $R_5$'s may be the same as or different from each other, and plural $R^{4'}$s may bind to each other to form a ring structure.

[Chemical Formula 25]

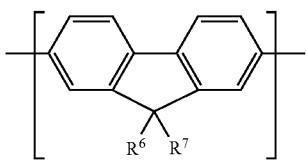

(A-2)

In the formula, $R^6$ and $R^7$ each independently represent a hydrogen atom, an alkyl group, an aryl group or a monovalent heterocyclic group, and those groups may have a substituent. $R^6$ and $R^7$ may bind to each other to form a ring structure.

$R^6$ and $R^7$ are preferably an alkyl group, an aryl group or a monovalent heterocyclic group, and more preferably an alkyl group or an aryl group.

[Chemical Formula 26]

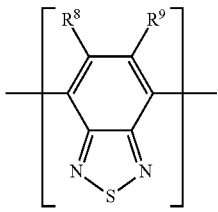

(A-3)

In the formula, $R^8$ and $R^9$ each independently represent an alkyl group, an alkoxy group, an aryl group, an aryloxy group, an aryl alkenyl group, an aryl alkynyl group, an acyl group, an acyloxy group, a monovalent heterocyclic group, a carboxyl group, a nitro group, a cyano group, an amino group, a substituted amino group, a hydrogen atom or a halogen atom, and those groups may have a substituent. $R^8$ and $R^9$ may bind to each other to form a ring structure.

$R^8$ and $R^9$ preferably are a hydrogen atom, an alkyl group, an alkoxy group, an aryl group, an aryloxy group, a substituted amino group, an acyl group or a monovalent heterocyclic group, more preferably a hydrogen atom, an alkyl group, an alkoxy group, an aryl group, an aryloxy group or a monovalent heterocyclic group, still more preferably a hydrogen atom or an alkyl group, and particularly preferably a hydrogen atom.

[Chemical Formula 27]

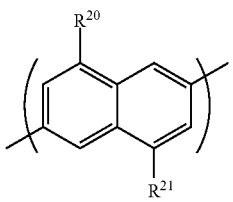

(A-4)

In the formula, $R^{20}$ and $R^{21}$ each represent a hydrogen atom, an alkyl group, an aryl group, or a monovalent heterocyclic group. Those groups may have a substituent. $R^{20}$ and $R^{21}$ are preferably a hydrogen atom, an alkyl group or an aryl group, and more preferably an alkyl group or an aryl group.

[Chemical Formula 28]

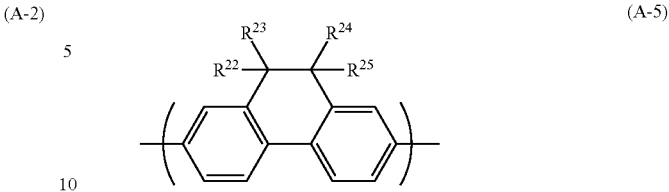

(A-5)

In the formula, $R^{22}$, $R^{23}$, $R^{24}$ and $R^{25}$ each independently represent a hydrogen atom, an alkyl group, an aryl group or a monovalent heterocyclic group. Those groups may have a substituent. $R^{22}$, $R^{23}$, $R^{24}$ and $R^{25}$ may bind to each other to form a ring structure.

$R^{22}$, $R^{23}$, $R^{24}$ and $R^{25}$ are preferably a hydrogen atom, an alkyl group or an aryl group, and more preferably an alkyl group or an aryl group.

In the formula (B), $Ar^2$, $Ar^3$ and $Ar^4$ each independently represent an arylene group or a divalent heterocyclic group, and they may have a substituent. Herein, examples of the substituent include an alkyl group, an alkoxy group, an aryl group, an aryloxy group, an aryl alkenyl group, an aryl alkynyl group, an amino group, a substituted amino group, a halogen atom, an acyl group, an acyloxy group, a monovalent heterocyclic group, a carboxyl group, a nitro group, a cyano group and a halogen atom, preferably, an alkyl group, an alkoxy group, an aryl group, an aryloxy group, a substituted amino group, an acyl group or a cyano group, and more preferably an alkyl group, an alkoxy group or an aryl group.

In the formula (B), the arylene group as $Ar^2$, $Ar^3$ and $Ar^4$ is the same as the explanations and examples given in the "Explanation of terminology" described above, and a 1,3-phenylene group, a 1,4-phenylene group, a 2,7-biphenylylene group, a 1,4-naphthalenediyl group, a 2,6-naphthalenediyl group and a 2,7-fluorenediyl group are preferable.

In the formula (B), the divalent heterocyclic group as $Ar^2$, $Ar^3$ and $Ar^4$ is the same as the explanations and examples given in the "Explanation of terminology" described above, and a 2,5-thiophenediyl group, a N-methyl-2,5-pyrrolediyl group, a 2,5-furandiyl group, a 4,7-benzo[2,1,3]thiadiazolediyl group, a 2,5-pyridinediyl group and a 2,5-pyrimidinediyl group are preferable.

$Ar^2$ and $Ar^4$ are preferably an arylene group, more preferably a 1,3-phenylene group, a 1,4-phenylene group, a 2,7-biphenylylene group, a 1,4-naphthalenediyl group or a 2,6-naphthalenediyl group, still more preferably a 1,4-phenylene group, a 2,7-biphenylylene group or a 1,4-naphthalenediyl group, and particularly preferably a 1,4-phenylene group. Those groups may have a substituent.

$Ar^3$ is preferably a 1,3-phenylene group, a 1,4-phenylene group, a 2,7-biphenylylene group, a 1,4-naphthalenediyl group, a 2,7-fluorenediyl group or a 4,7-benzo[2,1,3]thiadiazolediyl group, more preferably a 1,4-phenylene group, a 2,7-biphenylylene group, a 1,4-naphthalenediyl group or a 2,7-fluorenediyl group, and particularly preferably a 1,4-phenylene group or a 2,7-biphenylylene group. Those groups may have a substituent.

It is preferable that $R^1$ and $R^2$ each independently represent an alkyl group, an aryl group or a monovalent heterocyclic group. More preferably, they are an alkyl group or an aryl group, and still more preferably an aryl group.

Examples of the constitutional unit represented by the formula (B) include constitutional units represented by the following formula (B-1), (B-2), (B-3), (B-4), (B-5), or (B-11).

In the following formulas, $R^a$ represents a hydrogen atom, an alkyl group, an alkoxy group, an aryl group, an aryloxy group, an aryl alkenyl group, an aryl alkynyl group, an amino group, a substituted amino group, a halogen atom, an acyl group, an acyloxy group, a monovalent heterocyclic group, a carboxyl group, a nitro group, or a cyano group. Plural $R^a$'s may be the same as or different from each other, and they may bind to each other to form a ring structure.

In the following formulas, $R^b$ represents hydrogen atom, an alkyl group, an alkoxy group, an aryl group, an aryloxy group, an aryl alkenyl group, an aryl alkynyl group, an amino group, a substituted amino group, a halogen atom, an acyl group, an acyloxy group, a monovalent heterocyclic group, a carboxyl group, a nitro group, or a cyano group. Plural $R^b$'s may be the same as or different from each other, and they may bind to each other to form a ring structure. The ring structure formed by binding between $R^b$ is preferably a 5-membered ring.

[Chemical Formula 29]

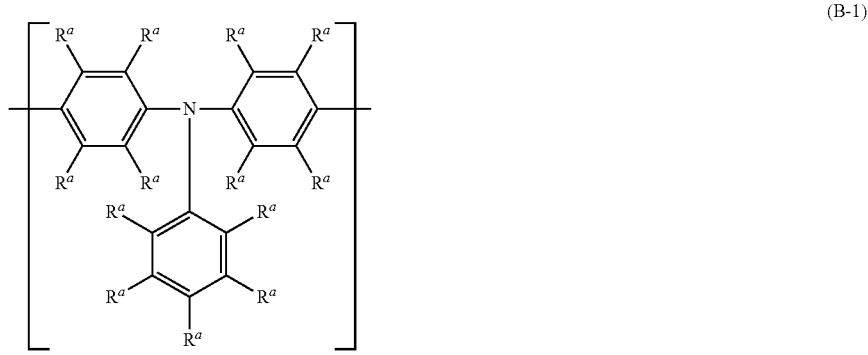

(B-1)

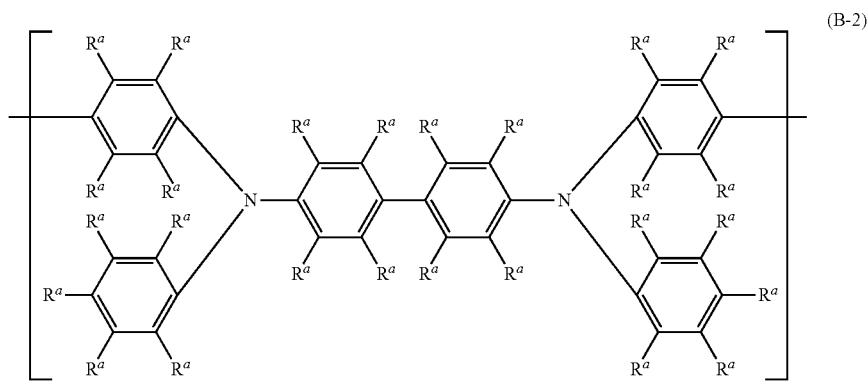

(B-2)

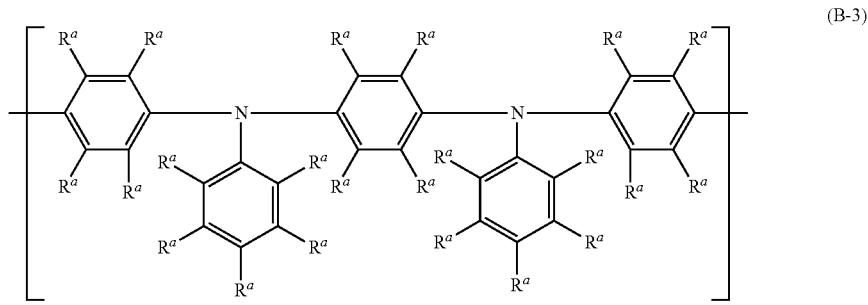

(B-3)

-continued
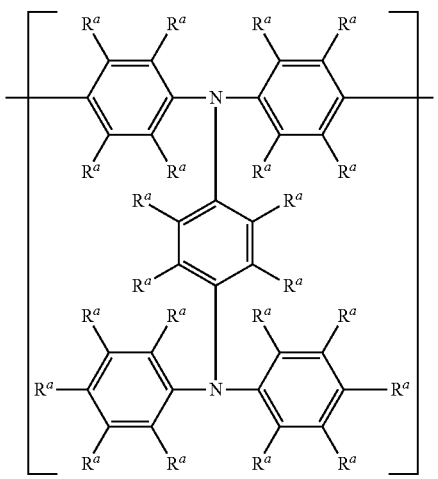
(B-4)
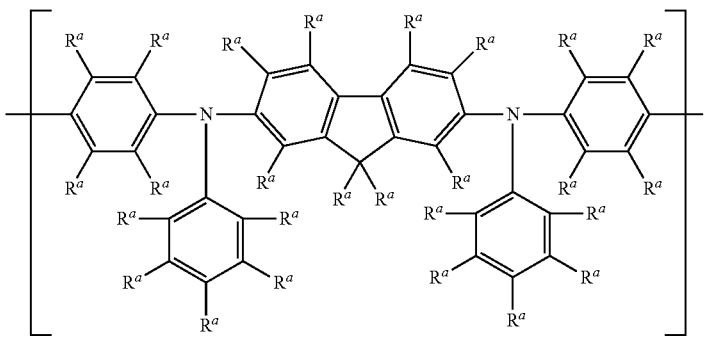
(B-5)
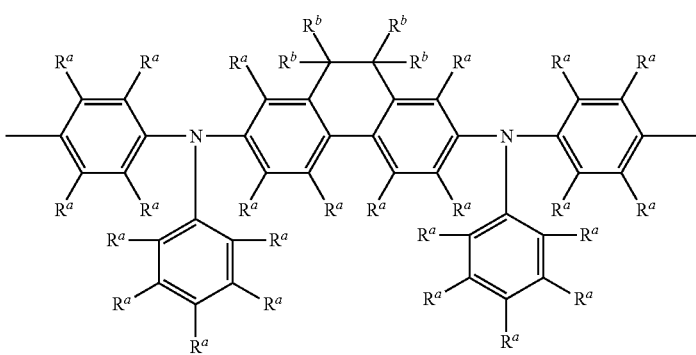
(B-11)

In the formula (B), when a is 1, $Ar^2$ and $Ar^3$ or $Ar^3$ and $Ar^4$ may bind to each other to form a ring. When a is 0, $Ar^2$ and $Ar^4$ may bind to each other to form a ring. Herein, $Ar^2$ and $Ar^3$, $Ar^3$ and $Ar^4$, or $Ar^2$ and $Ar^4$ may bind to each other via a carbon atom, an oxygen atom, a nitrogen atom, a sulfur atom or a silicon atom, or they may directly bind to each other.

Preferred examples of the constitutional unit represented by the formula (B) include constitutional units represented by the following formula (B-6), (B-7), (B-8), (B-9), or (B-10).

[Chemical Formula 30]

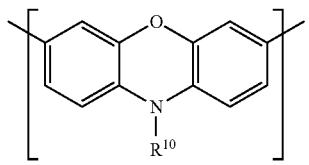
(B-6)

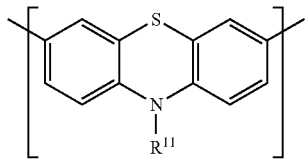
(B-7)

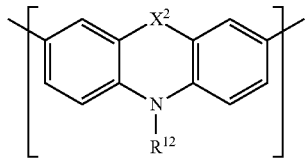
(B-8)

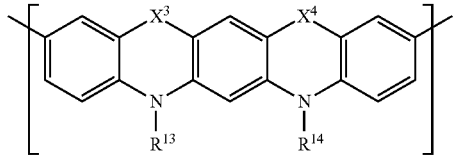
(B-9)

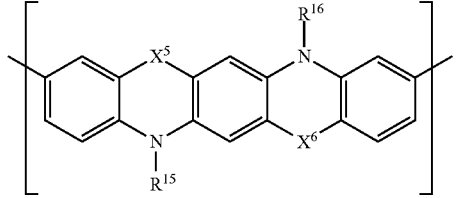
(B-10)

In the formulas, $R^{10}$, $R^{11}$, $R^{12}$, $R^{13}$, $R^{14}$, $R^{15}$ and $R^{16}$ each independently represent a hydrogen atom, an alkyl group, an aryl group, or a monovalent heterocyclic group, and they may have a substituent. $X^2$, $X^3$, $X^4$, $X^5$ and $X^6$ each independently represent a group represented by —$(CR^{17}R^{18})_d$—. $R^{10}$, $R^{11}$, $R^{12}$, $R^{13}$, $R^{14}$, $R^{15}$, $R^{16}$, $R^{17}$ and $R^{18}$ are preferably an alkyl group, an aryl group or a monovalent heterocyclic group, more preferably an alkyl group or an aryl group, and still more preferably an aryl group. $R^{17}$ and $R^{18}$ each independently represent a hydrogen atom, an alkyl group, an aryl group or a monovalent heterocyclic group, and they may have a substituent. d represents an integer of 0 to 2, preferably 0 or 1, and more preferably 1. When d is 2, plural $R^{17}$'s may be the same as or different from each other, and plural $R^{18}$'s may be the same as or different from each other.

An arylene group, a divalent heterocyclic group and a divalent group having a metal complex structure as $Ar^5$ in the formula (C) are the same groups as $Ar^1$ described above.

Examples of the constitutional unit represented by the formula (C) include constitutional units represented by the following formula (C-1), (C-2), (C-3), (C-4), (C-5), (C-6), (C-7), (C-8), or (C-9).

[Chemical Formula 31]

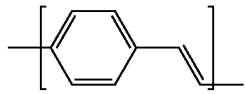
(C-1)

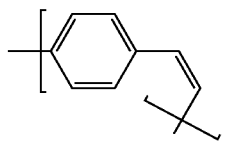
(C-2)

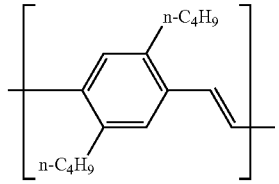
(C-3)

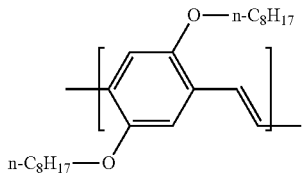
(C-4)

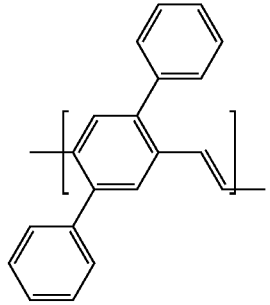
(C-5)

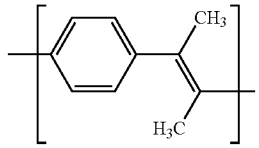
(C-6)

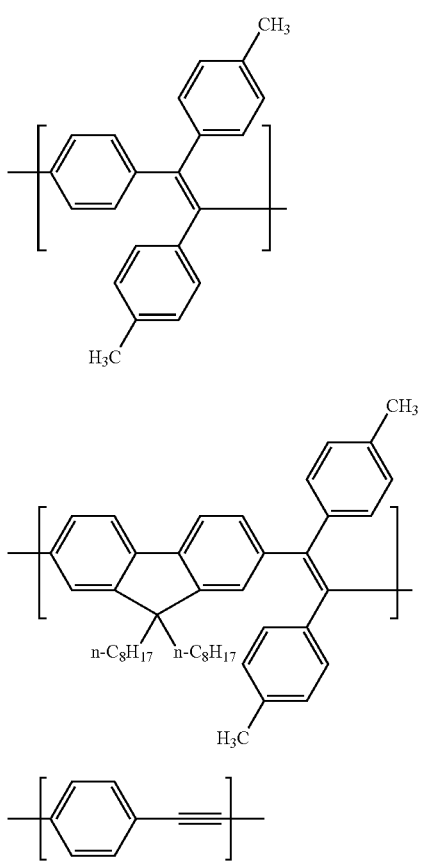

(C-7)

(C-8)

(C-9)

Herein below, preferred method for producing the polymer compound and the polymeric light emitting material according to the present embodiment is explained in detail. The polymer compound and the polymeric light emitting material according to the present embodiment can be produced by a condensation polymerization, for example.

Examples of the condensation polymerization include, for example, a method of polymerization by the Suzuki reaction (Chemical Review (Chem. Rev.), vol. 95, p. 2457 (1995)), a method of polymerization by the Grignard reaction (Kyoritsu Shuppan Co., Ltd., Polymer Functional Material Series vol. 2, Synthesis and Reaction of Polymer (2), p. 432 to 433), and a method of polymerization by the Yamamoto Polymerization method (Progressive polymer science (Prog. Polym. Sci.), vol. 17, p. 1153 to 1205, 1992).

The polymer compound and polymeric light emitting material are preferably synthesized by the condensation polymerization, and more preferably synthesized by the method of polymerization by the Suzuki reaction.

In particular, when a polymer compound containing a constitutional sequence represented by the formula (1) is to be polymerized, a method of synthesizing the constitutional unit of [—(Y)$_n$—Z—]$_m$ as a single unit and incorporating it to a main chain of the polymer, and, a method of polymerizing a polymer containing the constitutional sequence based on a polymerization method which allows sequence control, such as a method of polymerization by the Suzuki reaction, and the like can be mentioned. Of those, a method of polymerization by the Suzuki reaction is preferable. However, as long as it is a polymer containing a constitutional sequence, the synthetic method is not limited.

Herein below, a method of polymerization by the Suzuki reaction is explained.

In the polymer compound, groups represented by Y and Z and a constitutional sequence represented by the formula (1) can be introduced by condensation polymerization between a compound represented by the following formula (M1) and a compound represented by the following formula (M2) or between a compound represented by the following formula (M3) and a compound represented by the following formula (M4). In the polymer compound, arbitrary additional group which is different from the groups represented by Y and Z may be introduced by condensation polymerization.

When the polymeric light emitting material contains the constitutional unit represented by the formula (A), (B), or (C), the constitutional unit represented by the formula (A), (B), or (C) is introduced by condensation polymerization of a compound represented by the following formula (M5), (M6), or (M7), for example. In the polymeric light emitting material, arbitrary additional group which is different from the constitutional unit represented by the formula (A), (B), or (C) may be introduced by condensation polymerization.

A-Y-A    (M1)

In the formula, Y has the same meaning as defined above. A represents a halogen atom. Two A may be the same as or different from each other.

B'—Z—B'    (M2)

In the formula, Z has the same meaning as defined above. B' represents a boric acid ester residue, a boric acid residue (—B(OH)$_2$), a group represented by the following formula (a-1), a group represented by the following formula (a-2), a group represented by the following formula (a-3), or a group represented by the following formula (a-4). Two B' may be the same as or different from each other.

[Chemical Formula 32]

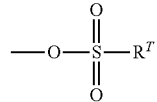

(a-1)

(a-2)

(a-3)

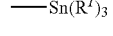

(a-4)

In the formulas, $R^T$ represents an alkyl group, or an aryl group, and may be substituted. $X^A$ represents a halogen atom.

A-Z-A    (M3)

In the formula, Z and A have the same meaning as defined above. Two A may be the same as or different from each other.

B'—Y—B'    (M4)

In the formula, Y and B' have the same meaning as defined above. Two B' may be the same as or different from each other.

C'—Ar$^1$—C'    (M5)

In the formula, Ar$^1$ has the same meaning as defined above. C' represents a halogen atom, a boric acid ester residue, a boric acid residue, a group represented by the formula (a-1), a group represented by the formula (a-2), a group represented by the formula (a-3), or a group represented by the formula (a-4). Two C' may be the same as or different from each other.

[Chemical Formula 33]

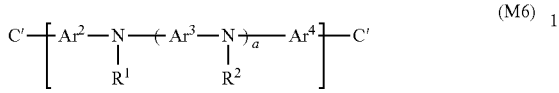
(M6)

In the formula, $Ar^2$, $Ar^3$, $Ar^4$, $R^1$, $R^2$ and C' have the same meaning as defined above. a is 0 or 1.

(M7)

In the formula, $Ar^5$, $X^1$ and C' have the same meaning as defined above.

Examples of the halogen atom represented by A, C', or $X^A$ include a chlorine atom, a bromine atom, and an iodine atom.

Examples of the boric acid ester residue represented by B' or C' include the group represented by the following formula.

[Chemical Formula 34]

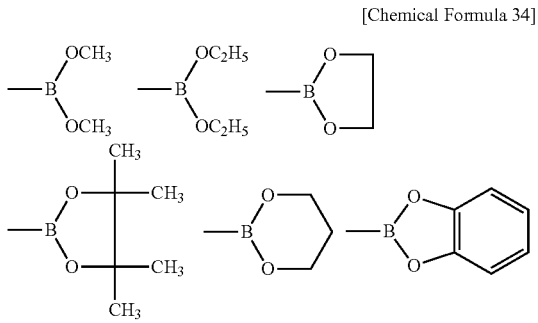

In the formula (a-1), examples of unsubstituted alkyl groups represented by $R^T$ include a methyl group, an ethyl group, and a n-butyl group. Examples of substituted alkyl groups represented by $R^T$ include a trifluoromethyl group and a pentafluoroethyl group.

In the formula (a-1), examples of the aryl group represented by $R^T$ include a phenyl group, a 4-methylphenyl group, and a 4-n-butylphenyl group.

Examples of the group represented by the formula (a-1) include a methane sulfonate group, a trifluoromethane sulfonate group, a phenyl sulfonate group, and a 4-methylphenyl sulfonate group.

In the formula (a-4), the alkyl group represented by $R^T$ is the same as the explanations and examples given in the "Explanation of terminology" described above, the unsubstituted alkyl group is preferably a methyl group, an ethyl group and an n-butyl group, and the substituted alkyl group is preferably a trifluoromethyl group and a pentafluoroethyl group.

In the formula (a-1), the aryl group represented by $R^T$ is the same as the explanations and examples given in the "Explanation of terminology" described above, is preferably a phenyl group, a 4-methylphenyl group, a 4-n-butylphenyl group.

Examples of the groups represented by formula (a-4) include a trimethylstannanyl group, a triethylstannanyl group, a tributylstannanyl group.

The compounds represented by the formula (M1), (M2), (M3), (M4), (M5), (M6), or (M7) may be synthesized and isolated beforehand to be used, or may be prepared in the reaction system and used directly.

B' in the formulas (M2) and (M4) and C' in the formulas (M5), (M6) and (M7) are preferably a boric acid ester residue or boric acid residue in terms of convenience of synthesis and ease of handling of the compound represented by the formula (M2), (M4), (M5), (M6) and (M7).

Examples of the method of condensation polymerization include a method of reacting a compound represented by the formula (M1), (M2), (M3), (M4), (M5), (M6), or (M7), using an appropriate catalyst and an appropriate base.

Such catalysts include a catalyst consisting of a transition metal complex such as palladium complexes like palladium [tetrakis(triphenylphosphine)], [tris(dibenzylideneacetone)] dipalladium, palladium acetate or the like, nickel complexes like nickel [tetrakis(triphenylphosphine)], [1,3-bis(diphenylphosphino)propane]dichloronickel, [bis(1,4-cyclooctadiene)]nickel, or the like, and, as necessary, a further ligand such as triphenylphosphine, tri(tert-butylphosphine), tricyclohexylphosphine, diphenylphosphinopropane, bipyridyl. The catalyst may be synthesized beforehand to be used, or may be prepared in the reaction system and used directly. These catalysts may be used either alone or in combinations of two or more.

When the aforementioned catalyst is used, the amount of metal atom in the catalyst is preferably 0.00001 to 3 mol equivalents, more preferably 0.00005 to 0.5 mol equivalents, even more preferably 0.0001 to 0.2 mol equivalents, and particularly preferably 0.0001 to 0.01 mol equivalents with respect to the total number of moles of the compound represented by the formula (M1), (M2), (M3), (M4), (M5), (M6), or (M7).

Examples of the bases include inorganic bases such as sodium carbonate, potassium carbonate, cesium carbonate, potassium fluoride, cesium fluoride or tripotassium phosphate, or organic bases such as tetrabutylammonium fluoride, tetrabutylammonium chloride, tetrabutylammonium bromide or tetrabutylammonium hydroxide. These bases may be used either alone or in combinations of two or more.

When the base is used, the amount of use is preferably 0.5 to 20 mol equivalents and more preferably 1 to 10 mol equivalents with respect to the total number of moles of the compound represented by the formula (M1), (M2), (M3), (M4), (M5), (M6), or (M7).

The condensation polymerization is usually conducted in the presence of a solvent such as an organic solvent.

The organic solvent may vary depending on the type of compound represented by the formula (M1), (M2), (M3), (M4), (M5), (M6), or (M7) and on the reaction, and is, for example, toluene, xylene, mesitylene, tetrahydrofuran, 1,4-dioxane, dimethoxyethane, N,N-dimethylacetamide or N,N-dimethyl formamide. In order to inhibit secondary reactions, such solvents are preferably subjected to deoxidizing treatment in advance. These organic solvents may be used either alone or in combinations of two or more.

The amount of organic solvent used is such that the total concentration of the compound represented by the formula (M1), (M2), (M3), (M4), (M5), (M6), or (M7) is usually 0.1 to 90% by mass, preferably 1 to 50% by mass, and more preferably 2 to 30% by mass.

The reaction temperature for the condensation polymerization is preferably −100 to 200° C., more preferably −80 to 150° C. and even more preferably 0 to 120° C.

The reaction time may vary depending on the conditions such as the reaction temperature, but it will usually be at least 1 hour, and is preferably 2 to 500 hours.

In the polymer compound, when mole numbers of Y, Z, and the arbitrary additional group M in the polymer compound are $N_Y$, $N_Z$ and $N_M$, respectively, $N_Y$, $N_Z$ and $N_M$ preferably satisfy the following equation (2)

$$30 \leq N_Y \times 100/(N_Y+N_Z+N_M) \leq 75 \qquad (2)$$

When both the polymer compound and the polymeric light emitting material are synthesized by condensation polymerization, and mole numbers of Y, Z, and the arbitrary additional group M in the polymer compound are $N_Y$, $N_Z$ and $N_M$, respectively, and a mole number of chemical structures in the polymeric light emitting material constituting the light emitting material, that is introduced by the condensation polymerization, is $N_L$, $N_Y$, $N_Z$, $N_M$, and $N_L$ preferably satisfy the following equation (3).

$$0.5 \leq N_Y \times 100/(N_Y+N_Z+N_M+N_L) \leq 37.5 \qquad (3)$$

It is particularly preferable that the polymer compound is a copolymer consisting of a constitutional sequence represented by the formula (1) only.

Post-treatment after condensation polymerization may be carried out by a known method, such as adding the reaction solution obtained by condensation polymerization to a lower alcohol such as methanol and filtering and drying the deposited precipitate.

The polymer compound and the light emitting material that are obtained as described above may be mixed by a known method to prepare a composition.

Block Type Copolymer

In the present invention, "block type copolymer" indicates a copolymer which has a "constitutional sequence represented by the formula (1)" as a main chain and a "chemical structure constituting the light emitting material" as a main chain or a side chain. The block type copolymer may have "the constitutional sequence represented by the formula (1)" as a side chain and may have a constitutional sequence other than "constitutional sequence represented by the formula (1)" and the "chemical structure constituting the light emitting material" (hereinafter, referred to as a "other constitutional sequence"), and/or a "divalent group like a linking group" as a main chain or a side chain. The block type copolymer may contain "the constitutional sequence represented by the formula (1)", "the chemical structure constituting the light emitting material", and "other constitutional sequence", either singly or in combination of two or more.

The block type copolymer according to the present embodiment of the invention has the constitutional sequence represented by the formula (1) as a main chain and the chemical structure constituting the light emitting material as a main chain or a side chain. The block type copolymer preferably has 1 to 30 constitutional sequences represented by the formula (1). The constitutional sequence represented by the formula (1) is the same as the constitutional sequence represented by the formula (1) which has been described above in relation to the polymer compound.

Examples of the chemical structure constituting the light emitting material include a chemical structure constituting a low molecular fluorophore, for example. When the chemical structure constituting a low molecular fluorophore is incorporated to a polymer chain, the chemical structure constituting a low molecular fluorophore may be incorporated to a main chain or a side chain. Preferred examples of the chemical structure constituting the light emitting material include a chemical structure constituting polyfluorene, a copolymer of fluorene derivatives, polyarylene, a copolymer of arylene derivatives, polyarylene vinylene, a copolymer of arylene vinylene derivatives, an aromatic amine or the derivatives. It is preferable that the chemical structure constituting the light emitting material is at least one of constitutional unit represented by the formula (A), (B), or (C), and more preferably a constitutional unit represented by the formula (B). The constitutional unit represented by the formula (A), (B), or (C) are the same as the constitutional unit represented by the formula (A), (B), or (C), which has been described above in relation to the light emitting material. However, the constitutional unit represented by the formula (1) is not included in the chemical structure constituting the light emitting material.

Further, the chemical structure constituting the light emitting material preferably includes at least one of constitutional unit represented by the formula (A) and at least one of constitutional unit represented by the formula (B).

In the block type copolymer, examples of the bond between the chemical structure constituting the light emitting material and the constitutional sequence represented by the formula (1) include a direct bond, a conjugate bond via an aromatic ring, or a non-conjugated bond via an alkylene chain. Among them, a direct bond or a conjugate bond via an aromatic ring are preferable.

The block type copolymer has a polystyrene-equivalent number average molecular weight of preferably $1 \times 10^3$ to $1 \times 10^7$, more preferably $1 \times 10^4$ to $5 \times 10^6$. In addition, the block type copolymer has a polystyrene-equivalent weight average molecular weight of preferably $1 \times 10^4$ to $5 \times 10^7$, more preferably $5 \times 10^4$ to $1 \times 10^7$. Resistance to charge transfer tends to decrease and the property of forming a film by coating tends to get improved when the number average molecular weight and the weight average molecular weight are higher than the lower limits described above, and the property of forming a film by coating tends to get improved when the number average molecular weight and the weight average molecular weight are lower than the upper limits described above.

The block type copolymer is preferably synthesized by condensation polymerization. More preferably, it is a copolymer synthesized by a polymerization by a method of polymerizing the polymer compound containing a constitutional sequence by a polymerization method which allows sequence control, such as the Suzuki reaction or the like. However, as long as it is a polymer compound containing a constitutional sequence and the chemical structure constituting the light emitting material, the synthetic method is not limited. Further, when the block type copolymer is synthesized by a method of polymerization by the Suzuki reaction, the block type copolymer can be synthesized similar to the polymer compound described above.

When the block type copolymer is obtained by condensation polymerization, groups represented by Y and Z and the chemical structure constituting the light emitting material are introduced to the block type copolymer by condensation polymerization. In addition, an arbitrary additional group different from the above group and chemical structure may be introduced by condensation polymerization.

Examples of the method for condensation polymerization are the same as the method for the polymer compound or the light emitting material described above. For example, as a method for producing a block type copolymer with a block having the constitutional sequence represented by the formula (1) and a block having the chemical structure constituting the light emitting material which is different from the block as a main chain, there is (Method 1), (Method 2), or (Method 3) described below.

(Method 1)

A method including carrying out condensation polymerization of a monomer required for forming a block having the constitutional sequence represented by the formula (1) to produce a polymer having the constitutional sequence represented by the formula (1), and carrying out condensation polymerization after adding, to the polymer, a monomer required for forming a block having the chemical structure constituting the light emitting material.

(Method 2)

A method including producing a polymer having the chemical structure constituting the light emitting material in which a monomer required for forming a block having the chemical structure constituting the light emitting material has been subjected to condensation polymerization and carrying out condensation polymerization after adding, to the polymer, a monomer required for forming a block having the constitutional sequence represented by the formula (1).

(Method 3)

A method including carrying out condensation polymerization of a monomer required for forming a block having the constitutional sequence represented by the formula (1) to produce a polymer (a) having the constitutional sequence represented by the formula (1), separately producing a polymer (b) obtained by condensation polymerization of a monomer required for forming a block having the chemical structure constituting the light emitting material, and carrying out condensation polymerization of the polymer (a) and the polymer (b).

Examples of the monomer used for (Method 1) to (Method 3) include the compound represented by the formula (M1), (M2), (M3), (M4), (M5), (M6), or (M7), which are the same as that of the polymer compound or the light emitting material described above. According to (Method 1), for example, the constitutional sequence represented by the formula (1) in the polymer having the constitutional sequence represented by the formula (1) is introduced by condensation polymerization of a compound represented by the formula (M1) and a compound represented by the formula (M2) or a compound represented by the formula (M3) and a compound represented by the formula (M4). Further, the chemical structure constituting the light emitting material is introduced by condensation polymerization after adding a compound represented by the formula (M5), (M6), or (M7) to the polymer. Consequently, the constitutional sequence represented by the formula (1) and the chemical structure constituting the light emitting material are introduced to the block type copolymer. According to (Method 2) and (Method 3), the constitutional sequence represented by the formula (1) and the chemical structure constituting the light emitting material are introduced to the block type copolymer in the same manner as (Method 1).

Conditions including catalyst, base, type and amount of an organic solvent, and reaction temperature for condensation polymerization are the same as those described above.

In the block type copolymer, when mole numbers of Y, Z, the arbitrary additional group M and the chemical structure constituting the light emitting material are $N_Y$, $N_Z$, $N_M$ and $N_K$, respectively, $N_Y$, $N_Z$, $N_M$ and $N_K$ preferably satisfy the following equation (4), and more preferably the following equation (4-1).

$$2 \leq N_Y \times 100/(N_Y+N_Z+N_K+N_M) < 40 \quad (4)$$

$$3 \leq N_Y \times 100/(N_Y+N_Z+N_K+N_M) \leq 30 \quad (4\text{-}1)$$

Further, in the block type copolymer, when mole numbers of Y, Z and the arbitrary additional group M are $N_Y$, $N_Z$, and $N_M$, respectively, $N_Y$, $N_Z$ and $N_M$ preferably satisfy the following equation (5), and more preferably the following equation (5-1).

$$20 \leq N_Y \times 100/(N_Y+N_Z+N_K) \quad (5)$$

$$30 \leq N_Y \times 100/(N_Y+N_Z+N_K) \quad (5\text{-}1)$$

Further, when the polymer compound or block type copolymer is polymerized by the Suzuki reaction, it is preferable that the monomer type and monomer ratio of the monomers used are appropriately selected.

For example, when dibromide (50 mol %) of Y and diboric acid compound (50 mol %) of Z are prepared as a monomer and polymerized by the Suzuki reaction, an alternating copolymer of Y and Z is yielded, and therefore a polymer consisting only of the following constitutional sequence represented by the formula (1) can be polymerized.

$$[-Y-Z-]_m \quad (1)$$

Further, for a polymer compound which is obtained by preparing dibromide of Y, diboric acid compound of Z, and monomer as a third component (referred to as J) and polymerizing them by the Suzuki reaction with molar ratio of 37.5 mol %:50 mol %:12.5 mol % for the dibromide of Y, diboric acid compound of Z, and dibromide of J, there is a possibility that the polymer compound in which m is less than 4 like the following formula (1-1) is yielded:

$$\begin{array}{c}-Y-Z-Y-Z-Y-Z-J-Z-Y-Z-Y-Z-Y-\\ Z-J-Z\end{array} \quad (1\text{-}1)$$

Meanwhile, when the dibromide of Y is greater than 37.5 mol % and the dibromide of J is smaller than 12.5 mol %, the polymerization proceeds to yield only a polymer compound having a constitutional sequence with m of 4 or more. For example, even for a case in which the dibromide of Y, the diboric acid compound of Z, and the dibromide of J are polymerized by the Suzuki reaction with molar ratio of 45 mol %:50 mol %:5 mol %, the polymer compound or block type copolymer having the constitutional sequence represented by the formula (1) as a main chain can be produced.

According to the present embodiment, when a monomer other than the dibromide of Y and the diboric acid compound of Z is used for polymerization of the polymer compound or the block copolymer, it is preferable to select each monomer type and monomer ratio such that the polymer containing the constitutional sequence represented by the formula (1) is necessarily yielded.

As described above, for a case in which the dibromide of J as a third component is present in addition to the dibromide of Y and the diboric acid compound of Z, and when the dibromide of Y, the diboric acid compound of Z, and the dibromide of J are used at ratio of 50-t (mol %):50 (mol %):t (mol %), preferred range of t is 0<t<12.5, more preferably 0<t≤10, and still more preferably 0<t≤5. Herein, t is a number which is larger than 0 but less than 50.

When the polymer compound or block type copolymer of the present embodiment containing the constitutional sequence is synthesized by use of the Suzuki reaction, by obtaining in advance the average of constitutional sequence yielded by the ratios of polymerized monomers according to the method described in the following "Polymerization simulation", it is possible to determine whether or not the polymer compound or block type copolymer contains the constitutional sequence.

Polymerization Simulation

Polymerization simulation was performed by establishing a program having functions described below.

The number of each of k (k is an integer of 1 or more) types of the monomer units [hereinafter, referred to as "monomer unit A group"] having two leaving group A (for example, a boric acid ester residue) is defined as:

$M_1, \ldots, M_k$ ($M_1, \ldots, M_k$ are an integer of 1 or more), and the number of each of v (v is an integer of 1 or more) types of the monomer units [hereinafter, referred to as "monomer unit B group"] having two leaving group B (for example, a bromine atom) is defined as:

$N_1, \ldots, N_v$ ($N_1, \ldots, N_v$ are an integer of 1 or more).

Then, a program which repeats the following two steps ("Step 1" and "Step 2") until the ratio ($N_F/N_0$) of the number of unreacted leaving group ($N_F$) to the number of leaving group present at initial stage ($N_0$) decreases to a specific value (hereinafter, referred to as "R value") is established. Herein, the number of unreacted leaving group indicates the total number of leaving groups which remain after performing the following two steps ("Step 1" and "Step 2").

Step 1:

Step for selecting one monomer unit from the monomer unit A group and one monomer unit from the monomer unit B group based on two random numbers.

Step 2:

Step for registering a bond between two monomer units which have been selected from Step 1 and reducing one at a time the number of leaving group in the selected monomer units.

Regarding an occurrence of random numbers by a calculator, the program described in Hiroshi Haramoto, Makoto Matsumoto, INFORMS Journal on Computing Vol. 20, No. 3, Summer 2008, pp. 385-390) was used.

Calculation of Average Sequence Length

The average sequence length was calculated as described below. First, one monomer unit is selected from each of the monomer unit A group and the monomer unit B group, the same identification symbol P is given to them, and then "Polymerization simulation" was performed. Sequence of the polymer obtained by polymerization was scanned and number of P (hereinafter, referred to as "P sequence length") constituting the sequence (hereinafter, referred to as "P sequence") of the monomer unit identified as symbol P was recorded. A case in which the monomer unit identified as symbol P is present without forming a sequence (i.e., P is present as a unreacted monomer) and a case in which all the monomer units bound to P are not P are excluded. In other words, a case in which no P sequence is present is excluded. Further, the number obtained by dividing the total P constituting the P sequence (i.e., total of the P sequence length) by the number of P sequence is taken as the average sequence length. The "Polymerization simulation" was independently performed five times for one polymerization condition, and the average sequence length obtained from five runs was averaged to obtain a desired average sequence length.

Specific conditions for calculation are based on the following settings.

(S1) Condition of Polymerization Simulation (General)

With k=1, v=2, R value=0.003, and, $M_1$=5000, the first type of the monomer unit was given with the identification symbol P for both the monomer unit A group and the monomer unit B group.

(S2) Individual Condition for Polymerization Simulation

Polymerization condition 1: $N_1$=500, $N_2$=4500
Polymerization condition 2: $N_1$=1000, $N_2$=4000
Polymerization condition 3: $N_1$=1500, $N_2$=3500
Polymerization condition 4: $N_1$=2000, $N_2$=3000
Polymerization condition 5: $N_1$=2500, $N_2$=2500
Polymerization condition 6: $N_1$=3000, $N_2$=2000
Polymerization condition 7: $N_1$=3500, $N_2$=1500
Polymerization condition 8: $N_1$=4000, $N_2$=1000
Polymerization condition 9: $N_1$=4500, $N_2$=500

The average sequence lengths obtained by calculation are as follows.

Polymerization condition 1: average sequence length=3.2
Polymerization condition 2: average sequence length=3.5
Polymerization condition 3: average sequence length=3.8
Polymerization condition 4: average sequence length=4.3
Polymerization condition 5: average sequence length=5.0
Polymerization condition 6: average sequence length=5.9
Polymerization condition 7: average sequence length=7.6
Polymerization condition 8: average sequence length=10.7
Polymerization condition 9: average sequence length=19.8

Herein, when $M_1$ and $N_1$ each corresponds to Z and $(Y)_n$ of the formula (1), in the polymer according to aforementioned polymerization condition, the average value (m') corresponding to m of the formula (1) is as follows.

Polymerization condition 1: m'=1.6
Polymerization condition 2: m'=1.75
Polymerization condition 3: m'=1.9
Polymerization condition 4: m'=2.15
Polymerization condition 5: m'=2.5
Polymerization condition 6: m'=2.95
Polymerization condition 7: m'=3.8
Polymerization condition 8: m'=5.35
Polymerization condition 9: m'=9.9

Further, with regard to m' as obtained above, it is preferable that m'≥3.0, it is more preferable that m'≥3.8, it is still more preferable that m'≥5.35, it is particularly preferable that m'≥9.9.

Meanwhile, to see whether or not the polymer compound and block type copolymer synthesized based on the description of "Polymerization simulation" satisfies the above formula (1), nuclear magnetic resonance (NMR) spectroscopy can be used, for example.

The composition according to the present embodiment may contain at least one material selected from the group consisting of hole transport materials and electron transport materials. Further, the block type copolymer may be prepared as a composition with at least one material selected from the group consisting of hole transport materials and electron transport materials. Herein below, those two kinds of composition are simply referred to as a "composition according to the present embodiment" and explanations are given therefor. The hole transport material and the electron transport material principally play a role of adjusting a charge (holes and charges) balance.

Examples of the hole transport material include polyvinylcarbazole and derivatives thereof, polysilane and derivatives thereof, polysiloxane derivatives having an aromatic amine in a side chain or a main chain, pyrazoline derivatives, arylamine derivatives, stilbene derivatives, triphenyldiamine derivatives, polyaniline and derivatives thereof, polythiophene and derivatives thereof, polypyrrole and derivatives thereof, poly(p-phenylenevinylene) and derivatives thereof, poly(2,5-thienylenevinylene) and derivatives thereof. Further examples include those hole transport materials described in Japanese Patent Application Laid-Open Publication No. 63-70257, Japanese Patent Application Laid-Open Publication No. 63-175860, Japanese Patent Application Laid-Open Publication No. 2-135359, Japanese Patent Application Laid-Open Publication No. 2-135361, Japanese Patent Application Laid-Open Publication No. 2-209988, Japanese Patent Application Laid-Open Publication No. 3-37992, and Japanese Patent Application Laid-Open Publication No. 3-152184.

The content ratio of the hole transport material is preferably 3 to 30 parts by mass, more preferably 3 to 20 parts by mass, especially preferably 3 to 10 parts by mass based on 100 parts by mass of the composition from the viewpoint of the good charge balance.

The content ratio of the hole transport material is preferably 3 to 30 parts by mass, more preferably 3 to 20 parts by mass, especially preferably 3 to 10 parts by mass based on 100 parts by mass of the block type copolymer from the viewpoint of the good charge balance.

Examples of the electron transport material include oxadiazole derivatives, anthraquinodimethane and derivatives thereof, benzoquinone and derivatives thereof, naphthoquinone and derivatives thereof, anthraquinone and derivatives thereof, teteracyanoanthraquinonodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof. Further examples include those electron transport materials described in 63-70257, Japanese Patent Application Laid-Open Publication No. 63-175860, Japanese Patent Application Laid-Open Publication No. 2-135359, Japanese Patent Application Laid-Open Publication No. 2-135361, Japanese Patent Application Laid-Open Publication No. 2-209988, Japanese Patent Application Laid-Open Publication No. 3-37992, and Japanese Patent Application Laid-Open Publication No. 3-152184.

The content ratio of the electron transport material is preferably 5 to 50 parts by mass, more preferably 5 to 30 parts by mass, especially preferably 5 to 20 parts by mass based on 100 parts by mass of the composition from the viewpoint of obtaining the good charge balance.

The content ratio of the electron transport material is added preferably 5 to 50 parts by mass, more preferably 5 to 30 parts by mass, especially preferably 5 to 20 parts by mass based on 100 parts by mass of the block type copolymer from the viewpoint of obtaining good charge balance.

The composition according to the present embodiment can include an organic solvent, or the block type copolymer according to the present embodiment can be mixed with an organic solvent, to form a solution or a dispersion liquid (hereinafter, referred to simply as a "solution"). By making them form a solution, a film can be formed by a coating method. This solution is generally called an ink composition, a liquid composition or the like. The solution may also contain the hole transport material and/or the electron transport material described above.

Examples of the organic solvent include chlorine based solvents, such as chloroform, methylene chloride, 1,2-dichloroethane, 1,1,2-trichloroethane, chlorobenzene, and o-dichlorobenzene, ether based solvents, such as tetrahydrofuran and dioxane, aromatic hydrocarbon based solvents, such as toluene, xylene, trimethylbenzene, and mesitylene, aliphatic hydrocarbon based solvents, such as cyclohexane, methylcyclohexane, n-pentane, n-hexane, n-heptane, n-octane, n-nonane, and n-decane, ketone based solvents, such as acetone, methyl ethyl ketone, and cyclohexanone, ester based solvents, such as ethyl acetate, butyl acetate, methyl benzoate, and ethyl cellosolve acetate, polyols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, and 1,2-hexanediol and derivatives thereof, alcoholic solvents, such as methanol, ethanol, propanol, isopropanol, and cyclohexanol, sulfoxide based solvents, such as dimethylsulfoxide, and amide based solvents, such as N-methyl-2-pyrolidone, and N,N-dimethyl formamide. Further, these solvents may be used either singly or in combination of two or more kinds. Among these solvents, it is preferable to include organic solvents having a structure including a benzene ring, and having a melting point of 0° C. or lower and boiling point of 100° C. or higher, because the solution has an appropriate viscosity and, as a result, there is a tendency that film-forming property gets better.

Content ratio of the organic solvent is preferably 10.0 to 99.9 parts by mass, more preferably 20.0 to 99.8 parts by mass, especially preferably 30.0 to 99.7 parts by mass based on 100 parts by mass of the composition from the viewpoint of obtaining good film-forming property.

Content ratio of the organic solvent is preferably 10 to 1000 parts by mass, more preferably 20 to 500 parts by mass, especially preferably 30 to 100 parts by mass based on 1 part by mass of the block type copolymer from the viewpoint of obtaining good film-forming property.

For a case in which the composition according to the present embodiment includes an organic solvent, and for a case in which the block type copolymer is used in combination of an organic solvent, it is only necessary to remove the organic solvent by drying after applying the solution for laminating/forming a film made of the composition and a film made of the block type copolymer, which is very advantageous in manufacture. Further, for drying, the light emitting material may be dried with heating to about 50 to 150° C. or dried under a reduced pressure of about $10^{-3}$ Pa.

For lamination and film formation, there can be used coating methods such as a spin coating method, a casting method, a micro-gravure coating method, a gravure coating method, a bar coating method, a roll coating method, a wire bar coating method, a dip coating method, a slit coating method, a capillary coating method, a spray coating method, a screen printing method, a flexographic printing method, an offset printing method, an inkjet printing method, and a nozzle coating method.

If the composition according to the present embodiment includes an organic solvent, and/or if the block type copolymer according to the present embodiment includes an organic solvent, viscosity of the solution is preferably in a range of 0.5 to 500 mPa·s at 25° C., although it may vary depending on the printing method. Further, viscosity is preferably in a range of 0.5 to 20 mPa·s at 25° C. for preventing clogging and deflection during jetting in the case of a printing method in which a solution passes through a jetting apparatus, such as an inkjet printing method or the like.

Film

The aforementioned composition and/or block type copolymer are useful for manufacture of a film to be an organic layer. Such film can be easily produced from the above-mentioned solution by the method described above. Such a film is made of the composition or contains the block type copolymer, and therefore is suitable as a light emitting layer of an organic EL device, and an organic EL device having the film as a light emitting layer has an improved luminous life time.

Organic EL Device

The organic EL device includes a pair of electrodes consisting of an anode and a cathode and an organic layer provided between the pair of electrodes. Here, the organic layer functions as a light emitting layer. The organic EL device preferably has a light emitting layer consisting of the film described above.

Constitutions of the organic EL device include the following constitutions a) to d).
a) anode/light emitting layer/cathode
b) anode/hole transport layer/light emitting layer/cathode
c) anode/light emitting layer/electron transport layer/cathode
d) anode/hole transport layer/light emitting layer/electron transport layer/cathode Here, /means that the layers are laminated adjacent to one another. The same applies herein below.

Further, the light emitting layer is a layer having a function of emitting light. The hole transport layer is a layer having a function of transporting holes. The electron transport layer is a layer having a function of transporting electrons. The hole transport layer and the electron transport layer are collectively called a charge transport layer.

Lamination/film formation of the layers can be carried out from a solution. For lamination/film formation from a solution, there can be used coating methods such as a spin coating method, a casting method, a micro-gravure coating method, a gravure coating method, a bar coating method, a roll coating method, a wire bar coating method, a dip coating method, a slit coating method, a capillary coating method, a spray coating method, a screen printing method, a flexographic printing method, an offset printing method, an inkjet printing method, and a nozzle coating method.

Film thickness of the light emitting layer may be selected so that the driving voltage and light emitting efficiency become appropriate values, but is normally 1 nm to 1 µm, preferably 2 nm to 500 nm, and still more preferably 5 nm to 200 nm.

If the organic EL device has a hole transport layer, examples of the hole transport material used include the same materials as those described above. Film formation of the hole transport layer may be carried out by any method, but if the hole transport material is a small molecule compound, it is preferable to form a film from a mixed solution with a polymer binder. If the hole transport material is a polymer compound, it is preferable to form a film from a solution. For film formation from a solution, a method provided as an example of a coating method may be used.

The polymer binder to be mixed with the hole transport material is preferably a compound that does not extremely hinder charge transportation, and has no strong absorption of visible light. Examples of the polymer binder include polycarbonate, polyacrylate, polymethyl acrylate, polymethyl methacrylate, polystyrene, polyvinyl chloride, and polysiloxane.

Film thickness of the hole transport layer may be selected so that the driving voltage and light emitting efficiency become appropriate values, but is normally 1 nm to 1 µm, preferably 2 nm to 500 nm, and still more preferably 5 nm to 200 nm.

If the organic EL device has an electron transport layer, examples of the electron transport material used include the same materials as those described above. Film formation of the electron transport layer may be carried out by any method, but if the electron transport material is a small molecule compound, a vacuum deposition method from a powder, and a method by film formation from a solution or a molten state are preferable. If the electron transport material is a polymer compound, a method by film formation from a solution or a molten state is preferable. For film formation from a solution or a molten state, a polymer binder may be used in combination. For film formation from a solution, a method provided as an example of a coating method may be used.

The polymer binder to be mixed with the electron transport material is preferably a compound that does not extremely hinder charge transportation, and has no strong absorption of visible light. Examples of the polymer binder include poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonate, polyacrylate, polymethyl acrylate, polymethyl methacrylate, polystyrene, polyvinyl chloride, and polysiloxane.

Film thickness of the electron transport layer may be selected so that the driving voltage and light emitting efficiency become appropriate values, but is normally 1 nm to 1 µm, preferably 2 nm to 500 nm, and still more preferably 5 nm to 200 nm.

Among charge transport layers provided adjacent to the electrode, a layer having a function of improving efficiency of charge injection from the electrode and having an effect of lowering the driving voltage of the device may be particularly called a charge injection layer (hole injection layer, electron injection layer) in some cases. Moreover, the charge injection layer or an insulating layer may be provided adjacent to the electrode for improvement of adhesive properties with the electrode and improvement of injection of charges from the electrode, or a thin buffer layer may be inserted into an interface of the charge transport layer or the light emitting layer for improvement of adhesive properties of the interface, prevention of mixing and the like. Further, the order and the number of layers to be laminated and thickness of each layer may be selected as appropriate in consideration of the light emitting efficiency and device life.

The organic EL devices provided with a charge injection layer include those having the following constitutions e) to p).
e) anode/charge injection layer/light emitting layer/cathode
f) anode/light emitting layer/charge injection layer/cathode
g) anode/charge injection layer/light emitting layer/charge injection layer/cathode
h) anode/charge injection layer/hole transport layer/light emitting layer/cathode
i) anode/hole transport layer/light emitting layer/charge injection layer/cathode
j) anode/charge injection layer/hole transport layer/light emitting layer/charge injection layer/cathode
k) anode/charge injection layer/light emitting layer/charge transport layer/cathode
l) anode/light emitting layer/electron transport layer/charge injection layer/cathode
m) anode/charge injection layer/light emitting layer/electron transport layer/charge injection layer/cathode
n) anode/charge injection layer/hole transport layer/light emitting layer/charge transport layer/cathode
o) anode/hole transport layer/light emitting layer/electron transport layer/charge injection layer/cathode
p) anode/charge injection layer/hole transport layer/light emitting layer/electron transport layer/charge injection layer/cathode.

Examples of the charge injection layer include a layer including a conducting polymer, a layer provided between the anode and the hole transport layer and including a material having an ionization potential of a medium value between ionization potentials of an anode material and a hole transport material included in the hole transport layer, and a layer provided between the cathode and the electron transport layer and including a material having an electron affinity of a medium value between electron affinities of a cathode material and an electron transport material included in the electron transport layer.

If the charge injection layer is a layer including a conducting polymer, the electric conductivity of the conducting polymer is preferably $10^{-5}$ S/cm to $10^3$ S/cm, and is more preferably $10^{-5}$ S/cm to $10^2$ S/cm, and still more preferably $10^{-5}$ S/cm to $10^1$ S/cm for reducing a leak current between light emitting pixels. For satisfying such a range, the conducting polymer may be doped with an appropriate amount of ions.

The types of ions to be doped are an anion for the hole injection layer and a cation for the electron injection layer. Examples of the anion include a polystyrenesulfonic acid ion, an alkylbenzenesulfonic acid ion, and a camphorsulfonic acid ion, and examples of the cation include a lithium ion, a sodium ion, a potassium ion, and a tetrabutyl ammonium ion.

Film thickness of the charge injection layer is, for example, 1 to 100 nm, preferably 2 to 50 nm.

The material to be used for the charge injection layer may be appropriately selected in relation to the electrode and a material of an adjacent layer, and examples thereof include polyaniline and derivatives thereof, polythiophene and derivatives thereof, polypyrrole and derivatives thereof, polyphenylene vinylene and derivatives thereof, polythienylene vinylene and derivatives thereof, polyquinoline and derivatives thereof, polyquinoxaline and derivatives thereof, conducting polymers such as polymers having an aromatic amine structure in the main chain or side chain, metal phthalocyanines (e.g., copper phthalocyanine), and carbon.

The insulating layer has a function of facilitating charge injection. Average thickness of the insulating layer is normally 0.1 to 20 nm, preferably 0.5 to 10 nm, more preferably 1 to 5 nm.

Examples of a material used for the insulating layer include metal fluorides, metal oxides, and organic insulating materials.

Constitutions of the organic EL device provided with an insulating layer include the following constitutions q) to ab).
q) anode/insulating layer/light emitting layer/cathode
r) anode/light emitting layer/insulating layer/cathode
s) anode/insulating layer/light emitting layer/insulating layer/cathode
t) anode/insulating layer/hole transport layer/light emitting layer/cathode
u) anode/hole transport layer/light emitting layer/insulating layer/cathode
v) anode/insulating layer/hole transport layer/light emitting layer/insulating layer/cathode
w) anode/insulating layer/light emitting layer/electron transport layer/cathode
x) anode/light emitting layer/electron transport layer/insulating layer/cathode
y) anode/insulating layer/light emitting layer/electron transport layer/insulating layer/cathode
z) anode/insulating layer/hole transport layer/light emitting layer/electron transport layer/cathode
aa) anode/hole transport layer/light emitting layer/electron transport layer/insulating layer/cathode
ab) anode/insulating layer/hole transport layer/light emitting layer/electron transport layer/insulating layer/cathode The substrate to form the organic EL device may be any substrate as long as it does not chemically decompose when an electrode and an organic layer are formed, and examples thereof include substrates of glass, plastic, polymer films, and silicon. In the case of a nontransparent substrate, an electrode closer to the substrate and an opposite electrode are preferably transparent or semitransparent.

In the present embodiment, normally at least one of electrodes including an anode and a cathode is transparent or semitransparent, and preferably the electrode at the anode side is transparent or semitransparent.

As a material of the anode, an conducting metal oxide film, a semitransparent metal film or the like is used, and specifically a film prepared using a conducting inorganic compound including indium oxide, zinc oxide, tin oxide, or indium/tin/oxide (ITO), indium/zinc/oxide and the like that are a complex thereof, NESA, gold, platinum, silver, copper or the like is used. Also, an organic transparent conducting film of polyaniline and a derivative thereof, polythiophene and a derivative thereof, or the like may be used as an anode. Also, a layer made of a phthalocyanine derivative, a conducting polymer, carbon or the like, or a layer made of a metal oxide, a metal fluoride, an organic insulating material or the like may be provided on the anode for facilitating charge injection.

Examples of a method for preparing an anode include a vacuum deposition method, a sputtering method, an ion plating method, and a plating method.

Film thickness of the anode may be selected as appropriate in consideration of light transmittance and electric conductivity, but is normally 10 nm to 10 μm, preferably 20 nm to 1 μm, and still more preferably 40 nm to 500 nm.

As a material of the cathode, a material having a small work function is preferable, and a metal such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium or the like, an alloy of two or more of these metals, an alloy of one or more of these metals with one or more of gold, silver, platinum, copper, manganese, titanium, cobalt, nickel, tungsten and tin, or graphite, a graphite intercalation compound or the like is used.

As a method for preparing a cathode, a vacuum deposition method, a sputtering method, a lamination method by thermocompression of a metal film, or the like is used.

Film thickness of the cathode may be selected as appropriate in consideration of electric conductivity and durability, but is normally 10 nm to 10 μm, preferably 20 nm to 1 μm, and still more preferably 50 nm to 500 nm.

Also, a layer made of a conducting polymer or a layer made of a metal oxide, a metal fluoride, an organic insulating material or the like may be provided between the cathode and the light emitting layer or the cathode and the electron transport layer, or a protective layer for protecting the organic EL device may be mounted after preparation of the cathode. For using the organic EL device with stability for a long time period, a protective layer and/or a protective cover are preferably mounted for protecting the organic EL device from outside.

As the protective layer, a resin, a metal oxide, a metal fluoride, a metal boride or the like may be used. As the protective cover, a glass plate, a plastic plate with the surface subjected to a water permeability reducing treatment, or the like may be used, and a method is suitably used in which the protective cover is laminated with a device substrate by a thermosetting resin or a photocurable resin to perform sealing. If a space is maintained using a spacer, the device is easily prevented from being scratched. If an inert gas such as nitrogen, argon or the like is filled in the space, oxidation of the cathode can be prevented, and further by placing a drying agent such as barium oxide or the like in the space, moisture adsorbed in a manufacturing step is easily inhibited from damaging the device.

An organic EL device which has an organic layer obtained by using the composition of the present embodiment or an organic layer containing the block type copolymer is useful for, for example, a surface light sources (e.g., lighting) such as a curved surface light source, and a flat light source; display devices such as a segment display device, a dot matrix display device (e.g., a dot matrix flat display), a liquid crystal display device (e.g., a liquid crystal display device, backlight of a liquid crystal display). In addition, the composition and/or block type copolymer according to the present embodiment is not only suitable as a material for use in production of the above-mentioned articles, but also useful, for example, as a pigment for a laser, a material for an organic solar battery, an organic semiconductor for an organic transistor, a material for a conductive film such as an electrically conductive film or an organic semiconductor film, a light emitting film material emitting fluorescence, a material of a polymer electric field effect transistor.

If a light emitting layer having the composition according to the present embodiment is used or a light emitting layer containing the block type copolymer is used as a part of white lighting, a light emitting material with a color other than blue may be contained in the light emitting layer, or a second light emitting layer having a light emitting material with a color other than blue may be included for obtaining white color purity.

For obtaining planar light emission using the organic EL device which has an organic layer containing the composition and/or the block type copolymer according to the present embodiment, a planar anode and cathode may be arranged so that they are superimposed on each other. For obtaining patterned light emission, there are a method in which a mask provided with a patterned window is placed on the surface of the planar organic EL device and a method in which either one of an anode and a cathode, or both the electrodes are formed in a patterned form. A pattern is formed by either of these methods, and some electrodes are arranged so that they can be independently turned ON/OFF, to thereby obtain a segment type display device that can display numbers, characters, simple symbols and the like. Further, for forming a dot matrix display device, both an anode and a cathode may be formed in a striped form and placed so that they are orthogonal to each other. Partial color display and multi-color display can be provided by a method of painting in different colors multi kinds of polymer compounds with different luminescent colors or a method of using a color filter or a fluorescence conversion filter. The dot matrix display device can be passively driven, or may be actively driven in combination with a TFT or the like. These display devices can be used, for example, as computers, televisions, portable terminals, mobile phones, car navigations, and view finders of video cameras.

EXAMPLES

Herein below, the present invention will be described more specifically based on examples and comparative examples, but the present invention is not in any way limited to the following examples.

Number Average Molecular Weight and Weight Average Molecular Weight

The polystyrene-equivalent number average molecular weight and weight average molecular weight were determined by gel permeation chromatography (GPC, manufactured by Shimadzu Corporation, trade name: LC-10 Avp). A compound to be measured was dissolved in tetrahydrofuran so as to have a concentration of about 0.5% by mass, and the solution was injected into GPC in an amount of 30 µl. Tetrahydrofuran was used for a mobile phase of GPC, and was allowed to flow at a flow rate of 0.6 mL/minute. For a column, two pieces of TSKgel Super HM-H (manufactured by TOSOH CORPORATION) and a piece of TSKgel SuperH 2000 (manufactured by TOSOH CORPORATION) connected in series were used. For a detector, a differential refractive index detector (manufactured by Shimadzu Corporation, trade name: RID-10A) was used.

NMR Measurement

The NMR measurement of the compounds was carried out under the following conditions.

Apparatus: nuclear magnetic resonance apparatus, INOVA 300 (trade name), manufactured by Varian Medical Systems Inc.

Measurement solvent: deuterated chloroform or deuterated tetrahydrofuran

Concentration of sample: about 1% by mass

Measurement temperature: 25° C.

LC-MS Measurement

LC-MS measurement was performed according to the following method. The measurement sample was dissolved in chloroform or tetrahydrofuran to have concentration of about 2 mg/mL, and then 1 µL was injected to LC-MS (trade name: 1100LCMSD, manufactured by Agilent Technologies). As a mobile phase for LC-MS, ion exchange water, acetonitrile, tetrahydrofuran, or a mixture liquid thereof was used, and acetic acid was added, if necessary. As a column, L-column 2 ODS (3 µm) (manufactured by Chemicals Evaluation and Research Institute, inner diameter: 2.1 mm, length: 100 mm, particle diameter: 3 µm) was used.

Synthesis of Compounds Used for Polymerization

Synthesis Example 1

Synthesis of Compound 3A

Gas within a four neck flask was replaced with nitrogen and 16.5 parts by mass of 2,7-dibromofluorenone were suspended in diphenyl ether contained in the flask. The suspension was heated to 120° C. to dissolve 2,7-dibromofluorenone, 15.5 parts by mass of potassium hydroxide were added to the solution, and after raising the temperature to 160° C., it was stirred for 2.5 hours. The solution was cooled to the room temperature, then added with hexane, filtered, and the resulting solid matter was washed with hexane. Gas within a four neck flask was replaced with nitrogen and the product obtained from above was dissolved in dehydrated N,N-dimethylformamide (hereinafter, referred to as "DMF") contained in the flask. The obtained solution was heated to 90° C., and then total amount of 53.0 parts by mass of methyl iodide was added thereto while following the reaction. The reaction time was 10 hours in total. The solution cooled to the room temperature was added dropwise to water which has been cooled to 0° C., and the reaction product was extracted twice with hexane. The resulting solution was filtered through a glass filter overlaid with silica gel, and the filtered solution was concentrated. The concentrate was purified by silica gel column chromatography to obtain the compound 1A in an amount of 13.3 parts by mass.

$^1$H-NMR (300 MHz/CDCl$_3$):

δ(ppm)=3.68 (s, 3H), 7.15 (d, 2H), 7.20 (d, 1H), 7.52 (d, 2H), 7.65 (d, 1H), 8.00 (brs, 1H).

$^{13}$C-NMR (300 MHz/CDCl$_3$):

δ(ppm)=52.6, 121.8, 122.2, 130.1, 131.6, 132.3, 132.4, 133.2, 134.7, 139.4, 140.6, 167.8.

[Chemical Formula 35]

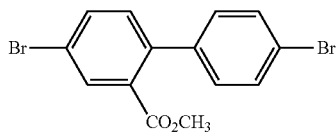

Compound 1A

To a three neck round-bottomed flask, 7.5 parts by mass of 1-bromo-4-n-hexylbenzene and anhydrous tetrahydrofuran were added and cooled to −78° C. Thereafter, 1.6 M n-butyl lithium/hexane solution (1 mol equivalent to 1-bromo-4-n-hexylbenzene) was added slowly and stirred for 2 hours at −78° C. While maintaining the temperature, 4.95 parts by mass of the compound 1A were dissolved in anhydrous tetrahydrofuran and, the solution was added dropwise by using a dropping funnel while the temperature is maintained at −70° C. or less. After the dropwise addition was completed, the mixture was stirred for 2 hours at −78° C. and slowly warmed to the room temperature. To the resulting solution, 500 mL of saturated aqueous solution of ammonium chloride was added and stirred. After transferring to a separatory funnel, the aqueous layer was removed. The resulting organic layer was washed twice with water and dried by adding anhydrous sodium sulfate. To a glass filter overlaid with silica gel layer, the dried organic layer was applied and then filtered, and the eluent was washed with tetrahydrofuran. The resulting solution was concentrated and dried. Subsequently, it was suspended in 300 mL of hexane, stirred, and filtered to obtain the compound 2A in an amount of 6.0 parts by mass.

[Chemical Formula 36]

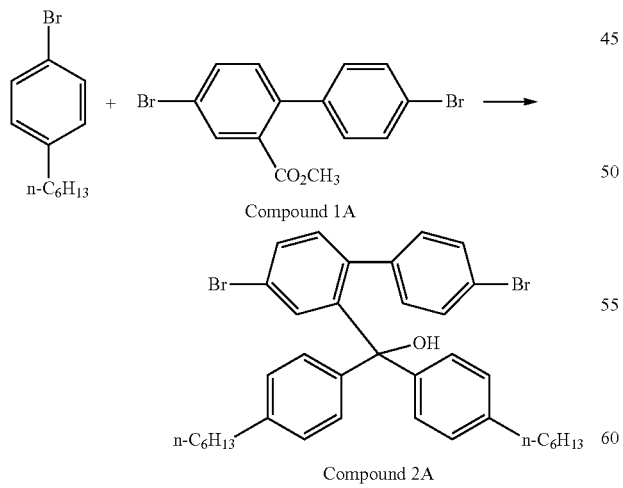

Compound 1A

Compound 2A

To a three neck round-bottomed flask, the compound 2A (6.0 parts by mass) and dichloromethane were added and cooled to 0° C. by using an ice bath. To the resulting solution, boron trifluoride diethyl ether complex (27 parts by mass) was added dropwise by using a dropping funnel. The solution was stirred for 2 hours at 0° C., and then the solution was added to a beaker containing water and ice to terminate the reaction. The reaction solution was transferred to a separatory funnel for liquid separation. After extraction with dichloromethane, the organic layer was combined, washed twice with water, and dried by adding anhydrous sodium sulfate. To a glass filter overlaid with silica gel layer, the sodium sulfate was filtered off and the filtered solution was concentrated. The resulting oily material was added with toluene and refluxed under heating. After cooling to 70° C., isopropyl alcohol was added, stirred, and then the mixture was kept at the room temperature for cooling. The produced crystals were filtered and dried. The obtained crystals were added to an eggplant flask, additionally added with hexane and activated carbon, and refluxed for 2 hours under heating. A glass filter overlaid with Celite on top of Radiolite (manufactured by Showa Chemical Industry Co., Ltd.) was heated to 70° C. and then the activated carbon was removed by filtering using the glass filter. The obtained filtered solution was concentrated to half volume, refluxed under heating, and stirred at the room temperature for 1 hour. The reaction solution was again stirred for 2 hours under cooling by using an ice bath, and the crystals produced were filtered and collected. As a result, the compound 3A as a target compound was obtained in an amount of 5.4 parts by mass.

$^1$H-NMR (300 MHz/CDCl$_3$):

δ(ppm)=0.87 (t, 6H), 1.28~1.37 (m, 12H), 1.50~1.62 (m, 4H), 2.54 (t, 4H), 7.04 (s, 8H), 7.45 (d, 2H), 7.49 (s, 2H), 7.55 (d, 2H).

$^{13}$C-NMR (300 MHz/CDCl$_3$):

δ(ppm)=14.4, 22.9, 29.4, 31.6, 32.0, 35.8, 65.4, 121.8, 122.1, 128.1, 128.7, 129.7, 131.1, 138.3, 141.9, 142.1, 153.7.

[Chemical Formula 37]

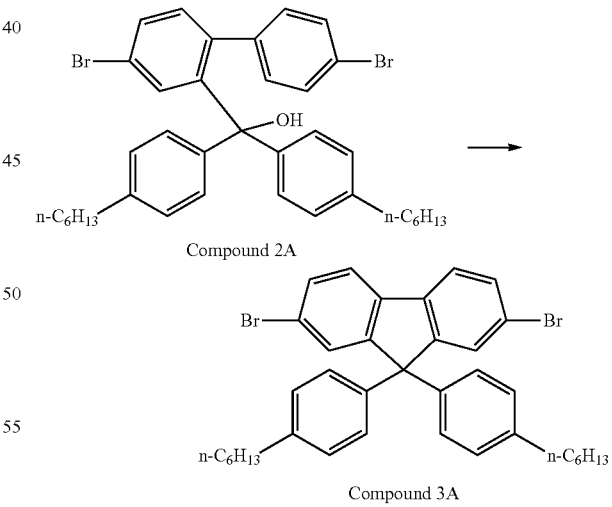

Compound 2A

Compound 3A

Synthesis Example 2

Synthesis of Compound 4A

Under inert gas atmosphere, to a solution consisting of the compound 3A (6.1 parts by mass) and anhydrous tetrahydrofuran, 2.5 M n-butyl lithium/hexane solution (2.5 mol equivalents compared to the compound 3A) were added dropwise at the temperature of −78 to −70° C., and further stirred for 6 hours. Subsequently, at the temperature of −70° C. or less, the compound 5A (isopropyl pinacol borate) (5.2 parts by mass) was added dropwise and stirred overnight at the room temperature. To the reaction mixture, hydrochloric acid-diethyl ether solution was added dropwise at −30° C. After dropwise addition was completed, the temperature of the reaction solution was brought back to the room temperature, and the mixture was concentrated under reduced pressure and stirred after adding toluene. The reaction solution was filtered through a filter overlaid with silica gel and the obtained filtered solution was concentrated under reduced pressure to obtain a solid. The resulting solid was re-crystallized by using acetonitrile and toluene. As a result, the compound 4A as a target compound was obtained in an amount of 4.5 parts by mass.

[Chemical Formula 38]

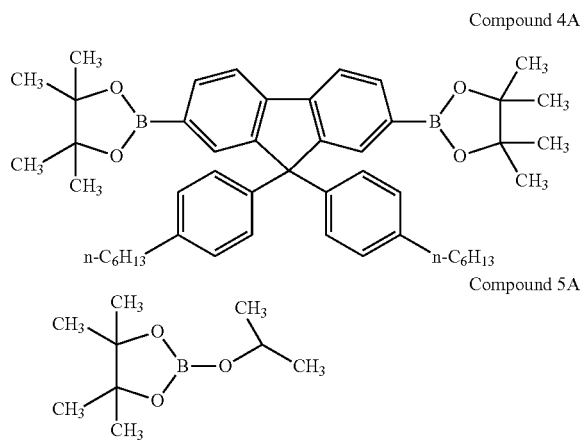

Compound 4A

Compound 5A

Synthesis Example 3

Synthesis of Compound 2B

Under argon atmosphere, 1-bromo-3,5-di-n-hexylbenzene (20.0 parts by mass) and tetrahydrofuran were added to a reaction vessel to prepare a homogeneous solution, which was then cooled to −69° C. Thereafter, 2.76 M n-butyl lithium/hexane solution (1 mol equivalent compared to 1-bromo-3,5-di-n-hexylbenzene) was added dropwise for 1.5 hours at −68° C. and stirred for 1.5 hours at −70° C. Subsequently, a solution consisting of the compound 1B-1 (9.0 parts by mass) and tetrahydrofuran were added dropwise thereto for 1 hour at −70° C. and stirred for 2 hours at −70° C. To the solution, methanol and distilled water were added at −70° C. and stirred. After warming to the room temperature, it was stirred overnight at the room temperature. Subsequently, the reaction mixture was filtered, and the filtered solution was concentrated and stirred after adding heptane and water. After maintaining for a while for liquid separation, the aqueous layer was removed from the organic layer. Saturated brine was added to the organic layer followed by stirring. After maintaining for a while for liquid separation, the aqueous layer was removed from the organic layer. The organic layer was then added with magnesium sulfate and stirred. The filtered solution obtained by filtering was concentrated to obtain the compound 1B in an amount of 23.4 parts by mass.

[Chemical Formula 39]

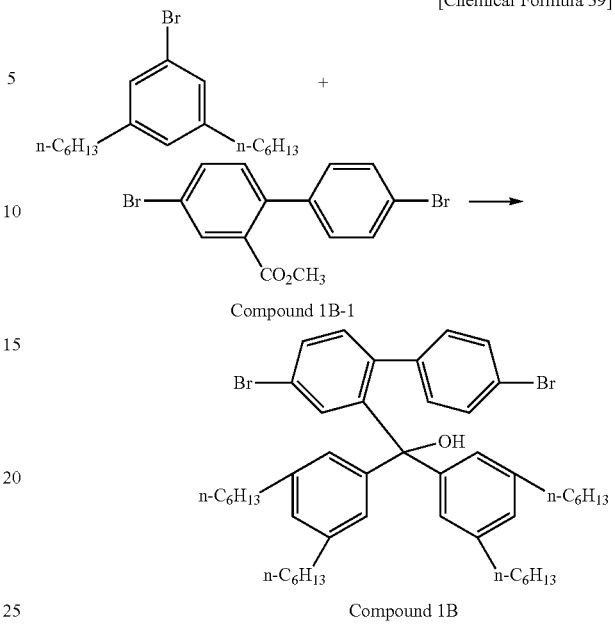

Compound 1B-1

Compound 1B

Under argon atmosphere, the compound 1B (48.0 parts by mass) and dichloromethane were added to a reaction vessel to prepare a homogeneous solution, which was then cooled to −30° C. To the solution, boron trifluoride diethyl ether complex (1 mol equivalent compared to the compound 1B) was added dropwise over 30 minutes and stirred overnight at the room temperature. The reaction mixture was then cooled to −20° C., added with distilled water and stirred for 1 hour. After maintaining for a while for liquid separation, the aqueous layer was removed from the organic layer. Subsequently, water was added and stirred. After maintaining for a while for liquid separation, the aqueous layer was removed from the organic layer. 10% by mass of aqueous solution of sodium hydrogen carbonate was added to the resulting organic layer followed by stirring. After maintaining for a while for liquid separation, the aqueous layer was removed from the organic layer. The organic layer was then concentrated to remove the solvent. Subsequently, the resultant was purified by silica gel column chromatography by using toluene and heptane as a developing solvent. The solvent was then removed by concentration. Thereafter, according to re-crystallization using butyl acetate and methanol, the compound 2B as a target compound was obtained in an amount of 23.2 parts by mass.

[Chemical Formula 40]

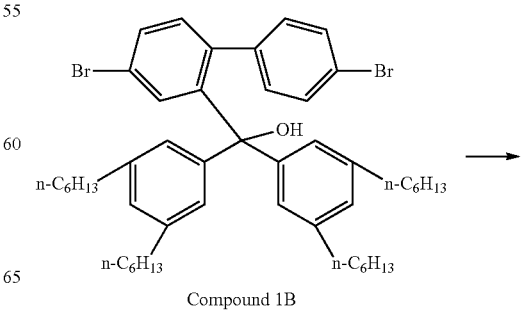

Compound 1B

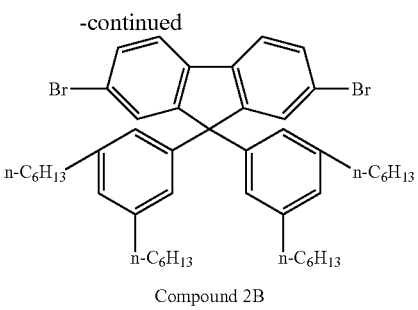

Compound 2B

Synthesis Example 4

Synthesis of Compound 3B

Under argon atmosphere, the compound 2B (9.5 parts by mass), the compound 3B-1 (6.6 parts by mass), 1,4-dioxane, potassium acetate (7.05 parts by mass), 1,1'-bis(diphenylphosphino)ferrocene (dppf, 0.1 parts by mass) and 1,1'-bis(diphenylphosphino)ferrocene palladium (II) dichloride methylene chloride complex ($PdCl_2(dppf) \cdot CH_2Cl_2$, 0.15 parts by mass) were added to a 2 L four neck flask, and stirred for 5 hours at 100 to 102° C. After cooling the obtained reaction mixture to the room temperature, it was filtered through a filter overlaid with Celite and silica gel, and the filtered solution was concentrated to remove the solvent. Subsequently, to a solution prepared by adding hexane, activated carbon was added and stirred for 1 hour at the temperature which allows reflux of hexane. The resulting mixture was cooled to the room temperature, filtered through a filter overlaid with Celite, and concentrated to remove the solvent. Thereafter, according to re-crystallization using toluene and acetonitrile, the compound 3B as a target compound was obtained in an amount of 10.1 parts by mass.

[Chemical Formula 41]

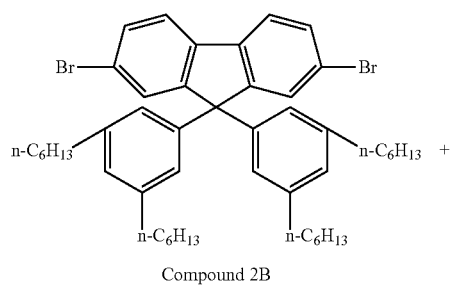

Compound 2B

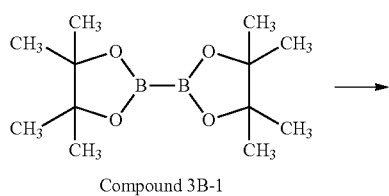

Compound 3B-1

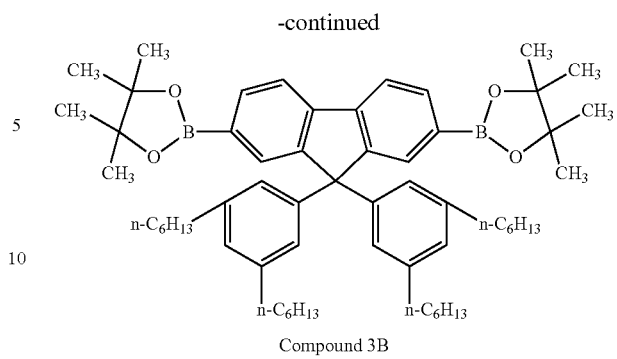

Compound 3B

Synthesis Example 5

Synthesis of Compound 2C

Under inert atmosphere, 3-n-hexyl-5-methylbromobenzene (26.2 parts by mass) and anhydrous tetrahydrofuran were added to a three neck flask to prepare a homogeneous solution, which was then cooled to −70° C. To the resulting solution, 2.5 M n-butyl lithium/hexane solution (0.93 mol equivalents compared to 3-n-hexyl-5-methylbromobenzene) was added dropwise while maintaining the temperature at −70° C. and stirred for 4 hours at the same temperature to prepare a solution (hereinafter, referred to as "solution A").

Separately, 2-methoxycarbonyl-4,4'-dibromobiphenyl (16.0 parts by mass) and anhydrous tetrahydrofuran were added to a two neck flask to prepare a solution (hereinafter, referred to as "solution B").

The solution B was added dropwise to the solution A while maintaining the temperature of the solution A at −70° C. followed by stirring. Subsequently, the reaction solution was stirred for 15 hours at the room temperature. The reaction solution was then added with water at 0° C. and stirred. Subsequently, the obtained mixture liquid was concentrated under reduced pressure to remove the solvent by distillation. The residuals were added with hexane and water, stirred, and kept to obtain an organic layer after removing an aqueous layer. The organic layer was washed with saturated brine, dried over anhydrous magnesium sulfate, and concentrated under reduced pressure to obtain the compound 1C represented by the following formula as a white solid.

[Chemical Formula 42]

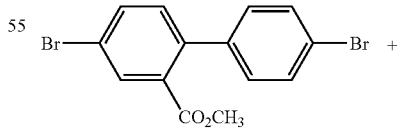

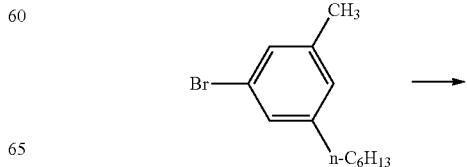

-continued

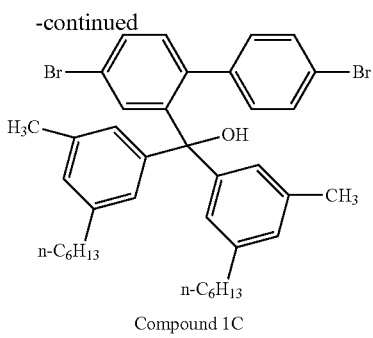

Compound 1C

Under inert atmosphere, the compound 1C (30.0 parts by mass) and anhydrous dichloromethane were added to three neck flask and then cooled to 5° C. To the resulting solution, boron trifluoride diethyl ether complex (4.2 mol equivalents compared to the compound 1C) was added dropwise while maintaining the temperature in the range of 0 to 5° C. and stirred overnight at the room temperature. The reaction solution was carefully poured over ice water and stirred for 30 minutes. After maintaining for a while for liquid separation, the aqueous layer was removed from the organic layer. 10% by mass of aqueous solution of potassium phosphate was added to the organic layer followed by stirring for 2 hours. After maintaining for a while, the formed aqueous layer was removed from the organic layer. The organic layer was then washed with water, dried over anhydrous magnesium sulfate, and concentrated to remove the solvent by distillation, and oily liquid was obtained. Methanol was added to the oily liquid to give a solid. The solid was re-crystallized from n-butyl acetate and methanol, and as a result, the compound 2C represented by the following formula was obtained in an amount of 24.0 parts by mass.

[Chemical Formula 43]

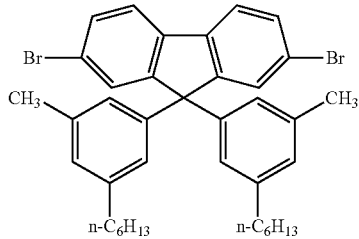

Compound 2C

Synthesis Example 6

Synthesis of Compound 3C

To a three neck flask, the compound 2C (8.0 parts by mass) synthesized in the Synthesis Example 5, bis(pinacolate)diborone (6.6 parts by mass), 1,1'-bis(diphenylphosphino)ferrocene palladium (II) dichloride methylene chloride complex (Pd(dppf).CH$_2$Cl$_2$, 0.15 parts by mass), 1,1'-bis(diphenylphosphino)ferrocene (0.099 parts by mass), and anhydrous 1,4-dioxane and potassium acetate (7.0 parts by mass) were added and stirred at 100° C. for 20 hours. The reaction solution was cooled to the room temperature, passed through silica gel, and the silica gel was washed with toluene and the obtained solution was concentrated for removing the solvent by distillation, yielding brown liquid. The resulting liquid was purified by silica gel column chromatography by using hexane as a developing solvent. To the liquid obtained by concentrating the eluent, acetonitrile was added to obtain a solid. Re-crystallization of solid was performed once by using acetonitrile and toluene, and then re-crystallization of solid was performed once by using dichloromethane and methanol. After drying under reduced pressure, the compound 3C represented by the following formula was obtained in an amount of 2.9 parts by mass.

[Chemical Formula 44]

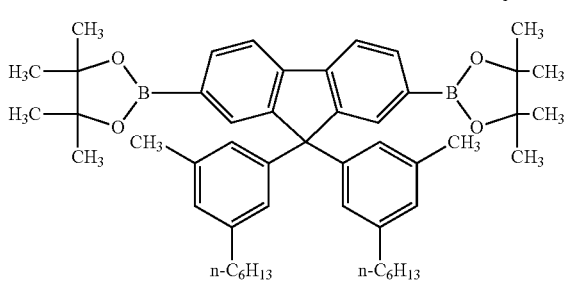

Compound 3C

Synthesis Example 7

Synthesis of Compound 2D

Gas within a three neck flask was replaced with nitrogen and 22.6 parts by mass of 1-bromo-3-n-hexylbenzene were dissolved in anhydrous tetrahydrofuran in the three neck flask. The resulting solution was cooled to −75° C. or lower, added dropwise with 2.5 M n-butyl lithium/hexane solution (0.96 mol equivalents compared to 1-bromo-3-n-hexylbenzene), and stirred for 5 hours while maintaining at −75° C. or lower. A solution in which 15.0 parts by mass of 2-methoxycarbonyl-4,4'-dibromobiphenyl are dissolved in anhydrous tetrahydrofuran was added dropwise thereto while maintaining the temperature at −70° C. or lower. The solution was slowly warmed to the room temperature and stirred overnight. The reaction solution was added dropwise with water while stirring at 0° C. The solvent was removed from the reaction solution by distillation, and the residues were added with water and extracted three times with hexane. The resulting organic layer was combined, washed with saturated brine, and the aqueous layer was re-extracted with hexane. The obtained organic layer was combined and dried over magnesium sulfate. As a result of removing the solvent from the dried organic layer, a crude product of the compound 1D was obtained in an amount of 26.4 parts by mass.

[Chemical Formula 45]

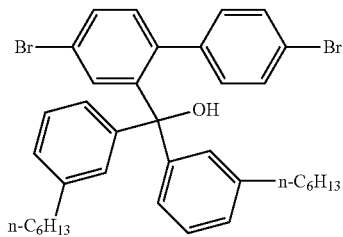

Compound 1D

The compound 1D (26.4 parts by mass) synthesized above were dissolved in dichloromethane in a three neck flask, and the gas within the flask was replaced with nitrogen. The resulting solution was cooled to 0° C. or lower and boron trifluoride diethyl ether complex (5 mol equivalents compared to the compound 1D) was added dropwise while maintaining the temperature at 5° C. or lower. After slowly raising to the room temperature, the mixture was stirred overnight. The reaction solution was poured over ice water and stirred for 30 minutes. After liquid separation on the reaction solution, the aqueous layer was extracted with dichloromethane. The organic layer was combined, and liquid separation was performed by adding 10% by mass of aqueous solution of potassium phosphate. The organic layer was washed twice with water and dried over magnesium sulfate. The solvent was removed from the dried organic layer by distillation, and the resulting oil was dissolved in toluene and filtered by passing through a glass filter overlaid with silica gel. The solvent was removed from the filtered solution by distillation, added with methanol, and vigorously stirred. The resulting crystals were filtered and washed with methanol. The washed crystals were re-crystallized using a mixture solvent of hexane and butyl acetate, and as a result, the compound 2D was obtained in an amount of 12.1 parts by mass.

$^1$H-NMR (300 MHz, CDCl$_3$):

δ(ppm)=0.86 (6H, t), 1.26 (12H, m), 1.52 (4H, m), 2.51 (4H, t), 6.87 (2H, d), 7.00 (2H, s), 7.04 (2H, d), 7.12 (2H, t), 7.46 (2H, dd), 7.48 (2H, d), 7.55 (2H, d).

[Chemical Formula 46]

Compound 2D

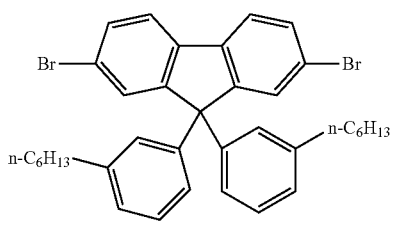

Synthesis Example 8

Synthesis of Compound 3D

The compound 2D (5.0 parts by mass) was added to a three neck flask, and the gas within the flask was replaced with nitrogen. Anhydrous tetrahydrofuran was added thereto, and cooled to −70° C. or lower. While maintaining the obtained solution at −70° C. or lower, 2.5 M n-butyl lithium/hexane solution (2.2 mol equivalents compared to the compound 2D) was added dropwise thereto. After the dropwise addition was completed, stirring was conducted for 4 hours while maintaining the temperature of the reaction solution. Then, 2-isopropoxy-4,4,5,5-tetramethyl-1,3,2-dioxaborolane (2.8 mol equivalents compared to the compound 2D) was added thereto. After slowly raising to the room temperature, the mixture was stirred overnight. The reaction solution was cooled to −30° C., added dropwise with 2 M hydrochloric acid/diethyl ether solution, and heated to the room temperature. After the solvent was removed therefrom by distillation, toluene was added to dissolve it, and it was filtered by passing through a glass filter overlaid with silica gel. The solvent in the obtained solution was removed by distillation to give a crude product in an amount of 5.0 parts by mass. The crude product was re-crystallized by using a mixture solvent of toluene and acetonitrile under nitrogen atmosphere to give the compound 3D in an amount of 3.4 parts by mass.

$^1$H-NMR (300 MHz, CDCl$_3$):

δ(ppm)=0.86 (6H, t), 1.26-1.29 (12H, m), 1.31 (24H, s), 1.52-1.53 (4H, m), 2.50 (4H, t), 6.92 (2H, d), 7.00 (2H, d), 7.08 (2H, t), 7.13 (2H, s), 7.77 (2H, d), 7.81-7.82 (4H, m).

[Chemical Formula 47]

Compound 3D

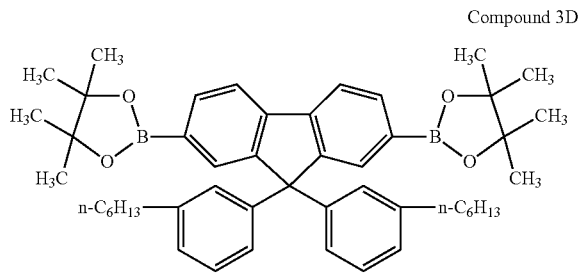

Synthesis Example 9

Synthesis of Compound 1E

To a solution prepared by adding chloroform to pyrene (8.8 parts by mass), a solution consisting of bromine (13.4 parts by mass) and chloroform was added dropwise over 7 hours at 20 to 25° C., and further stirred for 3 hours at 20 to 25° C. After the reaction solution was kept for three hours at 20 to 25° C., the precipitated solid was filtered, washed with chloroform, and dried under reduced pressure to obtain 9.7 parts by mass of solid A. Subsequently, the solid A (4.0 parts by mass) was added with toluene and stirred for 1 hour at 30 to 35° C., and kept at 5° C. for 18 hours. The precipitated solid was filtered, washed with methanol, and dried under reduced pressure. As a result, the compound 1E as a target compound was obtained in an amount of 2.66 parts by mass.

LC-MS (APPI-MS (posi)): 358 [M]$^+$

[Chemical Formula 48]

Compound 1E

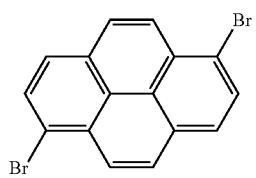

Synthesis Example 10

Synthesis of Compound 4F

To a three neck flask, 9.6 parts by mass of 3,5-dibromophenol, 30.9 parts by mass of 3,5-bis(4-tert-butylphenyl) phenylboronic acid (synthesized according to the method described in Japanese Patent Application Laid-Open Publication No. 2005-82730), and 95.0 parts by mass (20% by mass aqueous solution) of tetraethyl ammonium hydroxide were added and the gas within the flask was replaced with nitrogen. Toluene and 0.15 parts by mass of dichlorobis(triphenylphosphine) palladium were added thereto and it was heated for 8 hours at 100° C. After that, by cooling the mixture liquid, crystals were precipitated. The crystals were dissolved by adding chloroform to give a solution, which was then acidified by adding 1 N hydrochloric acid followed by liquid separation. The obtained aqueous layer was extracted with chloroform and the chloroform after extraction was combined with an organic layer, and washed with water and saturated brine in order. The organic layer after washing was filtered by passing through a glass filter overlaid with silica gel. Thereafter, the solvent was removed by distillation to obtain a crude product in an amount of 41.8 parts by mass. Hexane was added thereto, temperature was raised to the reflux temperature followed by cooling slowly to the room temperature. After filtering and washing the precipitates with hexane, the compound 1F represented by the following formula was obtained in an amount of 28.0 parts by mass.

LC-MS (APPI-MS, posi) 775 ([M+H]$^+$, exact mass=774)

$^1$H-NMR (300 MHz, CDCl$_3$):

δ(ppm)=1.35 (36H, s), 5.19 (1H, s), 7.15 (s, 2H), 7.47 (d, 8H), 7.59 (s, 1H), 7.60 (d, 8H), 7.78 (s, 6H).

$^{13}$C-NMR (300 MHz, CDCl$_3$):

δ(ppm)=31.8, 34.9, 113.9, 119.6, 125.2, 125.7, 126.2, 127.4, 138.6, 142.1, 142.6, 144.0, 150.9, 156.6.

[Chemical Formula 49]

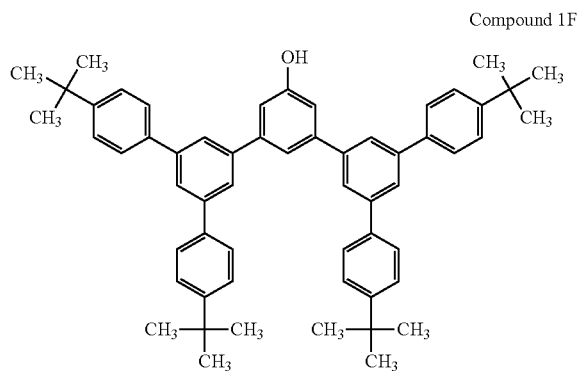

Compound 1F

Gas within a four neck flask was replaced with nitrogen, and 28.0 parts by mass of the compound 1F and 13.0 parts by mass of N,N-dimethyl-4-aminopyridine were dissolved in anhydrous dichloromethane in the four neck flask followed by cooling to 0° C. Then, 25.0 parts by mass of anhydrous trifluoromethane sulfonic acid was added dropwise thereto over 30 minutes. After stirring for 20 minutes, a cool bath was removed and the stirring was continued for 1.5 hours. The resulting mixture liquid was filtered through a glass filter overlaid with silica gel, and washed with toluene. The solvent was removed from the mixture liquid by distillation. As a result, the compound 2F was obtained in an amount of 28.9 parts by mass.

LC-MS (ESI-MS, positive) 945 ([M+K]$^+$, exact mass=906)

$^1$H-NMR (300 MHz, CDCl$_3$):

δ(ppm)=1.38 (36H, s), 7.52 (8H, d), 7.57 (2H, s), 7.64 (8H, d), 7.77 (4H, s), 7.85 (2H, s), 7.97 (1H, s).

$^{13}$C-NMR (300 MHz, CDCl$_3$):

δ(ppm)=31.7, 34.9, 119.3.

[Chemical Formula 50]

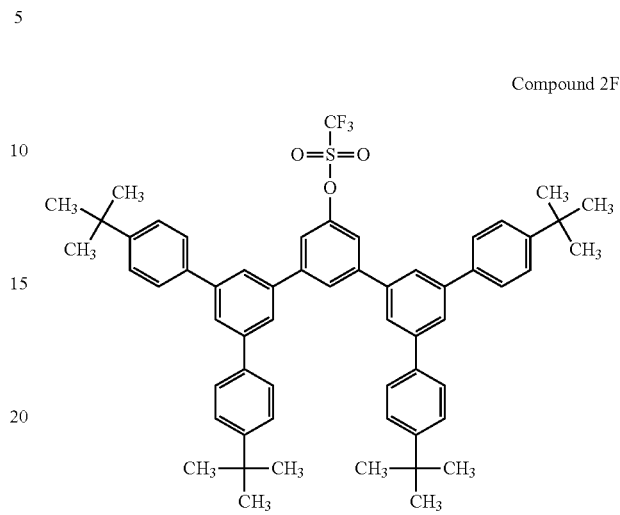

Compound 2F

Gas within a four neck flask was replaced with nitrogen, and 6.1 parts by mass of phenoxazine was added thereto and dissolved in anhydrous toluene. 0.71 parts by mass of tris(dibenzylidene acetone)dipalladium, 0.86 parts by mass of 1,1'-bis(diphenylphosphino)ferrocene, and 15.2 parts by mass of cesium carbonate were added and heated to 110° C. A solution in which 28.9 parts by mass of the compound 2F is dissolved in anhydrous toluene purged with nitrogen was added dropwise thereto over one hour. After stirring for 20 hours, the obtained mixture was hot-filtered through a glass filter overlaid with silica gel and washed with toluene. When the solvent was removed from the mixture liquid by distillation, a crude produce was obtained in an amount of 33.0 parts by mass. The crude product was dissolved in toluene and the obtained solution was added dropwise to 1 L of methanol and reprecipitated. The resulting solution was filtered and washed with methanol to give a crude product of 50.0 parts by mass. Toluene was added thereto, dissolved by heating, and added dropwise with ethanol for re-crystallization. The resulting product was filtered and washed with ethanol to obtain 24.8 parts by mass of the product. The product was re-crystallized by using a mixture solvent of toluene and ethanol. As a result, the compound 3F represented by the following formula was obtained in an amount of 16.6 parts by mass.

LC-MS (APCI, positive) 940 ([M+H]$^+$, exact mass=939)

$^1$H-NMR (300 MHz, CDCl$_3$):

δ(ppm)=1.37 (36H, s), 6.13-6.16 (2H, m), 6.62-6.71 (6H, m), 7.50 (8H, d), 7.64 (8H, d), 7.72 (2H, s), 7.83 (6H, s), 8.11 (1H, s).

$^{13}$C-NMR (300 MHz, CDCl$_3$):

δ(ppm)=31.7, 34.9, 113.7, 115.8, 121.7, 123.7, 125.0, 126.0, 126.1, 126.3, 127.4, 128.8, 134.6, 138.4, 140.4, 141.1, 142.8, 144.3, 145.3, 151.0.

[Chemical Formula 51]

Compound 3F

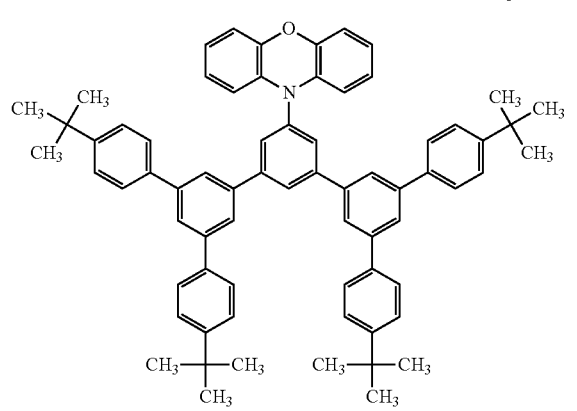

Gas within a four neck flask was replaced with nitrogen, and 16.6 parts by mass of the compound 3F were added thereto and dissolved in chloroform. The resulting solution was cooled to 0° C., and added dropwise over 50 minutes with a solution in which 6.3 parts by mass of NBS (N-bromosuccinimide) is dissolved in DMF. After stirring for 10 minutes, the cool bath was removed, and the stirring was continued for 3 hours. The resulting mixture liquid was cooled again to 0° C. and added dropwise with a solution in which 0.1 parts by mass of NBS is dissolved in DMF. Thereafter, the mixture was stirred at the room temperature for 1.5 hours and liquid separation was carried out by adding water. The obtained aqueous layer was extracted twice with toluene, and the extracted toluene was combined with the organic layer and added with toluene. The resulting mixture liquid was washed with water and saturated brine. The mixture liquid after washing was filtered by passing through a glass filter overlaid with silica gel and washed with toluene. The solvent was removed from the mixture liquid by distillation. As a result, the compound 4F represented by the following formula was obtained in an amount of 25.1 parts by mass.

LC-MS (APCI, positive) 1096 ([M+H]$^+$, exact mass=1095)

$^1$H-NMR (300 MHz, CDCl$_3$):

δ(ppm)=1.37 (36H, s), 5.99 (2H, d), 6.75 (2H, d), 6.85 (2H, brs), 7.50 (8H, d), 7.61-7.65 (10H, m), 7.82 (6H, d), 8.11 (1H, s).

$^{13}$C-NMR (300 MHz, CDCl$_3$):

δ(ppm)=31.7, 34.9, 113.3, 114.9, 119.0, 125.0, 126.2, 126.7, 127.3, 128.2, 129.3, 133.5, 138.3, 139.6, 140.7, 142.9, 144.5, 145.6, 151.1.

[Chemical Formula 52]

Compound 4F

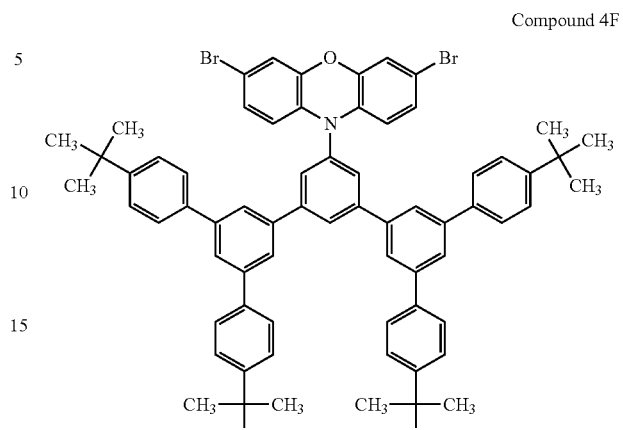

Synthesis Example 11

Synthesis of Compound 3G

Under inert atmosphere, 225 parts by mass of acetic acid were added to a three neck flask and added with 24.3 parts by mass of 5-tert-butyl-m-xylene. Then, 31.2 parts by mass of bromine were added and the reaction was performed for 3 hours at 15 to 20° C. The reaction solution was added to water and the precipitates were filtered. The precipitates were washed twice with water and 34.2 parts by mass of the compound 1G were obtained as a white solid.

$^1$H-NMR (300 MHz/CDCl$_3$):

δ(ppm)=1.3 (s, 9H), 2.4 (s, 6H), 7.1 (s, 2)

MS (FD+) M$^+$ 241

[Chemical Formula 53]

Compound 1G

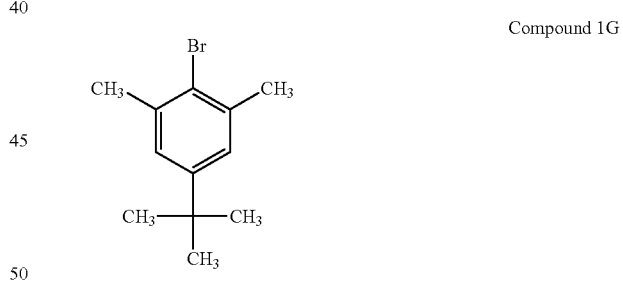

Under inert atmosphere, deaerated and anhydrous toluene was added to a three neck flask. 0.63 parts by mass of tri(tert-butyl)phosphine were added thereto. Subsequently, 0.41 parts by mass of tris(dibenzylidene acetone)dipalladium, 9.6 parts by mass of the compound 1G, 5.2 parts by mass of sodium tert-butoxide, and 4.7 parts by mass of N,N'-diphenyl-1,4-phenylenediamine were added thereto and reacted for 3 hours at 100° C. The reaction solution was added to saturated brine and extracted with chloroform which has been pre-heated to about 50° C. As a result of removing the solvent from the obtained organic layer, a solid was obtained, which were then heated until the solid dissolves after adding toluene. Subsequently, the resulting solution was cooled to the room temperature, and by filtering the precipitates, 9.9 parts by mass of the Compound 2G were obtained as a white solid.

[Chemical Formula 54]

Compound 2G

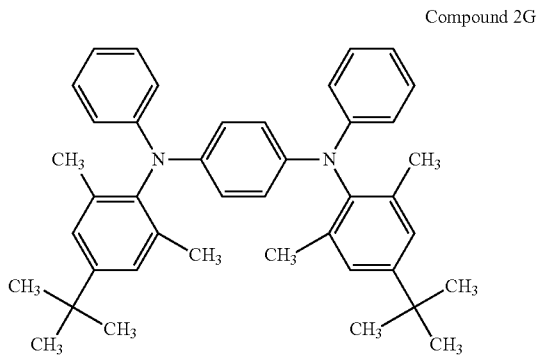

Under inert atmosphere, anhydrous N,N-dimethyl formamide was added to a three neck flask. 5.2 parts of the Compound 2G were dissolved therein, and added dropwise with 3.5 parts by mass solution of N-bromosuccinimide/N,N-dimethyl formamide in an ice bath. The reaction was allowed to occur overnight. The reaction solution was added with water, and the precipitates were filtered and washed twice with methanol to obtain 4.4 parts by mass of the compound 3G as a white solid.

$^1$H-NMR (300 MHz/tetrahydrofuran-d8): δ(ppm)=1.3 (s, 18H), 2.0 (s, 12H), 6.6~6.7 (d, 4H), 6.8~6.9 (br, 4H), 7.1 (s, 4H), 7.2~7.3 (d, 4H).

MS (FD+) M$^+$ 738

[Chemical Formula 55]

Compound 3G

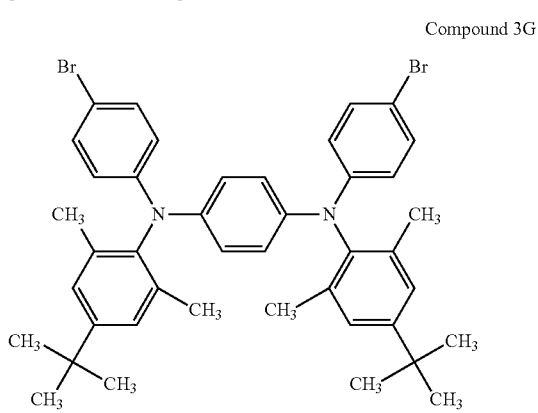

Synthesis Example 12

Synthesis of Compound 4I

Under argon atmosphere, 1-bromo-3,5-di-n-hexylbenzene (58.4 g) and tetrahydrofuran were added to a reaction vessel to prepare a homogeneous solution, which was then cooled to −75° C. To the solution, 2.5 M n-butyl lithium/hexane solution (71.2 mL) (1 mol equivalent compared to 1-bromo-3,5-di-n-hexylbenzene) was added dropwise for 1.5 hours at −75° C., and the solution was stirred for 1.5 hours at −70° C. Subsequently, a solution consisting of 2,7-dibromofluorenone (55.2 g) and tetrahydrofuran was added dropwise thereto for 1 hour at −75° C. and, after heating to the room temperature, the reaction solution was stirred for 4 hours. Subsequently, the solution was cooled to 0° C., slowly added with acetone and 2 mol % aqueous solution of hydrochloric acid, and stirred, then raised in temperature to the room temperature followed by being kept at the room temperature. Subsequently, the reaction mixture was filtered, and the filtered solution was concentrated and stirred after adding hexane and water. After maintaining for a while for liquid separation, the aqueous layer was removed from the organic layer. Saturated brine was added to the organic layer followed by stirring. After maintaining for a while for liquid separation, the aqueous layer was removed from the organic layer. The organic layer was then added with magnesium sulfate and stirred. The filtered solution obtained by filtering was concentrated to obtain the compound 1I (30.2 g).

[Chemical Formula 56]

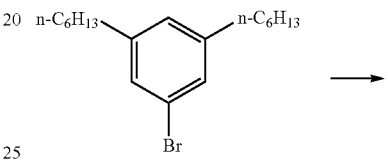

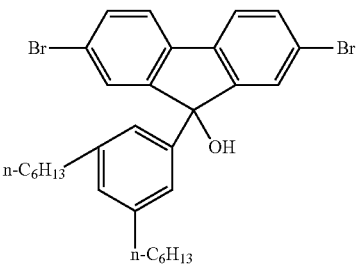

Compound 1I

A reaction vessel was purged with argon, and added with the compound 1I (27.7 g) and trifluoroacetic acid (36 mL). A mixture liquid of trimethylsilane (8.4 mL) and hexane (25 mL) was added dropwise to the solution over 30 minutes and stirred overnight at the room temperature. Subsequently, the reaction solution was cooled to 10° C., added with hexane and distilled water, and stirred for 1 hour. After maintaining for a while for liquid separation, the aqueous layer was removed from the organic layer. Water was added followed by stirring. After maintaining for a while for liquid separation, the aqueous layer was removed from the organic layer. The organic layer was then added with saturated brine and stirred. After maintaining for a while for liquid separation, the aqueous layer was removed from the organic layer. The organic layer was added with magnesium sulfate and stirred. The filtered solution obtained by filtering was concentrated. Subsequently, it was purified by silica gel column chromatography by using hexane and dichloromethane as a developing solvent. Then washing with methanol, the compound 2I (12.1 g) as a target compound was obtained.

[Chemical Formula 57]

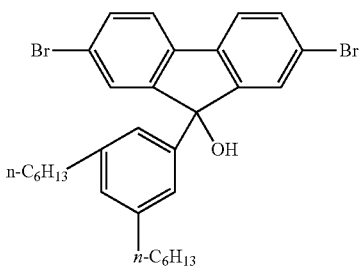

Compound 1I

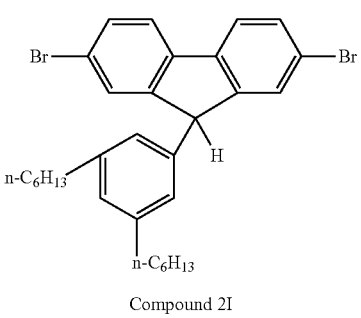

Compound 2I

Under argon atmosphere, the compound 2I (12.0 g), dimethyl sulfoxide (60 mL), water (2 mL) and potassium hydroxide (4.85 g) were added to a reaction vessel. To the solution, methyl iodide (4.1 mL) was added dropwise and stirred overnight at the room temperature. Subsequently, the reaction solution was added with hexane and distilled water at the room temperature and stirred for 1 hour. After maintaining for a while for liquid separation, the aqueous layer was removed from the organic layer. Water was added thereto followed by stirring. After maintaining for a while for liquid separation, the aqueous layer was removed from the organic layer. Saturated brine was added to the organic layer followed by stirring. After maintaining for a while for liquid separation, the aqueous layer was removed from the organic layer. The organic layer was added with magnesium sulfate and the filtered solution obtained by filtration was concentrated. Subsequently, according to re-crystallization using methanol and butyl acetate, the compound 3I (4.3 g) as a target compound was obtained.

[Chemical Formula 58]

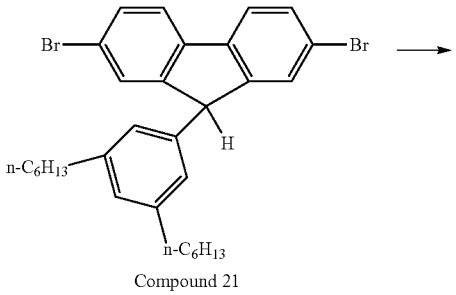

Compound 2I

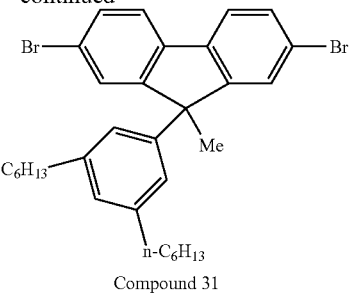

Compound 3I

Under argon atmosphere, the compound 3I (4.2 g), bis(pinacolate)diborone (4,4,4',4',5,5,5',5'-octamethyl-2,2'-bi-1,3,2-dioxaborolane) (4.0 g), 1,4-dioxane (45 mL), potassium acetate (4.2 g), 1,1'-bis(diphenylphosphino)ferrocene (dppf, 59 mg), and 1,1'-bis(diphenylphosphino)ferrocene palladium (II) dichloride methylene chloride complex (PdCl$_2$(dppf).CH$_2$Cl$_2$, 88 mg) were added to a reaction vessel and stirred at 100° C. for 20 hours. Subsequently, after cooling the obtained reaction mixture to the room temperature, it was filtered through a filter overlaid with Celite and silica gel, and the filtered solution was concentrated to remove the solvent. Subsequently, to a solution prepared by adding hexane, activated carbon was added and stirred for 1 hour at the temperature which allows reflux of hexane. The resulting mixture was cooled to the room temperature, filtered through a filter overlaid with Celite, and concentrated to remove the solvent. Thereafter, according to re-crystallization using toluene and methanol, the compound 4I as a target compound was obtained (3.9 g).

[Chemical Formula 59]

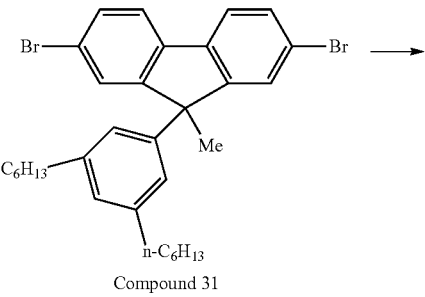

Compound 3I

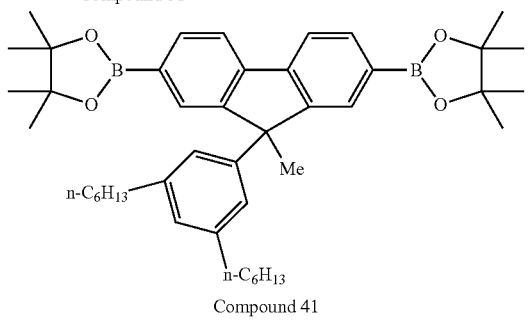

Compound 4I

Synthesis Example 13

Synthesis of Compound 1T

Gas within a 100 mL three neck flask was replaced with nitrogen, and 2-ethylhexyl magnesium bromide (1.0 M diethyl ether solution, 25 mL, 25 mmol) was added followed by reflux. To the solution, a suspension in which 2-bromoanthracene (5.34 g, 20.8 mmol) and PdCl$_2$(dppf).CH$_2$Cl$_2$ (33 mg, 0.04 mmol) are suspended in 50 mL of anhydrous cyclopentyl methyl ether was added dropwise for 35 minutes. After reflux for 1 hour, the reaction solution was cooled by placing it in an ice bath, and added dropwise with 2 M hydrochloric acid (5 mL). Then, 50 mL of toluene was added thereto and liquid separation was carried out with 50 mL water and 30 mL water in order for washing. The aqueous layer was combined and re-extracted with toluene. The organic layer was combined and washed with 30 mL saturated brine. It was then filtered through a glass filter applied with 20 g of silica gel and washed with toluene. The solvent was removed from the filtered solution by distillation to obtain a crude product in an amount of 7.45 g.

The crude product (5.40 g) was re-crystallized with isopropyl alcohol (54 mL). Herein, during naturally cooling after it was confirmed that the crude product was dissolved by heating, crystallization was observed at the inside temperature of 65° C., and the same temperature was kept for 2 hours. After that, the resulting solution was slowly cooled and naturally cooled to the room temperature. After filtration, washing with isopropyl alcohol was conducted. Re-crystallization using isopropyl alcohol was further repeated two times to obtain 3.81 g of 2-(2-ethylhexyl)anthracene (yield: 67.2%) as a white solid.

LC-MS (APPI positive): 291 ([M+H]$^+$, exact mass=290)

$^1$H-NMR (CDCl$_3$, 300 MHz):

δ(ppm)=0.87~0.94 (6H, m), 1.27~1.48 (8H, m), 1.68~1.75 (1H, m), 2.71 (2H, d), 7.29 (1H, d), 7.40~7.46 (2H, m), 7.71 (s, 1H), 7.91 (1H, d), 7.95~7.98 (2H, m), 8.32 (1H, s), 8.36 (1H, s).

$^{13}$C-NMR (CDCl$_3$, 75 MHz):

δ(ppm)=11.1, 14.4, 23.4, 25.9, 29.2, 32.8, 40.9, 41.0, 125.2, 125.5, 125.6, 126.2, 127.2, 128.2, 128.3, 128.4, 128.5, 131.0, 131.8, 132.2, 139.2.

[Chemical Formula 60]

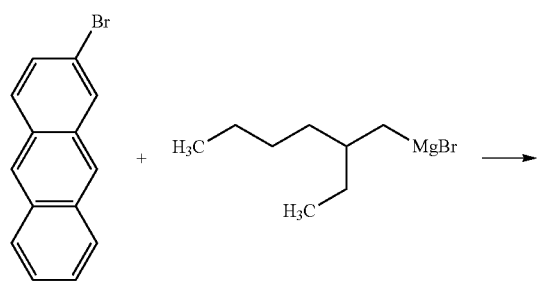

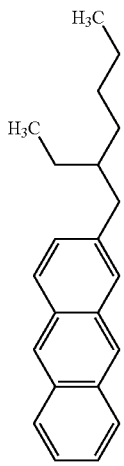

Gas within a 300 mL four neck flask was replaced with nitrogen, and added with 2-(2-ethylhexyl)anthracene (3.50 g, 12.1 mmol), which was then dissolved in 105 mL anhydrous dichloromethane. The obtained solution was cooled by placed in an ice bath, and then added dropwise with bromine (4.17 g, 26.1 mmol) for 20 minutes. After stirring for 45 minutes, a 1% by mass aqueous solution of sodium thiosulfate was added dropwise over 5 minutes to terminate the reaction. After liquid separation, the organic layer was extracted with 100 mL of chloroform. The organic layers were combined and washed with water. After filtration using a glass filter applied with 20 g of silica gel, it was washed with hexane. The filtered and washed solution was concentrated to obtain a crude product as a yellow viscous oil (5.47 g).

The yellow viscous oil was purified by silica gel column chromatography (silica 120 g, developing solvent: hexane only) to obtain 4.26 g of yellow viscous oil. Subsequently, 1 L of methanol was added and dissolved by heating. After maintaining it overnight, crystals were obtained. The resulting slurry solution was concentrated to about 150 mL and filtered to give 3.91 g of pale yellow solid.

The resulting solid was dissolved in hexane (50 mL), added with 1.00 g of activated carbon, and stirred for 1 hour. After filtration through a glass filter applied with 13 g of Celite and washing with hexane, the filtered and washed solution was concentrated. Then, isopropyl alcohol (100 mL) was added thereto followed by heating. After cooling to 35° C., seed crystals were added. After stirring, filtration, and washing with isopropyl alcohol, 2.76 g (yield: 51%) of 9,10-dibromo-2-(2-ethylhexyl)anthracene (the compound 1T) was obtained as a pale yellow solid.

$^1$H-NMR (CDCl$_3$, 300 MHz):

δ(ppm)=0.86~0.97 (6H, m), 1.20~1.40 (8H, m), 1.72~1.77 (1H, m), 2.78 (2H, d), 7.43 (1H, d), 7.55~7.59 (2H, m), 8.28 (1H, s), 8.46 (1H, d), 8.51~8.54 (2H, m).

$^{13}$C-NMR (CDCl$_3$, 75 MHz):

δ(ppm)=11.2, 14.5, 23.3, 25.9, 29.1, 32.7, 40.7, 40.9, 122.8, 123.6, 127.2, 127.3, 127.6, 128.3, 128.4, 128.5, 130.3, 130.8, 131.4, 141.7.

[Chemical Formula 61]

[Chemical Formula 62]

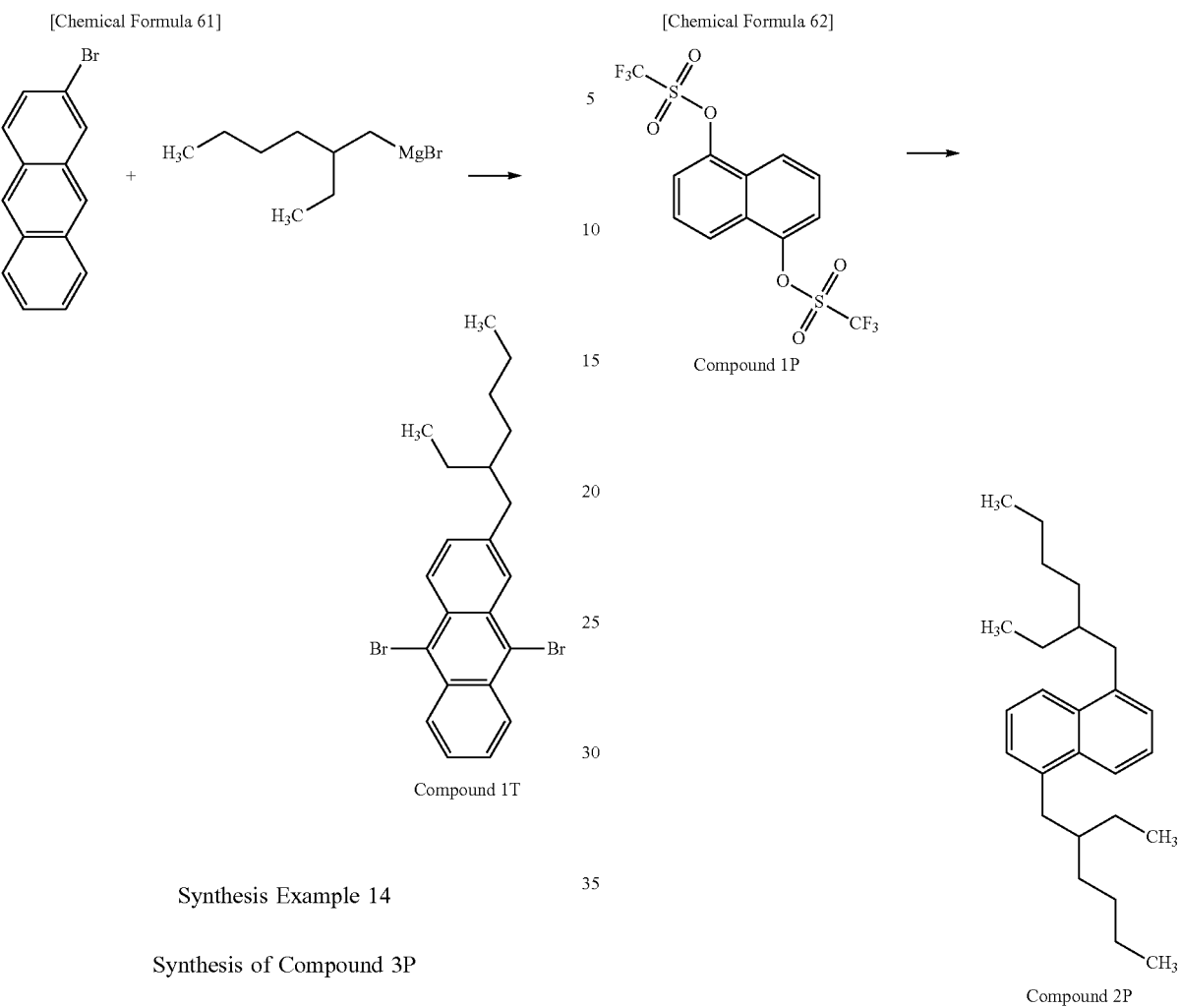

Compound 1P

Compound 1T

Compound 2P

Synthesis Example 14

Synthesis of Compound 3P

Under nitrogen atmosphere, 1,5-naphthylbis(trifluoromethane sulfonate) (the compound 1P, 25.0 g) and [1,1'-bis(diphenylphosphino)ferrocene]palladium (II) dichloride dichloromethylene adduct (0.24 g), and tert-butyl methyl ether (410 mL) were placed and, at 10° C. or lower, 2-ethylhexyl magnesium bromide (1 mol/L diethyl ether solution, 173 mL) was added thereto dropwise followed by stirring for 4 hours at the room temperature. After the reaction was completed, the reaction solution was added to a mixture liquid of water and 2N hydrochloric acid, and the aqueous layer was extracted with ethyl acetate. Subsequently, the obtained organic layer was washed with aqueous solution of sodium chloride. The washed organic layer was dried over magnesium sulfate and the solvent was distilled off under reduced pressure. The residues were purified by silica gel column chromatography (developing solvent: hexane) to obtain 21.3 g of compound 2P as a pale yellow oily matter.

MS (ESI, positive): [M$^+$]353

$^1$H-NMR (300 MHz, CDCl$_3$):

δ(ppm)=0.75-1.00 (12H, m), 1.10-1.50 (16H, m), 1.69-1.85 (2H, m), 2.90-3.05 (4H, m), 7.24-7.38 (3H, m), 7.35-7.44 (3H, m), 7.90-7.95 (3H, m).

Under nitrogen atmosphere, a mixture of the compound 2P (21.3 g), bis(pinacolate)diborone (4,4,4',4',5,5,5',5'-octamethyl-2,2'-bi-1,3,2-dioxaborolane) (46.0 g), bis(1,5-cyclooctadiene)di-µ-methoxy diiridium (I) (0.24 g) (manufactured by Aldrich), 4,4'-ditert-butyl-2,2'-dipyridyl (0.19 g) and dioxane (140 mL) was stirred at 100° C. for 3 hours. After cooling the resulting mixture, dioxane was distilled off under reduced pressure. The residues were added with methanol and the precipitated solid were collected by filtration followed by drying. The solid was dissolved in toluene and added with activated white clay, followed by stirring for 30 minutes at 60° C. After that, the mixture was hot-filtered using a filter pre-coated with silica gel, and the filtered liquid was concentrated under reduced pressure. The concentrated residues were added with methanol and dried to obtain the compound 3P as a white solid powder (28.0 g).

LC-MS (ESI, positive): [M$^+$]605

$^1$H-NMR (300 MHz, CDCl$_3$):

δ(ppm)=0.85-0.95 (12H, m), 1.24-1.50 (16H, m), 1.66-1.85 (2H, m), 2.90-3.18 (4H, m), 7.60 (2H, s), 8.47 (2H, s).

[Chemical Formula 63]

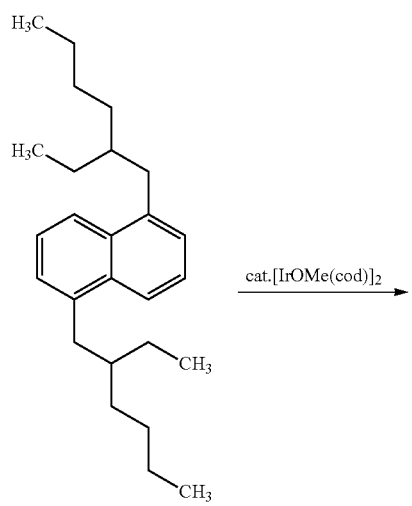

Compound 2P

Compound 3P

Synthesis Example 15

Synthesis of Compound 6M

To a three neck flask (5 L), magnesium (60.5 g, 2.485 mol), anhydrous diethyl ether (1500 mL), and 1,2-dibromoethane (1 mL, 0.0115 mol) were added, and 2-ethylhexyl bromide was slowly added thereto and stirred for 2 hours at 40° C. followed by cooling to the room temperature to prepare the solution A. Subsequently, to a 5 L three neck flask, 3,4-dibromothiophene (100 g, 0.4233 mol), bis(diphenylphosphinopropane) nickel (II), and anhydrous diethyl ether (1500 mL) were added to give a solution. The solution A was added thereto at the room temperature followed by stirring for 4 hours at the room temperature and further for 14 hours at 40° C. The obtained reaction solution was added to a mixture of 1.5 N aqueous solution of hydrochloric acid and ice and stirred to separate an resulting organic layer from an aqueous layer. The organic layer was washed with water (1000 mL) and saturated brine (1000 mL), concentrated, and solidified by drying. The obtained crude product was purified by silica gel column chromatography to obtain the compound 1M as a target compound (124 g, yield 97%).

$^1$H-NMR (CDCl$_3$, 300 MHz):
δ(ppm)=0.96~1.03 (12H, m), 1.19~1.38 (16H, m), 1.55~1.60 (2H, m), 2.44 (4H, d), 6.86 (2H, s).

[Chemical Formula 64]

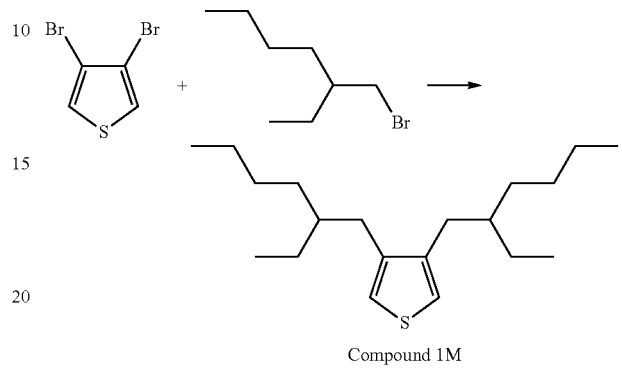

Compound 1M

To a 5 L three neck flask, the compound 1M (124 g, 0.4018 mol) and dichloromethane (2.5 L) were added, and metachloroperbenzoic acid (m-CPBA) was slowly added thereto under stirring and further stirred for 14 hours at the room temperature. Subsequently, the mixture was added with dichloromethane (1 L) and washed twice with NaHSO$_3$ aqueous solution (500 mL), twice with NaHCO$_3$ aqueous solution (500 mL), and twice with saturated brine (500 mL). The organic layer was concentrated and solidified by drying to obtain a crude product. The crude product was purified by silica gel column chromatography to obtain the compound 2M as a target compound (80 g, yield 59%).

$^1$H-NMR (CDCl$_3$, 300 MHz):
δ(ppm)=0.86~0.92 (12H, m), 1.27~1.39 (16H, m), 1.40~1.60 (2H, m), 2.22 (4H, d), 6.20 (2H, s).

[Chemical Formula 65]

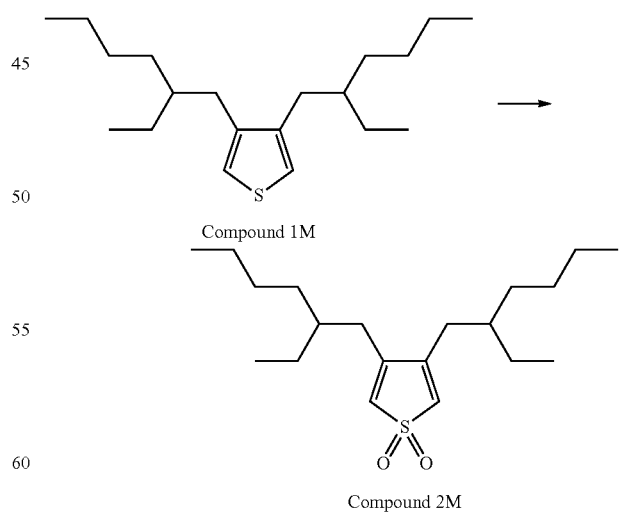

Compound 1M

Compound 2M

To a 2 L three neck flask, the compound 2M (80 g, 0.2349 mol), 1,4-naphthalene dione (63.15 g, 0.3993 mol), and dimethyl sulfoxide (1600 mL) were added and stirred for 60 hours at 110° C. Subsequently, the obtained reaction solution

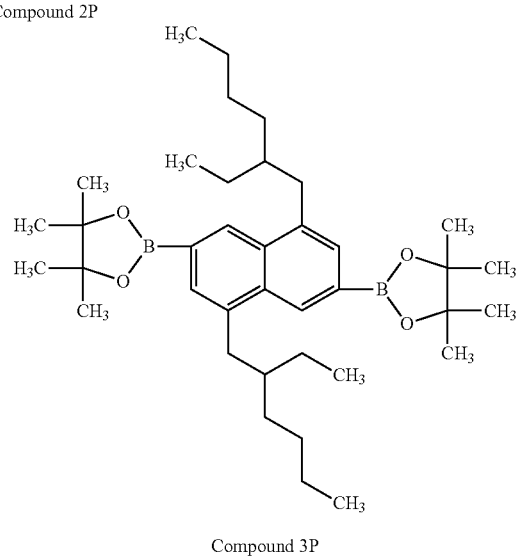

was slowly added to water (1 L) at the room temperature, added with dichloromethane (2 L), and stirred. The resulting organic layer was separated from the aqueous layer. The organic layer was washed twice with water (500 mL) and once with saturated brine (1000 mL), concentrated and solidified by drying to obtain a crude product. Subsequently the crude product was purified by silica gel column chromatography to obtain the compound 3M as a target compound (51 g, yield 49%).

$^1$H-NMR (CDCl$_3$, 300 MHz):

δ(ppm)=0.92~0.99 (12H, m), 1.26~1.39 (16H, m), 1.66~1.68 (2H, m), 2.71 (4H, d), 7.78 (2H, dd), 8.05 (2H, s), 8.31 (2H, dd).

[Chemical Formula 66]

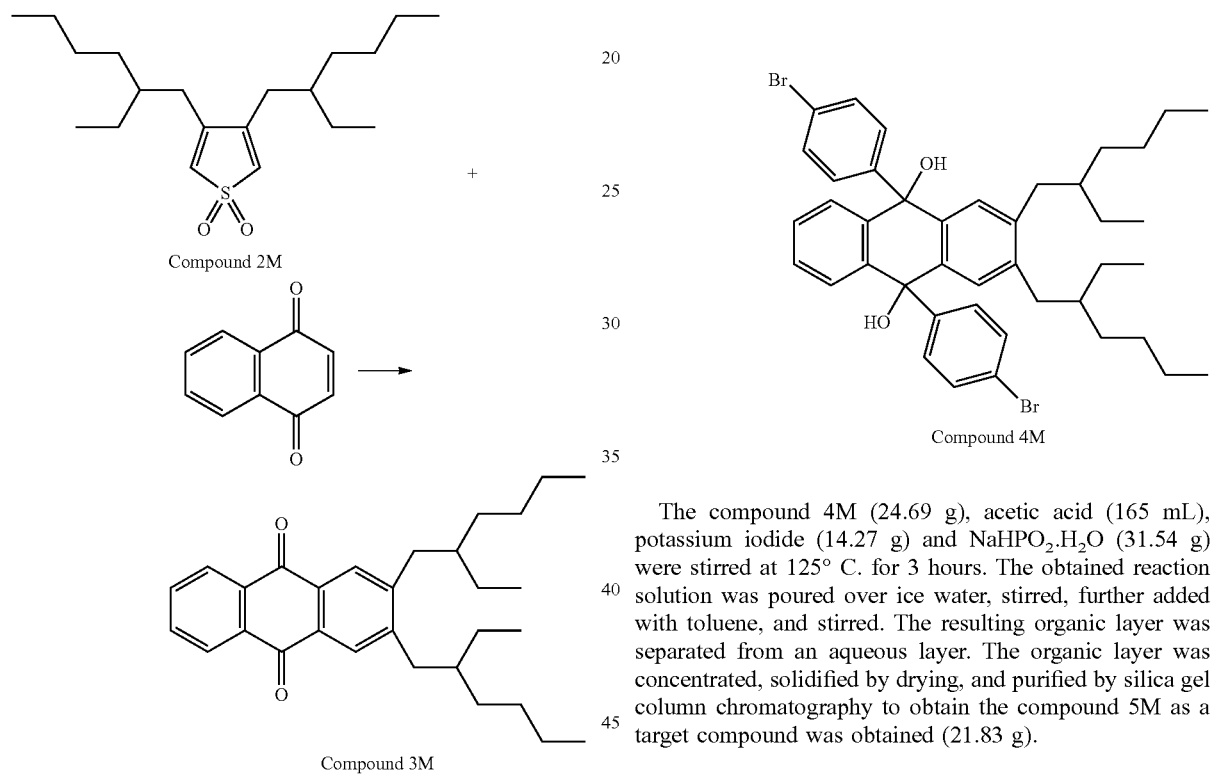

[Chemical Formula 67]

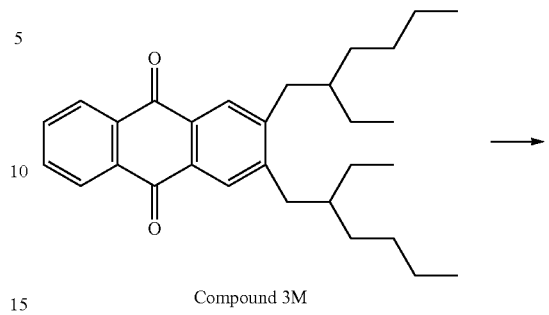

Compound 3M

To a solution consisting of 1,4-dibromobenzene (31.20 g, 132 mmol) and anhydrous diethyl ether (279 mL), 1.67 M (n-butyl lithium/n-hexane solution (79.2 mL, 132 mmol) was added dropwise at −78° C. followed by stirring for 1 hour at the same temperature to prepare a solution B. Subsequently, to a solution consisting of the compound 3M (14.31 g, 33 mmol) and anhydrous diethyl ether (28 mL), the solution B was added dropwise at −78° C. followed by stirring for 1 hour at the same temperature. Subsequently, it was stirred at the room temperature for 3 hours and stirred after added with water (140 mL) at 0° C. Then, ethyl acetate was added followed by stirring, and the resulting organic layer was separated from an aqueous layer. The obtained organic layer was concentrated and solidified by drying to obtain the compound 4M as a target compound (32.8 g).

The compound 4M (24.69 g), acetic acid (165 mL), potassium iodide (14.27 g) and NaHPO$_2$.H$_2$O (31.54 g) were stirred at 125° C. for 3 hours. The obtained reaction solution was poured over ice water, stirred, further added with toluene, and stirred. The resulting organic layer was separated from an aqueous layer. The organic layer was concentrated, solidified by drying, and purified by silica gel column chromatography to obtain the compound 5M as a target compound was obtained (21.83 g).

[Chemical Formula 68]

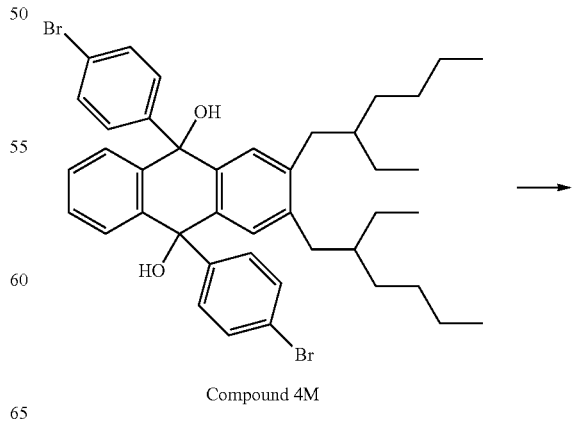

Compound 4M

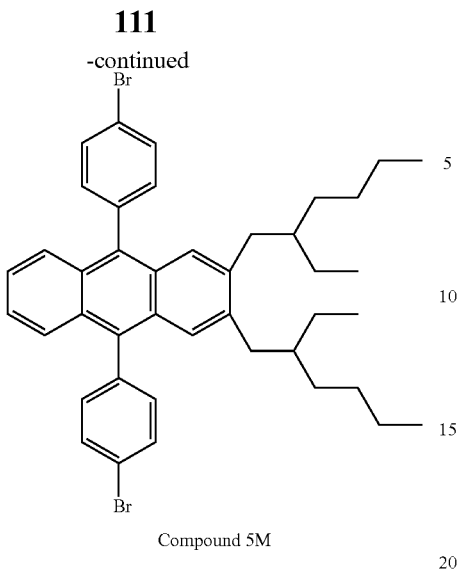

Compound 5M

Under inert gas atmosphere, the compound 5M (1.70 g, 2.39 mmol), bis(pinacolate)diborone (4,4,4',4',5,5,5',5'-octamethyl-2,2'-bi-1,3,2-dioxaborolane) (1.33 g, 5.25 mmol), 1,1-bis(diphenylphosphino)ferrocene palladium (II) dichloride dichloromethane complex (Pd(dppf).CH$_2$Cl$_2$, 38 mg, 0.05 mmol), 1,1-bis(diphenylphosphino)ferrocene (30 mg, 0.05 mmol), anhydrous 1,4-dioxane (20 mL) and potassium acetate (1.4 g, 14.31 mmol) were added and stirred under reflux for 6 hours. The resulting mixture was brought back to the room temperature, added with water and toluene, and stirred. The resulting organic layer is separated from an aqueous layer, concentrated, and solidified by drying to obtain a crude product. The crude product was added with hexane (100 mL) and activated carbon (0.3 g), stirred for 30 minutes at 40° C., and filtered through a filter overlaid with Celite. By concentration and solidification by drying, a solid was obtained. The solid was re-crystallized with hexane and the compound 6M as a target compound was obtained (0.43 g).

[Chemical Formula 69]

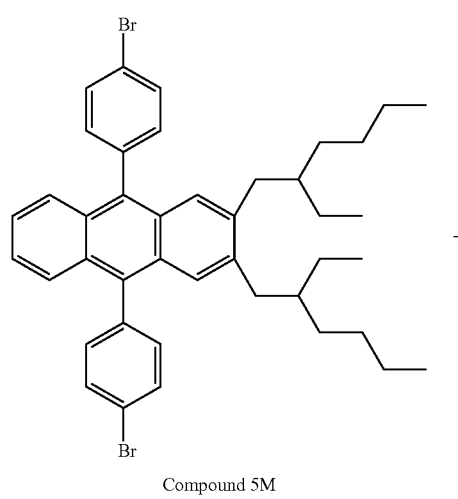

Compound 5M

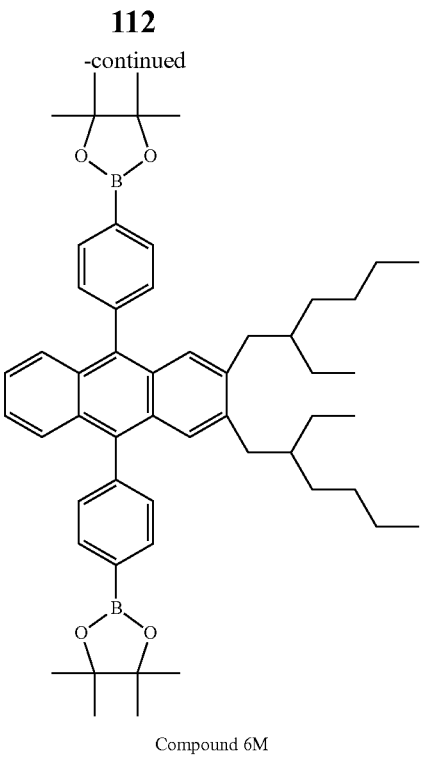

Compound 6M

Synthesis Example 16

Synthesis of Compound 5N

First, the compound 2N was synthesized as described below by using the compound 1N.

[Chemical Formula 70]

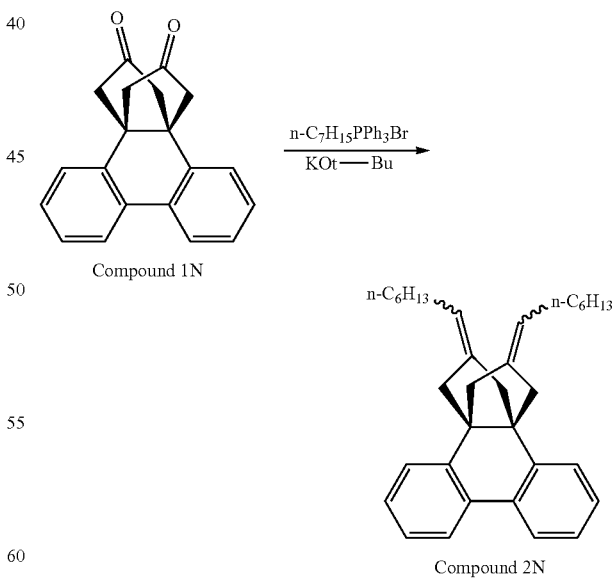

Compound 1N

Compound 2N

In the formula, broken lines indicate that the compound with the broken lines is a mixture of geometric isomers.

To a four neck flask (1 L) equipped with a stirrer, heptyltriphenyl phosphonium bromide (115.0 g) was added and the gas within the flask was replaced with argon.

Toluene (375 g) was added to the flask and cooled to 5° C. or lower. Potassium tert-butoxide (29.2 g) was added, heated to the room temperature, and stirred while keeping the room temperature for 3 hours. To the red slurry generated in the reaction solution, the compound 1N (15.0 g) was added and stirred for 12 hours while keeping the room temperature. To the reaction solution, acetic acid (10.0 g) was added, stirred for 15 minutes, and filtered. The filtered residues were washed several times with toluene. The filtered solution obtained after several washings were combined, concentrated, and added with hexane. As a result, slurry was generated, which was then stirred for 1 hour at 50° C. while keeping the temperature. The resulting mixture was cooled to the room temperature and filtered. The filtered residues were washed several times with hexane, and the filtered solution obtained after several times were combined and concentrated to obtain a crude product. The crude product was purified by using a silica gel column (developing solvent: hexane) to obtain the compound 2N as a colorless and transparent liquid (21.7 g).

LC-MS (ESI, positive): [M+K]$^+$ 491

$^1$H-NMR (CDCl$_3$, 300 MHz):

δ(ppm)=0.87 (6H, t), 1.20~1.36 (16H, m), 1.82~1.97 (4H, m), 2.57~2.81 (8H, m), 5.20 (2H, br), 7.23~7.32 (4H, m), 7.41~7.48 (2H, m), 7.87~7.90 (2H, m).

Subsequently, the compound 3N was synthesized as described below by using the compound 2N.

[Chemical Formula 71]

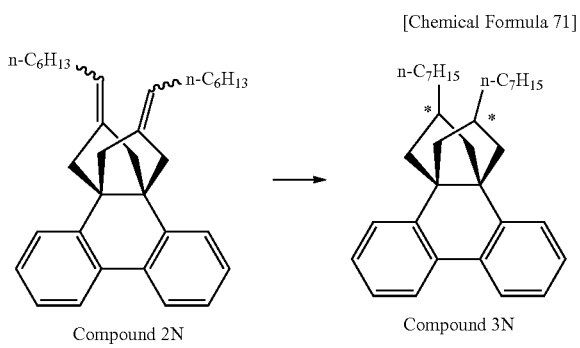

Compound 2N → Compound 3N

In the formula, broken lines indicate that the compound with the broken lines is a mixture of geometric isomers, further, * in the formula means that the carbon atom bearing the symbol is an asymmetrical carbon atom.

To a 1 L four neck flask equipped with a stirrer, the compound 2N (21.7 g) was added and ethyl acetate (152.4 g) and ethanol (151.6 g) were further added. The gas within the flask was replaced with nitrogen. 5% by mass Pd/C (containing moisture in an amount of about 50% by mass) (4.3 g) was added and the gas within the flask was replaced with hydrogen. Under hydrogen atmosphere, the mixture was stirred for 27 hours at 40° C. while keeping the temperature. The obtained mixture was cooled to the room temperature and filtered through a filter precoated with Celite. The residues were washed several times with ethyl acetate, and the filtered solution obtained after several times were combined and concentrated to obtain a crude product. The crude product was purified by using a silica gel column (developing solvent: hexane) to obtain the compound 3N as a colorless and transparent liquid (21.7 g).

LC-MS (APPI, positive): [M]$^+$ 456

$^1$H-NMR (CDCl$_3$, 300 MHz):

δ(ppm)=0.66~0.98 (6H, m), 1.00~2.22 (34H, m), 7.13~7.50 (6H, m), 7.80~7.98 (2H, m).

Subsequently, the compound 4N was synthesized as described below by using the compound 3N.

[Chemical Formula 72]

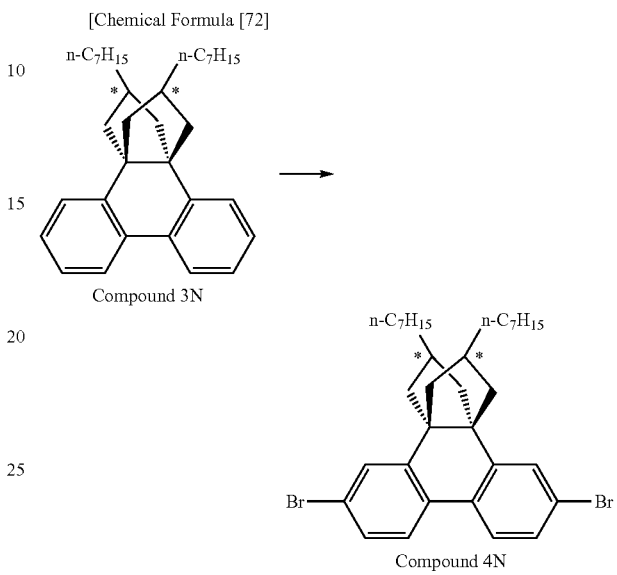

Compound 3N → Compound 4N

In the formula, * means that the carbon atom bearing the symbol is an asymmetrical carbon atom.

To a four neck flask (500 mL) equipped with a stirrer, the compound 3N (21.7 g), chloroform (261.1 g) and trifluoroacetic acid (44 g) were added and the gas within the flask was replaced with argon. Then, the four neck flask was completely covered against light and a mixture of bromine (19.0 g) and chloroform (65.3 g) was added dropwise to the flask over 15 minutes at the room temperature, and the temperature was raised to 35° C. thereafter.

After stirring for 7 hours at 35° C. while keeping the temperature, it was cooled to 15° C. or less. The reaction solution was added with 10% by mass aqueous solution of sodium sulfite (109 g) and the temperature was raised to the room temperature. The aqueous layer was separated from the reaction solution and the organic layer was washed with water, 5% by mass aqueous solution of sodium hydrogen carbonate, and water in order. The organic layer obtained was dried over magnesium sulfate and filtered. The filtered solution was concentrated to obtain a crude product. The crude product was re-crystallized twice with a mixture of ethanol and hexane. The obtained solid was dissolved in hexane, and purified by using a silica gel column (developing solvent: hexane). To the resulting hexane solution, activated carbon (2.1 g) was added and stirred for 1 hour at 45° C. while keeping the temperature. The obtained mixture was cooled to the room temperature, filtered through a filter precoated with Celite, and the residues were washed several times with hexane. The filtered solutions obtained after several times were combined and partially concentrated to obtain a hexane solution. The hexane solution was added with ethanol and the compound 4N as a white solid (18.8 g) was obtained by re-crystallization.

LC-MS (ESI, negative): [M+Cl]$^-$ 648

$^1$H-NMR (CDCl$_3$, 300 MHz):

δ(ppm)=0.66~0.98 (6H, m), 1.00~2.20 (34H, m), 7.22~7.78 (6H, m).

Based on the ¹H-NMR measurement result, it was found that the compound 4N is a mixture of isomers with different stereochemistry (4a:4b:4c=51:39:10) (molar ratio).

[Chemical Formula 73]

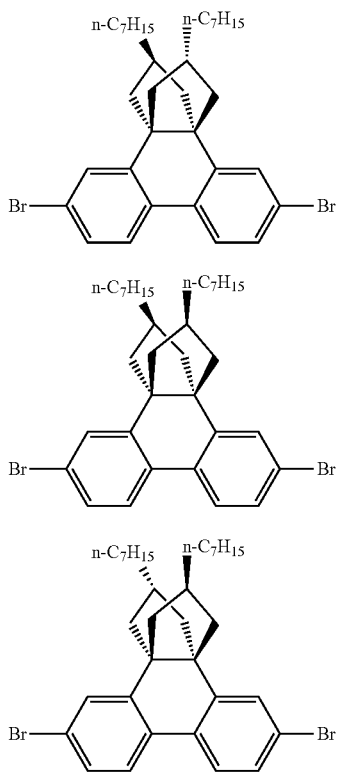

4a

4b

4c

Subsequently, the compound 5N was synthesized as described below by using the compound 4N.

[Chemical Formula 74]

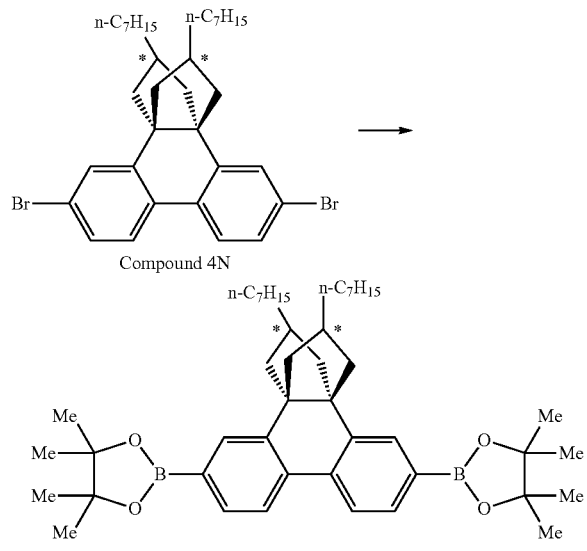

Compound 4N

Compound 5N

In the formula, * means that the carbon atom bearing the symbol is an asymmetrical carbon atom.

To a 200 mL four neck flask, the compound 4N (9.70 g), bis(pinacolate)diborone (8.82 g) and potassium acetate (9.25 g) were added and the gas with the flask was replaced with nitrogen. 1,4-dioxane (95 mL), palladium chloride (diphenylphosphinoferrocene)dichloromethane adduct (PdCl$_2$ (dppf) (CH$_2$Cl$_2$) (0.195 g) and diphenylphosphinoferrocene (dppf) (0.131 g) were added thereto and stirred for 7 hours at 105° C. The resulting solution was cooled to the room temperature, and filtered through a funnel precoated with Celite. The filtered solution was concentrated under reduced pressure and the obtained concentrated was dissolved in hexane, added with activated carbon, and stirred for 1 hour at 40° C. with heating. The obtained mixture was cooled to the room temperature, and filtered through a funnel precoated with Celite. The solid obtained after concentration under reduced pressure was re-crystallized with a mixture solvent of toluene and acetonitrile, and as a result, the compound 5N was obtained as a white solid (9.0 g).

LC-MS (ESI, positive, added with KCl): [M+K]$^+$ 747

Synthesis Example 17

Synthesis of Compound 2Q

The compound 1Q (3.00 g) described below, bis(pinacolate)diborone (2.84 g), potassium acetate (2.99 g), 1,4-dioxane (30 g), palladium chloride (diphenylphosphinoferrocene)dichloromethane adduct (PdCl$_2$(dppf) (CH$_2$Cl$_2$) (83 mg) and diphenylphosphinoferrocene (dppf) (56 mg) were stirred at 103° C. for 6 hours. The resulting solution was cooled to the room temperature, and filtered through a funnel overlaid with Celite. The filtered solution was concentrated under reduced pressure and the obtained concentrated was dissolved in hexane, added with activated carbon, and stirred for 1 hour at 40° C. with heating. The obtained mixture was cooled to the room temperature, and filtered through a funnel overlaid with Celite. The solid obtained after concentration under reduced pressure was re-crystallized with a mixture solvent of toluene and acetonitrile, and as a result, the compound 2Q was obtained as a white solid (2.6 g).

[Chemical Formula 75]

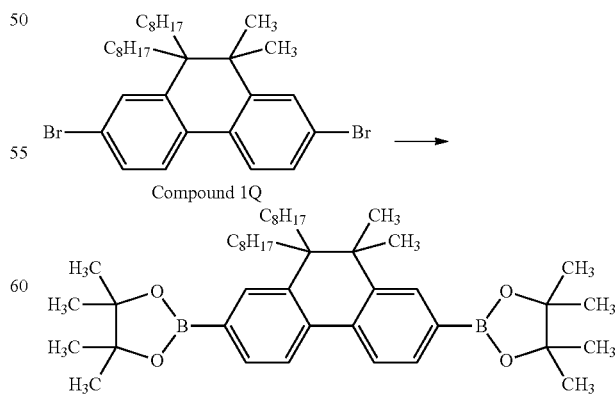

Compound 1Q

Compound 2Q

Synthesis Example 18

Synthesis of Compound 5R

First, the compound 2R was synthesized as described below by using the compound 1R.

[Chemical Formula 76]

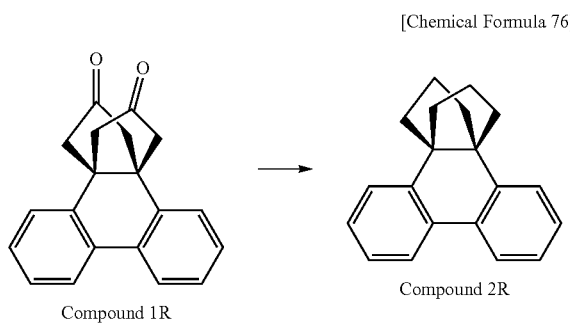

Compound 1R

Compound 2R

To a four neck flask (500 mL) equipped with a stirrer, the compound 1R (4.5 g) and ethylene glycol (180 g) were added and the gas within the flask was replaced with argon. Then, hydrazine monohydrate (3.2 g) and potassium hydroxide (4.3 g) were added thereto, and the mixture was heated to 180° C. and stirred for 28 hours at the same temperature. The reaction solution was cooled to the room temperature and added with water. As a result, the solid was precipitated, which was then recovered by filtration and dried at the room temperature under reduced pressure to obtain the compound 2R as a white solid (3.9 g).

$^1$H-NMR (CDCl$_3$, 300 MHz):

δ(ppm)=1.35~1.72 (4H, m), 1.89~2.24 (8H, m), 7.10~7.46 (6H, m), 7.90 (2H, d).

Subsequently, the compound 3R was synthesized as described below by using the compound 2R.

[Chemical Formula 77]

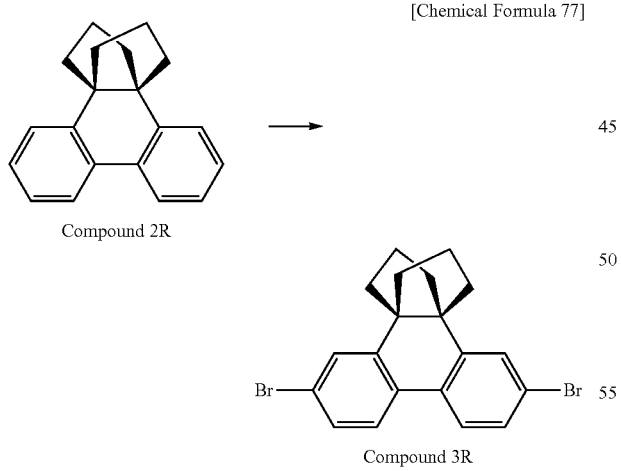

Compound 2R

Compound 3R

Gas within a 100 mL four neck flask was replaced with argon, and added with the compound 2R (3.7 g), chloroform (45 g), and trifluoroacetic acid (7.5 mL). Then, the four neck flask was completely covered against light and a mixture of bromine (5.7 g) and chloroform (11.2 g) was added dropwise to the flask at the room temperature. The mixture was stirred at the room temperature for 2.5 hours and added with 10% by mass aqueous solution of sodium sulfite (20 g). The aqueous layer was separated from the reaction solution and the organic layer was washed with water, 10% by mass aqueous solution of dipotassium hydrogen phosphate, and water in order. The organic layer obtained was dried over magnesium sulfate and filtered. The filtered solution was concentrated to obtain a crude product. The crude product was re-crystallized with a mixture of toluene and methanol. The obtained solid was dissolved in chloroform, and purified by using a silica gel column (developing solvent: toluene/hexane). The resulting solution was concentrated, added with activated carbon (3 g) and stirred for 0.5 hour at 65° C. At the same temperature, the mixture was filtered through a filter precoated with Celite. The filtered residues were washed several times with toluene. The filtered solution obtained after several washings were combined and partially concentrated to obtain a toluene solution. The toluene solution was added with hexane and re-crystallized to obtain the compound 3R as a white solid (3.6 g).

LC-MS (ESI, positive): [M+H]$^+$ 417

$^1$H-NMR (CDCl$_3$, 300 MHz): δ(ppm)=1.38~1.76 (4H, m), 1.85~2.24 (8H, m), 7.33 (2H, d), 7.50 (2H, s), 7.70 (2H, d).

Subsequently, the compound 4R was synthesized as described below by using the compound 3R.

[Chemical Formula 78]

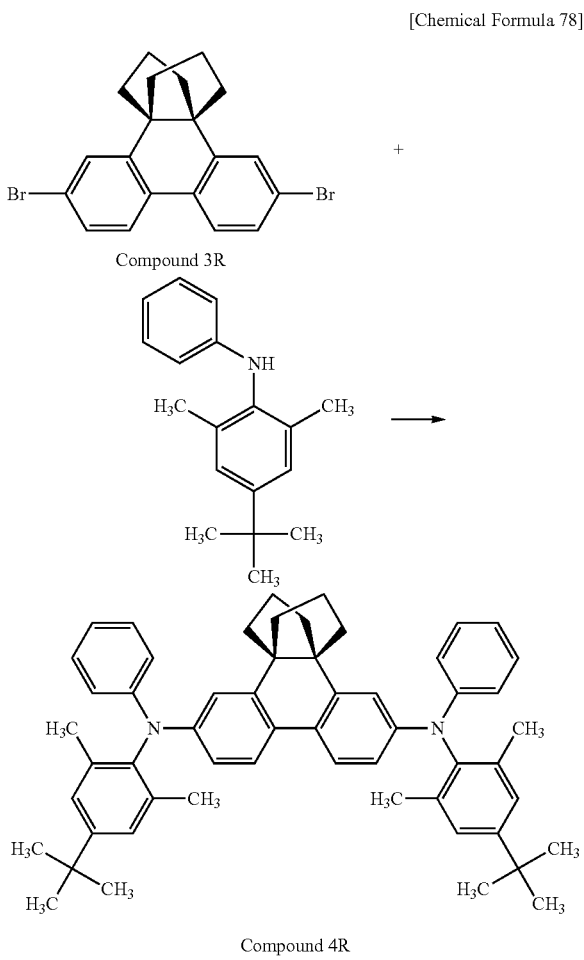

Compound 3R

Compound 4R

To a four neck flask (500 mL) equipped with a stirrer, N-phenyl-N-(4-tert-butyl)-2,6-dimethylphenylamine (24.3 g), tris(dibenzylidene acetone)dipalladium (0) (1.99 g), tritert-butylphosphonium tetrafluoroborate (2.53 g), and sodium tert-butoxide (12.6 g) were added and the gas within the flask was replaced with nitrogen. Then, toluene (100 mL) and tert-butanol (9 mL) were added thereto, and a mixture of the compound 3R (18.2 g) and toluene (170 mL) was added dropwise thereto. After that, the temperature was raised to the reflux temperature and the mixture was stirred for 2 hours under heating.

The reaction solution was cooled to the room temperature, added with water, and filtered through a filter precoated with Celite. The residues were washed with toluene, and an aqueous layer was separated from the filtered solution, and the organic layer was washed with water. The obtained organic layer was concentrated to obtain a crude product. The obtained crude product was purified by using a silica gel column (developing solvent: a mixture of hexane/toluene). The resulting solution was concentrated and re-crystallized with a mixture of isopropanol and toluene, and as a result, the compound 4R was obtained as a white solid (30.6 g).

Subsequently, the compound 5R was synthesized as described below by using the compound 4R.

[Chemical Formula 79]

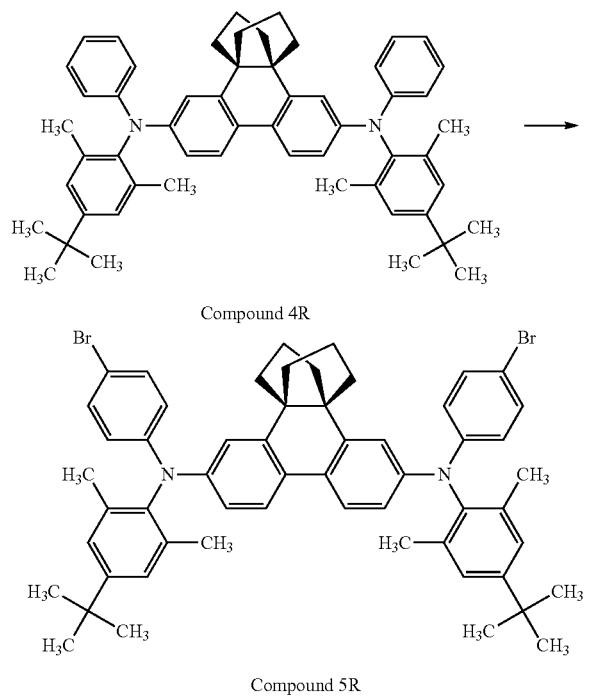

Compound 4R

Compound 5R

Gas within a 1 L four neck flask equipped with a stirrer was replaced with nitrogen, and added with the compound 4R (30.1 g), N,N-dimethyl formamide (36 mL), chlorobenzene (360 mL) and chloroform (100 mL) followed by cooling to 10° C. Then, the flask was completely covered against light and N-bromosuccinimide (NBS) (14.2 g) was added over several times at 10° C. After stirring for four hours at the same temperature, water was added and, subsequently, saturated aqueous solution of sodium sulfite was added until the color of bromine disappears. After raising the temperature to the room temperature, chloroform was added to the resulting solution and an aqueous layer was separated. The organic layer was washed twice with water and concentrated to obtain a crude product. The crude product was dissolved in toluene, heated to 65° C., and added with silica gel (75 g) and activated carbon (2 g). The mixture was stirred for 30 minutes under heating. The silica gel was filtered through a filter precoated with silica gel, and the residues were washed with toluene. The obtained toluene solution was added with isopropanol for re-crystallization, and further re-crystallized with a mixture of toluene and isopropanol to obtain 29.8 g of the compound 5R as a white solid.

LC-MS (APCI, positive): $[M+H]^+$ 919

$^1$H-NMR (CDCl$_3$, 300 MHz):

δ(ppm)=1.11~1.63 (22H, m), 1.80~2.08 (20H, m), 6.53~6.70 (2H, br), 6.75~6.90 (4H, m), 7.05~7.36 (10H, m), 7.50~7.66 (2H, br).

Synthesis Example 19

Synthesis of Compound 3S

The reaction vessel was purged with argon and added with 3-n-bromobenzene (111.1 g) and tetrahydrofuran to prepare a homogeneous solution, which was cooled to −75° C. Thereafter, 2.5 M n-butyl lithium/hexane solution (1 mol equivalent compared to 1-bromo-3,5-di-n-hexylbenzene) (176 mL) was added dropwise for 1.5 hours at −75° C. and stirred for further 1.5 hours at −70° C. Subsequently, solution of 2,7-dibromofluorenone (142 g) and tetrahydrofuran was added dropwise for 1 hour at −75° C. and the reaction solution was raised to the room temperature and stirred for 4 hours. Subsequently, the solution was cooled to 0° C., added slowly with acetone and 2 mol % hydrochloric acid water and stirred, then raised to the room temperature and kept at the room temperature. Subsequently, the reaction mixture was filtered, and the filtered solution was concentrated and added with hexane and water followed by stirring. From an organic layer obtained after maintaining, an aqueous layer was removed. The organic layer was added with saturated brine, maintained for a while, and an aqueous layer was removed from an organic layer, which was then added with magnesium sulfate. The filtered solution obtained after filtration was concentrated. Subsequently, by using hexane and dichloromethane as a developing solvent, purification was performed by silica gel column chromatography to obtain the compound 1S (162 g).

[Chemical Formula 80]

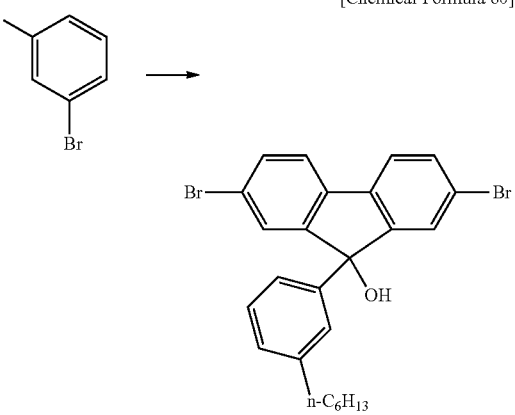

Compound 1S

The reaction vessel was purged with argon and added with the compound 1S (162 g) and trifluoroacetic acid (245 mL). Thereafter, trimethyl silane (115 mL) was added dropwise for 30 minutes and stirred overnight at the room temperature. Subsequently, the reaction solution was cooled to 10° C. and added with hexane and distilled water followed by stirring for 1 hour, and then kept for liquid separation to form an aqueous layer, which was removed from an organic layer. Then, the organic layer was added with water and stirred, then kept for liquid separation to form an aqueous layer, which was removed from an organic layer. The organic layer was added with saturated brine and stirred, and then kept for liquid separation to form an organic layer, from which an aqueous layer was removed. The organic layer was added with magnesium sulfate and stirred. The filtered solution obtained after filtration was concentrated. Subsequently, by using hexane and dichloromethane as a developing solvent, purification was performed by silica gel column chromatography and the solvent was removed by concentration. According to washing with methanol, the compound 2S as a target compound was obtained (138 g).

[Chemical Formula 81]

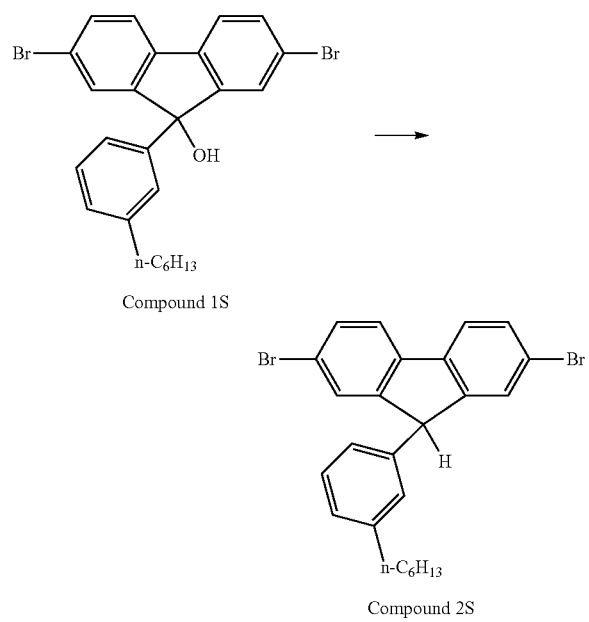

Compound 1S

Compound 2S

The reaction vessel was purged with argon and added with the compound 2S (138 g), 1-bromooctane (75.4 mL), methyl trioctyl ammonium chloride (trade name: Aliquat (registered trademark) 336, manufactured by Aldrich Company) (1.2 g) and 40% potassium hydroxide (60 mL) followed by stirring overnight at 85° C. Then, the reaction solution was cooled to the room temperature, added with dichloromethane and distilled water and stirred for 1 hour, then kept for liquid separation to form an aqueous layer, which was removed from an organic layer. Then, the organic layer was added with water, stirred, and kept for liquid separation to form an aqueous layer, which was removed from an organic layer. The organic layer was added with saturated brine, stirred, and kept for liquid separation to form an aqueous layer, which was removed from an organic layer. The organic layer was added with magnesium sulfate and stirred. The filtered solution obtained after filtration was concentrated. Subsequently, by using hexane and dichloromethane as a developing solvent, purification was performed by silica gel column chromatography by using hexane and dichloromethane as a developing solvent and the solvent was removed by concentration. Subsequently, reprecipitation was performed using methanol and dichloromethane to obtain the compound 3S as a target compound (145 g).

[Chemical Formula 82]

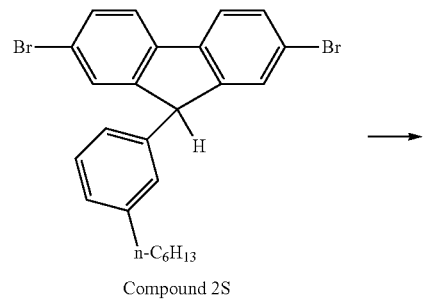

Compound 2S

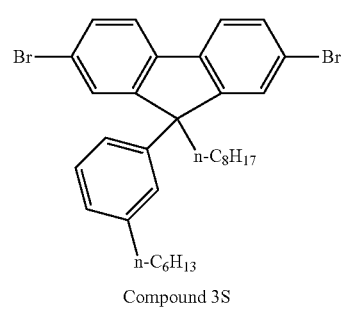

Compound 3S

Production of Polymers

Polymerization Example 1

Synthesis of Polymer 1

Under inert atmosphere, the compound 3C (6.501 g, 8.48 mmol), the compound 2D (4.425 g, 6.87 mmol), the compound 4F (1.885 g, 1.72 mmol), dichlorobis(triphenylphosphine) palladium (6.0 mg) and toluene (203 mL) were mixed and heated to 105° C. 20% by mass aqueous solution of tetraethylammonium hydroxide (28.5 mL) was added dropwise to the reaction solution, which was then refluxed for 3 hours. After the reaction, phenylboronic acid (104.7 mg), dichlorobis(triphenylphosphine) palladium (6.1 mg), and 20% by mass aqueous solution of tetraethylammonium hydroxide (28.5 mL) were added and reflux was continued for 16 hours. Next, aqueous solution of sodium diethyl dithiacarbamate was added thereto followed by stirring at 80° C. for 2 hours. After cooling the mixture obtained, washing was performed twice with water, twice with a 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 6.87 g of the polymer 1 (polymeric light emitting material). The polystyrene equivalent number average molecular weight of the polymer 1 was $9.3 \times 10^4$, and the polystyrene equivalent weight average molecular weight was $2.1 \times 10^5$.

The polymer 1 is a copolymer having a constitutional unit represented by the following formula:

[Chemical Formula 83]

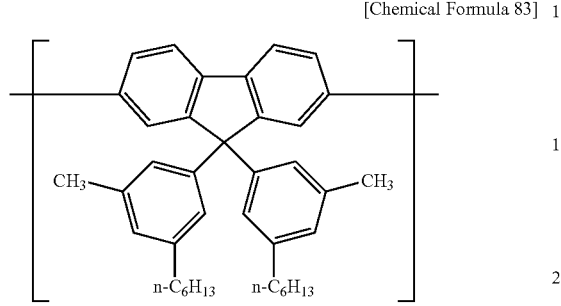

a constitutional unit represented by the following formula:

[Chemical Formula 84]

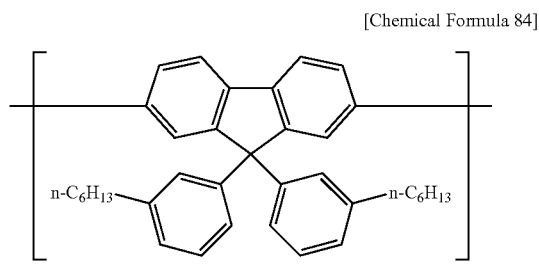

and a constitutional unit represented by the following formula:

[Chemical Formula 85]

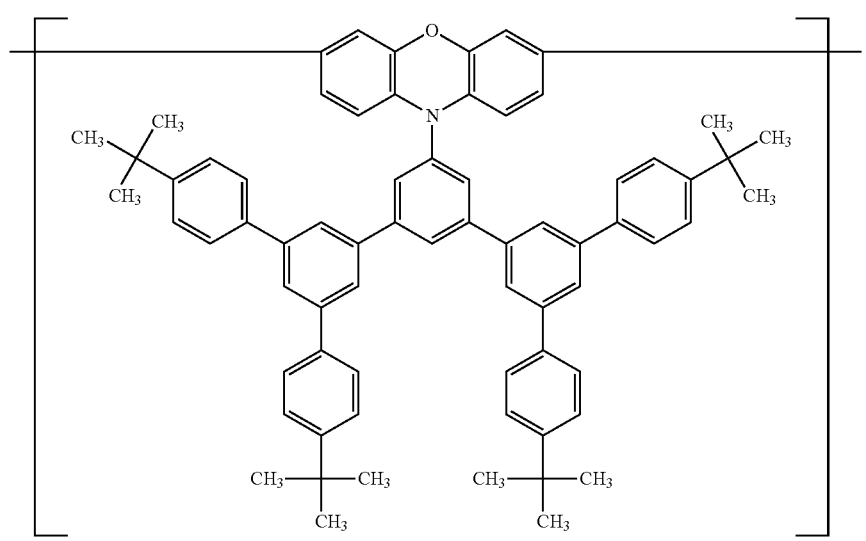

in a molar ratio of 50:40:10, as the theoretical value calculated from the amounts of the used starting materials.

Polymerization Example 2

Synthesis of Polymer 2

Under inert atmosphere, the compound 3C (13.554 g, 17.68 mmol), the compound (F8BE: 3.631 g, 6.85 mmol) represented by the following formula,

[Chemical Formula 86]

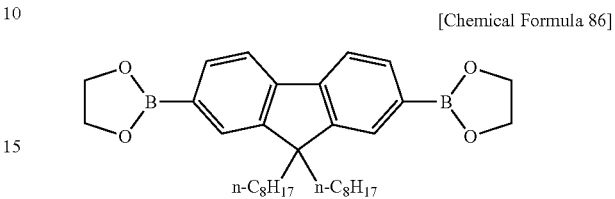

the compound 2D (12.571 g, 19.50 mmol), the compound 3G (3.564 g, 4.82 mmol), dichlorobis(triphenylphosphine) palladium (17.2 mg), and toluene (581 mL) were mixed and heated to 105° C. 20% by mass aqueous solution of tetraethylammonium hydroxide (86 mL) was added dropwise to the reaction solution, which was then refluxed for 8 hours. After the reaction, phenylboronic acid (300 mg) and dichlorobis(triphenylphosphine) palladium (17.1 mg) were added and reflux was continued for further 14.5 hours. Next, aqueous solution of sodium diethyl dithiacarbamate was added theretofollowed by stirring at 80° C. for 2 hours. After cooling the mixture obtained, washing was performed twice with water, twice with 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 20 g of the polymer 2 (polymeric light emitting material). The polystyrene equivalent number average molecular weight of the polymer 2 was $8.1 \times 10^4$, and the polystyrene equivalent weight average molecular weight was $2.5 \times 10^5$.

The polymer 2 was a copolymer having a constitutional unit represented by the following formula:

[Chemical Formula 87]

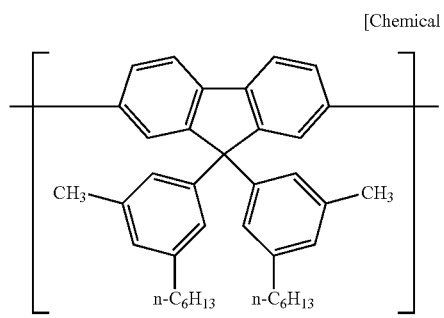

a constitutional unit represented by the following formula;

[Chemical Formula 88]

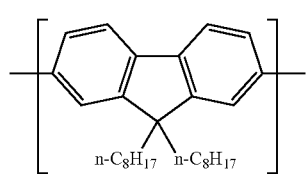

a constitutional unit represented by the following formula; and

[Chemical Formula 89]

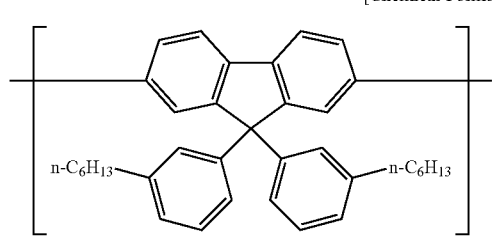

a constitutional unit represented by the following formula;

[Chemical Formula 90]

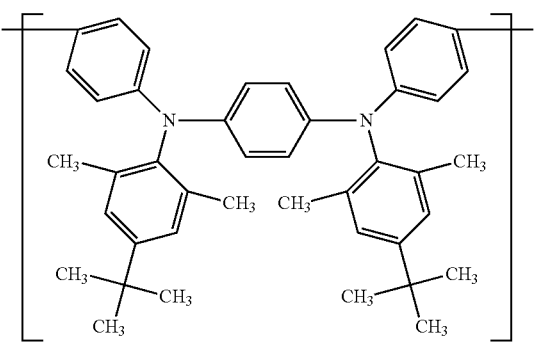

in a molar ratio of 36:14:40:10, as the theoretical value calculated from the amounts of the used starting materials.

Polymerization Example 3

Synthesis of Polymer 3

Under inert atmosphere, the compound 3C (13.380 g, 17.45 mmol), the compound F8BE (3.702 g, 6.98 mmol), the compound 2D (16.121 g, 24.93 mmol), dichlorobis(triphenylphosphine) palladium (17.5 mg), and toluene (478 mL) were mixed and heated to 100° C. 20% by mass aqueous tetraethylammonium hydroxide solution (83.7 g) was added dropwise to the reaction solution, which was then refluxed for 4.5 hours. After the reaction, phenylboronic acid (300 mg) and dichlorobis (triphenylphosphine) palladium (17.5 mg) were added thereto and refluxed for 14 hours. Next, aqueous solution of sodium diethyl dithiacarbamate was added thereto followed by stirring at 80° C. for 2 hours. After cooling the mixture obtained, washing was performed twice with water, twice with 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 14.75 g of the polymer 3 (polymeric light emitting material). The polystyrene equivalent number average molecular weight of the polymer 3 was $6.1 \times 10^4$, and the polystyrene equivalent weight average molecular weight was $2.1 \times 10^5$.

The polymer 3 was a copolymer having a constitutional unit represented by the following formula:

[Chemical Formula 91]

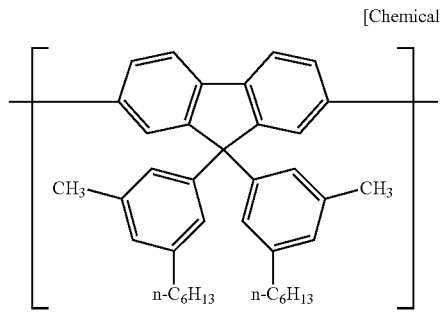

a constitutional unit represented by the following formula; and

[Chemical Formula 92]

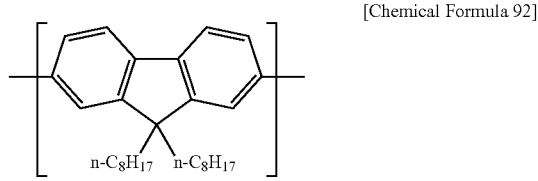

a constitutional unit represented by the following formula;

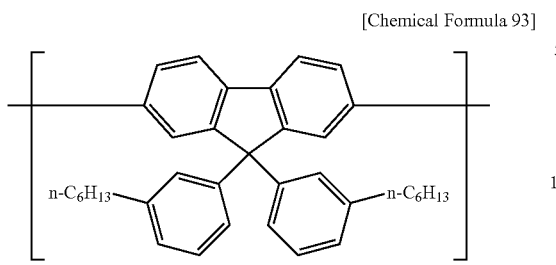

[Chemical Formula 93]

in a molar ratio of 36:14:50, as the theoretical value calculated from the amounts of the used starting materials.

Polymerization Example 4

Synthesis of Polymer 4

Under inert atmosphere, the compound 4A (2.218 g, 3.00 mmol), the compound 1H (:1.008 g, 3.02 mmol) represented by the following formula,

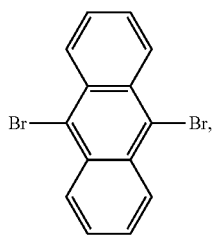

[Chemical Formula 94]

dichlorobis (triphenylphosphine) palladium (2.1 mg), and toluene (75 mL) were mixed heated to 105° C. 20% by mass aqueous tetraethylammonium hydroxide solution (10 mL) was added dropwise to the reaction solution, which was then refluxed for 5.5 hours. After the reaction, phenylboronic acid (36.6 mg), dichlorobis (triphenylphosphine) palladium (2.1 mg), and 20% by mass aqueous tetraethylammonium hydroxide solution (10 mL) were added thereto and refluxed for 14 hours. Next, aqueous solution of sodium diethyl dithiacarbamate was added thereto followed by stirring at 80° C. for 2 hours. After cooling the mixture obtained, washing was performed twice with water, twice with 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 1.33 g of the polymer 4. The polystyrene equivalent number average molecular weight of the polymer 4 (polymer compound) was $1.4 \times 10^5$, and the polystyrene equivalent weight average molecular weight was $3.2 \times 10^5$.

The polymer 4 was an alternating copolymer having a constitutional unit represented by the following formula, which corresponds to Z in the formula (1):

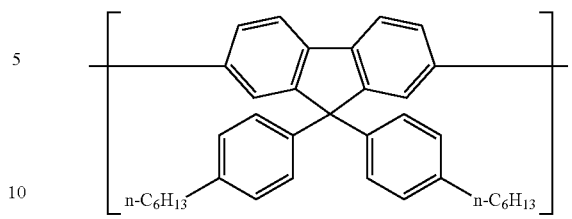

[Chemical Formula 95]

and a constitutional unit represented by the following formula, which corresponds to Y in the formula (1):

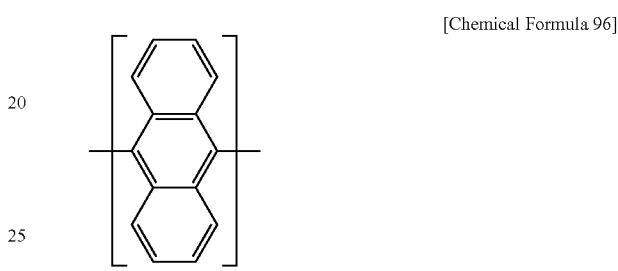

[Chemical Formula 96]

in a molar ratio of 50:50, as the theoretical value calculated from the amounts of the used starting materials, in which the copolymer consisted of the constitutional sequence (n=1) represented by the formula (1) only.

Polymerization Example 5

Synthesis of Polymer 5

Under inert atmosphere, the compound 3B (2.694 g, 2.97 mmol), the compound 1H (1.008 g, 3.00 mmol), phenylboronic acid (7.3 mg), dichlorobis(triphenylphosphine) palladium (2.1 mg), and toluene (71 mL) were mixed and heated to 105° C. 20% by mass aqueous tetraethylammonium hydroxide solution (10 mL) was added dropwise to the reaction solution, which was then refluxed for 6.5 hours. After the reaction, phenylboronic acid (36.5 mg), dichlorobis(triphenylphosphine) palladium (2.1 mg), and 20% by mass aqueous tetraethylammonium hydroxide solution (10 mL) were added thereto and refluxed for 16.5 hours. Next, aqueous sodium diethyl dithiacarbamate solution was added followed by stirring at 80° C. for 2 hours. After cooling the mixture obtained, washing was performed twice with water, twice with 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 2.13 g of the polymer 5 (polymer compound). The polystyrene equivalent number average molecular weight of the polymer 5 was $2.9 \times 10^4$, and the polystyrene equivalent weight average molecular weight was $8.6 \times 10^4$.

The polymer 5 was an alternating copolymer having a constitutional unit represented by the following formula, which corresponds to Z in the formula (1):

[Chemical Formula 97]

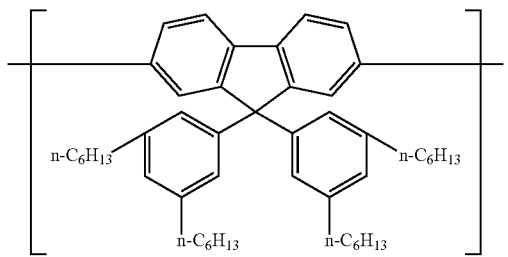

and a constitutional unit represented by the following formula, which corresponds to Y in the formula (1):

[Chemical Formula 98]

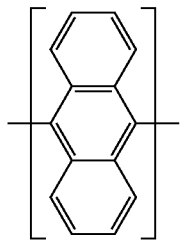

in a molar ratio of 50:50, as the theoretical value calculated from the amounts of the used starting materials, in which the copolymer consisted of the constitutional sequence (n=1) represented by the formula (1) only.

Polymerization Example 6

Synthesis of Polymer 6

Under inert atmosphere, the compound 3C (2.300 g, 3.00 mmol), the compound 1H (1.008 g, 3.00 mmol), dichlorobis(triphenylphosphine) palladium (2.1 mg), and toluene (71 mL) were mixed and heated to 105° C. 20% by mass aqueous tetraethylammonium hydroxide solution (10 mL) was added dropwise to the reaction solution, which was then refluxed for 3.5 hours. After the reaction, phenyl boronic acid (37.0 mg), dichlorobis(triphenylphosphine) palladium (2.1 mg), and 20% by mass aqueous tetraethylammonium hydroxide solution (10 mL) were added thereto and refluxed for 16 hours. Next, aqueous solution of sodium diethyl dithiacarbamate was added thereto followed by stirring at 80° C. for 2 hours. After cooling the mixture obtained, washing was performed twice with water, twice with 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 1.50 g of the polymer 6 (polymer compound). The polystyrene equivalent number average molecular weight of the polymer 6 was $1.3 \times 10^5$, and the polystyrene equivalent weight average molecular weight was $3.6 \times 10^5$.

The polymer 6 was an alternating copolymer having a constitutional unit represented by the following formula, which corresponds to Z in the formula (1):

[Chemical Formula 99]

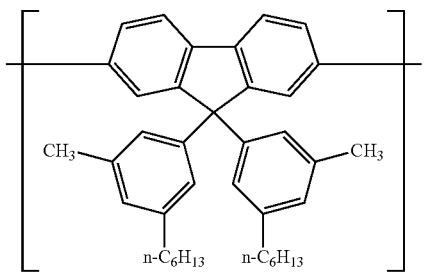

and a constitutional unit represented by the following formula, which corresponds to Y in the formula (1):

[Chemical Formula 100]

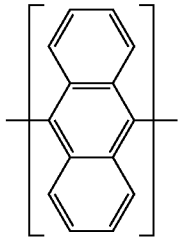

in a molar ratio of 50:50, as the theoretical value calculated from the amounts of the used starting materials, in which the copolymer consisted of the constitutional sequence (n=1) represented by the formula (1) only.

Polymerization Example 7

Synthesis of Polymer 7

Under inert atmosphere, the compound 3B (1.785 g, 1.97 mmol), the compound 1E (0.720 g, 2.00 mmol), dichlorobis(triphenylphosphine) palladium (1.4 mg), and toluene (47 mL) were mixed and heated to 105° C. 20% by mass aqueous tetraethylammonium hydroxide solution (7 mL) was added dropwise to the reaction solution, which was then refluxed for 4 hours. After the reaction, phenyl boronic acid (24.4 mg), dichlorobis (triphenylphosphine) palladium (1.3 mg), and 20% by mass aqueous tetraethylammonium hydroxide solution (7 mL) were added thereto and refluxed for 19 hours. Next, aqueous sodium diethyl dithiacarbamate solution was added thereto followed by stirring at 80° C. for 2 hours. After cooling the mixture obtained, washing was performed twice with water, twice with a 3% by mass of aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 1.41 g of the polymer 7 (polymer compound). The polystyrene equivalent number average molecular weight of the polymer 7 was $6.1 \times 10^4$, and the polystyrene equivalent weight average molecular weight was $1.5 \times 10^5$.

The polymer 7 was an alternating copolymer having a constitutional unit represented by the following formula, which corresponds to Z in the formula (1):

[Chemical Formula 101]

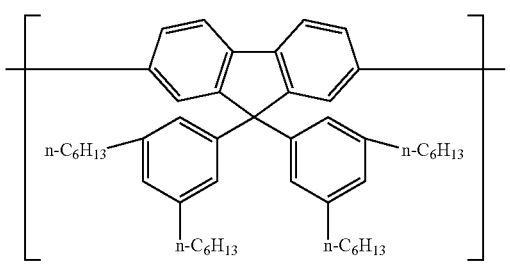

and a constitutional unit represented by the following formula, which corresponds to Y in the formula (1):

[Chemical Formula 102]

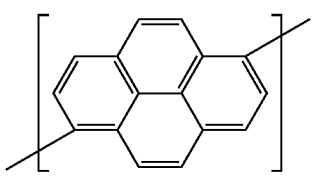

in a molar ratio of 50:50, as the theoretical value calculated from the amounts of the used starting materials, in which the copolymer consisted of the constitutional sequence (n=1) represented by the formula (1) only.

Polymerization Example 8

Synthesis of Polymer 8

Under inert atmosphere, the compound 3B (1.805 g, 1.99 mmol), the compound 1J (1.024 g, 2.00 mmol) represented by the following formula,

[Chemical Formula 103]

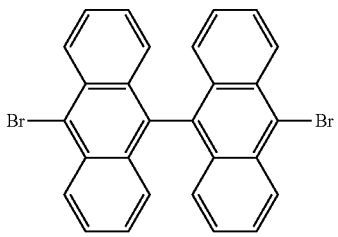

acetic acid palladium (0.5 mg), tris(tri-o-methoxyphenylphosphine) (2.8 mg), and toluene (60 mL) were mixed and heated to 105° C. 20% by mass aqueous tetraethylammonium hydroxide solution (7 mL) was added dropwise to the reaction solution, which was then refluxed for 3 hours. After the reaction, phenylboronic acid (24.4 mg), acetic acid palladium (0.5 mg), tris(tri-o-methoxyphenylphosphine) (2.8 mg), and 20% by mass aqueous tetraethylammonium hydroxide solution (7 mL) were added thereto and refluxed for 18.5 hours. Next, aqueous sodium diethyl dithiacarbamate solution was added thereto followed by stirring at 80° C. for 2 hours. After cooling the mixture obtained, washing was performed twice with water, twice with 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 0.87 g of the polymer 8 (polymer compound). The polystyrene equivalent number average molecular weight of the polymer 8 was $5.6 \times 10^4$, and the polystyrene equivalent weight average molecular weight was $3.1 \times 10^5$.

The polymer 8 was an alternating copolymer having a constitutional unit represented by the following formula, which corresponds to Z in the formula (1):

[Chemical Formula 104]

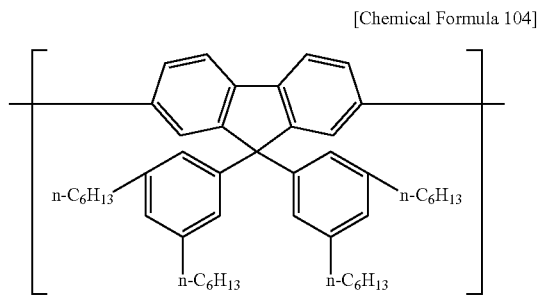

and a constitutional unit represented by the following formula, which corresponds to $(Y)_2$ in the formula (1):

[Chemical Formula 105]

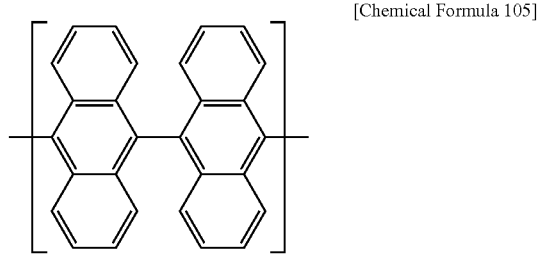

in a molar ratio of 50:50, as the theoretical value calculated from the amounts of the used starting materials, in which the copolymer consisted of the constitutional sequence (n=2) represented by the formula (1) only.

Polymerization Example 9

Synthesis of Polymer 9

Under inert atmosphere, the compound 3B (2.688 g, 2.96 mmol), the compound 1K (1.640 g, 1.80 mmol) represented by the following formula:

[Chemical Formula 106]

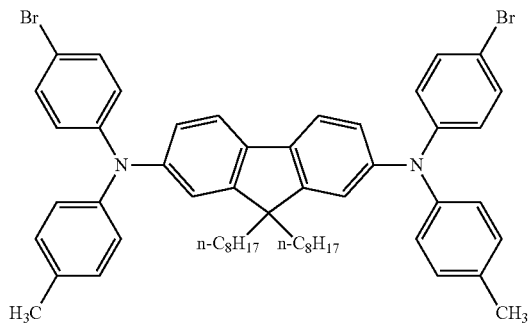

the compound F8BR: 0.411 g, 0.75 mmol) represented by the following formula; and

[Chemical Formula 107]

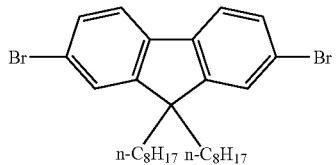

the compound 1L (0.238 g, 0.45 mmol) represented by the following formula,

[Chemical Formula 108]

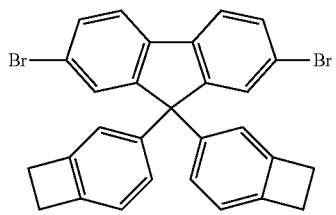

dichlorobis(triphenylphosphine) palladium (2.1 mg), and toluene (62 mL) were mixed and heated to 105° C. 20% by mass aqueous tetraethylammonium hydroxide solution (10 mL) was added dropwise to the reaction solution, which was then refluxed for 3 hours and 20 minutes. After the reaction, phenylboronic acid (36.8 mg), dichlorobis(triphenylphosphine) palladium (2.1 mg), and 20% by mass aqueous tetraethylammonium hydroxide solution (10 mL) were added and refluxed for 16 hours. Next, aqueous solution of sodium diethyl dithiacarbamate was added thereto followed by stirring at 80° C. for 2 hours. After cooling the mixture obtained, washing was performed twice with water, twice with 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 3.12 g of the polymer 9. The polystyrene equivalent number average molecular weight of the polymer 9 was $8.0 \times 10^4$, and the polystyrene equivalent weight average molecular weight was $2.6 \times 10^5$.

The polymer 9 was a copolymer having a constitutional unit represented by the following formula:

[Chemical Formula 109]

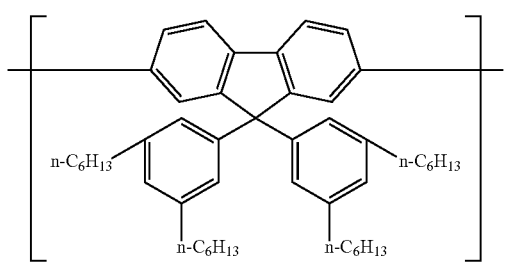

a constitutional unit represented by the following formula:

[Chemical Formula 110]

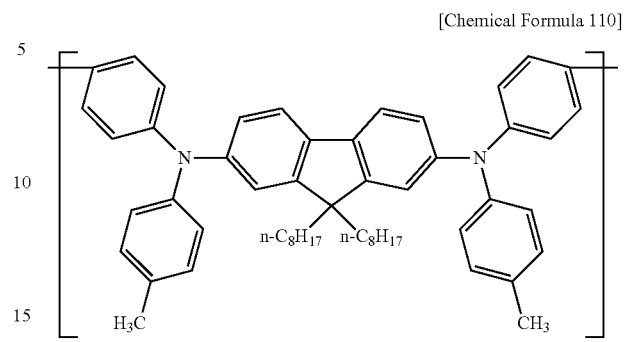

a constitutional unit represented by the following formula; and

[Chemical Formula 111]

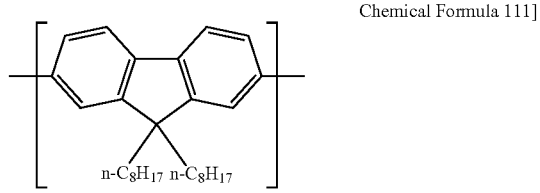

and a constitutional unit represented by the following formula:

[Chemical Formula 112]

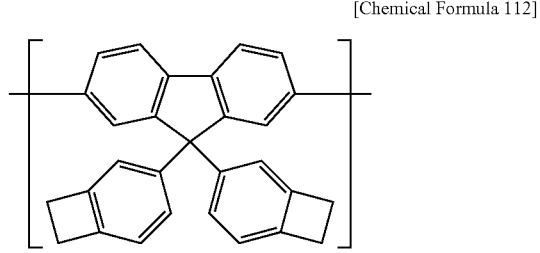

in a molar ratio of 50:30:12.5:7.5, as the theoretical value calculated from the amounts of the used starting materials.

Polymerization Example 10

Synthesis of Polymer 10 to be Polymerization Working Example 1

Under inert atmosphere, the compound 3C (1.803 g, 2.35 mmol), the compound 3G (0.133 g, 0.18 mmol), the compound 4F (0.329 g, 0.30 mmol), F8BR (0.329 g, 0.60 mmol), the compound 2D (0.851 g, 1.32 mmol), dichlorobis(triphenylphosphine) palladium (2.1 mg), and toluene (53 mL) were mixed and heated to 105° C. 20% by mass aqueous tetraethylammonium hydroxide solution (10 mL) was added dropwise to the reaction solution, which was then refluxed for 2.5 hours. Subsequently, the compound 3C (0.471 g, 0.61 mmol) and the compound 1H (0.202 g, 0.60 mmol) were added thereto and refluxed for 2.5 hours. After the reaction, phenylboronic acid (36.5 mg), dichlorobis (triphenylphosphine) palladium (2.2 mg), and 20% by mass aqueous tetraethylammonium hydroxide solution (10 mL) were added thereto and refluxed for 16.5 hours. Next, aqueous solution of sodium diethyl dithiacarbamate was added thereto followed by stirring at 80° C. for 2 hours. After cooling the mixture obtained, washing was performed twice with water, twice with 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 2.49 g of the polymer 10 (block type copolymer). The polystyrene equivalent number average molecular weight of the polymer 10 was $9.3 \times 10^4$, and the polystyrene equivalent weight average molecular weight was $2.5 \times 10^5$.

The polymer 10 was a block type copolymer having a constitutional unit 10A represented by the following formula, which corresponds to Z in the formula (1):

[Chemical Formula 113]

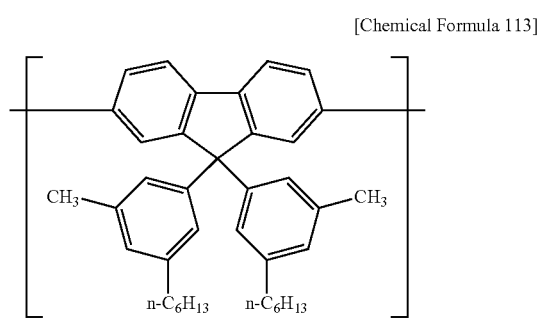

a constitutional unit 10B represented by the following formula;

[Chemical Formula 114]

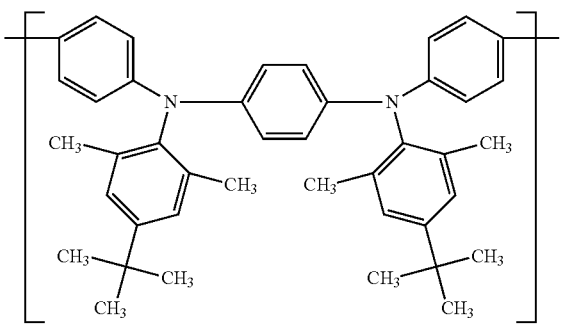

a constitutional unit 10C represented by the following formula;

[Chemical Formula 115]

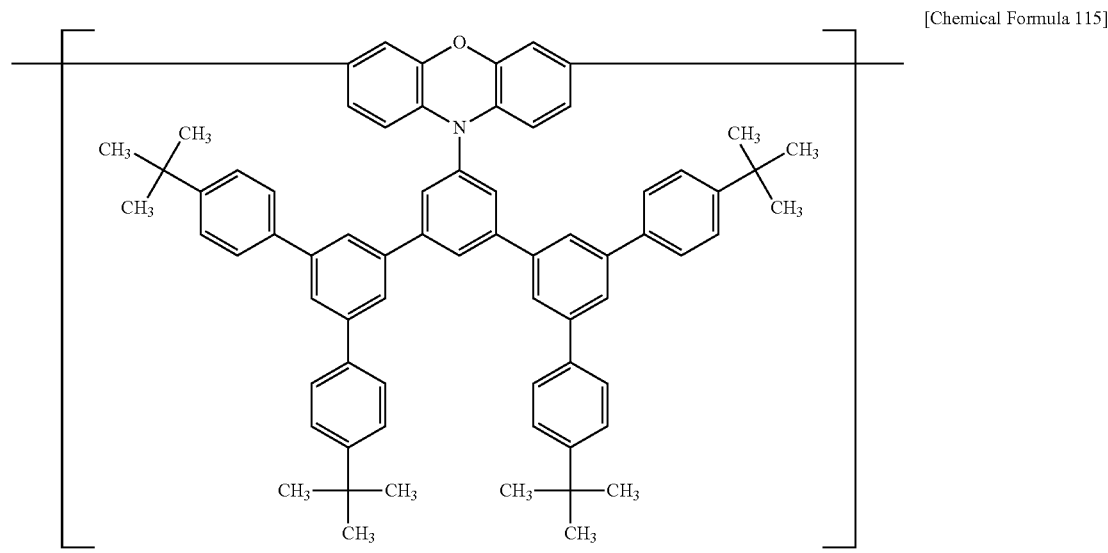

a constitutional unit 10D represented by the following formula;

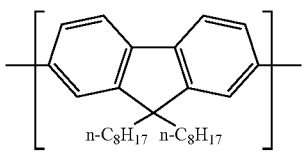
[Chemical Formula 116]

a constitutional unit 10E represented by the following formula; and

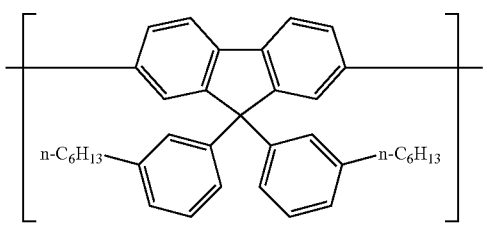
[Chemical Formula 117]

a constitutional unit 10F represented by the following formula which corresponds to Y in the formula (1):

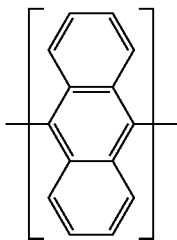
[Chemical Formula 118]

in a molar ratio of 50:3:5:10:22:10, as the theoretical value calculated from the amounts of the used starting materials, in which the block type copolymer had the block 10X consisting of 5 types of constitutional units including the constitutional unit 10A, the constitutional unit 10B, the constitutional unit 10C, the constitutional unit 10D, and the constitutional unit 10E and the block 10Y consisting of 2 types of constitutional units including the constitutional unit 10A and the constitutional unit 10F and the block 10Y consisted of the constitutional sequence (n=1) represented by the formula (1) only.

Polymerization Example 11

Synthesis of Polymer 11 to be Polymerization Example 2

Under inert atmosphere, the compound 3C (1.803 g, 2.35 mmol), the compound 3G (0.133 g, 0.18 mmol), the compound 4F (0.329 g, 0.30 mmol), F8BR (0.329 g, 0.60 mmol), the compound 2D (0.851 g, 1.32 mmol) dichlorobis (triphenylphosphine) palladium (2.0 mg), and toluene (53 mL) were mixed and heated to 105° C. 20% by mass aqueous tetraethylammonium hydroxide solution (10 mL) was added dropwise to the reaction solution, which was then refluxed for 2.5 hours. Subsequently, the compound 3B (0.558 g, 0.61 mmol) and the compound 1H (0.201 g, 0.60 mmol) were added thereto and refluxed for 2.5 hours. After the reaction, phenylboronic acid (36.6 mg), dichlorobis (triphenylphosphine) palladium (2.2 mg), and 20% by mass an aqueous tetraethylammonium hydroxide solution (10 mL) were added and refluxed for 16.5 hours. Next, aqueous solution of sodium diethyl dithiacarbamate was added thereto followed by stirring at 80° C. for 2 hours. After cooling the mixture obtained, washing was performed twice with water, twice with 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 2.13 g of the polymer 11 (block type copolymer). The polystyrene equivalent number average molecular weight of the polymer 11 was $9.7\times10^4$, and the polystyrene equivalent weight average molecular weight was $3.2\times10^5$.

The polymer 11 was a block type copolymer having a constitutional unit 11A represented by the following formula:

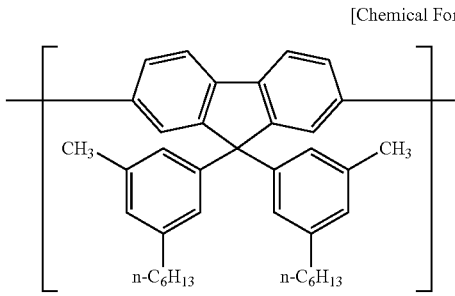
[Chemical Formula 119]

a constitutional unit 11B represented by the following formula, which corresponds to Z in the formula (1);

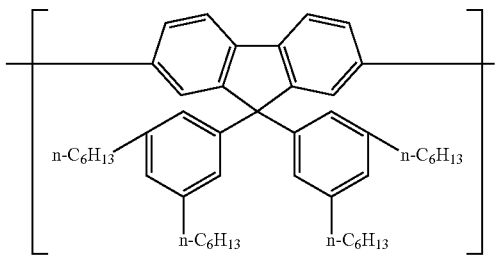
[Chemical Formula 120]

a constitutional unit 11C represented by the following formula;

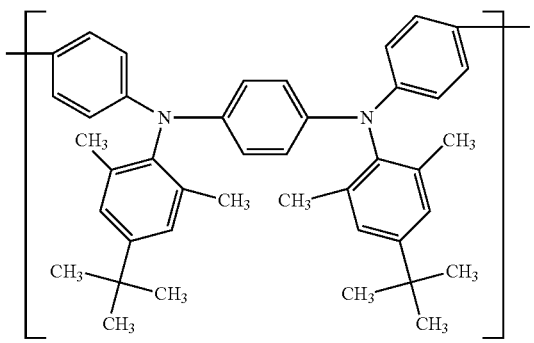
[Chemical Formula 121]

a constitutional unit 11D represented by the following formula;

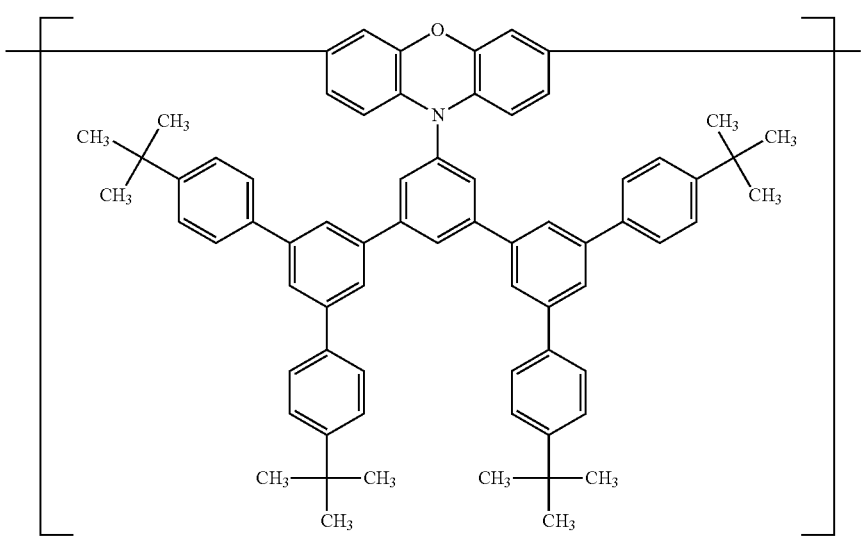
[Chemical Formula 122]

a constitutional unit 11E represented by the following formula;

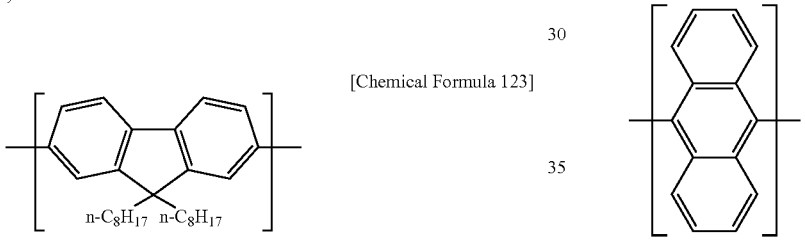
[Chemical Formula 123]

a constitutional unit 11F represented by the following formula; and

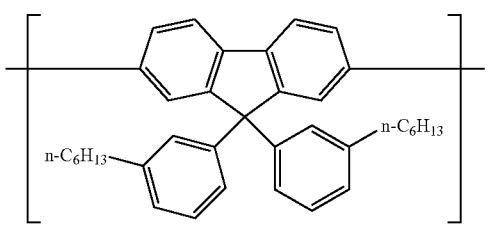
[Chemical Formula 124]

a constitutional unit 11G represented by the following formula which corresponds to Y in the formula (1):

[Chemical Formula 125]

in a molar ratio of 40:10:3:5:10:22:10, as the theoretical value calculated from the amounts of the used starting materials, in which the block type copolymer had the block 11X consisting of 5 types of constitutional units including the constitutional unit 11A, the constitutional unit 11C, the constitutional unit 11D, the constitutional unit 11E, and the constitutional unit 11F and the block 11Y consisting of 2 types of constitutional units including the constitutional unit 11B and the constitutional unit 11G and the block 11Y consisted of the constitutional sequence (n=1) represented by the formula (1) only.

Polymerization Example 12

Synthesis of Polymer 12

Under inert atmosphere, the compound 3C (2.2749 g, 2.97 mmol), the compound F8BR (0.3290 g, 0.60 mmol), the compound 2D (1.2375 g, 1.92 mmol), the compound 3G (0.1330 g, 0.18 mmol), the compound 4F (0.3295 g, 0.30 mmol), dichlorobis (triphenylphosphine) palladium (2.1 mg), and toluene (76 mL) were mixed and heated to 105° C. 20% by mass aqueous tetraethylammonium hydroxide solution (10 mL) was added dropwise to the reaction solution, which was then refluxed for 2 hours. After the reaction, phenylboronic acid (37 mg), dichlorobis (triphenylphosphine) palladium (2.1 mg), toluene (6 mL), and 20% by mass aqueous tetraethylammonium hydroxide solution (10 mL) were added thereto and refluxed for 14.5 hours. Next, aqueous sodium diethyl dithiacarbamate solution was added thereto followed by stirring at 80° C. for 2 hours. After cooling the mixture obtained, washing was performed twice with water, twice with 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 2.42 g of the polymer 12. The polystyrene equivalent number average molecular weight of the polymer 12 was $1.0 \times 10^5$, and the polystyrene equivalent weight average molecular weight was $2.9 \times 10^5$.

The polymer 12 was a copolymer having a constitutional unit represented by the following formula:

[Chemical Formula 126]

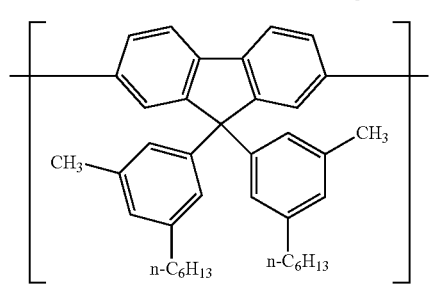

a constitutional unit represented by the following formula;

[Chemical Formula 127]

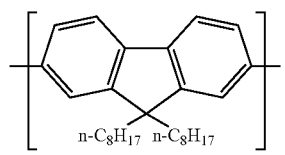

a constitutional unit represented by the following formula;

[Chemical Formula 128]

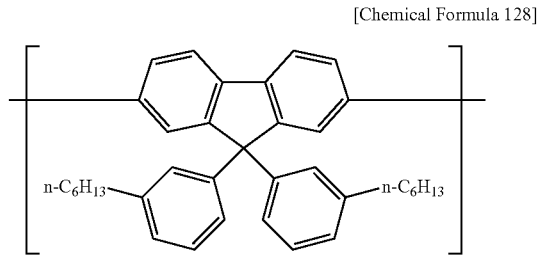

a constitutional unit represented by the following formula; and

[Chemical Formula 129]

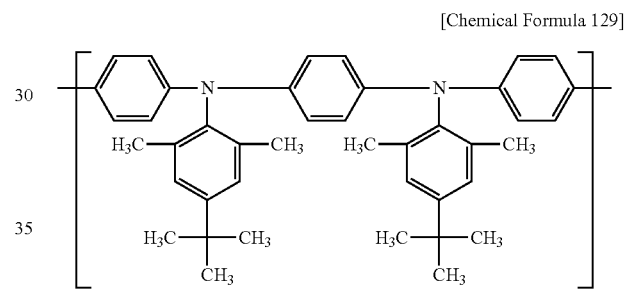

a constitutional unit represented by the following formula:

[Chemical Formula 130]

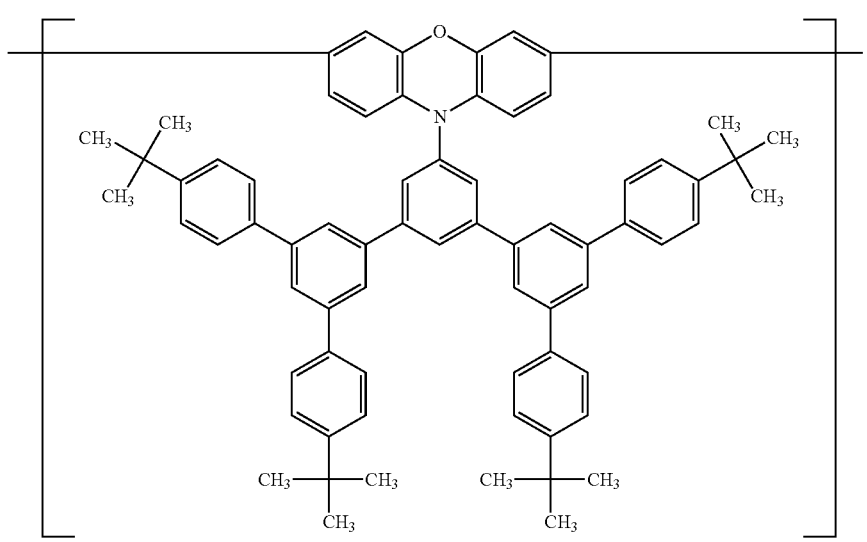

in a molar ratio 50:10:32:3:5, as the theoretical value calculated from the amounts of the used starting materials.

Polymerization Example 13

Synthesis of Polymer 13

Under inert atmosphere, the compound 3P (1.1969 g, 1.98 mmol), the compound 3S (1.0737 g, 1.80 mmol), the compound 4F (0.2197 g, 0.20 mmol), dichlorobis(triphenylphosphine) palladium (1.4 mg), and toluene (47 mL) were mixed and heated to 105° C. 20% by mass aqueous tetraethylammonium hydroxide solution (6.6 mL) was added dropwise to the reaction solution, which was then refluxed for 3.5 hours. After the reaction, phenylboronic acid (24 mg), 20% by mass aqueous tetraethylammonium hydroxide solution (6.6 mL), and dichlorobis(triphenylphosphine) palladium (1.4 mg) were added thereto and refluxed for 16.5 hours. Next, aqueous sodium diethyl dithiacarbamate solution was added thereto followed by stirring at 80° C. for 2 hours. After cooling the mixture obtained, washing was performed twice with water, twice with 3% by mass aqueous acetic acid solution, and twice with water, and the obtained solution was added dropwise to methanol and filtered to obtain a precipitate. The precipitate was dissolved in toluene and passed through an alumina column and a silica gel column in that order for purification. The obtained solution was added dropwise to methanol and stirred, and then the resulting precipitate was filtered and dried to give 1.12 g of the polymer 13. The polystyrene equivalent number average molecular weight of the polymer 13 was $7.5 \times 10^4$, and the polystyrene equivalent weight average molecular weight was $2.7 \times 10^5$.

The polymer 13 was a copolymer having a constitutional unit represented by the following formula:

[Chemical Formula 131]

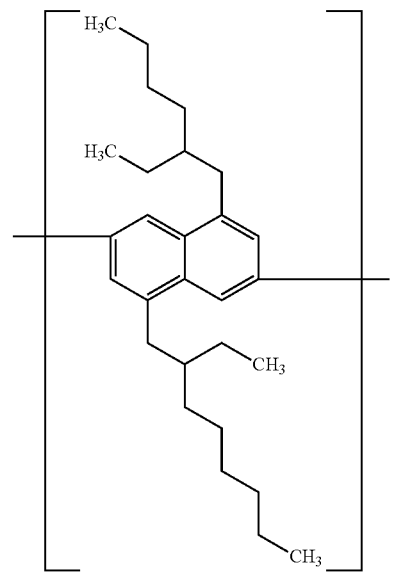

a constitutional unit represented by the following formula; and

[Chemical Formula 132]

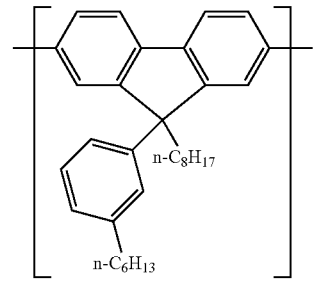

and a constitutional unit represented by the following formula:

[Chemical Formula 133]

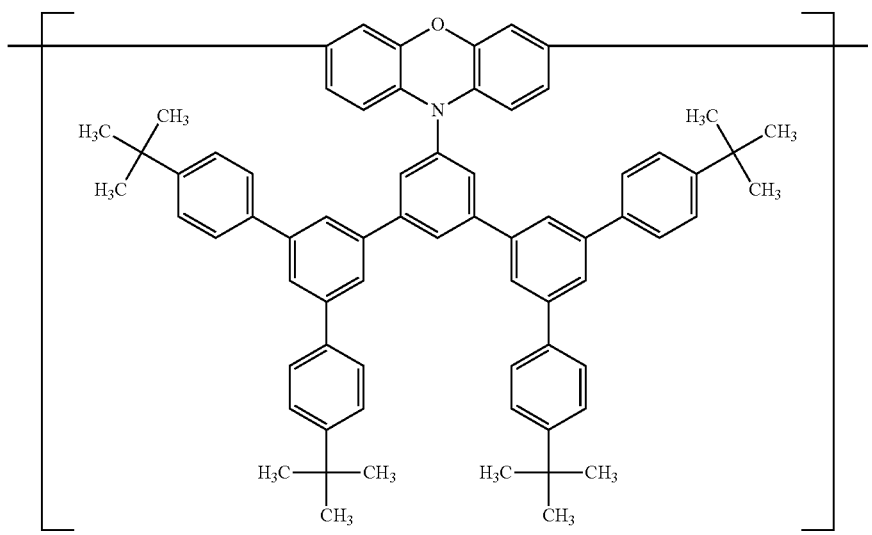

in a molar ratio of 50:45:5, as the theoretical value calculated from the amounts of the used starting materials.

Polymerization Example 14

Synthesis of Polymer 14

Under inert atmosphere, the compound 3B (8.888 g, 9.80 mmol), the compound 2B (0.813 g, 1.00 mmol), the compound 1H (3.024 g, 9.00 mmol), dichlorobis(triphenylphosphine) palladium (7.0 mg), and toluene (202 mL) were mixed and heated to 100° C. 20% by mass aqueous tetraethylammonium hydroxide solution (33 mL) was added dropwise to the reaction solution, which was then refluxed for 6 hours. After the reaction, phenylboronic acid (122 mg), dichlorobis(triphenylphosphine) palladium (7.0 mg), and 20% by mass aqueous tetraethylammonium hydroxide solution (33 mL) were added and refluxed for 12 hours. Next, aqueous solution of sodium diethyl dithiacarbamate was added thereto followed by stirring at 80° C. for 2 hours. After cooling the mixture obtained, washing was performed twice with water (129 mL), twice with 3% by mass aqueous acetic acid solution (129 mL), and twice with water (129 mL), and the obtained solution was added dropwise to methanol (1560 mL) and filtered to obtain a precipitate. The precipitate was dissolved in toluene (320 mL) and passed through an alumina column and a silica gel column in that order for purification. The obtained solution was added dropwise to methanol (1560 mL) and stirred, and then the resulting precipitate was filtered and dried to give 6.4 g of the polymer 14 (polymer compound). The polystyrene equivalent number average molecular weight of the polymer 14 was $6.9 \times 10^4$, and the polystyrene equivalent weight average molecular weight was $2.1 \times 10^5$.

The polymer 14 was a copolymer having a constitutional unit represented by the following formula, which corresponds to Z in the formula (1):

[Chemical Formula 134]

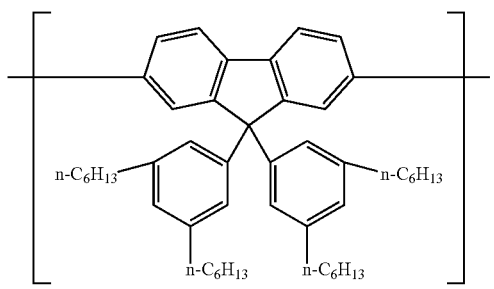

and a constitutional unit represented by the following formula, which corresponds to Y in the formula (1):

[Chemical Formula 135]

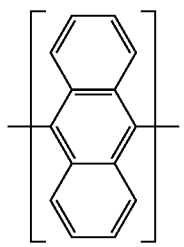

in a molar ratio of 55:45, as the theoretical value calculated from the amounts of the used starting materials. The copolymer corresponded to the Polymerization condition 9 using the "Polymerization simulation" described above, and it was a polymer containing the constitutional sequence (n=1, m'=9.9) included in the copolymer, which is represented by the formula (1).

Polymerization Example 15

Synthesis of Polymer 15

Under inert atmosphere, the compound 4I (1.725 g, 2.55 mmol), the compound 1H (0.8401 g, 2.50 mmol), dichlorobis(tris-o-methoxyphenylphosphine) palladium (2.2 mg), and toluene (39 mL) were mixed and heated to 100° C. 20% by mass aqueous tetraethylammonium hydroxide solution (8.3 mL) was added dropwise to the reaction solution, which was then refluxed for 2.5 hours. After the reaction, phenylboronic acid (30.5 mg), dichlorobis(tris-o-methoxyphenylphosphine) palladium (2.2 mg), and 20% by mass aqueous tetraethylammonium hydroxide solution (8.3 mL) were added thereto and refluxed for 12 hours. Next, aqueous sodium diethyl dithiacarbamate solution was added thereto followed by stirring at 80° C. for 2 hours. After cooling the mixture obtained, washing was performed twice with water (18 mL), twice with 3% by mass aqueous acetic acid solution (18 mL), and twice with water (18 mL), and the obtained solution was added dropwise to methanol (253 mL) and filtered to obtain a precipitate. The precipitate was dissolved in toluene (52 mL) and passed through an alumina column and a silica gel column in that order for purification. The obtained solution was added dropwise to methanol (253 mL) and stirred, and then the resulting precipitate was filtered and dried to give 6.4 g of the polymer 15 (polymer compound). The polystyrene equivalent number average molecular weight of the polymer 15 was $1.2 \times 10^5$, and the polystyrene equivalent weight average molecular weight was $4.8 \times 10^5$.

The polymer 15 was an alternating copolymer having a constitutional unit represented by the following formula, which corresponds to Z in the formula (1):

[Chemical Formula 136]

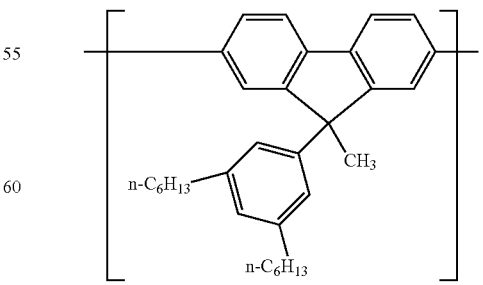

and a constitutional unit represented by the following formula, which corresponds to Y in the formula (1):

[Chemical Formula 137]

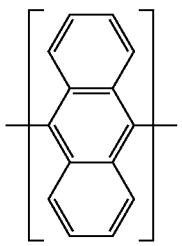

in a molar ratio of 50:50, as the theoretical value calculated from the amounts of the used starting materials, in which the copolymer consisted of the constitutional sequence (n=1) represented by the formula (1) only.

Polymerization Example 16

Synthesis of Polymer 16

Under inert atmosphere, the compound 4I (1.999 g, 3.0 mmol), the compound 1T (1.345 g, 3.0 mmol), dichlorobis(tris-o-methoxyphenylphosphine) palladium (2.7 mg), and toluene (55 mL) were mixed and heated to 100° C. 20% by mass aqueous tetraethylammonium hydroxide solution (10 mL) was added dropwise to the reaction solution, which was then refluxed for 6.5 hours. After the reaction, phenylboronic acid (37 mg), dichlorobis(tris-o-methoxyphenylphosphine) palladium (2.7 mg), and 20% by mass aqueous tetraethylammonium hydroxide solution (10 mL) were added thereto and refluxed for 12 hours. Next, aqueous solution of sodium diethyl dithiacarbamate was added thereto followed by stirring at 80° C. for 2 hours. After cooling the mixture obtained, washing was performed twice with water (30 mL), twice with 3% by mass aqueous acetic acid solution (30 mL), and twice with water (30 mL), and the obtained solution was added dropwise to methanol (360 mL) and filtered to obtain a precipitate. The precipitate was dissolved in toluene (123 mL) and passed through an alumina column and a silica gel column in that order for purification. The obtained solution was added dropwise to methanol (360 mL) and stirred, and then the resulting precipitate was filtered and dried to give 1.37 g of the polymer 16 (polymer compound). The polystyrene equivalent number average molecular weight of the polymer 16 was $9.4 \times 10^4$, and the polystyrene equivalent weight average molecular weight was $2.6 \times 10^5$.

The polymer 16 was an alternating copolymer having a constitutional unit represented by the following formula, which corresponds to Z in the formula (1):

[Chemical Formula 138]

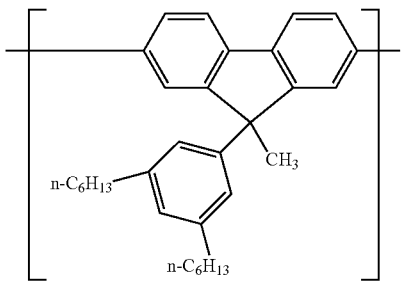

and a constitutional unit represented by the following formula, which corresponds to Y in the formula (1):

[Chemical Formula 139]

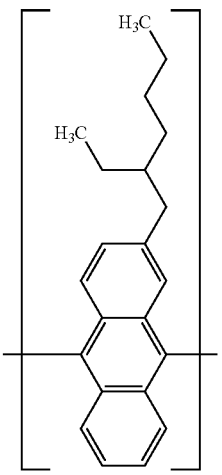

in a molar ratio of 50:50, as the theoretical value calculated from the amounts of the used starting materials, in which the copolymer consisted of the constitutional sequence (n=1) represented by the formula (1) only.

Polymerization Example 17

Synthesis of Polymer 17

Under inert atmosphere, the compound 3P (1.782 g, 2.95 mmol), the compound 1T (1.345 g, 3.00 mmol), dichlorobis(tris-o-methoxyphenylphosphine) palladium (2.7 mg), and toluene (50 mL) were mixed and heated to 100° C. 20% by mass aqueous tetraethylammonium hydroxide solution (10 mL) was added dropwise to the reaction solution, which was then refluxed for 3.0 hours. After the reaction, phenylboronic acid (37 mg), dichlorobis(tris-o-methoxyphenylphosphine) palladium (2.7 mg), and 20% by mass aqueous tetraethylammonium hydroxide solution (10 mL) were added thereto and refluxed for 12 hours. Next, aqueous solution of sodium diethyl dithiacarbamate was added thereto followed by stirring at 80° C. for 2 hours. After cooling the mixture obtained, washing was performed twice with water (27 mL), twice with 3% by mass aqueous acetic acid solution (27 mL), and twice with water (27 mL), and the obtained solution was added dropwise to methanol (323 mL) and filtered to give a precipitate. The precipitate was dissolved in toluene (199 mL) and passed through an alumina column and a silica gel column in that order for purification. The obtained solution was added dropwise to methanol (323 mL) and stirred, and then the resulting precipitate was filtered and dried to give 1.60 g of the polymer 17 (polymer compound). The polystyrene equivalent number average molecular weight of the polymer 17 was $4.4 \times 10^4$, and the polystyrene equivalent weight average molecular weight was $2.9 \times 10^5$.

The polymer 17 was an alternating copolymer having a constitutional unit represented by the following formula, which corresponds to Z in the formula (1):

[Chemical Formula 140]

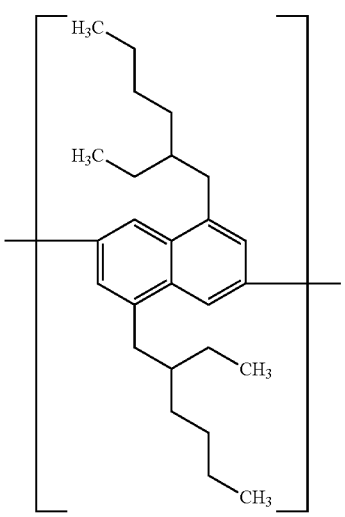

and a constitutional unit represented by the following formula, which corresponds to Y in the formula (1):

[Chemical Formula 141]

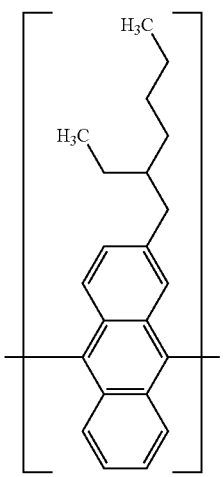

in a molar ratio of 50:50, as the theoretical value calculated from the amounts of the used starting materials, in which the copolymer consisted of the constitutional sequence (n=1) represented by the formula (1) only.

Polymerization Example 18

Synthesis of Polymer 18

Under inert atmosphere, the compound 6M (0.8175 g, 1.0 mmol), the compound 1T (0.4706 g, 1.0 mmol), dichlorobis(tris-o-methoxyphenylphosphine) palladium (0.9 mg), and toluene (36 mL) were mixed and heated to 100° C. 20% by mass aqueous tetraethylammonium hydroxide solution (3.5 mL) was added dropwise to the reaction solution, which was then refluxed for 6 hours. After the reaction, phenylboronic acid (13 mg), dichlorobis(tris-o-methoxyphenylphosphine) palladium (0.9 mg), and 20% by mass aqueous tetraethylammonium hydroxide solution (3.5 mL) were added thereto and refluxed for 12 hours. Next, aqueous sodium diethyl dithiacarbamate solution was added thereto followed by stirring at 80° C. for 2 hours. After cooling the mixture obtained, washing was performed twice with water (12 mL), twice with 3% by mass aqueous acetic acid solution (12 mL), and twice with water (12 mL), and the obtained solution was added dropwise to methanol (149 mL) and filtered to give a precipitate. The precipitate was dissolved in toluene (102 mL) and passed through an alumina column and a silica gel column in that order for purification. The obtained solution was added dropwise to methanol (149 mL) and stirred, and then the resulting precipitate was filtered and dried to give 0.49 g of the polymer 18 (polymer compound). The polystyrene equivalent number average molecular weight of the polymer 18 was $4.5 \times 10^4$, and the polystyrene equivalent weight average molecular weight was $2.2 \times 10^5$.

The polymer 18 was an alternating copolymer having a constitutional unit represented by the following formula, which corresponds to Y and Z in the formula (1):

[Chemical Formula 142]

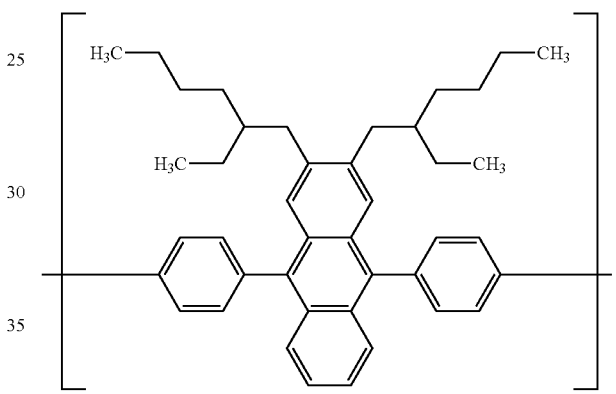

and a constitutional unit represented by the following formula, which corresponds to Y in the formula (1):

[Chemical Formula 143]

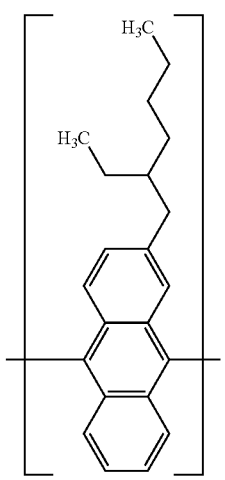

in a molar ratio of 50:50, as the theoretical value calculated from the amounts of the used starting materials, in which the copolymer consisted of the constitutional sequence (n=1) represented by the formula (1) only.

Polymerization Example 19

Under inert atmosphere, the compound 3P (0.7300 g, 1.21 mmol), the compound 5N (0.8858 g, 1.25 mmol), the compound 1T (1.1206 g, 2.50 mmol), dichlorobis(tris-o-methoxyphenylphosphine) palladium (2.2 mg), and toluene (45 mL) were mixed and heated to 100° C. 20% by mass aqueous tetraethylammonium hydroxide solution (8.3 mL) was added dropwise to the reaction solution, which was then refluxed for 4 hours. After the reaction, phenylboronic acid (31 mg), dichlorobis(tris-o-methoxyphenylphosphine) palladium (2.2 mg), and 20% by mass aqueous tetraethylammonium hydroxide solution (8.3 mL) were added thereto and refluxed for 20 hours. Next, aqueous sodium diethyl dithiacarbamate solution was added thereto followed by stirring at 80° C. for 2 hours. After cooling the mixture obtained, washing was performed twice with water (24 mL), twice with 3% by mass aqueous acetic acid solution (24 mL), and twice with water (24 mL), and the obtained solution was added dropwise to methanol (292 mL) and filtered to give a precipitate. The precipitate was dissolved in toluene (120 mL) and passed through an alumina column and a silica gel column in that order for purification. The obtained solution was added dropwise to methanol (292 mL) and stirred, and then the resulting precipitate was filtered and dried to give 1.25 g of the polymer 19 (polymer compound). The polystyrene equivalent number average molecular weight of the polymer 19 was $7.0 \times 10^4$, and the polystyrene equivalent weight average molecular weight was $8.0 \times 10^5$.

The polymer 19 was a copolymer having a constitutional unit represented by the following formula, which corresponds to Z in the formula (1):

[Chemical Formula 144]

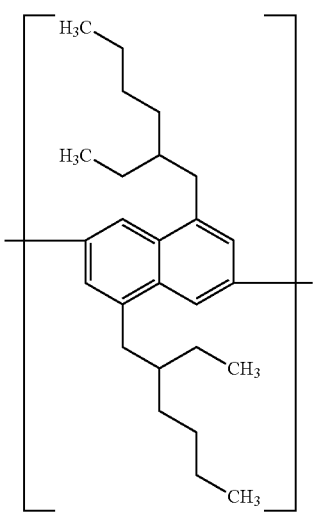

a constitutional unit represented by the following formula, which corresponds to Z in the formula (1):

[Chemical Formula 145]

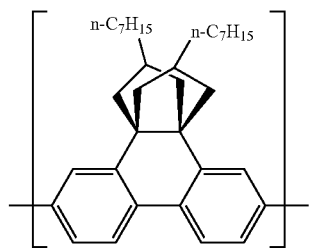

and a constitutional unit represented by the following formula, which corresponds to Y in the formula (1):

[Chemical Formula 146]

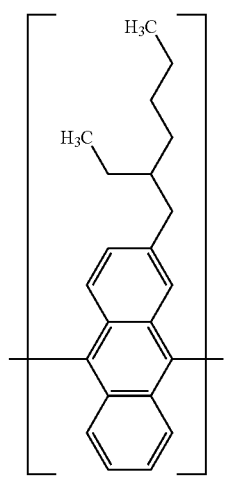

in a molar ratio of 25:25:50, as the theoretical value calculated from the amounts of the used starting materials, in which the copolymer consisted of the constitutional sequence (n=1) represented by the formula (1) only.

Polymerization Example 20

Synthesis of Polymer 20

Under inert atmosphere, the compound 2Q (1.3419 g, 1.960 mmol), the compound 4I (0.3383 g, 0.500 mmol), the compound 1T (1.1206 g, 2.50 mmol), dichlorobis(tris-o-methoxyphenylphosphine) palladium (2.2 mg), and toluene (46 mL) were mixed and heated to 100° C. 20% by mass aqueous tetraethylammonium hydroxide solution (8.3 mL) was added dropwise to the reaction solution, which was then refluxed for 4 hours. After the reaction, phenylboronic acid (31 mg), dichlorobis(tris-o-methoxyphenylphosphine) palladium (2.2 mg), and 20% by mass aqueous tetraethylammonium hydroxide solution (8.3 mL) were added thereto and refluxed for 20 hours. Next, aqueous sodium diethyl dithiacarbamate solution was added thereto followed by stirring at 80° C. for 2 hours. After cooling the mixture obtained, washing was performed twice with water (25 mL), twice with 3% by mass aqueous acetic acid solution (25 mL), and twice with water (25 mL), and the obtained solution was added dropwise to methanol (303 mL) and filtered to give a precipitate. The precipitate was dissolved in toluene (124 mL) and passed through an alumina column and a silica gel column in that order for purification. The obtained solution was added dropwise to methanol (673 mL) and stirred, and then the resulting precipitate was filtered and dried to give 1.36 g of the polymer 20 (polymer compound). The polystyrene equivalent number average molecular weight of the polymer 20 was $7.5 \times 10^4$, and the polystyrene equivalent weight average molecular weight was $3.0 \times 10^5$.

The polymer 20 was a copolymer having a constitutional unit represented by the following formula, which corresponds to Z in the formula (1):

[Chemical Formula 147]

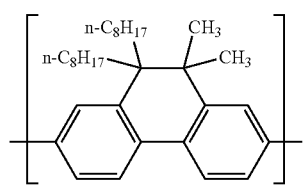

a constitutional unit represented by the following formula, which corresponds to Z in the formula (1):

[Chemical Formula 148]

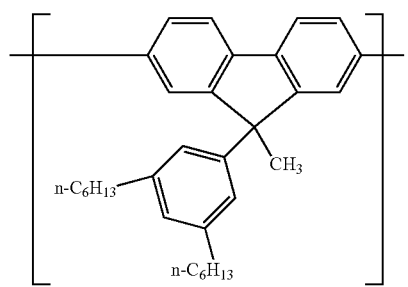

and a constitutional unit represented by the following formula, which corresponds to Y in the formula (1):

[Chemical Formula 149]

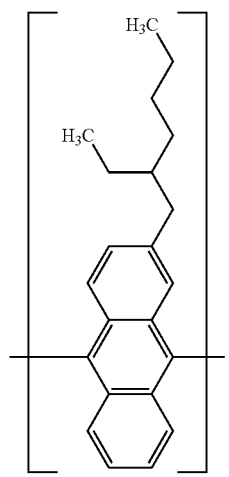

in a molar ratio of 40:10:50, as the theoretical value calculated from the amounts of the used starting materials, in which the copolymer consisted of the constitutional sequence (n=1) represented by the formula (1) only.

Polymerization Example 21

Synthesis of Polymer 21

Under inert atmosphere, the compound 3P (0.7330 g, 1.213 mmol), the compound 4I (0.8457 g, 1.250 mmol), the compound 1T (1.1206 g, 2.50 mmol), dichlorobis(tris-o-methoxyphenylphosphine) palladium (2.2 mg), and toluene (44 mL) were mixed and heated to 100° C. 20% by mass aqueous tetraethylammonium hydroxide solution (8.3 mL) was added dropwise to the reaction solution, which was then refluxed for 5 hours. After the reaction, phenylboronic acid (31 mg), dichlorobis(tris-o-methoxyphenylphosphine) palladium (2.2 mg), and 20% by mass aqueous tetraethylammonium hydroxide solution (8.3 mL) were added thereto and refluxed for 20 hours. Next, aqueous sodium diethyl dithiacarbamate solution was added thereto followed by stirring at 80° C. for 2 hours. After cooling the mixture obtained, washing was performed twice with water (24 mL), twice with 3% by mass aqueous acetic acid solution (24 mL), and twice with water (24 mL), and the obtained solution was added dropwise to methanol (285 mL) and filtered to give a precipitate. The precipitate was dissolved in toluene (117 mL) and passed through an alumina column and a silica gel column in that order for purification. The obtained solution was added dropwise to methanol (380 mL) and stirred, and then the resulting precipitate was filtered and dried to give 1.14 g of the polymer 21 (polymer compound). The polystyrene equivalent number average molecular weight of the polymer 21 was $8.0 \times 10^4$, and the polystyrene equivalent weight average molecular weight was $2.6 \times 10^5$.

The polymer 21 was a copolymer having a constitutional unit represented by the following formula, which corresponds to Z in the formula (1):

[Chemical Formula 150]

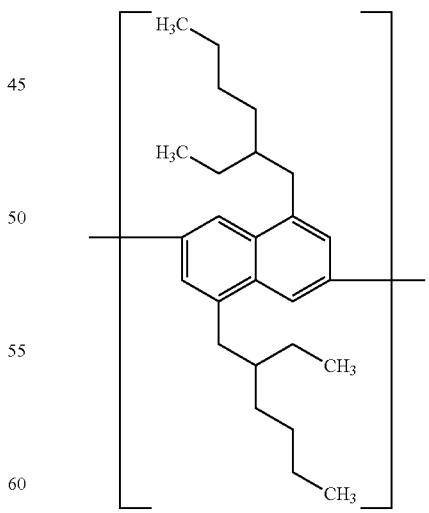

a constitutional unit represented by the following formula, which corresponds to Z in the formula (1):

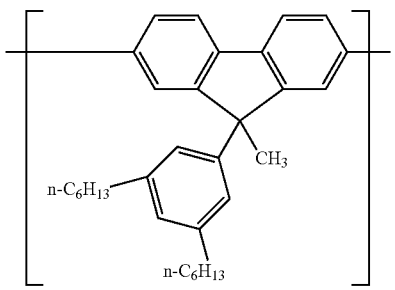

and a constitutional unit represented by the following formula, which corresponds to Y in the formula (1):

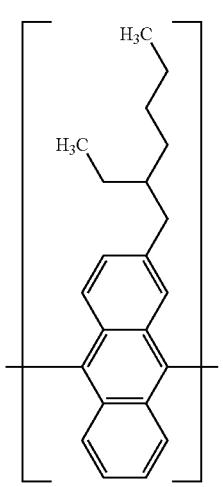

in a molar ratio of 25:25:50, as the theoretical value calculated from the amounts of the used starting materials, in which the copolymer consisted of the constitutional sequence (n=1) represented by the formula (1) only.

Polymerization Example 22

Synthesis of Polymer 22

Under inert atmosphere, the compound 3P (4.9955 g, 8.264 mmol), the compound 4I (1.4208 g, 2.100 mmol), the compound 1T (4.7064 g, 10.500 mmol), dichlorobis(tris-o-methoxyphenylphosphine) palladium (9.3 mg), and toluene (177 mL) were mixed and heated to 100° C. 20% by mass aqueous tetraethylammonium hydroxide solution (35 mL) was added dropwise to the reaction solution, which was then refluxed for 4 hours. After the reaction, phenylboronic acid (128 mg), dichlorobis(tris-o-methoxyphenylphosphine) palladium (9.3 mg), and 20% by mass aqueous tetraethylammonium hydroxide solution (35 mL) were added thereto and refluxed for 20 hours. Next, aqueous sodium diethyl dithiacarbamate solution was added thereto followed by stirring at 80° C. for 2 hours. After cooling the mixture obtained, washing was performed twice with water (96 mL), twice with 3% by mass aqueous acetic acid solution (96 mL), and twice with water (96 mL), and the obtained solution was added dropwise to methanol (1158 mL) and filtered to give a precipitate. The precipitate was dissolved in toluene (237 mL) and passed through an alumina column and a silica gel column in that order for purification. The obtained solution was added dropwise to methanol (1158 mL) and stirred, and then the resulting precipitate was filtered and dried to give 5.0 g of the polymer 22 (polymer compound). The polystyrene equivalent number average molecular weight of the polymer 22 was $7.0 \times 10^4$, and the polystyrene equivalent weight average molecular weight was $2.6 \times 10^5$.

The polymer 22 was a copolymer having a constitutional unit represented by the following formula, which corresponds to Z in the formula (1):

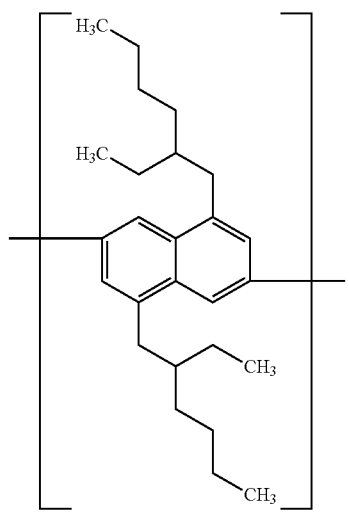

a constitutional unit represented by the following formula, which corresponds to Z in the formula (1):

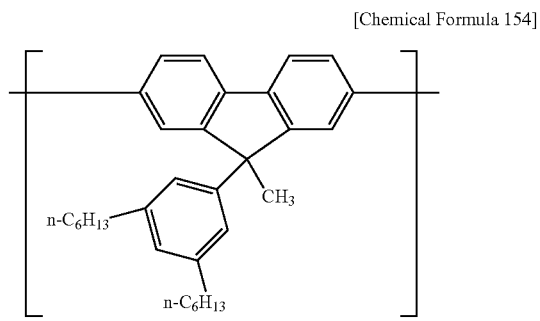

and a constitutional unit represented by the following formula, which corresponds to Y in the formula (1):

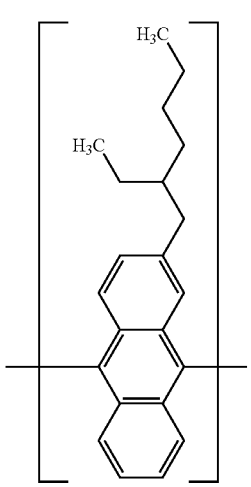

in a molar ratio of 40:10:50, as the theoretical value calculated from the amounts of the used starting materials, in which the copolymer consisted of the constitutional sequence (n=1) represented by the formula (1) only.

Polymerization Example 23

Synthesis of Polymer 23

Under inert atmosphere, the compound 3B (2.133 g, 2.352 mmol), the compound F8BR (0.085 g, 0.150 mmol), the compound 1K (1.640 g, 1.800 mmol), the compound 1L (0.238 g, 0.450 mmol), dichlorobis(triphenylphosphine) palladium (2.1 mg), and toluene (53 mL) were mixed and heated to 100° C. 20% by mass aqueous tetraethylammonium hydroxide solution (10 mL) was added dropwise to the reaction solution, which was then refluxed for 2 hours. Subsequently, the compound 3B (0.558 g, 0.615 mmol) and the compound 1H (0.202 g, 0.600 mmol) were added and refluxed for 2 hours. After the reaction, phenylboronic acid (37 mg), dichlorobis(triphenylphosphine) palladium (2.1 mg), and 20% by mass aqueous tetraethylammonium hydroxide solution (10 mL) were added thereto and refluxed for 12 hours. Next, aqueous solution of sodium diethyl dithiacarbamate was added thereto followed by stirring at 80° C. for 2 hours. After cooling the mixture obtained, washing was performed twice with water (39 mL), twice with 3% by mass aqueous acetic acid solution (39 mL), and twice with water (39 mL), and the obtained solution was added dropwise to methanol (466 mL) and filtered to give a precipitate. The precipitate was dissolved in toluene (94 mL) and passed through an alumina column and a silica gel column in that order for purification. The obtained solution was added dropwise to methanol (466 mL) and stirred, and then the resulting precipitate was filtered and dried to give 3.17 g of the polymer 23 (block type copolymer). The polystyrene equivalent number average molecular weight of the polymer 23 was $5.9 \times 10^4$, and the polystyrene equivalent weight average molecular weight was $1.8 \times 10^5$.

The polymer 23 was a block type copolymer having a constitutional unit 23A represented by the following formula, which corresponds to Z in the formula (1):

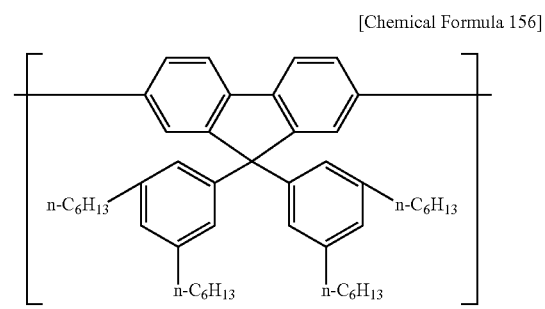

a constitutional unit 23B represented by the following formula;

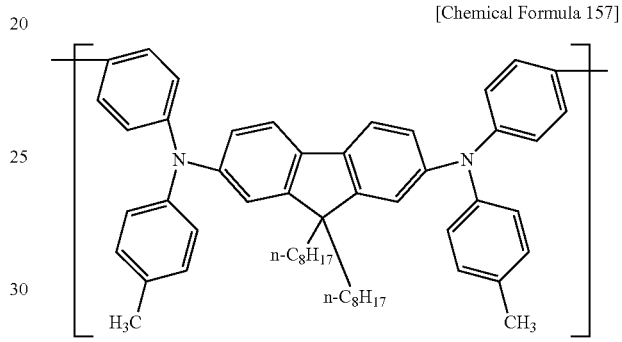

a constitutional unit 23C represented by the following formula;

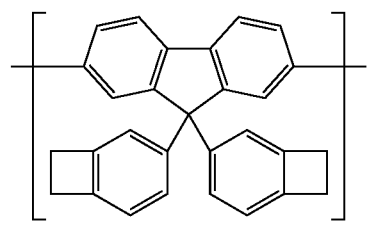

a constitutional unit 23D represented by the following formula; and

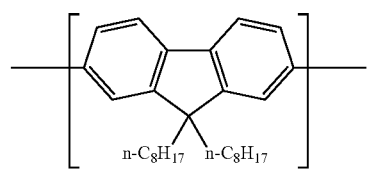

a constitutional unit 23E represented by the following formula which corresponds to Y in the formula (1):

[Chemical Formula 160]

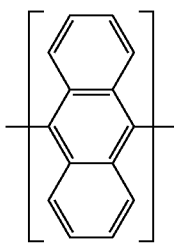

in a molar ratio of 50:30:7.5:2.5:10, as the theoretical value calculated from the amounts of the used starting materials, in which the block type copolymer had the block 23X consisting of 4 types of constitutional units including the constitutional unit 23A, the constitutional unit 23B, the constitutional unit 23C, and the constitutional unit 23D and the block 23Y consisting of 2 types of constitutional units including the constitutional unit 23A and the constitutional unit 23E and the block 23Y consisted of the constitutional sequence (n=1) represented by the formula (1) only.

Polymerization Example 24

Synthesis of Polymer 24

Under inert atmosphere, the compound 5N (1.403 g, 1.98 mmol), the compound 3S (1.002 g, 1.68 mmol), the compound 3G (0.089 g, 0.12 mmol), the compound 4F (0.220 g, 0.20 mmol), dichlorobis(tris-o-methoxyphenylphosphine) palladium (1.8 mg), and toluene (47 mL) were mixed and heated to 105° C. 20% by mass aqueous tetraethylammonium hydroxide solution (7.5 mL) was added dropwise to the reaction solution, which was then refluxed for 2.5 hours. After the reaction, phenylboronic acid (25 mg), 20% by mass aqueous tetraethylammonium hydroxide solution (7.5 mL), and dichlorobis(tris-o-methoxyphenylphosphine) palladium (1.8 mg), toluene (5 mL) were added thereto and refluxed for 17 hours. Next, aqueous sodium diethyl dithiacarbamate solution was added thereto followed by stirring at 80° C. for 2 hours. After cooling the mixture obtained, washing was performed twice with water (26 mL), twice with 3% by mass aqueous acetic acid solution (26 mL), and twice with water (26 mL), and the obtained solution was added dropwise to methanol (311 mL) and filtered to give a precipitate. The precipitate was dissolved in toluene and passed through an alumina column and a silica gel column in that order for purification. The obtained solution was added dropwise to methanol (327 mL) and stirred, and then the resulting precipitate was filtered and dried to give 1.16 g of the polymer 24. The polystyrene equivalent number average molecular weight of the polymer 24 was $1.2 \times 10^5$, and the polystyrene equivalent weight average molecular weight was $2.5 \times 10^5$.

The polymer 24 was a copolymer having a constitutional unit represented by the following formula:

[Chemical Formula 161]

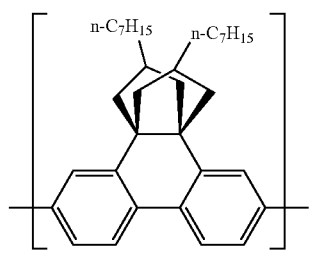

a constitutional unit represented by the following formula;

[Chemical Formula 162]

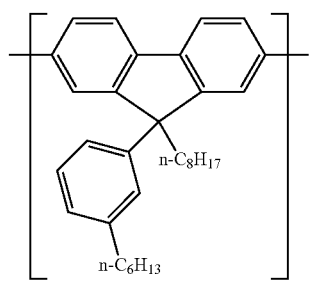

a constitutional unit represented by the following formula; and

[Chemical Formula 163]

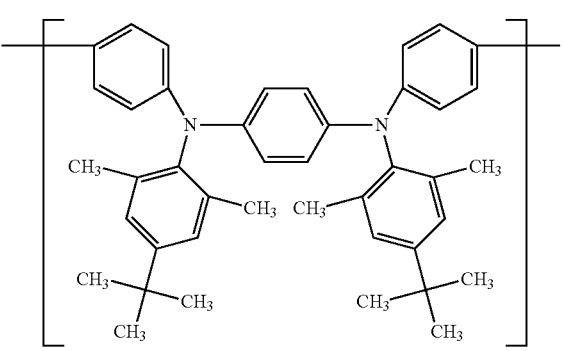

a constitutional unit represented by the following formula:

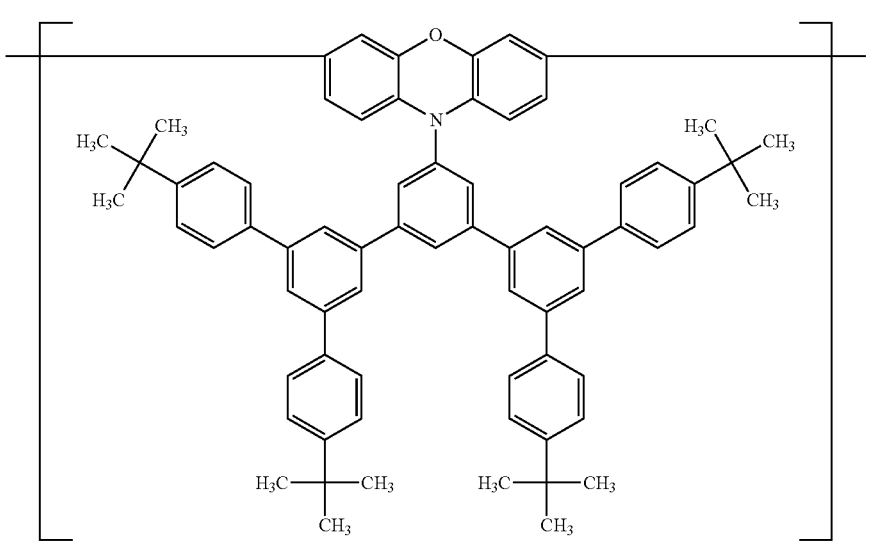

[Chemical Formula 164]

in a molar ratio of 50:42:3:5, as the theoretical value calculated from the amounts of the used starting materials.

Polymerization Example 25

Synthesis of Polymer 25

Under inert atmosphere, the compound 4I (1.6661 g, 2.463 mmol), the compound 3S (1.3122 g, 2.200 mmol), the compound 5R (0.2302 g, 0.250 mmol), the compound 4F (0.0549 g, 0.050 mmol), dichlorobis(tris-o-methoxyphenylphosphine) palladium (0.7 mg), and toluene (58 mL) were mixed and heated to 100° C. A 20% by mass aqueous solution of tetraethylammonium hydroxide (8.3 mL) was added dropwise to the reaction solution, which was then refluxed for 8 hours. After the reaction, phenylboronic acid (31 mg), dichlorobis(tris-o-methoxyphenylphosphine) palladium (2.2 mg), and 20% by mass aqueous tetraethylammonium hydroxide solution (8.3 mL) were added thereto and refluxed for 12 hours. Next, aqueous sodium diethyl dithiacarbamate solution was added thereto followed by stirring at 80° C. for 2 hours. After cooling the mixture obtained, washing was performed twice with water (32 mL), twice with 3% by mass aqueous acetic acid solution (32 mL), and twice with water (32 mL), and the obtained solution was added dropwise to methanol (380 mL) and filtered to give a precipitate. The precipitate was dissolved in toluene (78 mL) and passed through an alumina column and a silica gel column in that order for purification. The obtained solution was added dropwise to methanol (380 mL) and stirred, and then the resulting precipitate was filtered and dried to give 1.61 g of the polymer 25. The polystyrene equivalent number average molecular weight of the polymer 25 was $8.6 \times 10^4$, and the polystyrene equivalent weight average molecular weight was $2.4 \times 10^5$.

The polymer 25 was a copolymer having a constitutional unit represented by the following formula:

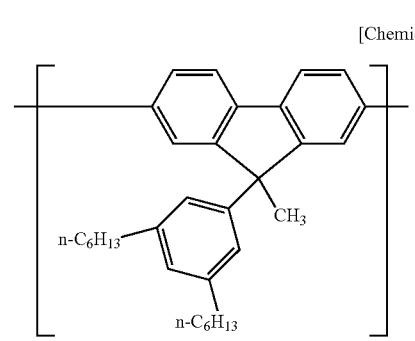

[Chemical Formula 165]

a constitutional unit represented by the following formula;

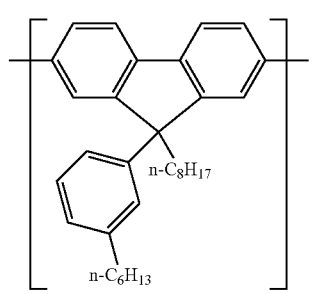

[Chemical Formula 166]

a constitutional unit represented by the following formula; and

[Chemical Formula 167]

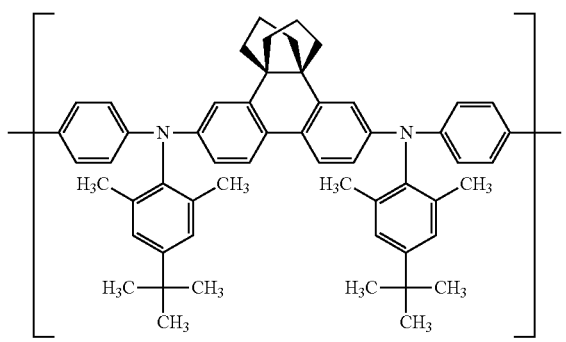

a constitutional unit represented by the following formula:

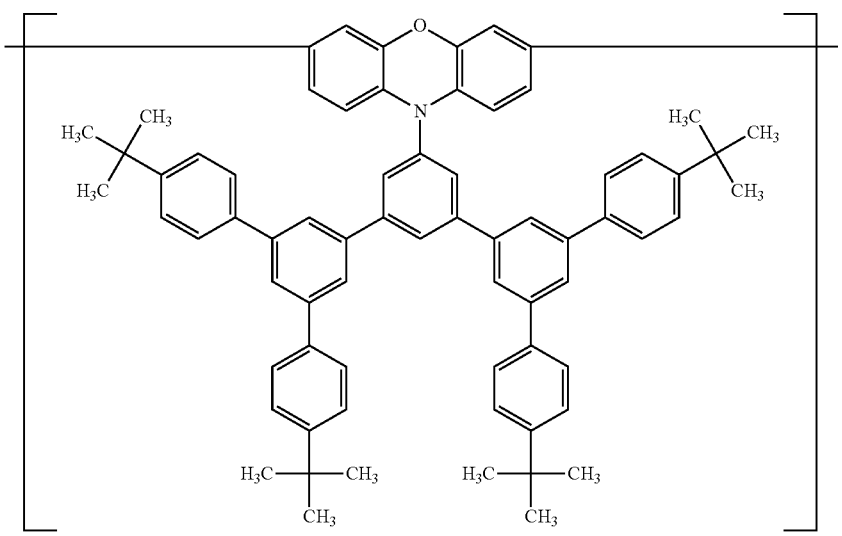

in a molar ratio of 50:44:5:1, as the theoretical value calculated from the amounts of the used starting materials.

Polymerization Example 26

Synthesis of Polymer 26

Under inert atmosphere, the compound 4I (1.3437 g, 1.986 mmol), the compound 3S (1.0498 g, 1.760 mmol), the compound 5R (0.2210 g, 0.240 mmol), dichlorobis(triphenylphosphine) palladium (1.4 mg), and toluene (46 mL) were mixed and heated to 100° C. 20% by mass aqueous tetraethylammonium hydroxide solution (6.7 mL) was added dropwise to the reaction solution, which was then refluxed for 5 hours. After the reaction, phenylboronic acid (24 mg), dichlorobis(triphenylphosphine) palladium (1.4 mg), and 20% by mass aqueous tetraethylammonium hydroxide solution (6.7 mL) were added thereto and refluxed for further 12 hours. Next, aqueous solution of sodium diethyl dithiacarbamate was added thereto followed by stirring at 80° C. for 2 hours. After cooling the mixture obtained, washing was performed twice with water (25 mL), twice with 3% by mass aqueous acetic acid solution (25 mL), and twice with water (25 mL), and the obtained solution was added dropwise to methanol (303 mL) and filtered to give a precipitate. The precipitate was dissolved in toluene (75 mL) and passed through an alumina column and a silica gel column in that order for purification. The obtained solution was added dropwise to methanol (303 mL) and stirred, and then the resulting precipitate was filtered and dried to give 1.08 g of the polymer 26. The polystyrene equivalent number average molecular weight of the polymer 26 was $8.9 \times 10^4$, and the polystyrene equivalent weight average molecular weight was $2.3 \times 10^5$.

The polymer 26 was a copolymer having a constitutional unit represented by the following formula:

[Chemical Formula 168]

[Chemical Formula 169]

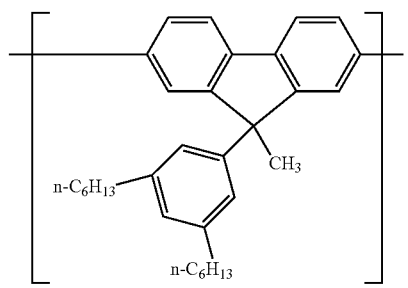

a constitutional unit represented by the following formula; and

[Chemical Formula 170]

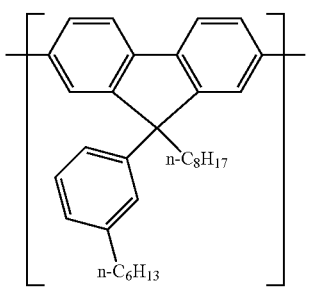

a constitutional unit represented by the following formula:

[Chemical Formula 171]

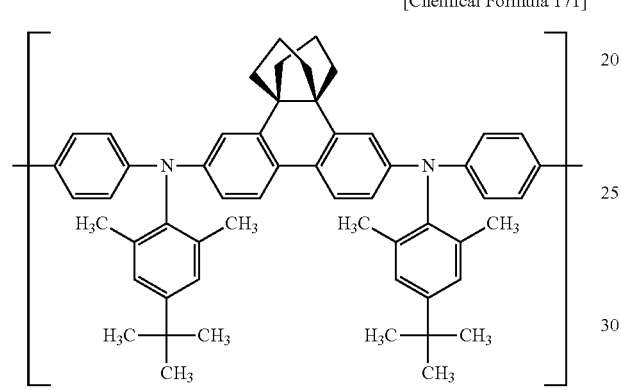

in a molar ratio of 50:44:6, as the theoretical value calculated from the amounts of the used starting materials.

Polymerization Example 27

Synthesis of Polymer 27

Under inert atmosphere, the compound 3C (1.7988 g, 2.346 mmol), the compound 3B (0.5440 g, 0.600 mmol), the compound 2D (1.2375 g, 1.920 mmol), the compound 3G (0.1330 g, 0.180 mmol), the compound 4F (0.3294 g, 0.300 mmol), the compound 1H (0.2016 g, 0.600 mmol), dichlorobis(triphenylphosphine) palladium (2.1 mg), and toluene (79 mL) were mixed and heated to 100° C. 20% by mass aqueous tetraethylammonium hydroxide solution (10 mL) was added dropwise to the reaction solution, which was then refluxed for 7 hours. After the reaction, phenylboronic acid (37 mg), dichlorobis(tris-o-methoxyphenylphosphine) palladium (2.1 mg), and 20% by mass aqueous tetraethylammonium hydroxide solution (10 mL) were added thereto and refluxed for further 12 hours. Next, aqueous sodium diethyl dithiacarbamate solution was added thereto followed by stirring at 80° C. for 2 hours. After cooling the mixture obtained, washing was performed twice with water (43 mL), twice with 3% by mass aqueous acetic acid solution (43 mL), and twice with water (43 mL), and the obtained solution was added dropwise to methanol (514 mL) and filtered to give a precipitate. The precipitate was dissolved in toluene (105 mL) and passed through an alumina column and a silica gel column in that order for purification. The obtained solution was added dropwise to methanol (514 mL) and stirred, and then the resulting precipitate was filtered and dried to give 1.78 g of the polymer 27. The polystyrene equivalent number average molecular weight of the polymer 27 was $7.7 \times 10^4$, and the polystyrene equivalent weight average molecular weight was $2.3 \times 10^5$.

The polymer 27 was a copolymer having a constitutional unit represented by the following formula:

[Chemical Formula 172]

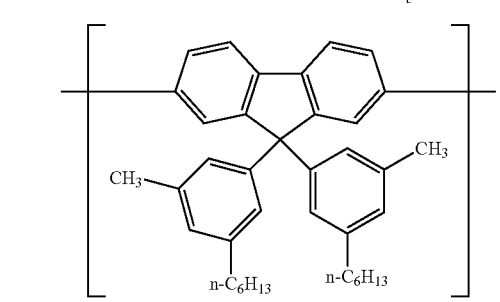

a constitutional unit represented by the following formula;

[Chemical Formula 173]

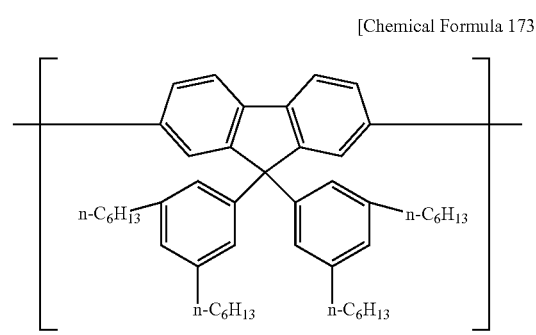

a constitutional unit represented by the following formula;

[Chemical Formula 174]

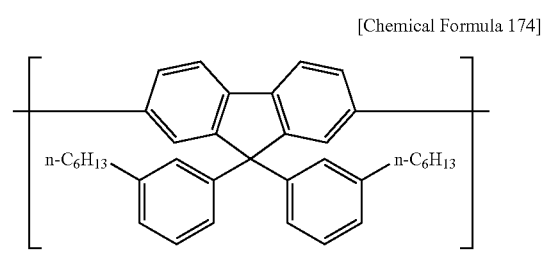

a constitutional unit represented by the following formula;

[Chemical Formula 175]

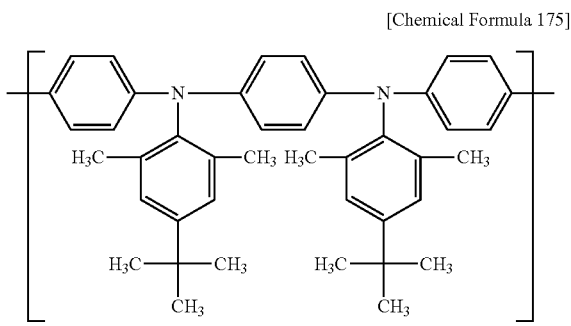

a constitutional unit represented by the following formula;

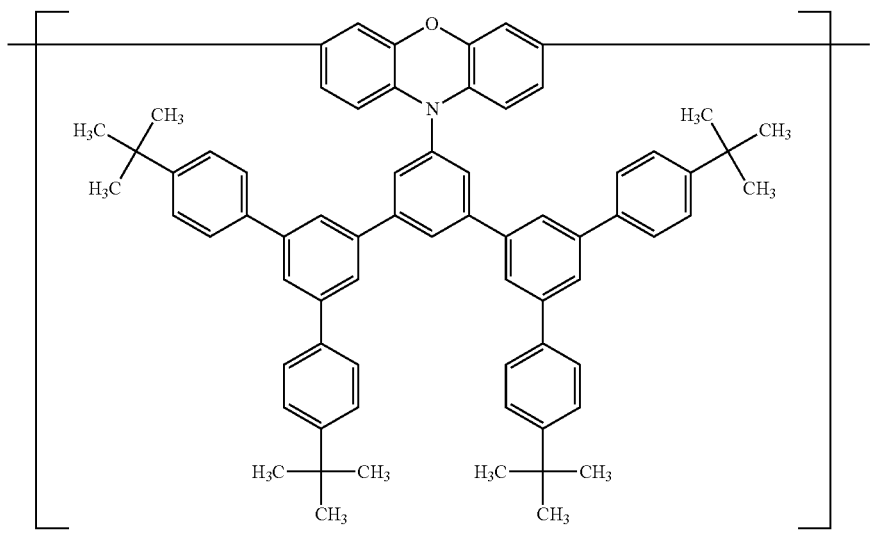

[Chemical Formula 176]

and a constitutional unit represented by the following formula:

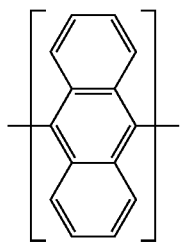

[Chemical Formula 177]

in a molar ratio of 40:10:32:3:5:10, as the theoretical value calculated from the amounts of the used starting materials.

Polymerization Example 28

Synthesis of Polymer 28

Under inert atmosphere, the compound 3B (1.796 g, 1.98 mmol), the compound 2B (0.650 g, 0.80 mmol), the compound 1H (0.403 g, 1.2 mmol), dichlorobis(triphenylphosphine) palladium (1.4 mg), and toluene (47 mL) were mixed and heated to 100° C. 20% by mass aqueous tetraethylammonium hydroxide solution (6.6 mL) was added dropwise to the reaction solution, which was then refluxed for 5 hours. After the reaction, phenylboronic acid (24.4 mg), dichlorobis(triphenylphosphine) palladium (1.4 mg), and 20% by mass aqueous tetraethylammonium hydroxide solution (6.6 mL) were added thereto and refluxed for further 20 hours. Next, aqueous solution of sodium diethyl dithiacarbamate was added thereto followed by stirring at 80° C. for 2 hours. After cooling the mixture obtained, washing was performed twice with water (26 mL), twice with 3% by mass aqueous acetic acid solution (26 mL), and twice with water (26 mL), and the obtained solution was added dropwise to methanol (311 mL) and filtered to give a precipitate. The precipitate was dissolved in toluene (63 mL) and passed through an alumina column and a silica gel column in that order for purification. The obtained solution was added dropwise to methanol (311 mL) and stirred, and then the resulting precipitate was filtered and dried to give 1.74 g of the polymer 28. The polystyrene equivalent number average molecular weight of the polymer 28 was $1.1 \times 10^5$, and the polystyrene equivalent weight average molecular weight was $3.7 \times 10^5$.

The polymer 28 was a copolymer having a constitutional unit represented by the following formula:

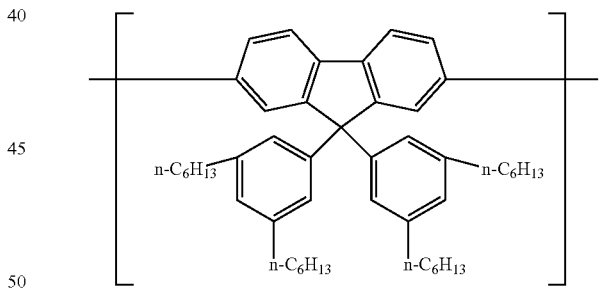

[Chemical Formula 178]

and a constitutional unit represented by the following formula:

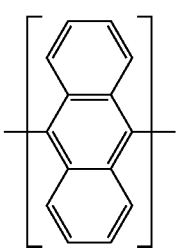

[Chemical Formula 179]

in a molar ratio of 70:30, as the theoretical value calculated from the amounts of the used starting materials. The copolymer corresponded to the Polymerization condition 6 using the "Polymerization simulation" described above, and it was a polymer containing the constitutional sequence (n=1, m'=2.95) included in the copolymer, which is represented by the formula (1).

Polymerization Example 29

Synthesis of Polymer 29

Under inert atmosphere, the compound 3B (1.796 g, 1.98 mmol), the compound 2B (0.9754 g, 1.20 mmol), the compound 1H (0.2688 g, 0.80 mmol), dichlorobis(tris-o-methoxyphenylphosphine) palladium (1.8 mg), and toluene (38 mL) were mixed and heated to 100° C. 20% by mass aqueous tetraethylammonium hydroxide solution (6.7 mL) was added dropwise to the reaction solution, which was then refluxed for 3.5 hours. After the reaction, phenylboronic acid (24.4 mg), dichlorobis(tris-o-methoxyphenylphosphine) palladium (1.8 mg), and 20% by mass aqueous tetraethylammonium hydroxide solution (6.7 mL) were added thereto and refluxed for further 12 hours. Next, aqueous solution of sodium diethyl dithiacarbamate was added thereto followed by stirring at 80° C. for 2 hours. After cooling the mixture obtained, washing was performed twice with water (31 mL), twice with 3% by mass aqueous acetic acid solution (31 mL), and twice with water (31 mL), and the obtained solution was added dropwise to methanol (376 mL) and filtered to give a precipitate. The precipitate was dissolved in toluene (77 mL) and passed through an alumina column and a silica gel column in that order for purification. The obtained solution was added dropwise to methanol (376 mL) and stirred, and then the resulting precipitate was filtered and dried to give 1.67 g of the polymer 29. The polystyrene equivalent number average molecular weight of the polymer 29 was $6.1 \times 10^4$, and the polystyrene equivalent weight average molecular weight was $2.4 \times 10^5$.

The polymer 29 was a copolymer having a constitutional unit represented by the following formula:

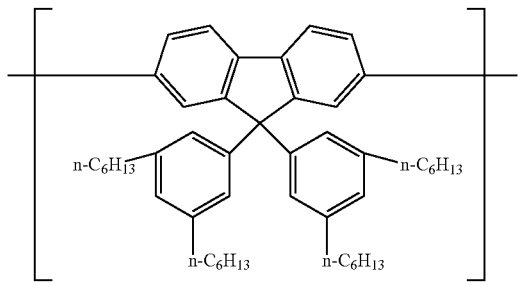

[Chemical Formula 180]

and a constitutional unit represented by the following formula:

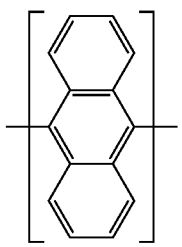

[Chemical Formula 181]

in a molar ratio of 80:20, as the theoretical value calculated from the amounts of the used starting materials. The copolymer corresponds to the Polymerization condition 4 using the "Polymerization simulation" described above, and it is a polymer containing the constitutional sequence (n=1, m'=2.15) included in the copolymer, which is represented by the formula (1).

Polymerization Example 30

Synthesis of Polymer 30

Under inert atmosphere, the compound 3B (1.796 g, 1.98 mmol), the compound 2B (1.301 g, 1.60 mmol), the compound 1H (0.131 g, 0.40 mmol), dichlorobis(triphenylphosphine) palladium (1.4 mg), and toluene (47 mL) were mixed and heated to 100° C. 20% by mass aqueous tetraethylammonium hydroxide solution (6.6 mL) was added dropwise to the reaction solution, which was then refluxed for 5 hours. After the reaction, phenylboronic acid (24.4 mg), dichlorobis(triphenylphosphine) palladium (1.4 mg), and 20% by mass aqueous tetraethylammonium hydroxide solution (6.6 mL) were added thereto and refluxed for further 20 hours. Next, aqueous solution of sodium diethyl dithiacarbamate was added thereto followed by stirring at 80° C. for 2 hours. After cooling the mixture obtained, washing was performed twice with water (26 mL), twice with 3% by mass aqueous acetic acid solution (26 mL), and twice with water (26 mL), and the obtained solution was added dropwise to methanol (311 mL) and filtered to give a precipitate. The precipitate was dissolved in toluene (63 mL) and passed through an alumina column and a silica gel column in that order for purification. The obtained solution was added dropwise to methanol (311 mL) and stirred, and then the resulting precipitate was filtered and dried to give 2.07 g of the polymer 30. The polystyrene equivalent number average molecular weight of the polymer 30 was $1.1 \times 10^5$, and the polystyrene equivalent weight average molecular weight was $3.4 \times 10^5$.

The polymer 30 was a copolymer having a constitutional unit represented by the following formula:

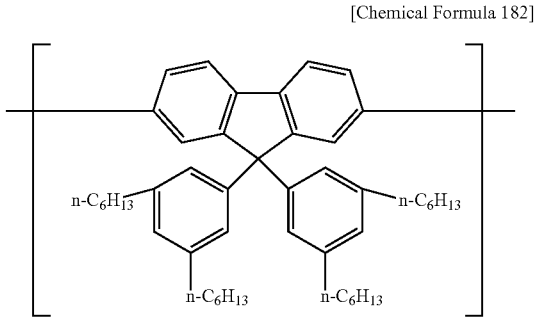

[Chemical Formula 182]

and a constitutional unit represented by the following formula:

[Chemical Formula 183]

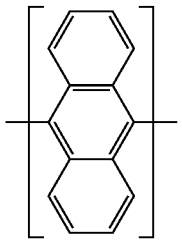

in a molar ratio of 90:10, as the theoretical value calculated from the amounts of the used starting materials. The copolymer corresponds to the Polymerization condition 2 using the "Polymerization simulation" described above, and it is a polymer containing the constitutional sequence (n=1, m'=1.75) included in the copolymer, which is represented by the formula (1).

Fabrication and Evaluation of Organic EL Device

Example 1

Fabrication and Evaluation of the Organic EL Device 1

AQ-1200 (manufactured by Plextronics) that was a polythiophene.sulfonic acid based hole injection agent was coated by spin coating method onto a glass panel on which an ITO film had been formed to thickness of 45 nm by sputtering method, with a film thickness of 50 nm. It was then dried on a hot plate at 170° C. for 15 minutes to fabricate a substrate for organic EL.

Next, the hole transport polymer (polymer 9) which has been dissolved in xylene solvent to the concentration of 0.7% by mass was spin-coated to form a film with thickness of about 20 nm. After that, it was treated with heat for 60 minutes at 180° C. on a hot plate under nitrogen atmosphere.

Next, a solution of the polymer 1 dissolved in xylene solvent to the concentration of 1.2% by mass, a solution of the polymer 2 dissolved in xylene solvent to the concentration of 1.2% by mass, and a solution of the polymer 5 dissolved in xylene solvent to the concentration of 1.2% by mass were mixed such that the polymer 1:the polymer 2:the polymer 5=50:30:20 in terms of weight ratio, thus yielding the composition 1.

The composition 1 was formed into a film on the substrate for organic EL described above by spin coating at a rotation speed of 1200 rpm. Film thickness was about 60 nm. This was dried under a nitrogen gas atmosphere at 130° C. for 10 minutes, after which as a cathode, sodium fluoride was deposited in a thickness of about 3 nm, and aluminum was then deposited in a thickness of about 80 nm to prepare the organic EL device 1. After the degree of vacuum reaches $1\times10^{-4}$ Pa or lower, deposition of metal was started.

A voltage was applied to the obtained organic EL device 1, and EL light emission having a peak at 460 nm which mainly originates from the polymer 1 was obtained from the device. The device started to emit light at 2.9 V and had a maximum light emitting efficiency of 9.29 cd/A.

A current value was set so that the organic EL device 1 obtained as described above had an initial luminance of 5000 cd/m$^2$, the device was then driven at a constant current, and a change in luminance with time was measured. As a result, it was found that the luminance decreases by half after 136 hours.

Example 2

Fabrication and Evaluation of the Organic EL Device 2

The organic EL device 2 was fabricated in the same manner as Example 1 except that, instead of the composition 1 of Example 1, the composition 2 was prepared by mixing a solution of the polymer 1 dissolved in xylene solvent to the concentration of 1.2% by mass, a solution of the polymer 2 dissolved in xylene solvent to the concentration of 1.2% by mass, and a solution of the polymer 4 dissolved in xylene solvent to the concentration of 1.2% by mass such that the polymer 1:the polymer 2:the polymer 4=50:30:20 in terms of weight ratio. A voltage was applied to the obtained organic EL device 2, and EL light emission having a peak at 460 nm which mainly originates from the polymer 1 was obtained from the device. The device started to emit light at 2.9 V and had a maximum light emitting efficiency of 8.23 cd/A.

A current value was set so that the organic EL device 2 obtained as described above had an initial luminance of 5000 cd/m$^2$, the device was then driven at a constant current, and a change in luminance with time was measured. As a result, it was found that the luminance decreases by half after 109 hours.

Example 3

Fabrication and Evaluation of the Organic EL Device 3

The organic EL device 3 was fabricated in the same manner as Example 1 except that, instead of the composition 1 of Example 1, the composition 3 was prepared by mixing a solution of the polymer 1 dissolved in xylene solvent to the concentration of 1.2% by mass, a solution of the polymer 2 dissolved in xylene solvent to the concentration of 1.2% by mass, and a solution of the polymer 6 dissolved in xylene solvent to the concentration of 1.2% by mass such that the polymer 1:the polymer 2:the polymer 6=50:30:20 in terms of weight ratio. A voltage was applied to the obtained organic EL device 3, and EL light emission having a peak at 460 nm which mainly originates from the polymer 1 was obtained from the device. The device started to emit light at 2.9 V and had a maximum light emitting efficiency of 8.70 cd/A.

A current value was set so that the organic EL device 3 obtained as described above had an initial luminance of 5000 cd/m$^2$, the device was then driven at a constant current, and a change in luminance with time was measured. As a result, it was found that the luminance decreases by half after 123 hours.

Example 4

Fabrication and Evaluation of the Organic EL Device 4

The organic EL device 4 was fabricated in the same manner as Example 1 except that, instead of the composition 1 of Example 1, the composition 4 was prepared by mixing a solution of the polymer 1 dissolved in xylene solvent to the concentration of 1.2% by mass, a solution of the polymer 2 dissolved in xylene solvent to the concentration of 1.2% by mass, and a solution of the polymer 7 dissolved in xylene solvent to the concentration of 1.2% by mass such that the polymer 1:the polymer 2:the polymer 7=50:30:20 in terms of weight ratio. A voltage was applied to the obtained organic EL device 4, and EL light emission having a peak at 460 nm which mainly originates from the polymer 1 was obtained from the device. The device started to emit light at 2.9 V and had a maximum light emitting efficiency of 10.34 cd/A.

A current value was set so that the organic EL device 4 obtained as described above had an initial luminance of 5000 cd/m$^2$, the device was then driven at a constant current, and a change in luminance with time was measured. As a result, it was found that the luminance decreases by half after 100 hours.

Example 5

Fabrication and Evaluation of the Organic EL Device 5

The organic EL device 5 was fabricated in the same manner as Example 1 except that, instead of the composition 1 of Example 1, a solution of the polymer 1 dissolved in xylene solvent to the concentration of 1.2% by mass, a solution of the polymer 2 dissolved in xylene solvent to the concentration of 1.2% by mass, and a solution of the polymer 8 dissolved in xylene solvent to the concentration of 1.2% by mass were mixed such that the polymer 1:the polymer 2:the polymer 8=50:30:20 in terms of weight ratio and the composition 5 was used. A voltage was applied to the obtained organic EL device 5, and EL light emission having a peak at 460 nm which mainly originates from the polymer 1 was obtained from the device. The device started to emit light at 2.9 V and had a maximum light emitting efficiency of 8.13 cd/A.

A current value was set so that the organic EL device 5 obtained as described above had an initial luminance of 5000 cd/m$^2$, the device was then driven at a constant current, and a change in luminance with time was measured. As a result, it was found that the luminance decreases by half after 137 hours.

Example 6

Fabrication and Evaluation of the Organic EL Device 6

The organic EL device 6 was fabricated in the same manner as Example 1 except that, instead of the composition 1 of Example 1, a solution of the polymer 10 dissolved in xylene solvent to the concentration of 1.2% by mass was prepared. A voltage was applied to the obtained organic EL device 6, and EL light emission having a peak at 460 nm which mainly originates from the block 10X in the polymer 10 was obtained from the device. The device started to emit light at 2.9 V and had a maximum light emitting efficiency of 11.45 cd/A.

A current value was set so that the organic EL device 6 obtained as described above had an initial luminance of 5000 cd/m$^2$, the device was then driven at a constant current, and a change in luminance with time was measured. As a result, it was found that the luminance decreases by half after 154 hours.

Example 7

Fabrication and Evaluation of the Organic EL Device 7

The organic EL device 7 was fabricated in the same manner as Example 1 except that, instead of the composition 1 of Example 1, a solution of the polymer 11 dissolved in xylene solvent to the concentration of 1.2% by mass was prepared. A voltage was applied to the obtained organic EL device 7, and EL light emission having a peak at 460 nm which mainly originates from the block 11X in the polymer 11 was obtained from the device. The device started to emit light at 2.9 V and had a maximum light emitting efficiency of 11.70 cd/A.

A current value was set so that the organic EL device 7 obtained as described above had an initial luminance of 5000 cd/m$^2$, the device was then driven at a constant current, and a change in luminance with time was measured. As a result, it was found that the luminance decreases by half after 192 hours.

Comparative Example 1

Fabrication and Evaluation of the Organic EL Device C1

The organic EL device C1 was fabricated in the same manner as Example 1 except that, instead of the composition 1 of Example 1, a solution of the polymer 1 dissolved in xylene solvent to the concentration of 1.2% by mass, a solution of the polymer 2 dissolved in xylene solvent to the concentration of 1.2% by mass, and a solution of the polymer 3 dissolved in xylene solvent to the concentration of 1.2% by mass were mixed such that the polymer 1:the polymer 2:the polymer 3=50:30:20 in terms of weight ratio and the composition 6 was used. A voltage was applied to the obtained organic EL device C1, and EL light emission having a peak at 460 nm which mainly originates from the polymer 1 was obtained from the device. The device started to emit light at 2.9 V and had a maximum light emitting efficiency of 8.68 cd/A.

A current value was set so that the organic EL device C1 obtained as described above had an initial luminance of 5000 cd/m$^2$, the device was then driven at a constant current, and a change in luminance with time was measured. As a result, it was found that the luminance decreases by half after 74 hours.

Comparative Example 2

Fabrication and Evaluation of the Organic EL Device C2

The organic EL device C2 was fabricated in the same manner as Example 1 except that, instead of the composition 1 of Example 1, a solution of the polymer 12 dissolved in xylene solvent to the concentration of 1.2% by mass was prepared. A voltage was applied to the obtained organic EL device C2, and EL light emission having a peak at 460 nm which mainly originates from the polymer 12 was obtained from the device. The device started to emit light at 2.9 V and had a maximum light emitting efficiency of 10.33 cd/A.

A current value was set so that the organic EL device C2 obtained as described above had an initial luminance of 5000 cd/m$^2$, the device was then driven at a constant current, and a change in luminance with time was measured. As a result, it was found that the luminance decreases by half after 84 hours.

Results obtained from the above Examples 1 to 7 and Comparative Examples 1 and 2 are given in Table 1.

TABLE 1

| | Composition/Block type copolymer | | Organic EL device | Maximum light emitting efficiency (cd/A) | Half period of luminance (hrs.) |
|---|---|---|---|---|---|
| | | Mixing ratio | | | |
| Example 1 | Polymer 1 | 50 | Organic EL device 1 | 9.29 | 136 |
| | Polymer 2 | 30 | | | |
| | Polymer 5 | 20 | | | |
| Example 2 | Polymer 1 | 50 | Organic EL device 2 | 8.23 | 109 |
| | Polymer 2 | 30 | | | |
| | Polymer 4 | 20 | | | |
| Example 3 | Polymer 1 | 50 | Organic EL device 3 | 8.70 | 123 |
| | Polymer 2 | 30 | | | |
| | Polymer 6 | 20 | | | |
| Example 4 | Polymer 1 | 50 | Organic EL device 4 | 10.34 | 100 |
| | Polymer 2 | 30 | | | |
| | Polymer 7 | 20 | | | |
| Example 5 | Polymer 1 | 50 | Organic EL device 5 | 8.13 | 137 |
| | Polymer 2 | 30 | | | |
| | Polymer 8 | 20 | | | |
| Example 6 | Polymer 10 | 100 | Organic EL device 6 | 11.45 | 154 |
| Example 7 | Polymer 11 | 100 | Organic EL device 7 | 11.70 | 192 |
| Comp. Example 1 | Polymer 1 | 50 | Organic EL device C1 | 8.68 | 74 |
| | Polymer 2 | 30 | | | |
| | Polymer 3 | 20 | | | |
| Comp. Example 2 | Polymer 12 | 100 | Organic EL device C2 | 10.33 | 84 |

Example 8

Fabrication and Evaluation of the Organic EL Device 8

Instead of the composition 1 of Example 1, the composition 8 was prepared in the same manner as Example 1 by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 14 dissolved in chlorobenzene solvent to the concentration of 0.9% by mass such that the polymer 1:the polymer 2:the polymer 14=50:30:20 in terms of weight ratio.

The composition 8 was formed into a film on the substrate for organic EL described above by spin coating at a rotation speed of 1500 rpm. Film thickness was about 60 nm. This film was dried under a nitrogen gas atmosphere at 130° C. for 10 minutes, after which as a cathode, sodium fluoride was deposited in a thickness of about 3 nm, and aluminum was then deposited in a thickness of about 80 nm to prepare the organic EL device 8. After the degree of vacuum reaches $1\times10^{-5}$ Pa or lower, deposition of a metal was started.

A voltage was applied to the obtained organic EL device 8, and EL light emission having a peak at 460 nm which mainly originates from the polymer 1 was obtained from the device. The device started to emit light at 2.6 V and had a maximum light emitting efficiency of 9.35 cd/A.

A current value was set so that the organic EL device 8 obtained as described above had an initial luminance of 5000 cd/m², the device was then driven at a constant current, and a change in luminance with time was measured. As a result, it was found that the luminance decreases by half after 105 hours.

Example 9

Fabrication and Evaluation of the Organic EL Device 9

The organic EL device 8 was fabricated in the same manner as Example 8 except that, instead of the composition 8 of Example 8, the composition 9 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 15 dissolved in chlorobenzene solvent to the concentration of 0.9% by mass such that the polymer 1:the polymer 2:the polymer 15=50:30:20 in terms of weight ratio. A voltage was applied to the obtained organic EL device 8, and EL light emission having a peak at 460 nm which mainly originates from the polymer 1 was obtained from the device. The device started to emit light at 2.6 V and had a maximum light emitting efficiency of 11.05 cd/A.

A current value was set so that the organic EL device 8 obtained as described above had an initial luminance of 5000 cd/m², the device was then driven at a constant current, and a change in luminance with time was measured. As a result, it was found that the luminance decreases by half after 158 hours.

Example 10

Fabrication and Evaluation of the Organic EL Device 10

The organic EL device 10 was fabricated in the same manner as Example 8 except that, instead of the composition 8 of Example 8, the composition 10 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 16 dissolved in chlorobenzene solvent to the concentration of 0.9% by mass such that the polymer 1:the polymer 2:the polymer 16=50:30:20 in terms of weight ratio. A voltage was applied to the obtained organic EL device 10, and EL light emission having a peak at 460 nm which mainly originates from the polymer 1 was obtained from the device. The device started to emit light at 2.7 V and had a maximum light emitting efficiency of 9.41 cd/A.

A current value was set so that the organic EL device 10 obtained as described above had an initial luminance of 5000 cd/m², the device was then driven at a constant current, and a change in luminance with time was measured. As a result, it was found that the luminance decreases by half after 124 hours.

Example 11

Fabrication and Evaluation of the Organic EL Device 11

The organic EL device 11 was fabricated in the same manner as Example 8 except that, instead of the composition 8 of Example 8, the composition 11 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 17 dissolved in chlorobenzene solvent to the concentration of 0.9% by mass such that the polymer 1:the polymer 2:the polymer 17=50:30:20 in terms of weight ratio. A voltage was applied to the obtained organic EL device 11, and EL light emission having a peak at 460 nm which mainly originates from the polymer 1 was obtained from the device. The device started to emit light at 3.0 V and had a maximum light emitting efficiency of 6.89 cd/A.

A current value was set so that the organic EL device 11 obtained as described above had an initial luminance of 5000 cd/m$^2$, the device was then driven at a constant current, and a change in luminance with time was measured. As a result, it was found that the luminance decreases by half after 111 hours.

Example 12

Fabrication and Evaluation of the Organic EL Device 12

The organic EL device 12 was fabricated in the same manner as Example 8 except that, instead of the composition 8 of Example 8, the composition 12 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 18 dissolved in chlorobenzene solvent to the concentration of 0.9% by mass such that the polymer 1:the polymer 2:the polymer 18=50:30:20 in terms of weight ratio. A voltage was applied to the obtained organic EL device 12, and EL light emission having a peak at 460 nm which mainly originates from the polymer 1 was obtained from the device. The device started to emit light at 2.8 V and had a maximum light emitting efficiency of 7.06 cd/A.

A current value was set so that the organic EL device 12 obtained as described above had an initial luminance of 5000 cd/m$^2$, the device was then driven at a constant current, and a change in luminance with time was measured. As a result, it was found that the luminance decreases by half after 101 hours.

Example 13

Fabrication and Evaluation of the Organic EL Device 13

The organic EL device 13 was fabricated in the same manner as Example 8 except that, instead of the composition 8 of Example 8, the composition 13 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 19 dissolved in chlorobenzene solvent to the concentration of 0.9% by mass such that the polymer 1:the polymer 2:the polymer 19=50:30:20 in terms of weight ratio. A voltage was applied to the obtained organic EL device 13, and EL light emission having a peak at 460 nm which mainly originates from the polymer 1 was obtained from the device. The device started to emit light at 2.8 V and had a maximum light emitting efficiency of 9.91 cd/A.

A current value was set so that the organic EL device 13 obtained as described above had an initial luminance of 5000 cd/m$^2$, the device was then driven at a constant current, and a change in luminance with time was measured. As a result, it was found that the luminance decreases by half after 137 hours.

Example 14

Fabrication and Evaluation of the Organic EL Device 14

The organic EL device 14 was fabricated in the same manner as Example 8 except that, instead of the composition 8 of Example 8, the composition 14 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 20 dissolved in chlorobenzene solvent to the concentration of 0.9% by mass such that the polymer 1:the polymer 2:the polymer 20=50:30:20 in terms of weight ratio. A voltage was applied to the obtained organic EL device 14, and EL light emission having a peak at 460 nm which mainly originates from the polymer 1 was obtained from the device. The device started to emit light at 2.6 V and had a maximum light emitting efficiency of 10.71 cd/A.

A current value was set so that the organic EL device 14 obtained as described above had an initial luminance of 5000 cd/m$^2$, the device was then driven at a constant current, and a change in luminance with time was measured. As a result, it was found that the luminance decreases by half after 124 hours.

Example 15

Fabrication and Evaluation of the Organic EL Device 15

The organic EL device 15 was fabricated in the same manner as Example 8 except that, instead of the composition 8 of Example 8, the composition 15 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 21 dissolved in chlorobenzene solvent to the concentration of 0.9% by mass such that the polymer 1:the polymer 2:the polymer 21=50:30:20 in terms of weight ratio. A voltage was applied to the obtained organic EL device 15, and EL light emission having a peak at 460 nm which mainly originates from the polymer 1 was obtained from the device. The device started to emit light at 2.7 V and had a maximum light emitting efficiency of 9.56 cd/A.

A current value was set so that the organic EL device 15 obtained as described above had an initial luminance of 5000 cd/m$^2$, the device was then driven at a constant current, and a change in luminance with time was measured. As a result, it was found that the luminance decreases by half after 126 hours.

Example 16

Fabrication and Evaluation of the Organic EL Device 16

The organic EL device 16 was fabricated in the same manner as Example 8 except that, instead of the composition 8 of Example 8, the composition 16 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 22 dissolved in chlorobenzene solvent to the concentration of 0.9% by mass such that the polymer 1:the polymer 2:the polymer 22=50:30:20 in terms of weight ratio. A voltage was applied to the obtained organic EL device 16, and EL light emission having a peak at 460 nm which mainly originates from the polymer 1 was obtained from the device. The device started to emit light at 2.8 V and had a maximum light emitting efficiency of 9.16 cd/A.

A current value was set so that the organic EL device 16 obtained as described above had an initial luminance of 5000 cd/m$^2$, the device was then driven at a constant current, and a change in luminance with time was measured. As a result, it was found that the luminance decreases by half after 103 hours.

Example 17

Fabrication and Evaluation of the Organic EL Device 17

The organic EL device 17 was fabricated in the same manner as Example 8 except that, instead of the composition 8 of Example 8, the composition 17 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, a solution of the polymer 3 dissolved in chlorobenzene solvent to the concentration of 0.9% by mass, and a solution of the polymer 5 dissolved in chlorobenzene solvent to the concentration of 0.9% by mass such that the polymer 1:the polymer 2:the polymer 3:the polymer 5=50:30:19:1 in terms of weight ratio. A voltage was applied to the obtained organic EL device 17, and EL light emission having a peak at 460 nm which mainly originates from the polymer 1 was obtained from the device. The device started to emit light at 2.6 V and had a maximum light emitting efficiency of 11.51 cd/A.

A current value was set so that the organic EL device 17 obtained as described above had an initial luminance of 5000 cd/m$^2$, the device was then driven at a constant current, and a change in luminance with time was measured. As a result, it was found that the luminance decreases by half after 79 hours.

Example 18

Fabrication and Evaluation of the Organic EL Device 18

The organic EL device 18 was fabricated in the same manner as Example 8 except that, instead of the composition 8 of Example 8, the composition 18 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, a solution of the polymer 3 dissolved in chlorobenzene solvent to the concentration of 0.9% by mass, and a solution of the polymer 5 dissolved in chlorobenzene solvent to the concentration of 0.9% by mass such that the polymer 1:the polymer 2:the polymer 3:the polymer 5=50:30:18:2 in terms of weight ratio. A voltage was applied to the obtained organic EL device 18, and EL light emission having a peak at 460 nm which mainly originates from the polymer 1 was obtained from the device. The device started to emit light at 2.6 V and had a maximum light emitting efficiency of 11.42 cd/A.

A current value was set so that the organic EL device 18 obtained as described above had an initial luminance of 5000 cd/m$^2$, the device was then driven at a constant current, and a change in luminance with time was measured. As a result, it was found that the luminance decreases by half after 105 hours.

Example 19

Fabrication and Evaluation of the Organic EL Device 19

The organic EL device 19 was fabricated in the same manner as Example 8 except that, instead of the composition 8 of Example 8, the composition 19 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, a solution of the polymer 3 dissolved in chlorobenzene solvent to the concentration of 0.9% by mass, and a solution of the polymer 5 dissolved in chlorobenzene solvent to the concentration of 0.9% by mass such that the polymer 1:the polymer 2:the polymer 3:the polymer 5=50:30:15:5 in terms of weight ratio. A voltage was applied to the obtained organic EL device 19, and EL light emission having a peak at 460 nm which mainly originates from the polymer 1 was obtained from the device. The device started to emit light at 2.6 V and had a maximum light emitting efficiency of 10.70 cd/A.

A current value was set so that the organic EL device 19 obtained as described above had an initial luminance of 5000 cd/m$^2$, the device was then driven at a constant current, and a change in luminance with time was measured. As a result, it was found that the luminance decreases by half after 115 hours.

Example 20

Fabrication and Evaluation of the Organic EL Device 20

The organic EL device 20 was fabricated in the same manner as Example 8 except that, instead of the composition 8 of Example 8, the composition 20 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, a solution of the polymer 3 dissolved in chlorobenzene solvent to the concentration of 0.9% by mass, and a solution of the polymer 5 dissolved in chlorobenzene solvent to the concentration of 0.9% by mass such that the polymer 1:the polymer 2:the polymer 3:the polymer 5=50:30:10:10 in terms of weight ratio. A voltage was applied to the obtained organic EL device 20, and EL light emission having a peak at 460 nm which mainly originates from the polymer 1 was obtained from the device. The device started to emit light at 2.7 V and had a maximum light emitting efficiency of 10.59 cd/A.

A current value was set so that the organic EL device 20 obtained as described above had an initial luminance of 5000 cd/m$^2$, the device was then driven at a constant current, and a change in luminance with time was measured. As a result, it was found that the luminance decreases by half after 138 hours.

Example 21

Fabrication and Evaluation of the Organic EL Device 21

The organic EL device 21 was fabricated in the same manner as Example 8 except that the polymer 23 was used as a hole transport polymer instead of the polymer 9, and instead of the composition of Example 8, the composition 6 (the polymer 1:the polymer 2:the polymer 3=50:30:20) of the Comparative Example 1 was prepared. A voltage was applied to the obtained organic EL device 21, and EL light emission having a peak at 460 nm which mainly originates from the polymer 1 was obtained from the device. The device started to emit light at 2.7 V and had a maximum light emitting efficiency of 9.83 cd/A.

A current value was set so that the organic EL device 21 obtained as described above had an initial luminance of 5000 cd/m$^2$, the device was then driven at a constant current, and a change in luminance with time was measured. As a result, it was found that the luminance decreases by half after 107 hours.

Example 22

Fabrication and Evaluation of the Organic EL Device 22

The organic EL device 22 was fabricated in the same manner as Example 8 except that, instead of the composition 8 of Example 8, the composition 21 was prepared by mixing a solution of the polymer 25 dissolved in chlorobenzene solvent to the concentration of 0.9% by mass and a solution of the polymer 15 dissolved in chlorobenzene solvent to the concentration of 0.9% by mass such that the polymer 25:the polymer 15=80:20 in terms of weight ratio. A voltage was applied to the obtained organic EL device 22, and EL light emission having a peak at 460 nm which mainly originates from the polymer 25 was obtained from the device. The device started to emit light at 2.7 V and had a maximum light emitting efficiency of 8.24 cd/A.

A current value was set so that the organic EL device 22 obtained as described above had an initial luminance of 5000 cd/m$^2$, the device was then driven at a constant current, and a change in luminance with time was measured. As a result, it was found that the luminance decreases by half after 199 hours.

Example 23

Fabrication and Evaluation of the Organic EL Device 23

The organic EL device 23 was fabricated in the same manner as Example 8 except that, instead of the composition 8 of Example 8, the composition 22 was prepared by mixing a solution of the polymer 26 dissolved in chlorobenzene solvent to the concentration of 0.9% by mass and a solution of the polymer 15 dissolved in chlorobenzene solvent to the concentration of 0.9% by mass such that the polymer 26:the polymer 15=80:20 in terms of weight ratio. A voltage was applied to the obtained organic EL device 23, and EL light emission having a peak at 445 nm which mainly originates from the polymer 26 was obtained from the device. The device started to emit light at 2.7 V and had a maximum light emitting efficiency of 6.29 cd/A.

A current value was set so that the organic EL device 23 obtained as described above had an initial luminance of 5000 cd/m$^2$, the device was then driven at a constant current, and a change in luminance with time was measured. As a result, it was found that the luminance decreases by half after 86 hours.

Example 24

Fabrication and Evaluation of the Organic EL Device 24

The organic EL device 24 was fabricated in the same manner as Example 8 except that, instead of the composition 8 of Example 8, the composition 24 was prepared by mixing a solution of the polymer 13 dissolved in chlorobenzene solvent to the concentration of 0.9% by mass and a solution of the polymer 15 dissolved in chlorobenzene solvent to the concentration of 0.9% by mass such that the polymer 13:the polymer 15=90:10 in terms of weight ratio. A voltage was applied to the obtained organic EL device 24, and EL light emission having a peak at 465 nm which mainly originates from the polymer 13 was obtained from the device. The device started to emit light at 2.6 V and had a maximum light emitting efficiency of 11.1 cd/A.

A current value was set so that the organic EL device 24 obtained as described above had an initial luminance of 5000 cd/m$^2$, the device was then driven at a constant current, and a change in luminance with time was measured. As a result, it was found that the luminance decreases by half after 360 hours.

Example 25

Fabrication and Evaluation of the Organic EL Device 25

The organic EL device 25 was fabricated in the same manner as Example 8 except that, instead of the composition 8 of Example 8, the composition 25 was prepared by mixing a solution of the polymer 24 dissolved in chlorobenzene solvent to the concentration of 0.9% by mass and a solution of the polymer 15 dissolved in chlorobenzene solvent to the concentration of 0.9% by mass such that the polymer 24:the the polymer 15=90:10 in terms of weight ratio. A voltage was applied to the obtained organic EL device 25, and EL light emission having a peak at 460 nm which mainly originates from the polymer 24 was obtained from the device. The device started to emit light at 2.6 V and had a maximum light emitting efficiency of 10.0 cd/A.

A current value was set so that the organic EL device 25 obtained as described above had an initial luminance of 5000 cd/m$^2$, the device was then driven at a constant current, and a change in luminance with time was measured. As a result, it was found that the luminance decreases by half after 188 hours.

Comparative Example 3

Fabrication and Evaluation of the Organic EL Device C3

The organic EL device C3 was fabricated in the same manner as Example 8 except that, instead of the composition 8 of Example 8, a solution of the polymer 27 dissolved in chlorobenzene solvent to the concentration of 0.9% by mass was prepared. A voltage was applied to the obtained organic EL device C3, and EL light emission having a peak at 460 nm which mainly originates from the polymer 27 was obtained from the device. The device started to emit light at 2.7 V and had a maximum light emitting efficiency of 7.45 cd/A.

A current value was set so that the organic EL device C3 obtained as described above had an initial luminance of 5000 cd/m$^2$, the device was then driven at a constant current, and a change in luminance with time was measured. As a result, it was found that the luminance decreases by half after 33 hours.

Comparative Example 4

Fabrication and Evaluation of the Organic EL Device C4

The organic EL device C4 was fabricated in the same manner as Example 8 except that, instead of the composition 8 of Example 8, the composition 28 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 28 dissolved in chlorobenzene solvent to the concentration of 0.9% by mass such that the polymer 1:the polymer 2:the polymer 28=50:30:20 in terms of weight ratio. A voltage was applied to the obtained organic EL device C4, and EL light emission having a peak at 460 nm which mainly originates from the polymer 1 was obtained from the device. The device started to emit light at 2.7 V and had a maximum light emitting efficiency of 7.53 cd/A.

A current value was set so that the organic EL device C4 obtained as described above had an initial luminance of 5000 cd/m$^2$, the device was then driven at a constant current, and a change in luminance with time was measured. As a result, it was found that the luminance decreases by half after 58 hours.

Comparative Example 5

Fabrication and Evaluation of the Organic EL Device C5

The organic EL device C5 was fabricated in the same manner as Example 8 except that, instead of the composition 8 of Example 8, the composition 29 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 29 dissolved in chlorobenzene solvent to the concentration of 0.9% by mass such that the polymer 1:the polymer 2:the polymer 29=50:30:20 in terms of weight ratio. A voltage was applied to the obtained organic EL device C5, and EL light emission having a peak at 460 nm which mainly originates from the polymer 1 was obtained from the device. The device started to emit light at 3.0 V and had a maximum light emitting efficiency of 6.02 cd/A.

A current value was set so that the organic EL device C5 obtained as described above had an initial luminance of 5000 cd/m$^2$, the device was then driven at a constant current, and a change in luminance with time was measured. As a result, it was found that the luminance decreases by half after 47 hours.

Comparative Example 6

Fabrication and Evaluation of the Organic EL Device C6

The organic EL device C6 was fabricated in the same manner as Example 8 except that, instead of the composition 8 of Example 8, the composition 30 was prepared by mixing a solution of the polymer 1 dissolved in chlorobenzene solvent to the concentration of 0.9% by mass, a solution of the polymer 2 dissolved in chlorobenzene solvent to the concentration of 0.9% by mass, and a solution of the polymer 30 dissolved in chlorobenzene solvent to the concentration of 0.9% by mass were admixed with each other such that the polymer 1:the polymer 2:the polymer 30=50:30:20 in terms of weight ratio. A voltage was applied to the obtained organic EL device C6, and EL light emission having a peak at 460 nm which mainly originates from the polymer 1 was obtained from the device. The device started to emit light at 2.7 V and had a maximum light emitting efficiency of 7.35 cd/A.

A current value was set so that the organic EL device C6 obtained as described above had an initial luminance of 5000 cd/m$^2$, the device was then driven at a constant current, and a change in luminance with time was measured. As a result, it was found that the luminance decreases by half after 56 hours.

Comparative Example 7

Fabrication and Evaluation of the Organic EL Device C7

The organic EL device C7 was fabricated in the same manner as Example 8 except that, instead of the composition 8 of Example 8, a solution of the polymer 25 dissolved in chlorobenzene solvent to the concentration of 0.9% by mass was prepared. A voltage was applied to the obtained organic EL device C7, and EL light emission having a peak at 460 nm which mainly originates from the polymer 25 was obtained from the device. The device started to emit light at 2.6 V and had a maximum light emitting efficiency of 7.21 cd/A.

A current value was set so that the organic EL device C7 obtained as described above had an initial luminance of 5000 cd/m$^2$, the device was then driven at a constant current, and a change in luminance with time was measured. As a result, it was found that the luminance decreases by half after 78 hours.

Comparative Example 8

Fabrication and Evaluation of the Organic EL Device C8

The organic EL device C8 was fabricated in the same manner as Example 8 except that, instead of the composition 8 of Example 8, a solution of the polymer 26 dissolved in chlorobenzene solvent to the concentration of 0.9% by mass was prepared. A voltage was applied to the obtained organic EL device C8, and EL light emission having a peak at 445 nm which mainly originates from the polymer 26 was obtained from the device. The device started to emit light at 2.6 V and had a maximum light emitting efficiency of 5.25 cd/A.

A current value was set so that the organic EL device C8 obtained as described above had an initial luminance of 5000 cd/m², the device was then driven at a constant current, and a change in luminance with time was measured. As a result, it was found that the luminance decreases by half after 23 hours.

Comparative Example 9

Fabrication and Evaluation of the Organic EL Device C9

The organic EL device C9 was fabricated in the same manner as Example 8 except that, instead of the composition 8 of Example 8, a solution of the polymer 13 dissolved in chlorobenzene solvent to the concentration of 0.9% by mass was prepared. A voltage was applied to the obtained organic EL device C9, and EL light emission having a peak at 465 nm which mainly originates from the polymer 13 was obtained from the device. The device started to emit light at 2.6 V and had a maximum light emitting efficiency of 9.19 cd/A.

A current value was set so that the organic EL device C9 obtained as described above had an initial luminance of 5000 cd/m², the device was then driven at a constant current, and a change in luminance with time was measured. As a result, it was found that the luminance decreases by half after 153 hours.

Comparative Example 10

Fabrication and Evaluation of the Organic EL Device C10

The organic EL device C10 was fabricated in the same manner as Example 8 except that, instead of the composition 8 of Example 8, a solution of the polymer 24 dissolved in chlorobenzene solvent to the concentration of 0.9% by mass was prepared. A voltage was applied to the obtained organic EL device C10, and EL light emission having a peak at 460 nm which mainly originates from the polymer 24 was obtained from the device. The device started to emit light at 2.6 V and had a maximum light emitting efficiency of 9.46 cd/A.

A current value was set so that the organic EL device C10 obtained as described above had an initial luminance of 5000 cd/m², the device was then driven at a constant current, and a change in luminance with time was measured. As a result, it was found that the luminance decreases by half after 80 hours.

Results obtained from Comparative Examples 3 to 8 are given in Table 4. Results obtained from Examples 8 to 25 are given in Tables 2 and 3. Results obtained from Comparative Examples 3 to 10 are given in Table 4.

TABLE 2

| | Composition/Block type copolymer | | Organic EL device | Maximum light emitting efficiency (cd/A) | Half period of luminance (hrs.) |
|---|---|---|---|---|---|
| | | Mixing ratio | | | |
| Example 8 | Polymer 1 | 50 | Organic EL device 8 | 9.35 | 105 |
| | Polymer 2 | 30 | | | |
| | Polymer 14 | 20 | | | |
| Example 9 | Polymer 1 | 50 | Organic EL device 9 | 11.05 | 158 |
| | Polymer 2 | 30 | | | |
| | Polymer 15 | 20 | | | |

TABLE 2-continued

| | Composition/Block type copolymer | | Organic EL device | Maximum light emitting efficiency (cd/A) | Half period of luminance (hrs.) |
|---|---|---|---|---|---|
| | | Mixing ratio | | | |
| Example 10 | Polymer 1 | 50 | Organic EL device 10 | 9.41 | 124 |
| | Polymer 2 | 30 | | | |
| | Polymer 16 | 20 | | | |
| Example 11 | Polymer 1 | 50 | Organic EL device 11 | 6.89 | 111 |
| | Polymer 2 | 30 | | | |
| | Polymer 17 | 20 | | | |
| Example 12 | Polymer 1 | 50 | Organic EL device 12 | 7.06 | 101 |
| | Polymer 2 | 30 | | | |
| | Polymer 18 | 20 | | | |
| Example 13 | Polymer 1 | 50 | Organic EL device 13 | 9.91 | 137 |
| | Polymer 2 | 30 | | | |
| | Polymer 19 | 20 | | | |
| Example 14 | Polymer 1 | 50 | Organic EL device 14 | 10.71 | 124 |
| | Polymer 2 | 30 | | | |
| | Polymer 20 | 20 | | | |
| Example 15 | Polymer 1 | 50 | Organic EL device 15 | 9.56 | 126 |
| | Polymer 2 | 30 | | | |
| | Polymer 21 | 20 | | | |
| Example 16 | Polymer 1 | 50 | Organic EL device 16 | 9.16 | 103 |
| | Polymer 2 | 30 | | | |
| | Polymer 22 | 20 | | | |

TABLE 3

| | Composition/Block type copolymer | | Organic EL device | Maximum light emitting efficiency (cd/A) | Half period of luminance (hrs.) |
|---|---|---|---|---|---|
| | | Mixing ratio | | | |
| Example 17 | Polymer 1 | 50 | Organic EL device 17 | 11.51 | 79 |
| | Polymer 2 | 30 | | | |
| | Polymer 3 | 19 | | | |
| | Polymer 5 | 1 | | | |
| Example 18 | Polymer 1 | 50 | Organic EL device 18 | 11.42 | 105 |
| | Polymer 2 | 30 | | | |
| | Polymer 3 | 18 | | | |
| | Polymer 5 | 2 | | | |
| Example 19 | Polymer 1 | 50 | Organic EL device 19 | 10.70 | 115 |
| | Polymer 2 | 30 | | | |
| | Polymer 3 | 15 | | | |
| | Polymer 5 | 5 | | | |
| Example 20 | Polymer 1 | 50 | Organic EL device 20 | 10.59 | 138 |
| | Polymer 2 | 30 | | | |
| | Polymer 3 | 10 | | | |
| | Polymer 5 | 10 | | | |
| Example 21 | Polymer 1 | 50 | Organic EL device 21 | 9.83 | 107 |
| | Polymer 2 | 30 | | | |
| | Polymer 3 | 20 | | | |
| Example 22 | Polymer 25 | 80 | Organic EL device 22 | 8.24 | 199 |
| | Polymer 15 | 20 | | | |
| Example 23 | Polymer 26 | 80 | Organic EL device 23 | 6.29 | 86 |
| | Polymer 15 | 20 | | | |
| Example 24 | Polymer 13 | 90 | Organic EL device 24 | 11.1 | 360 |
| | Polymer 15 | 10 | | | |
| Example 25 | Polymer 24 | 90 | Organic EL device 25 | 10.0 | 188 |
| | Polymer 15 | 10 | | | |

TABLE 4

| | Composition/Block type copolymer | | Organic EL device | Maximum light emitting efficiency (cd/A) | Half period of luminance (hrs.) |
|---|---|---|---|---|---|
| | | Mixing ratio | | | |
| Comp. Example 3 | Polymer 27 | 100 | Organic EL device C3 | 7.45 | 33 |
| Comp. Example 4 | Polymer 1 Polymer 2 Polymer 28 | 50 30 20 | Organic EL device C4 | 7.53 | 58 |
| Comp. Example 5 | Polymer 1 Polymer 2 Polymer 29 | 50 30 20 | Organic EL device C5 | 6.02 | 47 |
| Comp. Example 6 | Polymer 1 Polymer 2 Polymer 30 | 50 30 20 | Organic EL device C6 | 7.35 | 56 |
| Comp. Example 7 | Polymer 25 | 100 | Organic EL device C7 | 7.21 | 78 |
| Comp. Example 8 | Polymer 26 | 100 | Organic EL device C8 | 5.25 | 23 |
| Comp. Example 9 | Polymer 13 | 100 | Organic EL device C9 | 9.19 | 153 |
| Comp. Example 10 | Polymer 24 | 100 | Organic EL device C10 | 9.46 | 80 |

The invention claimed is:

1. A composition comprising:

a light emitting material; and a polymer compound having a constitutional sequence represented by the following formula (1) as a main chain:

 (1)

in the formula,

Y represents a divalent group, in which two hydrogen atoms are removed from a structure represented by the following formula (Y-1) or (Y-2), Z represents a divalent group, in which two hydrogen atoms are removed from a structure represented by the following formula (Z-1), (Z-2), (Z-3), (Z-4), (Z-5), (Z-6), (Z-7), or (Z-8), m represents an integer of 4 to 10,000, and n represents an integer of 1 to 3, plural Y's, Z's, and n's each may be the same as or different from each other, a hydrogen atom included in Y and Z may be substituted by R', and R' each independently represents a functional group selected from a group consisting of a carboxyl group, a nitro group, a cyano group, an alkyl group, an alkoxy group, an alkylthio group, an aryl group, an aryloxy group, an arylthio group, an alkenyl group, an alkynyl group, an amino group, a silyl group, an acyl group, an acyloxy group, an imine residue, an amide compound residue, an acid imide residue, a monovalent heterocyclic group, and a monovalent heterocyclic thio group, or a halogen atom, when there are plural R''s, they may be the same as or different from each other, and plural R''s may be bonded to each other to form a ring structure, and the hydrogen atom included in the functional group may be further substituted by a substituent,

[Chemical Formula 1]

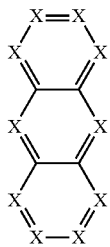 (Y-1)

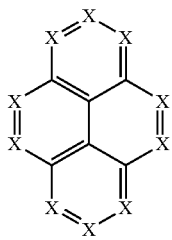 (Y-2)

[Chemical Formula 2]

 (Z-1)

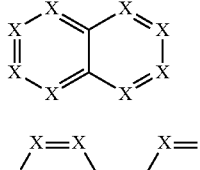 (Z-2)

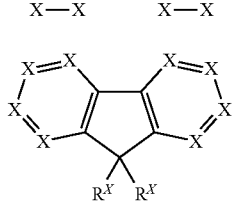 (Z-3)

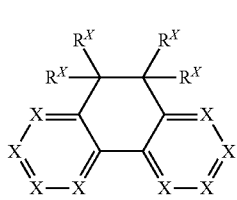 (Z-4)

(Z-5)

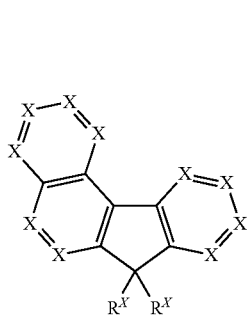 (Z-6)

-continued

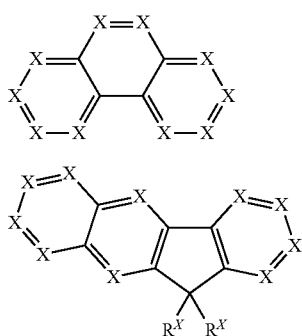
(Z-7)

(Z-8)

in the formulas,

X represents —CH= or —N=, and plural X's may be the same as or different from each other, with the proviso that the number of —N= as X is 0 to 2, $R^x$ represents a functional group selected from a group consisting of a carboxyl group, a nitro group, a cyano group, an alkyl group, an alkoxy group, an alkylthio group, an aryl group, an aryloxy group, an arylthio group, an alkenyl group, an alkynyl group, an amino group, a silyl group, an acyl group, an acyloxy group, an imine residue, an amide compound residue, an acid imide residue, a monovalent heterocyclic group, and a monovalent heterocyclic thio group, or a hydrogen atom or a halogen atom, plural $R^x$'s may be the same as or different from each other, and plural $R^x$'s may be bonded to each other to form a ring structure, and the hydrogen atom included in the functional group may be further substituted by a substituent, wherein the composition includes the light emitting material in an amount of 4 to 20 parts by mass relative to 1 part by mass of the polymer compound.

2. The composition according to claim 1, wherein the light emitting material is a polymeric light emitting material.

3. The composition according to claim 2, wherein the light emitting material is the polymeric light emitting material including at least one of constitutional units represented by the following formula (A), (B), or (C):

[Chemical Formula 3]

(A)

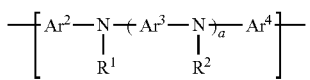
(B)

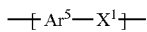
(C)

in the formulas, $Ar^1$ and $Ar^5$ each independently represent an arylene group, a divalent heterocyclic group, or a divalent group having a metal complex structure, $Ar^2$, $Ar^3$, and $Ar^4$ each independently represent an arylene group or a divalent heterocyclic group, $R^1$ and $R^2$ each independently represent a hydrogen atom, an alkyl group, an aryl group, or a monovalent heterocyclic group, $X^1$ represents —$CR^3$=$CR^4$— or —C≡C—, $R^3$ and $R^4$ each independently represent a hydrogen atom, a carboxyl group, a substituted car-boxyl group, a cyano group, an alkyl group, an aryl group, or a monovalent heterocyclic group, and a is 0 or 1.

4. The composition according to claim 3, wherein the light emitting material includes the constitutional unit represented by the formula (B).

5. The composition according to claim 1, wherein the Y is a divalent group represented by the following formula (Y-3), (Y-4), (Y-5), or (Y-6):

[Chemical Formula 4]

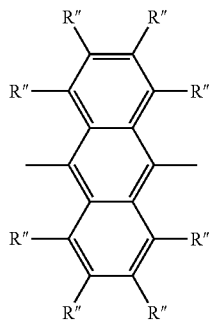
(Y-3)

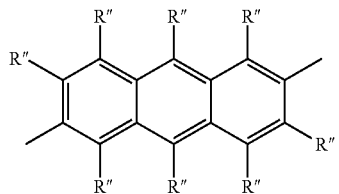
(Y-4)

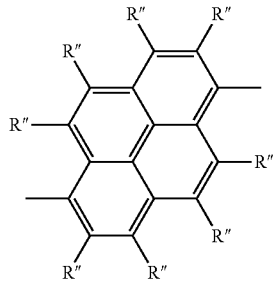
(Y-5)

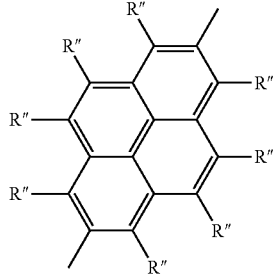
(Y-6)

in the formulas,

R" represents a hydrogen atom, an alkyl group, an aryl group, or a monovalent heterocyclic group, and plural R"'s may be the same as or different from each other.

6. The composition according to claim 1, wherein the Z is a divalent group represented by the following formula (Z-9), (Z-10), (Z-11), (Z-12), (Z-13), (Z-14), (Z-15), (Z-16), (Z-17), (Z-18), (Z-19), or (Z-20):

[Chemical Formula 5]

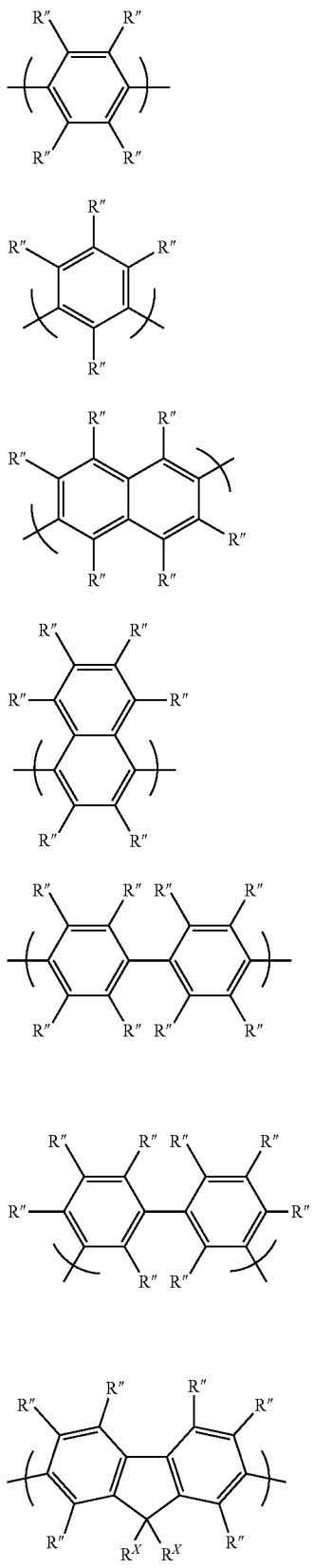

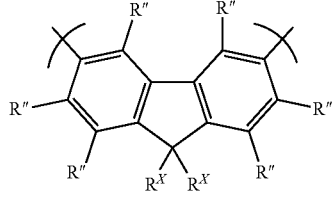
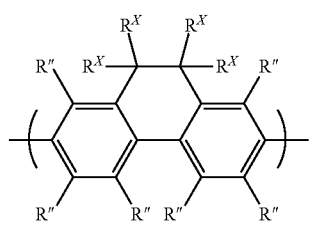
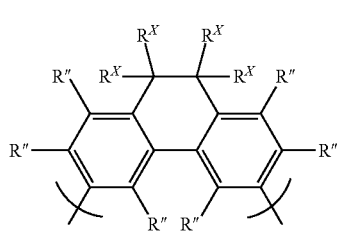
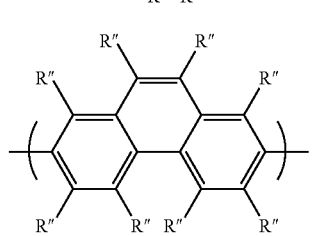
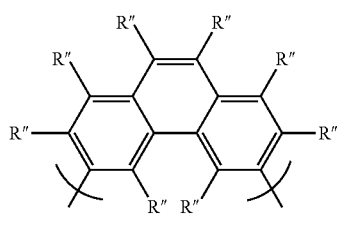

in the formulas,

R″ represents a hydrogen atom, an alkyl group, an aryl group, or a monovalent heterocyclic group, plural R″'s may be the same as or different from each other, and $R^x$ has the same meaning as defined above.

7. The composition according to claim 6, wherein the Z is a divalent group represented by the formula (Z-11), (Z-15), or (Z-17).

8. The composition according to claim 1, wherein the polymer compound is synthesized by condensation polymerization, in the polymer compound, the group represented by Y and the group represented by Z are introduced by condensation polymerization, an arbitrary additional group which is different from the group represented by Y and the group represented by Z may be introduced by condensation polymerization, and when mole numbers of Y, Z, and the arbitrary additional group in the polymer compound are $N_Y$, $N_Z$ and $N_M$, respectively, $N_Y$, $N_Z$ and $N_M$ satisfy the following equation (2):

$$30 \leq N_Y \times 100/(N_Y+N_Z+N_M) \leq 75 \qquad (2).$$

9. The composition according to claim 1,
wherein each of the polymer compound and the light emitting material is synthesized by condensation polymerization,
in the polymer compound, the group represented by Y and the group represented by Z are introduced by condensation polymerization,
an arbitrary additional group which is different from the group represented by Y and the group represented by Z may be introduced by condensation polymerization, and
when mole numbers of Y, Z, and the arbitrary additional group in the polymer compound are $N_Y$, $N_Z$ and $N_M$, respectively, and a mole number of chemical structures in the light emitting material constituting the light emitting material, which is introduced by the condensation polymerization, is $N_L$, $N_Y$, $N_Z$, $N_M$, and $N_L$ satisfy the following equation (3):

$$0.5 \leq N_Y \times 100/(N_Y+N_Z+N_M+N_L) \leq 37.5 \qquad (3).$$

10. The composition according to claim 1, wherein the main chain of the polymer compound is composed only of the constitutional sequence represented by the formula (1).

11. An organic electroluminescence device comprising: a pair of electrodes; and an organic layer provided between the pair of the electrodes, the organic layer being obtained by using the composition according to claim 1.

12. A surface light source device having the organic electroluminescence device according to claim 11.

13. A display device having the organic electroluminescence device according to claim 11.

14. A block type copolymer comprising:
a block consisting of a constitutional sequence represented by the following formula (1) as a main chain; and
a block consisting of a chemical structure constituting a light emitting material as a main chain:

$$-[-(Y)_n-Z-]_m- \qquad (1)$$

in the formula,
Y represents a divalent group, in which two hydrogen atoms are removed from a structure represented by the formula (Y-1) or (Y-2),
Z represents a divalent group represented by the following formula (Z-9), (Z-11), (Z-13), (Z-15), (Z-16), (Z-17), or (Z-19),
m represents an integer of 4 to 10,000, and n represents an integer of 1 to 3,
plural Y's, Z's, and n's each may be the same as or different from each other,
the hydrogen atom included in Y and Z may be substituted by R', and R' represents a functional group selected from a group consisting of a carboxyl group, a nitro group, a cyano group, an alkyl group, an alkoxy group, an alkylthio group, an aryl group, an aryloxy group, an arylthio group, an alkenyl group, an alkynyl group, an amino group, a silyl group, an acyl group, an acyloxy group, an imine residue, an amide compound residue, an acid imide residue, a monovalent heterocyclic group, and a monovalent heterocyclic thio group, or a hydrogen atom or a halogen atom, when there are plural R''s, they may be the same as or different from each other, and plural R''s may be bonded to each other to form a ring structure, and the hydrogen atom included in the functional group may be further substituted by a substituent,

[Chemical Formula 6]

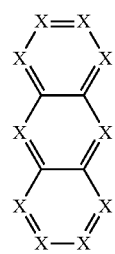
(Y-1)

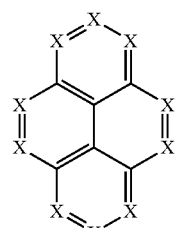
(Y-2)

[Chemical Formula 7]

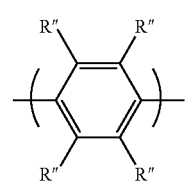
(Z-9)

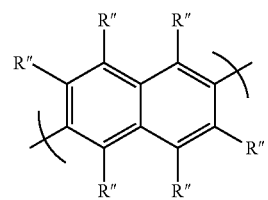
(Z-11)

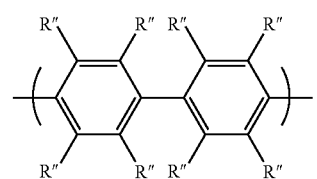
(Z-13)

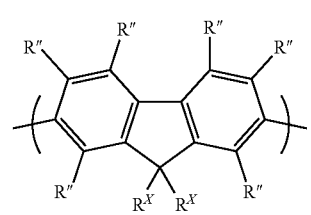
(Z-15)

-continued

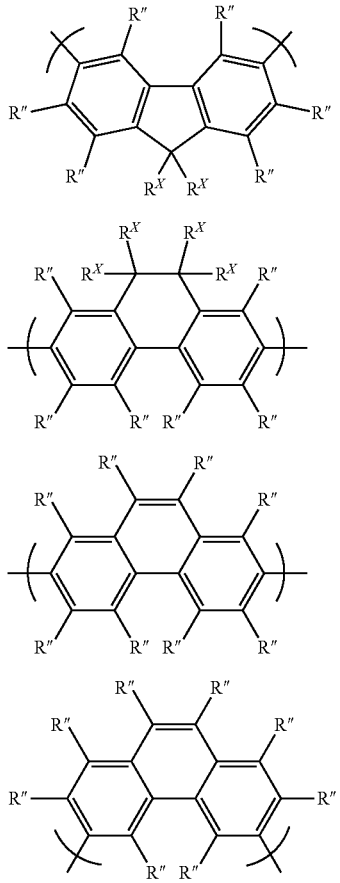

in the formulas,

X represents —CH= or —N=, and plural X's may be the same as or different from each other, with the proviso that the number of —N= as X is 0 to 2, R$^x$ represents a functional group selected from a group consisting of a carboxyl group, a nitro group, a cyano group, an alkyl group, an alkoxy group, an alkylthio group, an aryl group, an aryloxy group, an arylthio group, an alkenyl group, an alkynyl group, an amino group, a silyl group, an acyl group, an acyloxy group, an imine residue, an amide compound residue, an acid imide residue, a monovalent heterocyclic group, and a monovalent heterocyclic thio group, or a hydrogen atom or a halogen atom, plural R$^x$'s may be the same as or different from each other, and plural R$^x$'s may be bonded to each other to form a ring structure, and the hydrogen atom included in the functional group may be further substituted by a substituent, and R" represents a hydrogen atom, an alkyl group, an aryl group, or a monovalent heterocyclic group, when there are plural R"'s, they may be the same as or different from each other, wherein the chemical structure constituting the light emitting material consists of a constitutional unit represented by the following formula (B) and at least one constitutional unit selected from the group consisting of a constitutional unit represented by the following formula (A) and a constitutional unit represented by the following formula (C);

[Chemical Formula 3]

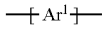 (A)

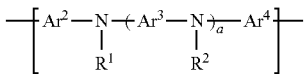 (B)

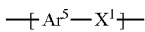 (C)

in the formulas,

Ar$^1$ and Ar$^5$ each independently represent an arylene group, a divalent heterocyclic group, or a divalent group having a metal complex structure, Ar$^2$, Ar$^3$ and Ar$^4$ each independently represent an arylene group or a divalent heterocyclic group, R$^1$ and R$^2$ each independently represent a hydrogen atom, an alkyl group, an aryl group, or a monovalent heterocyclic group, X$^1$ represents —CR$^3$=CR$^4$— or —C≡C—, R$^3$ and R$^4$ each independently represent a hydrogen atom, a carboxyl group, a substituted carboxyl group, a cyano group, an alkyl group, an aryl group, or a monovalent heterocyclic group, and a is 0 or 1, and the molar ratio between the constitutional unit represented by the formula (B) and the at least one constitutional unit selected from the group consisting of the constitutional unit represented by the formula (A) and the constitutional unit represented by the formula (C) is 5:95 to 20:80.

15. The block type copolymer according to claim 14, wherein the Y is a divalent group represented by the following formula (Y-3), (Y-4), (Y-5), or (Y-6):

[Chemical Formula 9]

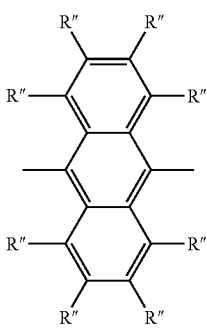 (Y-3)

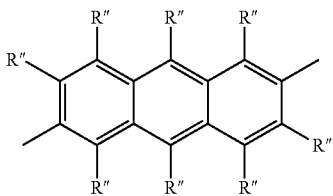 (Y-4)

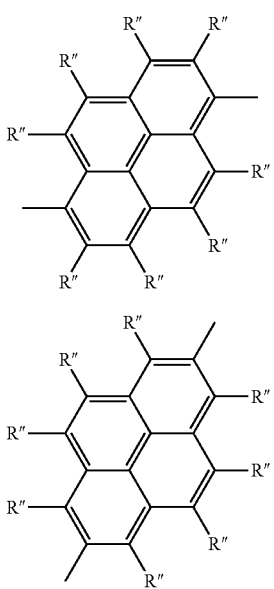

in the formulas,

R" represents a hydrogen atom, an alkyl group, an aryl group, or a monovalent heterocyclic group, and plural R"'s may be the same as or different from each other.

16. The block type copolymer according to claim 14, wherein the Z is a divalent group represented by the formula (Z-11), (Z-15), or (Z-17).

17. The block type copolymer according to claim 14, comprising 1 to 30 constitutional sequences represented by the formula (1).

18. The block type copolymer according to claim 14,
wherein the block type copolymer is synthesized by condensation polymerization,
in the block type copolymer, the group represented by Y, the group represented by Z, and a chemical structure constituting the light emitting material are introduced by condensation polymerization,
an arbitrary additional group which is different from the group represented by Y, the group represented by Z, and the chemical structure constituting the light emitting material may be introduced by condensation polymerization, and
when mole numbers of Y, Z, the arbitrary additional group, and the chemical structure constituting the light emitting material in the block type copolymer are $N_Y$, $N_Z$, $N_M$, and $N_K$, respectively, $N_Y$, $N_Z$, $N_M$, and $N_K$ satisfy the following equation (4):

$$2 \leq N_Y \times 100/(N_Y+N_Z+N_K+N_M) < 40 \qquad (4).$$

19. The block type copolymer according to claim 14, wherein the block type copolymer is composed only of the block consisting of the chemical structure constituting the light emitting material and the block consisting of the constitutional sequence represented by the formula (1).

20. An organic electroluminescence device comprising: a pair of electrodes; and an organic layer provided between the pair of the electrodes, the organic layer comprising the block type copolymer according to claim 14.

21. A surface light source device having the organic electroluminescence device according to claim 20.

22. A display device having the organic electroluminescence device according to claim 20.

23. The block type copolymer according to claim 14, wherein in formulae (Z-15) and (Z-16), one of the two $R^x$'s is an alkyl group and the other is an aryl group.

* * * * *